United States Patent
Lowenthal et al.

(10) Patent No.: US 9,018,833 B2
(45) Date of Patent: Apr. 28, 2015

(54) APPARATUS WITH LIGHT EMITTING OR ABSORBING DIODES

(75) Inventors: Mark David Lowenthal, Gilbert, AZ (US); William Johnstone Ray, Fountain Hills, AZ (US); Neil O. Shotton, Tempe, AZ (US); Richard A. Blanchard, Los Altos, CA (US); Mark Allan Lewandowski, North Port, FL (US); Brad Oraw, Mesa, AZ (US); Jeffrey Baldridge, Chandler, AZ (US); Eric Anthony Perozziello, Stanford, CA (US)

(73) Assignee: NthDegree Technologies Worldwide Inc, Tempe, AZ (US)

( * ) Notice: Subject to any disclaimer, the term of this patent is extended or adjusted under 35 U.S.C. 154(b) by 639 days.

(21) Appl. No.: 13/223,289

(22) Filed: Aug. 31, 2011

(65) Prior Publication Data

US 2012/0161196 A1    Jun. 28, 2012

Related U.S. Application Data

(63) Continuation-in-part of application No. 11/756,616, filed on May 31, 2007, and a continuation-in-part of application No. 12/601,268, filed on May 22, 2010, now abandoned, and a continuation-in-part of (Continued)

(51) Int. Cl.
*H01J 1/62*    (2006.01)
*H01L 25/04*    (2014.01)

(Continued)

(52) U.S. Cl.
CPC ............. *H01L 25/048* (2013.01); *H01L 51/52* (2013.01); *H01L 51/5203* (2013.01); *H01L 51/56* (2013.01); *H01L 2924/09701* (2013.01); *H01L 24/24* (2013.01); *H01L 24/95* (2013.01);

(Continued)

(58) Field of Classification Search
USPC .......................................... 313/503, 504, 506
See application file for complete search history.

(56) References Cited

U.S. PATENT DOCUMENTS

| | | |
|---|---|---|
| 4,020,389 A | 4/1977 | Dickson et al. |
| 4,074,299 A | 2/1978 | Kusano et al. |

(Continued)

FOREIGN PATENT DOCUMENTS

| | | |
|---|---|---|
| EP | 0747948 A2 | 12/1996 |
| EP | 2048704 A1 | 4/2009 |

(Continued)

OTHER PUBLICATIONS

European Search Report, European Patent Application No. 13164285.2, Feb. 13, 2014, pp. 1-6.

(Continued)

*Primary Examiner* — Joseph L Williams
(74) *Attorney, Agent, or Firm* — Nancy R. Gamburd; Gamburd Law Group LLC

(57) ABSTRACT

An exemplary printable composition of a liquid or gel suspension of diodes comprises a plurality of diodes, a first solvent and/or a viscosity modifier. An exemplary apparatus comprises: a plurality of diodes; at least a trace amount of a first solvent; and a polymeric or resin film at least partially surrounding each diode of the plurality of diodes. Various exemplary diodes have a lateral dimension between about 10 to 50 microns and about 5 to 25 microns in height. Other embodiments may also include a plurality of substantially chemically inert particles having a range of sizes between about 10 to about 50 microns.

105 Claims, 97 Drawing Sheets

Related U.S. Application Data application No. 13/149,681, filed on May 31, 2011, now abandoned, and a continuation-in-part of application No. 12/601,271, filed on May 22, 2010, now abandoned, and a continuation-in-part of application No. 11/756,616, filed as application No. PCT/US2008/065237, filed as application No. PCT/US2008/065230 on May 30, 2008, which is a continuation of application No. 11/756,619, filed on May 31, 2007, now Pat. No. 7,972,031, which is a continuation-in-part of application No. 11/756,619, filed on May 31, 2007, now Pat. No. 7,972,031, said application No. PCT/US2008/065237 is a continuation-in-part of application No. 11/756,616, filed on May 31, 2007, and a continuation-in-part of application No. 11/756,619, filed on May 31, 2007, now Pat. No. 7,972,031.

(60) Provisional application No. 61/379,284, filed on Sep. 1, 2010, provisional application No. 61/379,830, filed on Sep. 3, 2010, provisional application No. 61/379,820, filed on Sep. 3, 2010, provisional application No. 61/379,225, filed on Sep. 1, 2010.

(51) Int. Cl.
*H01L 51/52* (2006.01)
*H01L 51/56* (2006.01)
*H01L 23/00* (2006.01)

(52) U.S. Cl.
CPC ............... *H01L2224/24137* (2013.01); *H01L 2224/32225* (2013.01); *H01L 2224/73267* (2013.01); *H01L 2224/95101* (2013.01); *H01L 2924/13091* (2013.01); *H01L 2924/13062* (2013.01); *H01L 2924/12041* (2013.01); *H01L 2924/1306* (2013.01); *H01L 2924/13034* (2013.01); *H01L 2924/13033* (2013.01); *H01L 2924/1305* (2013.01)

(56) References Cited

U.S. PATENT DOCUMENTS

| | | | |
|---|---|---|---|
| 4,136,436 A | 1/1979 | Kilby et al. |
| 4,152,624 A | 5/1979 | Knaebel |
| 4,153,905 A | 5/1979 | Charmakadze et al. |
| 4,316,208 A | 2/1982 | Kobayashi et al. |
| 4,347,262 A | 8/1982 | Marcus |
| 4,396,929 A | 8/1983 | Ohki et al. |
| 4,407,320 A | 10/1983 | Levine |
| 4,626,567 A | 12/1986 | Chang |
| 4,638,110 A | 1/1987 | Erbert |
| 4,755,485 A | 7/1988 | Tsai |
| 4,761,720 A | 8/1988 | Solow |
| 4,767,966 A | 8/1988 | Simopoulos et al. |
| 4,919,506 A | 4/1990 | Covey |
| 5,028,546 A | 7/1991 | Hotchkiss |
| 5,113,232 A | 5/1992 | Itoh et al. |
| 5,214,306 A | 5/1993 | Hashimoto |
| 5,355,577 A | 10/1994 | Cohn |
| 5,376,580 A | 12/1994 | Kish et al. |
| 5,408,120 A | 4/1995 | Manabe et al. |
| 5,469,020 A | 11/1995 | Herrick |
| 5,507,404 A | 4/1996 | Ryu |
| 5,545,291 A | 8/1996 | Smith et al. |
| 5,583,394 A | 12/1996 | Burbank et al. |
| 5,634,835 A | 6/1997 | Wu et al. |
| 5,641,611 A | 6/1997 | Shieh et al. |
| 5,756,147 A | 5/1998 | Wu et al. |
| 5,786,664 A | 7/1998 | Liu |
| 5,793,455 A | 8/1998 | Nakamura |
| 5,904,545 A | 5/1999 | Smith et al. |
| 5,932,327 A | 8/1999 | Inoguchi et al. |
| 5,976,613 A | 11/1999 | Janusauskas |
| 5,990,984 A | 11/1999 | Meredith et al. |
| 6,046,543 A | 4/2000 | Bulovic et al. |
| 6,066,513 A | 5/2000 | Pogge et al. |
| 6,107,671 A | 8/2000 | Onodera |
| 6,118,426 A | 9/2000 | Albert et al. |
| 6,203,391 B1 | 3/2001 | Murasko et al. |
| 6,274,508 B1 | 8/2001 | Jacobsen et al. |
| 6,281,038 B1 | 8/2001 | Jacobsen et al. |
| 6,291,266 B1 | 9/2001 | Sayyah |
| 6,291,896 B1 | 9/2001 | Smith |
| 6,312,304 B1 | 11/2001 | Duthaler et al. |
| 6,316,278 B1 | 11/2001 | Jacobsen et al. |
| 6,331,063 B1 | 12/2001 | Kamada et al. |
| 6,339,013 B1 | 1/2002 | Naseem et al. |
| 6,352,940 B1 | 3/2002 | Seshan et al. |
| 6,380,729 B1 | 4/2002 | Smith |
| 6,407,763 B1 | 6/2002 | Yamaguchi et al. |
| 6,410,940 B1 | 6/2002 | Jiang et al. |
| 6,417,025 B1 | 7/2002 | Gengel |
| 6,420,266 B1 | 7/2002 | Smith et al. |
| 6,424,088 B1 | 7/2002 | Murasko et al. |
| 6,445,489 B1 | 9/2002 | Jacobson et al. |
| 6,456,392 B1 | 9/2002 | Asano |
| 6,465,969 B1 | 10/2002 | Murasko et al. |
| 6,468,638 B2 | 10/2002 | Jacobsen et al. |
| 6,479,395 B1 | 11/2002 | Smith et al. |
| 6,479,930 B1 | 11/2002 | Tanabe et al. |
| 6,507,989 B1 | 1/2003 | Bowden et al. |
| 6,515,522 B2 | 2/2003 | Inada et al. |
| 6,527,964 B1 | 3/2003 | Smith et al. |
| 6,528,351 B1 | 3/2003 | Nathan et al. |
| 6,555,408 B1 | 4/2003 | Jacobsen et al. |
| 6,566,744 B2 | 5/2003 | Gengel |
| 6,583,580 B2 | 6/2003 | Shimoda et al. |
| 6,586,338 B2 | 7/2003 | Smith et al. |
| 6,588,131 B2 | 7/2003 | O'Connell, Jr. |
| 6,590,346 B1 | 7/2003 | Hadley et al. |
| 6,599,769 B2 | 7/2003 | Kondo et al. |
| 6,605,483 B2 | 8/2003 | Victor et al. |
| 6,605,902 B2 | 8/2003 | Shimoda et al. |
| 6,606,079 B1 | 8/2003 | Smith |
| 6,606,247 B2 | 8/2003 | Credelle et al. |
| 6,607,930 B2 | 8/2003 | Karpov et al. |
| 6,611,002 B2 | 8/2003 | Weeks et al. |
| 6,611,237 B2 | 8/2003 | Smith |
| 6,623,579 B1 | 9/2003 | Smith et al. |
| 6,624,569 B1 | 9/2003 | Pennaz et al. |
| 6,624,571 B1 | 9/2003 | Toyoyasu et al. |
| 6,635,306 B2 | 10/2003 | Steckl et al. |
| 6,639,578 B1 | 10/2003 | Comiskey et al. |
| 6,642,069 B2 | 11/2003 | Armgarth et al. |
| 6,653,157 B2 | 11/2003 | Kondo |
| 6,657,289 B1 | 12/2003 | Craig et al. |
| 6,664,560 B2 | 12/2003 | Emerson et al. |
| 6,665,044 B1 | 12/2003 | Jacobsen et al. |
| 6,680,725 B1 | 1/2004 | Jacobson |
| 6,683,333 B2 | 1/2004 | Kazlas et al. |
| 6,683,663 B1 | 1/2004 | Hadley et al. |
| 6,693,384 B1 | 2/2004 | Vicentini et al. |
| 6,696,785 B2 | 2/2004 | Shimoda et al. |
| 6,706,959 B2 | 3/2004 | Hamakawa et al. |
| 6,715,901 B2 | 4/2004 | Huang |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,741,025 B2 | 5/2004 | Tuck et al. |
| 6,777,884 B1 | 8/2004 | Barnardo et al. |
| 6,780,696 B1 | 8/2004 | Schatz |
| 6,788,541 B1 | 9/2004 | Hsiung |
| 6,790,692 B2 | 9/2004 | Onozawa |
| 6,794,221 B2 | 9/2004 | Sayyah |
| 6,811,714 B1 | 11/2004 | Gorrell et al. |
| 6,811,895 B2 | 11/2004 | Murasko et al. |
| 6,816,380 B2 | 11/2004 | Credelle et al. |
| 6,844,673 B1 | 1/2005 | Bernkopf |
| 6,846,565 B2 | 1/2005 | Korgel et al. |
| 6,850,312 B2 | 2/2005 | Jacobsen et al. |
| 6,863,219 B1 | 3/2005 | Jacobsen et al. |

(56) References Cited

U.S. PATENT DOCUMENTS

| | | |
|---|---|---|
| 6,864,435 B2 | 3/2005 | Hermanns et al. |
| 6,864,570 B2 | 3/2005 | Smith |
| 6,864,875 B2 | 3/2005 | Drzaic et al. |
| 6,871,982 B2 | 3/2005 | Holman et al. |
| 6,875,629 B2 | 4/2005 | Senda et al. |
| 6,876,357 B2 | 4/2005 | Kim |
| 6,878,638 B2 | 4/2005 | Regan et al. |
| 6,879,615 B2 | 4/2005 | Henrichs |
| 6,896,145 B2 | 5/2005 | Higgins et al. |
| 6,897,139 B2 | 5/2005 | Shibata et al. |
| 6,898,225 B2 | 5/2005 | Mooradian |
| 6,918,946 B2 | 7/2005 | Korgel et al. |
| 6,919,225 B2 | 7/2005 | Craig et al. |
| 6,919,641 B2 | 7/2005 | Onozawa et al. |
| 6,927,085 B2 | 8/2005 | Hadley et al. |
| 6,927,382 B2 | 8/2005 | King et al. |
| 6,930,020 B2 | 8/2005 | Sayyah |
| 6,936,193 B2 | 8/2005 | Saxe et al. |
| 6,946,322 B2 | 9/2005 | Brewer |
| 6,965,196 B2 | 11/2005 | Murasko et al. |
| 6,970,219 B1 | 11/2005 | Hermann |
| 6,972,970 B2 | 12/2005 | Yamada |
| 6,974,604 B2 | 12/2005 | Hunter et al. |
| 6,980,184 B1 | 12/2005 | Stewart et al. |
| 6,985,361 B2 | 1/2006 | Credelle et al. |
| 6,988,667 B2 | 1/2006 | Stewart et al. |
| 7,001,639 B2 | 2/2006 | Murasko et al. |
| 7,007,370 B2 | 3/2006 | Gracias et al. |
| 7,015,479 B2 | 3/2006 | Haas et al. |
| 7,018,575 B2 | 3/2006 | Brewer et al. |
| 7,030,412 B1 | 4/2006 | Drzaic et al. |
| 7,045,446 B2 | 5/2006 | Onozawa et al. |
| 7,046,328 B2 | 5/2006 | Jacobsen et al. |
| 7,061,556 B2 | 6/2006 | Sugihara et al. |
| 7,064,356 B2 | 6/2006 | Stefanov et al. |
| 7,070,851 B2 | 7/2006 | Jacobsen et al. |
| 7,071,629 B2 | 7/2006 | Russ et al. |
| 7,080,444 B1 | 7/2006 | Craig et al. |
| 7,091,939 B2 | 8/2006 | Kasai |
| 7,095,477 B2 | 8/2006 | Liang et al. |
| 7,101,502 B2 | 9/2006 | Smith et al. |
| 7,113,250 B2 | 9/2006 | Jacobsen et al. |
| 7,115,971 B2 | 10/2006 | Stumbo et al. |
| 7,133,431 B2 | 11/2006 | Onozawa et al. |
| 7,141,176 B1 | 11/2006 | Smith et al. |
| 7,172,789 B2 | 2/2007 | Smith et al. |
| 7,172,910 B2 | 2/2007 | Hadley et al. |
| 7,198,978 B2 | 4/2007 | Onozawa |
| 7,199,527 B2 | 4/2007 | Holman |
| 7,202,505 B2 | 4/2007 | Nurminen et al. |
| 7,214,569 B2 | 5/2007 | Swindlehurst et al. |
| 7,218,041 B2 | 5/2007 | Isoda |
| 7,218,048 B2 | 5/2007 | Choi et al. |
| 7,218,527 B1 | 5/2007 | Jacobsen |
| 7,223,635 B1 | 5/2007 | Brewer |
| 7,236,366 B2 | 6/2007 | Chen |
| 7,238,966 B2 | 7/2007 | Nakata |
| 7,244,326 B2 | 7/2007 | Craig et al. |
| 7,244,960 B2 | 7/2007 | Spreitzer et al. |
| 7,251,882 B2 | 8/2007 | Ricks et al. |
| 7,252,781 B2 | 8/2007 | Spreitzer et al. |
| 7,253,091 B2 | 8/2007 | Brewer et al. |
| 7,260,882 B2 | 8/2007 | Credelle et al. |
| 7,273,663 B2 | 9/2007 | Liao et al. |
| 7,288,432 B2 | 10/2007 | Jacobsen et al. |
| 7,321,159 B2 | 1/2008 | Schatz |
| 7,323,757 B2 | 1/2008 | Fonstad, Jr. et al. |
| 7,327,078 B2 | 2/2008 | Setlur et al. |
| 7,329,945 B2 | 2/2008 | Moden |
| 7,332,361 B2 | 2/2008 | Lu et al. |
| 7,351,660 B2 | 4/2008 | Brewer et al. |
| 7,353,598 B2 | 4/2008 | Craig et al. |
| 7,356,952 B2 | 4/2008 | Sweeney et al. |
| 7,381,591 B2 | 6/2008 | Moden |
| 7,382,363 B2 | 6/2008 | Albert et al. |
| 7,396,142 B2 | 7/2008 | Laizure, Jr. et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,453,705 B2 | 11/2008 | Tolt |
| 7,489,248 B2 | 2/2009 | Gengel et al. |
| 7,491,969 B2 | 2/2009 | Wu et al. |
| 7,500,307 B2 | 3/2009 | Munn |
| 7,501,955 B2 | 3/2009 | Forster et al. |
| 7,510,672 B2 | 3/2009 | McCulloch et al. |
| 7,521,292 B2 | 4/2009 | Rogers et al. |
| 7,521,340 B2 | 4/2009 | Lemmi et al. |
| 7,531,218 B2 | 5/2009 | Smith et al. |
| 7,538,756 B2 | 5/2009 | Kerr et al. |
| 7,542,301 B1 | 6/2009 | Liong et al. |
| 7,551,454 B2 | 6/2009 | Wuchse et al. |
| 7,557,367 B2 | 7/2009 | Rogers et al. |
| 7,559,131 B2 | 7/2009 | Credelle et al. |
| 7,560,803 B2 | 7/2009 | Onozawa |
| 7,561,221 B2 | 7/2009 | Jacobsen et al. |
| 7,561,452 B2 | 7/2009 | Mednik et al. |
| 7,576,656 B2 | 8/2009 | Craig et al. |
| 7,595,588 B2 | 9/2009 | Gourlay |
| 7,605,799 B2 | 10/2009 | Amundson et al. |
| 7,607,812 B2 | 10/2009 | Kim |
| 7,615,479 B1 | 11/2009 | Craig et al. |
| 7,622,367 B1 | 11/2009 | Nuzzo et al. |
| 7,622,813 B2 | 11/2009 | Brewer |
| 7,623,034 B2 | 11/2009 | Ferguson et al. |
| 7,625,780 B2 | 12/2009 | Jacobs et al. |
| 7,629,026 B2 | 12/2009 | Sharma et al. |
| 7,645,177 B2 | 1/2010 | Kwasny |
| 7,662,008 B2 | 2/2010 | Hillis et al. |
| 7,687,277 B2 | 3/2010 | Sharma et al. |
| 7,698,800 B2 | 4/2010 | Watanabe |
| 7,704,763 B2 | 4/2010 | Fujii et al. |
| 7,716,160 B2 | 5/2010 | Smith et al. |
| 7,722,953 B2 | 5/2010 | Korgel et al. |
| 7,724,541 B2 | 5/2010 | Gracias et al. |
| 7,727,804 B2 | 6/2010 | Smith |
| RE41,563 E | 8/2010 | Caron et al. |
| 7,774,929 B2 | 8/2010 | Jacobs |
| 7,799,699 B2 | 9/2010 | Nuzzo et al. |
| 8,133,768 B2 | 3/2012 | Ray et al. |
| 2001/0003614 A1 | 6/2001 | Nagano et al. |
| 2001/0014520 A1 | 8/2001 | Usui et al. |
| 2001/0046652 A1 | 11/2001 | Ostler et al. |
| 2001/0048968 A1 | 12/2001 | Cox et al. |
| 2002/0001051 A1 | 1/2002 | Krusius et al. |
| 2002/0003233 A1 | 1/2002 | Mueller-Mach et al. |
| 2002/0005294 A1 | 1/2002 | Mayer et al. |
| 2002/0009274 A1 | 1/2002 | Gharavi |
| 2002/0027230 A1 | 3/2002 | Terada et al. |
| 2002/0130627 A1 | 9/2002 | Morgan et al. |
| 2002/0159488 A1 | 10/2002 | Wolak et al. |
| 2002/0190636 A1 | 12/2002 | Coghlan et al. |
| 2002/0195928 A1 | 12/2002 | Grace et al. |
| 2003/0080180 A1 | 5/2003 | Holley et al. |
| 2003/0080341 A1 | 5/2003 | Sakano et al. |
| 2003/0090199 A1 | 5/2003 | Saita et al. |
| 2003/0113581 A1 | 6/2003 | Gotou |
| 2003/0160260 A1 | 8/2003 | Hirai et al. |
| 2003/0172563 A1 | 9/2003 | Higgins et al. |
| 2003/0222263 A1 | 12/2003 | Choi |
| 2004/0018379 A1 | 1/2004 | Kinlen |
| 2004/0036856 A1 | 2/2004 | Wittman et al. |
| 2004/0051449 A1 | 3/2004 | Klausmann et al. |
| 2004/0099875 A1 | 5/2004 | Lin |
| 2004/0110279 A1 | 6/2004 | Everett |
| 2004/0113549 A1 | 6/2004 | Roberts et al. |
| 2004/0169813 A1 | 9/2004 | Liang et al. |
| 2004/0188672 A1 | 9/2004 | Spreitzer et al. |
| 2004/0190304 A1 | 9/2004 | Sugimoto et al. |
| 2004/0195576 A1 | 10/2004 | Watanabe et al. |
| 2004/0195967 A1 | 10/2004 | Padiyath et al. |
| 2004/0206939 A1 | 10/2004 | Spreitzer et al. |
| 2004/0218388 A1 | 11/2004 | Suzuki |
| 2004/0219730 A1 | 11/2004 | Basol |
| 2004/0227457 A1 | 11/2004 | Yamashita et al. |

(56) References Cited

U.S. PATENT DOCUMENTS

| | | |
|---|---|---|
| 2005/0020035 A1 | 1/2005 | Nause et al. |
| 2005/0029513 A1 | 2/2005 | Kawashima et al. |
| 2005/0067944 A1 | 3/2005 | Masuda et al. |
| 2005/0073849 A1 | 4/2005 | Rhoads et al. |
| 2005/0087131 A1 | 4/2005 | Shtein et al. |
| 2005/0146870 A1 | 7/2005 | Wu |
| 2005/0218421 A1 | 10/2005 | Andrews et al. |
| 2005/0230853 A1 | 10/2005 | Yoshikawa |
| 2005/0249901 A1 | 11/2005 | Yializis et al. |
| 2006/0001055 A1 | 1/2006 | Ueno et al. |
| 2006/0043390 A1 | 3/2006 | Nakata |
| 2006/0057293 A1 | 3/2006 | Sharma et al. |
| 2006/0105481 A1 | 5/2006 | Boardman et al. |
| 2006/0113510 A1 | 6/2006 | Luo et al. |
| 2006/0119686 A1 | 6/2006 | Odell |
| 2006/0130894 A1 | 6/2006 | Gui et al. |
| 2006/0185715 A1 | 8/2006 | Hammerbacher et al. |
| 2006/0199313 A1 | 9/2006 | Harting et al. |
| 2006/0238666 A1 | 10/2006 | Ko et al. |
| 2006/0240218 A1 | 10/2006 | Parce |
| 2006/0277778 A1 | 12/2006 | Mick et al. |
| 2006/0278886 A1 | 12/2006 | Tomoda et al. |
| 2006/0281341 A1 | 12/2006 | Soeta |
| 2007/0022644 A1 | 2/2007 | Lynch et al. |
| 2007/0035808 A1 | 2/2007 | Amundson et al. |
| 2007/0040489 A1 | 2/2007 | Ray et al. |
| 2007/0042614 A1 | 2/2007 | Marmaropoulos et al. |
| 2007/0065646 A1 | 3/2007 | Chaimberg et al. |
| 2007/0090383 A1 | 4/2007 | Ota et al. |
| 2007/0090758 A1 | 4/2007 | Kwasny et al. |
| 2007/0108459 A1 | 5/2007 | Lu |
| 2007/0110921 A1 | 5/2007 | Angelopoulos et al. |
| 2007/0111354 A1 | 5/2007 | Seong et al. |
| 2007/0126544 A1 | 6/2007 | Wotherspoon et al. |
| 2007/0131925 A1 | 6/2007 | Shalk et al. |
| 2007/0138923 A1 | 6/2007 | Sokola |
| 2007/0173578 A1 | 7/2007 | Spreitzer et al. |
| 2007/0188483 A1 | 8/2007 | Bonner |
| 2007/0289626 A1 | 12/2007 | Brabec et al. |
| 2008/0000122 A1 | 1/2008 | Shotton |
| 2008/0067475 A1 | 3/2008 | McCulloch et al. |
| 2008/0099772 A1 | 5/2008 | Shuy et al. |
| 2008/0111806 A1 | 5/2008 | Dyrc et al. |
| 2008/0121899 A1 | 5/2008 | Pires et al. |
| 2008/0135804 A1 | 6/2008 | Qiu et al. |
| 2008/0137333 A1 | 6/2008 | Tamaoki et al. |
| 2008/0160734 A1 | 7/2008 | Bertin et al. |
| 2008/0169753 A1 | 7/2008 | Skipor et al. |
| 2008/0191198 A1 | 8/2008 | Han et al. |
| 2008/0191220 A1 | 8/2008 | Daniels et al. |
| 2008/0199600 A1 | 8/2008 | Spreitzer et al. |
| 2008/0220288 A1 | 9/2008 | De Kok et al. |
| 2008/0223428 A1 | 9/2008 | Zeira |
| 2008/0237611 A1 | 10/2008 | Cok et al. |
| 2008/0248307 A1 | 10/2008 | Jurbergs et al. |
| 2008/0261341 A1 | 10/2008 | Zimmerman et al. |
| 2008/0265789 A1 | 10/2008 | Bertram et al. |
| 2008/0274574 A1 | 11/2008 | Yun |
| 2008/0289688 A1 | 11/2008 | Hammerbacher et al. |
| 2008/0297453 A1 | 12/2008 | Ray et al. |
| 2009/0014056 A1 | 1/2009 | Hockaday |
| 2009/0050921 A1 | 2/2009 | Bierhuizen et al. |
| 2009/0072245 A1 | 3/2009 | Noe et al. |
| 2009/0074649 A1 | 3/2009 | Korgel et al. |
| 2009/0140279 A1 | 6/2009 | Zimmerman et al. |
| 2009/0159907 A1 | 6/2009 | Wang |
| 2009/0168403 A1 | 7/2009 | Chang et al. |
| 2009/0217970 A1 | 9/2009 | Zimmerman et al. |
| 2009/0236616 A1 | 9/2009 | Ku |
| 2009/0242916 A1 | 10/2009 | Hsu et al. |
| 2009/0294786 A1 | 12/2009 | Jan et al. |
| 2009/0303715 A1 | 12/2009 | Takasago et al. |
| 2010/0060553 A1 | 3/2010 | Zimmerman et al. |
| 2010/0065862 A1 | 3/2010 | Ray et al. |
| 2010/0065863 A1 | 3/2010 | Ray et al. |
| 2010/0068838 A1 | 3/2010 | Ray et al. |
| 2010/0167441 A1 | 7/2010 | Ray et al. |
| 2010/0187482 A1 | 7/2010 | Mullen et al. |
| 2010/0247893 A1 | 9/2010 | Zimmerman |

FOREIGN PATENT DOCUMENTS

| | | |
|---|---|---|
| JP | 07022177 A1 | 1/1995 |
| JP | 07073969 A1 | 3/1995 |
| JP | 11292601 A | 10/1999 |
| JP | 2003203761 A | 7/2003 |
| JP | 2005174979 A1 | 6/2005 |
| WO | WO 99/39552 A1 | 8/1999 |
| WO | WO 99/67678 A1 | 12/1999 |
| WO | WO 00/72638 A1 | 11/2000 |
| WO | WO 01/16995 A1 | 3/2001 |
| WO | WO2008143635 A1 | 11/2008 |

OTHER PUBLICATIONS

European Search Report, European Patent Application No. 11822650.5, Feb. 13, 2014, pp. 1-5.

European Search Report, European Patent Application No. 13164278.7 Feb. 11, 2014, pp. 1-7.

European Search Report, European Patent Application No. 13163241.6, Feb. 13, 2014, pp. 1-7.

Hsi-Jen J. Yeh & John Smith, Fluidic Self-Assembly for the Integration of GaAs Light-Emitting Diodes on Si Substrates, IEEE Photonics Technology Letters, vol. 6, No. 6, Jun. 1994, pp. 706-708.

George M. Whitesides et al, Self-Assembly at All Scales, Science, vol. 295, Mar. 29, 2002, pp. 2418-2421.

Suk Tai Chang et al, Remotely powered self-propelling particles and micropumps based on miniature diodes, Nature Materials, vol. 6, Mar. 2007, pp. 235-240 and Supplementary Information pp. 1-7.

Sang-Il Park et al., Printed Assemblies of Inorganic Light-Emitting Diodes for Deformable and Semitransparent Displays, Science, vol. 325, Aug. 21, 2009, pp. 977-981, and Supporting Online Material, http://www.sciencemag.org/content/suppl/2009/08/20/325.5943.977.DC1, pp. 1-44.

Jong-Hyun Ahn, et al, Heterogeneous Three-Dimensional Electronics by Use of Printed Semiconductor Nanomaterials, Science, vol. 314, Dec. 15, 2006, pp. 1754-1757.

Paul Calvert, Inkjet Printing for Materials and Devices, Chem. Mater, vol. 13, Sep. 12, 2001, pp. 3299-3305.

Sean A. Stauth et al., Self-assembled single-crystal silicon circuits on plastic, PNAS, vol. 103, No. 38, Sep. 19, 2006, pp. 13922-13927.

David R. Allee et al, Circuit-Level Impact of a-Si:H Thin-Film-Transistor Degradation Effects, IEEE Transactions on Electron Devices, Jun. 2009, pp. 1166-1176, vol. 56.

Koyo Horiuchi et al, Profile Controlled Laser Doping for N-Type Silicon Solar Cells, Graduate School of Materials Science, Nara Institute of Science & Technology; pp. 1-4; http://www.energy-based.nrct.go.th/Article/Ts-3%20profile%20controlled%20laser%20doping%20for%20n-type%20silicon%20solar%20cells.pdf.

D.L. Meier et al, Self-Doping Contacts & Associated Silicon Solar Cell Structures, Crystalline Silicon Solar Cells & Technologies, 2nd World Conference and Exhibition on Photovoltaic Solar Energy Conversion, Vienna, Austria, Jul. 6-10, 1998, pp. 1491-1494.

Jeff C. Gelpey et al, Advanced Annealing for Sub-130nm Junction Formation, Vortek Industries Ltd., Vancouver, BC, http://www.vsea.com/pubs.nsf/0/5b03aafeb1918db485256caf0052a889/$FILE/VSEA5_DowneyArevalo.pdf; pp. 1-12.

Roberto Fenollosa et al., Optical microcavities and photonic sponges based on silicon spheres, http://deeea.urv.cat/DEEEA/cen2008/docs/Fenollosa_UPV_01.pdf, pp. 1-2.

Researchers develop new method for producing transparent conductors, http://www.physorg.com/print161456665.html, p. 1.

Zhijian Z. J. Lu et al., Wide-angle film diffuser, Journal of the Society for Information Display (SID), 15/8, 2007, pp. 565-569.

I. S. Tsai et al., Film surface morphology and field-emission characteristics of a carbon-nanotube array pattern fabricated under a magnetic field, Journal of the Society for Information Display (SID), 16/5, 2008, pp. 639-644.

(56) References Cited

OTHER PUBLICATIONS

Yiru Sun et al., Enhanced light out-coupling of organic light-emitting devices using embedded low-index grids, Nature Photonics, vol. 2, pp. 483-487, published online Jul. 11, 2008, http://www.nature.com/nphoton/journal/v2/n8/full/nphoton.2008.132.html.

H.W. Choi et al., Mechanism of enhanced light output efficiency in InGaN-based microlight emitting diodes, Journal of Applied Physics, vol. 93, No. 10, May 15, 2003, pp. 5978-5982.

Emmanuel Van Kerschaver et al., Back-contact Solar Cells: A Review, Prog.Photovolt: Res. Appl. 2006; 14:107-123.

Paul T. Fini et al., High-Efficiency Nitride-Based Solid State Lighting, Final Technical Progress Report, DoE Award No. DE-FC26-01NT41203, Jul. 30, 2005, pp. 1-132, http://www.osti.gov/bridge/servlets/purl/877537-2wWdpN/877537.pdf.

Z. Y. Fan et al., III-nitride micro-emitter arrays: development and applications, J. Phys. D: Appl. Phys. 41 (2008) 094001 (12 pp), pp. 1-12.

H. X. Jiang et al., Advances in III-Nitride Microstructures and Micro-Size Emitters, Journal of the Korean Physical Society, vol. 42, Feb. 2003, pp. S757-S764.

Breck Hitz, Q: What Did the Scientist Say to the LED? A: Don't Be Square, Photonics Technology News, Feb. 2008, pp. 27-29.

Christoph J. Brabec et al., Solution-Processed Organic Solar Cells, MRS Bulletin, vol. 33, Jul. 2008, pp. 670-675.

Yang Cao et al., A technique for controlling the alignment of silver nanowires with an electric field, Nanotechnology 17 (2006), pp. 2378-2380.

Saving Silicon, Nature Photonics, vol. 1, Oct. 2007, pp. 558-559.

D.R. McCamey et al., Spin Rabi flopping in the photocurrent of a polymer light-emitting diode, Nature Materials, vol. 7, Sep. 2008, pp. 723-728.

Xiang Zhang et al., Superlenses to overcome the diffraction limit, Nature Materials, vol. 7, Jun. 2008, pp. 435-441.

Aristeidis Karalis et al., Efficient wireless non-radiative mid-range energy transfer, Annals of Physics 323 (2008), pp. 34-48.

Vasily N. Astratov et al., Percolation of light through whispering gallery modes in 3D lattices of coupled microspheres, Optics Express, vol. 15, No. 25, Dec. 10, 2007, pp. 17351-17361.

M.L.M. Balistreri, Visualizing the whispering gallery modes in a cylindrical optical optical microcavity, Optics Letters, vol. 24, No. 24, Dec. 15, 1999, pp. 1829-1831.

Paul Paddon et al., Enabling Solar Cells, Laser+Photonics, vol. 4, 2008, pp. 42-45.

Peter Bermel et al., Improving thin-film crystalline silicon solar cell efficiencies with photonic crystals, Optics Express, vol. 15, No. 25, Dec. 10, 2007, pp. 16986-17000.

Committee on Nanophotonics Accessibility and Applicability, National Research Council, Nanophotonics: Accessibility and Applicability, pp. 1-237, http://www.nap.edu/catalog/11907.html.

Hoi Wai Choi et al. Whispering-gallery mode lasing in GaN microdisks, SPIE, 10.1117/2.1200707.0692, pp. 1-2.

Vladimir S. Ilchenko et al., Dispersion compensation in whispering-gallery modes, J. Opt. Soc. Am. A, vol. 20, No. 1, Jan. 2003, pp. 157-162.

Makoto Gonokami, Expanding the potential of light and materials—Combining nanotechnology with optical technology, Japan Nanonet Bulletin, 60th Issue, Dec. 22, 2005, http://www.nanonet.go.jp/english/mailmag/pdf/060a.pdf, pp. 1-3.

Bahram Jalali, Teaching silicon new tricks, Nature Photonics, vol. 1, Apr. 2007, pp. 193-195.

Eli Yablonovitch, Light Emission in Photonic Crystal Micro-Cavities, in E. Burstein et al., Confined Electrons and Photons, Plenum Press, NY, 1995, pp. 635-646, http://www.ee.ucla.edu/labs/photon/bkchaps/ey1994cepnpa635646.pdf.

Shinichi Koseki, Monolithic Waveguide Coupled GaAs Microdisk Microcavity Containing InGaAs Quantum Dots, Ph.D Defense, http://www.stanford.edu/group/yamamotogroup/slides/SKdefense.pdf, pp. 1-B15.

David H. Foster et al., Spatial and polarization structure in microdome resonators: effects of a Bragg mirror, in Alexis V. Kudryashov et al., Laser Resonators and Beam Control VII, Proceedings of SPIE 5333, pp. 195-203 (2004).

John Flintermann et al., Calculations on the Optical Properties of Layered Metal Nanospheres, Nanoscape, vol. 3, Issue 1, Spring 2006, pp. 29-37.

NASA Jet Propulsion Laboratory, Whispering Gallery Mode-Locked Lasers, http://www.techbriefs.com/index.php?option=com_staticxt& staticfile=/Briefs/Nov03/NPO30833.html, pp. 1-3.

Juha-Pekka Laine, Design and Applications of Optical Microsphere Resonators, Helsinki University of Technology Publications in Engineering Physics, Espoo, Finland, Apr. 22, 2003, http://lib.tkk.fi/Diss/2003/isbn951226448X/isbn951226448X.pdf, pp. 1-56.

Jeff Hecht, Photonic Frontiers: microcavities—The strange world of microcavity optics, http://www.optoiq.com/index/photonics-technologies-applications/lfw-display/lfw-article-display/335982/articles/optoiq2/photonics-technologies/technology-products/optical-components/micro-optics__/2009/12/photonic-frontiers-microcavities-the-strange-world-of-microcavity-optics.html, pp. 1-6.

Cherry Yee Yee Cheng, Spherical Silicon Photovoltaics: Characterization and Novel Device Structure, University of Waterloo, 2008, pp. 1-102, http://proquest.umi.com/pqdlink?Ver=1&Exp=07-24-2016&FMT=7&DID=1633772641&RQT=309&attempt=1&cfc=1.

Aliaksandr Rahachou, Theoretical studies of light propagation in photonic and plasmonic devices, Linkoping Studies in Science and Technology, Doctoral Dissertation No. 1115, Aug. 2007, pp. 1-80, http://webstaff.itn.liu.se/~alira/ITN-Diss1115-Rahachou.pdf.

Hong Luo et al., Trapped whispering-gallery optical modes in white light-emitting diode lamps with remote phosphor, Applied Physics Letters 89, 2006, pp. 041125-1-041125-3.

L. Deych et al., Rayleigh Scattering of Whispering Gallery Modes of Microspheres due to a Single Scatter: Myths and Reality, Dec. 23, 2008, pp. 1-10, http://arxiv.org/PS_cache/arxiv/pdf/0812/0812.4404v1.pdf.

Wei-Chi Lee et al., Enhanced Performance of GaN-Based Vertical Light-Emitting Diodes with Circular Protrusions Surmounted by Hexagonal Cones and Indium-Zinc Oxide Current Spreading Layer, Applied Physics Express, vol. 4, 2011, pp. 072104-1-072104-3.

Leaner and Cheaper The rise of thin-film solar power, The Economist, Oct. 24, 2009, p. 76.

International Search Report and the Written Opinion of the International Searching Authority, PCT/US2011/50168, Mar. 14, 2012, pp. 1-11.

International Search Report and the Written Opinion of the International Searching Authority, PCT/US2011/50174, Mar. 16, 2012, pp. 1-11.

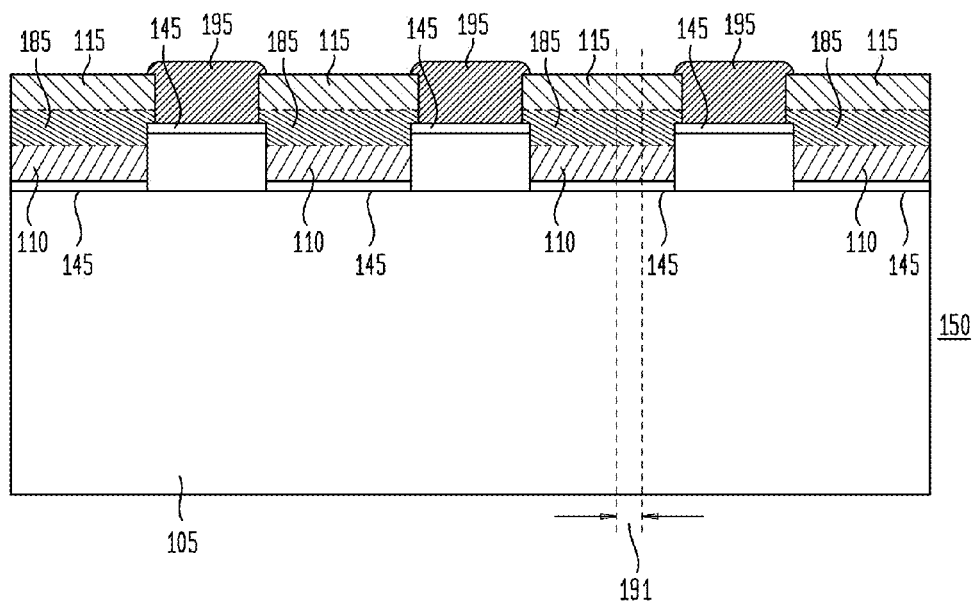
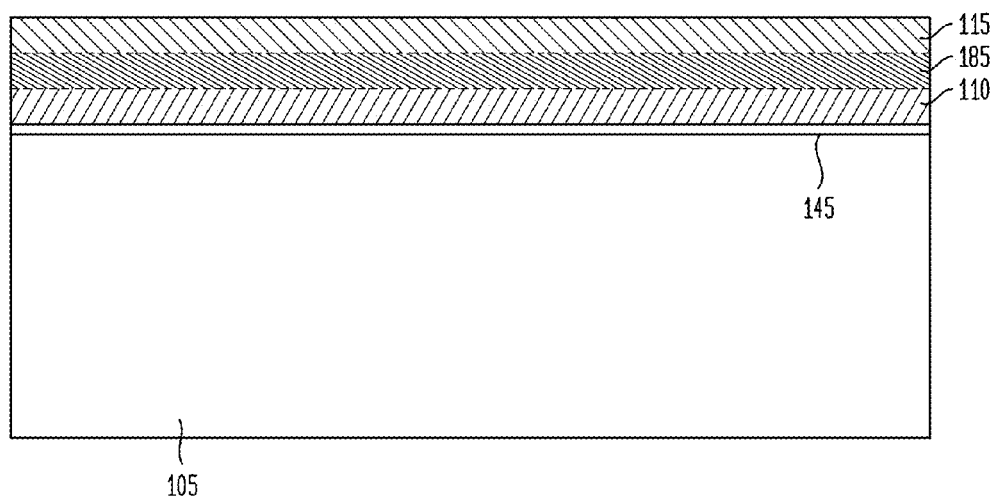

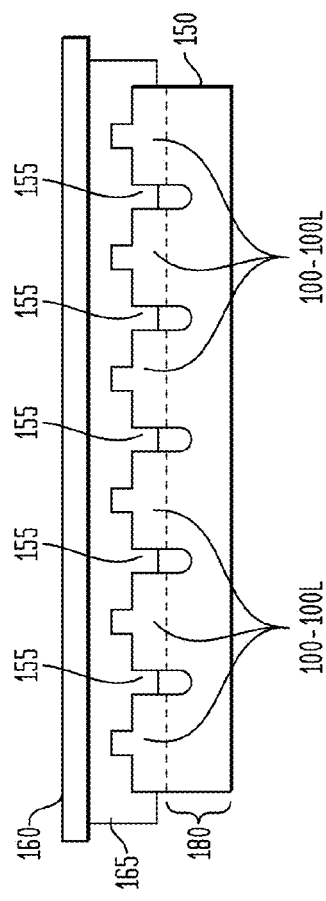
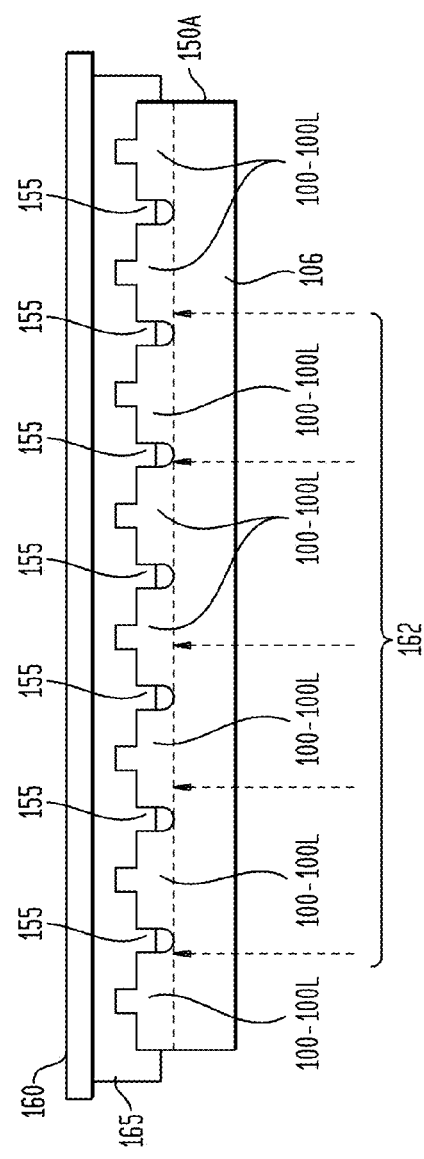

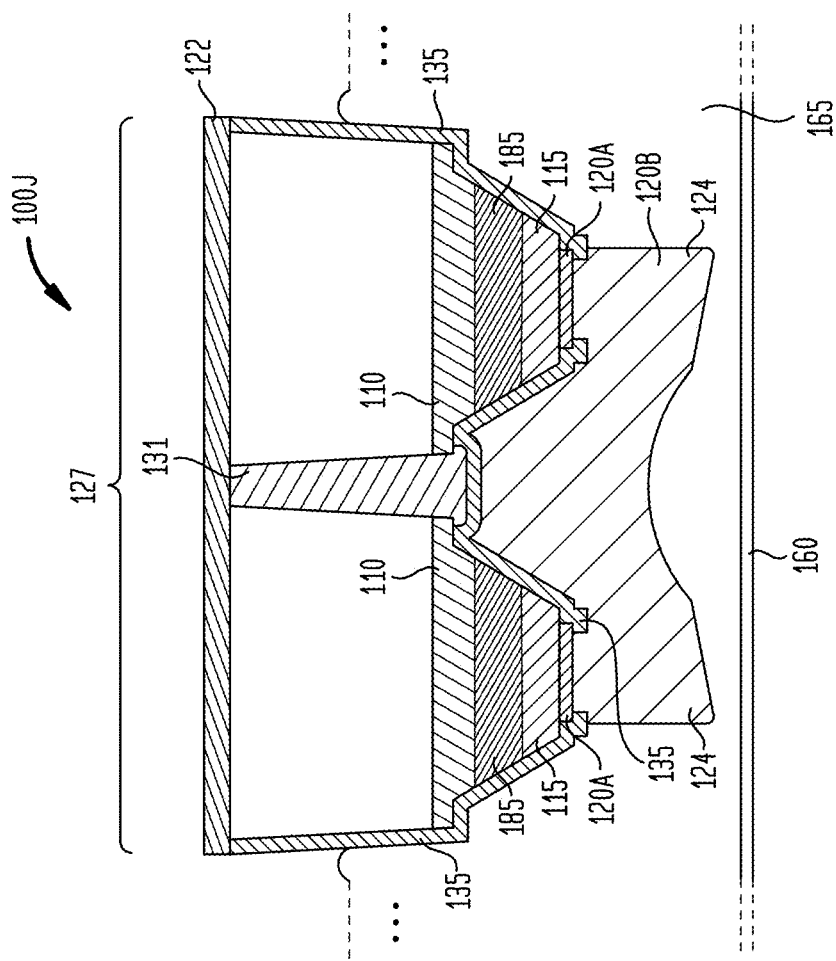

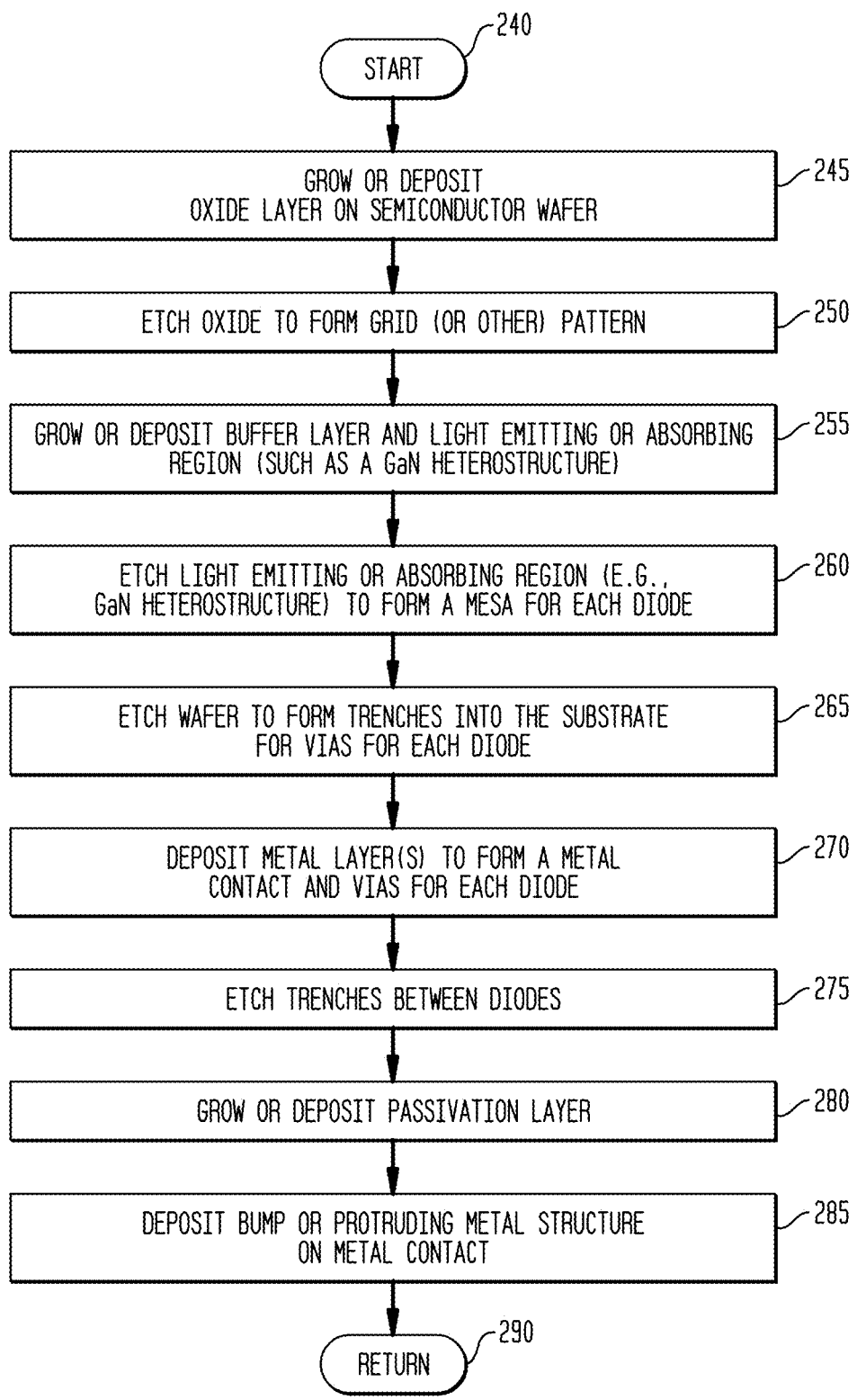

APPARATUS WITH LIGHT EMITTING OR ABSORBING DIODES

CROSS-REFERENCE TO RELATED APPLICATIONS

This application is a conversion of and claims priority to U.S. Provisional Patent Application Ser. No. 61/379,225, filed Sep. 1, 2010, inventors William Johnstone Ray et al., entitled "Printable Composition of a Liquid or Gel Suspension of Diodes", which is commonly assigned herewith, the entire contents of which are incorporated herein by reference with the same full force and effect as if set forth in their entirety herein, and with priority claimed for all commonly disclosed subject matter.

This application is a conversion of and claims priority to U.S. Provisional Patent Application Ser. No. 61/379,284, filed Sep. 1, 2010, inventors William Johnstone Ray et al., entitled "Light Emitting, Photovoltaic and Other Electronic Apparatus", which is commonly assigned herewith, the entire contents of which are incorporated herein by reference with the same full force and effect as if set forth in their entirety herein, and with priority claimed for all commonly disclosed subject matter.

This application is a conversion of and claims priority to U.S. Provisional Patent Application Ser. No. 61/379,830, filed Sep. 3, 2010, inventors William Johnstone Ray et al., entitled "Printable Composition of a Liquid or Gel Suspension of Diodes and Method of Making Same", which is commonly assigned herewith, the entire contents of which are incorporated herein by reference with the same full force and effect as if set forth in their entirety herein, and with priority claimed for all commonly disclosed subject matter.

This application is a conversion of and claims priority to United States Provisional Patent Application Ser. No. 61/379,820, filed Sep. 3, 2010, inventors William Johnstone Ray et al., entitled "Light Emitting, Photovoltaic and Other Electronic Apparatus", which is commonly assigned herewith, the entire contents of which are incorporated herein by reference with the same full force and effect as if set forth in their entirety herein, and with priority claimed for all commonly disclosed subject matter.

This application is a continuation-in-part of and claims priority to U.S. patent application Ser. No. 11/756,616, filed May 31, 2007, inventors William Johnstone Ray et al., entitled "Method of Manufacturing Addressable and Static Electronic Displays", which is commonly assigned herewith, the entire contents of which are incorporated herein by reference with the same full force and effect as if set forth in their entirety herein, and with priority claimed for all commonly disclosed subject matter.

This application is a continuation-in-part of and claims priority to U.S. patent application Ser. No. 12/601,268, filed Nov. 22, 2009, inventors William Johnstone Ray et al., entitled "Method of Manufacturing Addressable and Static Electronic Displays, Power Generating and Other Electronic Apparatus", now abandoned, which is a continuation-in-part of and claims priority to U.S. patent application Ser. No. 11/756,616, filed May 31, 2007, inventors William Johnstone Ray et al., entitled "Method of Manufacturing Addressable and Static Electronic Displays", and which is a U.S. National Phase application under 35 U.S.C. Section 371 of and claims priority to international application PCT/US2008/65237, filed May 30, 2008, inventors William Johnstone Ray et al., entitled "Method of Manufacturing Addressable and Static Electronic Displays, Power Generating and Other Electronic Apparatus", which claims priority to U.S. patent application Ser. No. 11/756,616, filed May 31, 2007, which are commonly assigned herewith, the entire contents of which are incorporated herein by reference with the same full force and effect as if set forth in their entireties herein, and with priority claimed for all commonly disclosed subject matter.

This application also is a continuation-in-part of and claims priority to U.S. patent application Ser. No. 13/149,681, filed May 31, 2011, inventors William Johnstone Ray et al., entitled "Addressable or Static Light Emitting or Electronic Apparatus", now abandoned, which is a continuation of and claims priority to U.S. patent application Ser. No. 11/756,619, filed May 31, 2007 and issued Jul. 5, 2011 as U.S. Pat. No. 7,972,031 B2, inventors William Johnstone Ray et al entitled "Addressable or Static Light Emitting or Electronic Apparatus", which are commonly assigned herewith, the entire contents of which are incorporated herein by reference with the same full force and effect as if set forth in their entireties herein, and with priority claimed for all commonly disclosed subject matter. This application is a continuation-in-part of and claims priority to U.S. patent application Ser. No. 12/601,271, filed Nov. 22, 2009, inventors William Johnstone Ray et al, entitled "Addressable or Static Light Emitting, Power Generating or Other Electronic Apparatus", now abandoned, which is a continuation-in-part of and claims priority to U.S. patent application Ser. No. 11/756,619, filed May 31, 2007, inventors William Johnstone Ray et al., entitled "Addressable or Static Light Emitting or Electronic Apparatus", and which is a U.S. National Phase application under 35 U.S.C. Section 371 of and claims priority to international application PCT/US2008/65230, filed May 30, 2008, inventors William Johnstone Ray et al., entitled "Addressable or Static Light Emitting, Power Generating or Other Electronic Apparatus", which claims priority to U.S. patent application Ser. No. 11/756,619, filed May 31, 2007, which are commonly assigned herewith, the entire contents of which are incorporated herein by reference with the same full force and effect as if set forth in their entireties herein, and with priority claimed for all commonly disclosed subject matter.

This application also is related to the following patent applications filed concurrently herewith, which are commonly assigned herewith, the entire contents of which are incorporated herein by reference with the same full force and effect as if set forth in their entireties herein, and with priority claimed for all commonly disclosed subject matter: (1) U.S. patent application Ser. No. 13/223,279, filed Aug. 31, 2011, inventors Mark D. Lowenthal et al., entitled "Printable Composition of a Liquid or Gel Suspension of Diodes"; (2) U.S. patent application Ser. No. 13/223,286, filed Aug. 31, 2011, inventors Mark D. Lowenthal et al., entitled "Method of Manufacturing a Printable Composition of a Liquid or Gel Suspension of Diodes"; (3) U.S. patent application Ser. No. 13/223,293, filed Aug. 31, 2011, inventors Mark D. Lowenthal et al., entitled "Method of Manufacturing a Light Emitting, Power Generating or Other Electronic Apparatus"; (4) U.S. patent application Ser. No. 13/223,297, filed Aug. 31, 2011 and issued Apr. 9, 2013 as U.S. Pat. No. 8,415,879, inventors Mark D. Lowenthal et al., entitled "Diode For a Printable Composition"; (5) U.S. patent application Ser. No. 13/223,294, filed Aug. 31, 2011 and issued Mar. 18, 2014 as U.S. Pat. No. 8,674,593, inventors Mark D. Lowenthal et al., entitled "Diode For a Printable Composition"; and (6) U.S. patent application Ser. No. 13/223,302, filed Aug. 31, 2011, inventors Mark D. Lowenthal et al., entitled "Printable Composition of a Liquid or Gel Suspension of Two-Terminal Integrated Circuits and Apparatus".

COPYRIGHT NOTICE AND PERMISSIONS

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document, the data and contents as described below, and the drawings hereto: Copyright © 2010-2011, NthDegree Technologies Worldwide, Inc.

FIELD OF THE INVENTION

The present invention in general is related to light emitting and photovoltaic technology and, in particular, is related to a composition of light emitting or photovoltaic diodes or other two-terminal integrated circuits suspended in a liquid or gel and capable of being printed, and methods of manufacturing a composition of light emitting, photovoltaic or other diodes or two-terminal integrated circuits suspended in a liquid or gel.

BACKGROUND OF THE INVENTION

Lighting devices having light emitting diodes ("LEDs") have typically required creating the LEDs on a semiconductor wafer using integrated circuit process steps. The resulting LEDs are substantially planar and comparatively large, on the order of two hundred or more microns across. Each such LED is a two terminal device, typically having two metallic terminals on the same side of the LED, to provide Ohmic contacts for p-type and n-type portions of the LED. The LED wafer is then divided into individual LEDs, typically through a mechanical process such as sawing. The individual LEDs are then placed in a reflective casing, and bonding wires are individually attached to each of the two metallic terminals of the LED. This process is time consuming, labor intensive and expensive, resulting in LED-based lighting devices which are generally too expensive for many consumer applications.

Similarly, energy generating devices such as photovoltaic panels have also typically required creating the photovoltaic diodes on a semiconductor wafer or other substrates using integrated circuit process steps. The resulting wafers or other substrates are then packaged and assembled to create the photovoltaic panels. This process is also time consuming, labor intensive and expensive, resulting in photovoltaic devices which are also too expensive for widespread use without being subsidized by third parties or without other governmental incentives.

Various technologies have been brought to bear in an attempt to create new types of diodes or other semiconductor devices for light emission or energy generation purposes. For example, it has been proposed that quantum dots, which are functionalized or capped with organic molecules to be miscible in an organic resin and solvent, may be printed to form graphics which then emit light when the graphics are pumped with a second light. Various approaches for device formation have also been undertaken using semiconductor nanoparticles, such as particles in the range of about 1.0 nm to about 100 nm (one-tenth of a micron). Another approach has utilized larger scale silicon powder, dispersed in a solvent-binder carrier, with the resulting colloidal suspension of silicon powder utilized to form an active layer in a printed transistor. Yet another different approach has used very flat AlInGaP LED structures, formed on a GaAs wafer, with each LED having a breakaway photoresist anchor to each of two neighboring LEDs on the wafer, and with each LED then picked and placed to form a resulting device.

Other approaches have used "lock and key" fluidic self-assembly, in which trapezoidal-shaped diodes have been placed in a solvent, and then poured over a substrate having matching, trapezoidal-shaped holes to catch and hold the trapezoidal-shaped diodes in place. The trapezoidal-shaped diodes in the solvent, however, are not suspended and dispersed within the solvent. The trapezoidal-shaped diodes instead settle out rapidly into clumps of diodes adhering to each other, are unable to be maintained in a suspension or otherwise dispersed within the solvent, and require active sonication or stirring immediately before use. Such trapezoidal-shaped diodes in a solvent cannot be utilized as a diode-based ink capable of being stored, packaged or otherwise used as an ink, and further are unsuitable for use in a printing process.

None of these approaches have utilized a liquid or gel containing two-terminal integrated circuits or other semiconductor devices which are actually dispersed and suspended in the liquid or gel medium, such as to form an ink, with the two-terminal integrated circuits suspended as particles, with the semiconductor devices being complete and capable of functioning, and which can be formed into an apparatus or system in a non-inert, atmospheric air environment, using a printing process.

These recent developments for diode-based technologies remain too complex and expensive for LED-based devices and photovoltaic devices to achieve commercial viability. As a consequence, a need remains for light emitting and/or photovoltaic apparatuses which are designed to be less expensive, in terms of incorporated components and in terms of ease of manufacture. A need also remains for methods to manufacture such light emitting or photovoltaic devices using less expensive and more robust processes, to thereby produce LED-based lighting devices and photovoltaic panels which may be available for widespread use and adoption by consumers and businesses. Various needs remain, therefore, for a liquid or gel suspension of completed, functioning diodes or other two-terminal integrated circuits which is capable of being printed to create LED-based devices and photovoltaic devices, for a method of printing to create such LED-based devices and photovoltaic devices, and for the resulting printed LED-based devices and photovoltaic devices.

SUMMARY

The exemplary embodiments provide a "diode ink", namely, a liquid or gel suspension and dispersion of diodes or other two-terminal integrated circuits which is capable of being printed, such as through screen printing or flexographic printing, for example. As described in greater detail below, the diodes themselves, prior to inclusion in the diode ink composition, are fully formed semiconductor devices which are capable of functioning when energized to emit light (when embodied as LEDs) or provide power when exposed to a light source (when embodied as photovoltaic diodes). An exemplary method also comprises a method of manufacturing diode ink which, as discussed in greater detail below, disperses and suspends a plurality of diodes in a solvent and viscous resin or polymer mixture which is capable of being printed to manufacture LED-based devices and photovoltaic devices. Exemplary apparatuses and systems formed by printing such a diode ink are also disclosed.

While the description is focused on diodes as a type of two-terminal integrated circuit, those having skill in the art will recognize that other types of semiconductor devices may be substituted equivalently to form what is referred to more broadly as a "semiconductor device ink", and that all such variations are considered equivalent and within the scope of the disclosure. Accordingly, any reference herein to "diode" shall be understood to mean and include any two-terminal integrated circuit, of any kind, such as resistors, inductors, capacitors, RFID circuits, sensors, piezo-electric devices, etc., and any other integrated circuit which may be operated using two terminals or electrodes.

An exemplary embodiment provides a composition comprising: a plurality of diodes; a first solvent; and a viscosity modifier.

In an exemplary embodiment, the first solvent comprises at least one solvent selected from the group consisting of: water; alcohols such as methanol, ethanol, N-propanol (including 1-propanol, 2-propanol (isopropanol), 1-methoxy-2-propanol), butanol (including 1-butanol, 2-butanol (isobutanol), pentanol (including 1-pentanol, 2-pentanol, 3-pentanol), octanol, N-octanol (including 1-octanol, 2-octanol, 3-octanol), tetrahydrofurfuryl alcohol, cyclohexanol, terpineol; ethers such as methyl ethyl ether, diethyl ether, ethyl propyl ether, and polyethers; esters such ethyl acetate, dimethyl adipate, propylene glycol monomethyl ether acetate, dimethyl glutarate, dimethyl succinate, glycerin acetate; glycols such as ethylene glycols, diethylene glycol, polyethylene glycols, propylene glycols, dipropylene glycols, glycol ethers, glycol ether acetates; carbonates such as propylene carbonate; glycerols such as glycerin; acetonitrile, tetrahydrofuran (THF), dimethyl formamide (DMF), N-methyl formamide (NMF), dimethyl sulfoxide (DMSO); and mixtures thereof. The first solvent may be present in an amount of about 0.3% to 50% or 60% by weight, for example.

In various exemplary embodiments, each diode of the plurality of diodes has a diameter between about 20 to 30 microns and a height between about 5 to 15 microns; or has a diameter between about 10 to 50 microns and a height between about 5 to 25 microns; or has a width and length each between about 10 to 50 microns and a height between about 5 to 25 microns; or has a width and length each between about 20 to 30 microns and a height between about 5 to 15 microns. The plurality of diodes may be light emitting diodes or photovoltaic diodes, for example.

An exemplary composition may further comprise a plurality of substantially optically transparent and chemically inert particles having a range of sizes between about 10 to about 50 microns and present in an amount of about 0.1% to 2.5% by weight. Another exemplary composition may further comprise a plurality of substantially optically transparent and chemically inert particles having a range of sizes between about 10 to about 30 microns and present in an amount of about 0.1% to 2.5% by weight.

In an exemplary embodiment, the viscosity modifier comprises at least one viscosity modifier selected from the group consisting of: clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxyl ethylcellulose, cellulose ether, cellulose ethyl ether, chitosan; polymers such as acrylate and (meth)acrylate polymers and copolymers; glycols such as ethylene glycols, diethylene glycol, polyethylene glycols, propylene glycols, dipropylene glycols, glycol ethers, glycol ether acetates; fumed silica, silica powders; modified ureas; and mixtures thereof. The viscosity modifier may be present in an amount of about 0.30% to 5% by weight, or about 0.10% to 3% by weight, for example.

The composition may further comprise a second solvent different from the first solvent. The second solvent is present in an amount of about 0.1% to 60% by weight, for example.

In an exemplary embodiment, the first solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 5% to 50% by weight; the viscosity modifier comprises methoxy propyl methylcellulose resin or hydroxy propyl methylcellulose resin or mixtures thereof, and present in an amount of about 0.10% to 5.0% by weight; and the second solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 0.3% to 50% by weight.

In another exemplary embodiment, the first solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 5% to 30% by weight; the viscosity modifier comprises methoxy propyl methylcellulose resin or hydroxy propyl methylcellulose resin or mixtures thereof, and present in an amount of about 1.0% to 3.0% by weight; and the second solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 0.2% to 8.0% by weight; and wherein the balance of the composition further comprises water.

In another exemplary embodiment, the first solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 40% to 60% by weight; the viscosity modifier comprises methoxy propyl methylcellulose resin or hydroxy propyl methylcellulose resin or mixtures thereof, and present in an amount of about 0.10% to 1.5% by weight; and the second solvent comprises N-propanol, isopropanol, dipropylene glycol, diethylene glycol, propylene glycol, 1-methoxy-2-propanol, 1-octanol, ethanol, tetrahydrofurfuryl alcohol, or cyclohexanol, or mixtures thereof, and present in an amount of about 40% to 60% by weight.

An exemplary method of making the composition may comprise: mixing the plurality of diodes with the first solvent; adding the mixture of the first solvent and plurality of diodes to the viscosity modifier; adding the second solvent; and mixing the plurality of diodes, the first solvent, the second solvent, and the viscosity modifier for about 25 to 30 minutes in an air atmosphere. An exemplary method may further comprise releasing the plurality of diodes from a wafer, and the step of releasing the plurality of diodes from the wafer further comprises etching the back side of the wafer, grinding and polishing a back side of the wafer, or a laser lift-off from a back side of the wafer, for example.

In various exemplary embodiments, the composition has a viscosity substantially between about 50 cps and about 25,000 cps at about 25° C., or between about 100 cps and about 25,000 cps at about 25° C., or between about 1,000 cps and about 10,000 cps at about 25° C., or between about 10,000 cps and about 25,000 cps at about 25° C.

In various exemplary embodiments, each diode of the plurality of diodes may comprise GaN and wherein the GaN portion of each diode of the plurality of diodes is substantially hexagonal, square, triangular, rectangular, lobed, stellate, or toroidal. In an exemplary embodiment, a light emitting or absorbing region of each diode of the plurality of diodes may have a surface texture selected from the group consisting of: a plurality of circular rings, a plurality of substantially curvilinear trapezoids, a plurality of parallel stripes, a stellate pattern, and mixtures thereof.

In an exemplary embodiment, each diode of the plurality of diodes has a first metal terminal on a first side of the diode and a second metal terminal on a second, back side of the diode, and the first and second terminals are each between about 1 to 6 microns in height. In another exemplary embodiment, each diode of the plurality of diodes has a diameter between about 20 to 30 microns and a height between 5 to 15 microns, and each diode of the plurality of diodes has a plurality of first metal terminals on a first side and one second metal terminal on the first side, a contact of the second metal terminal spaced apart from contacts of the plurality of first metal terminals by about 2 to 5 microns in the height dimension. In an exemplary embodiment, each first metal terminal of the plurality of first metal terminals is between about 0.5 to 2 microns in height and the second metal terminal is between about 1 to 8 microns in height. In another exemplary embodiment, each diode of the plurality of diodes has a diameter between about 10 to 50 microns and a height between 5 to 25 microns, and each diode of the plurality of diodes has a plurality of first metal terminals on a first side and one second metal terminal on the first side, a contact of the second metal terminal spaced apart from contacts of the plurality of first metal terminals by about 1 to 7 microns in the height dimension.

In another exemplary embodiment, each diode of the plurality of diodes has at least one metal via structure extending between at least one p+ or n+ GaN layer on a first side of the diode to a second, back side of the diode. The metal via structure comprises a central via, a peripheral via, or a perimeter via, for example.

In various exemplary embodiments, each diode of the plurality of diodes is less than about 30 microns in any dimension. In another exemplary embodiment, the diode has a diameter between about 20 to 30 microns and a height between about 5 to 15 microns; or a diameter between about 10 to 50 microns and a height between about 5 to 25 microns; or is substantially hexagonal laterally, has a diameter between about 10 to 50 microns measured opposing face-to face, and a height between about 5 to 25 microns; or is substantially hexagonal laterally, has a diameter measured opposing face-to face between about 20 to 30 microns and a height between about 5 to 15 microns; or has a width and length each between about 10 to 50 microns each and a height between about 5 to 25 microns; or has a width and length each between about 20 to 30 microns each and a height between about 5 to 15 microns. In various exemplary embodiments, the lateral sides of each diode of the plurality of diodes are less than about 10 microns in height. In another exemplary embodiment, the lateral sides of each diode of the plurality of diodes are between about 2.5 to 6 microns in height. In another exemplary embodiment, the lateral sides of each diode of the plurality of diodes are substantially sigmoidal and terminate in a curved point.

In various exemplary embodiments, the viscosity modifier further comprises an adhesive viscosity modifier. The viscosity modifier, when dried or cured, may form a polymer or resin lattice or structure substantially about the periphery of each diode of the plurality of diodes. The composition may be visually opaque when wet and substantially optically clear when dried or cured, for example. The composition may have a contact angle greater than about 25 degrees or greater than about 40 degrees. The composition may have a relative evaporation rate less than one, wherein the evaporation rate is relative to butyl acetate having a rate of one. A method of using the composition may comprise printing the composition over a base or over a first conductor coupled to the base.

In an exemplary embodiment, each diode of the plurality of diodes comprises at least one inorganic semiconductor selected from the group consisting of: silicon, gallium arsenide (GaAs), gallium nitride (GaN), GaP, InAlGaP, InAlGaP, AlInGaAs, InGaNAs, and AlInGASb. In another exemplary embodiment, each diode of the plurality of diodes comprises at least one organic semiconductor selected from the group consisting of: π-conjugated polymers, poly(acetylene)s, poly(pyrrole)s, poly(thiophene)s, polyanilines, polythiophenes, polyp-phenylene sulfide), poly(para-phenylene vinylene)s (PPV) and PPV derivatives, poly(3-alkylthiophenes), polyindole, polypyrene, polycarbazole, polyazulene, polyazepine, poly(fluorene)s, polynaphthalene, polyaniline, polyaniline derivatives, polythiophene, polythiophene derivatives, polypyrrole, polypyrrole derivatives, polythianaphthene, polythianaphthane derivatives, polyparaphenylene, polyparaphenylene derivatives, polyacetylene, polyacetylene derivatives, polydiacethylene, polydiacetylene derivatives, polyparaphenylenevinylene, polyparaphenylenevinylene derivatives, polynaphthalene, polynaphthalene derivatives, polyisothianaphthene (PITN), polyheteroarylenvinylene (ParV) in which the heteroarylene group is thiophene, furan or pyrrol, polyphenylene-sulphide (PPS), polyperinaphthalene (PPN), polyphthalocyanine (PPhc), and their derivatives, copolymers thereof and mixtures thereof.

Another exemplary embodiment provides a composition comprising: a plurality of diodes; a first solvent; and a viscosity modifier; wherein the composition has a viscosity substantially about 100 cps to about 25,000 cps at about 25° C. Another exemplary embodiment provides a composition comprising: a plurality of diodes, each diode of the plurality of diodes less than about 50 microns in any dimension; a first solvent; a second solvent different from the first solvent; and a viscosity modifier; wherein the composition has a viscosity substantially about 50 cps to about 25,000 cps at about 25° C. Another exemplary embodiment provides a composition comprising: a plurality of diodes less than about 50 microns in any dimension; and a viscosity modifier to provide a viscosity of the composition substantially between about 100 cps and about 20,000 cps at about 25° C. Another exemplary embodiment provides a composition comprising: a plurality of diodes; a first solvent selected from the group consisting of: N-propanol, isopropanol, dipropylene glycol, diethylene glycol, propylene glycol, 1-methoxy-2-propanol, 1-octanol, ethanol, tetrahydrofurfuryl alcohol, cyclohexanol, and mixtures thereof; a viscosity modifier selected from the group consisting of: methoxy propyl methylcellulose resin, hydroxy propyl methylcellulose resin, and mixtures thereof; and a second solvent different from the first solvent, the second solvent selected from the group consisting of: N-propanol, isopropanol, dipropylene glycol, diethylene glycol, propylene glycol, 1-methoxy-2-propanol, 1-octanol, ethanol, tetrahydrofurfuryl alcohol, cyclohexanol, and mixtures thereof.

Another exemplary embodiment provides an apparatus comprising: a plurality of diodes; at least a trace amount of a first solvent; and a polymeric or resin film at least partially surrounding each diode of the plurality of diodes. In an exemplary embodiment, the polymeric or resin film comprises a methylcellulose resin having a thickness between about 10 nm to 300 nm. In another exemplary embodiment, the polymeric or resin film comprises a methoxy propyl methylcellulose resin or a hydroxy propyl methylcellulose resin or mixtures thereof. The apparatus may further comprise at least a trace amount of a second solvent different from the first solvent.

In an exemplary embodiment, the polymeric or resin film comprises a cured, dried or polymerized viscosity modifier selected from the group consisting of: clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxyl ethylcellulose, cellulose ether, cellulose ethyl ether, chitosan; polymers such as acrylate and (meth)acrylate polymers and copolymers; glycols such as ethylene glycols, diethylene glycol, polyethylene glycols, propylene glycols, dipropylene glycols, glycol ethers, glycol ether acetates; fumed silica, silica powders; modified ureas; and mixtures thereof.

An exemplary apparatus may further comprise a plurality of substantially optically transparent and chemically inert particles, each inert particle of the plurality of substantially optically transparent and chemically inert particles between about 10 to about 50 microns; wherein the polymeric or resin film further at least partially surrounds each inert particle of the plurality of substantially optically transparent and chemically inert particles.

An exemplary apparatus may further comprise: a base; one or more first conductors coupled to the first terminals; at least one dielectric layer coupled to the one or more first conductors; and one or more second conductors coupled to the second terminals and to the dielectric layer. In an exemplary embodiment, at least one diode of the plurality of diodes has a first terminal coupled to at least one second conductor and a second terminal coupled to at least one first conductor. In another exemplary embodiment, a first portion of the plurality of diodes have first terminals coupled to at least one first conductor and second terminals coupled to at least one second conductor, and wherein a second portion of the plurality of diodes have first terminals coupled to at least one second conductor and second terminals coupled to at least one first conductor. An exemplary apparatus may further comprise: an interface circuit coupled to the one or more first conductors and to the one or more second conductors, the interface circuit further couplable to a power source.

In various exemplary embodiments, the one or more first conductors may further comprise: a first electrode comprising a first busbar and a first plurality of elongated conductors extending from the first busbar; and a second electrode comprising a second busbar and a second plurality of elongated conductors extending from the second busbar. The second plurality of elongated conductors may be interdigitated with the first plurality of elongated conductors. The one or more second conductors may be further coupled to the second plurality of elongated conductors.

In various exemplary embodiments, the apparatus is foldable and bendable. The apparatus may be substantially flat and have a total thickness less than about 3 mm. The apparatus may be die cut and folded into a selected shape. The apparatus may have an average surface area concentration of the plurality of diodes from about 25 to 50,000 diodes per square centimeter. In various exemplary embodiments, the apparatus does not include a heat sink or a heat sink component.

In another exemplary embodiment, an apparatus comprises: a base; a plurality of diodes, each diode of the plurality of diodes having a first terminal and a second terminal, each diode of the plurality of diodes less than about 50 microns in any dimension; a film substantially surrounding each diode of the plurality of diodes, the film comprising a polymer or a resin and having a thickness between about 10 nm to 300 nm; one or more first conductors coupled to a first plurality of first terminals; a first dielectric layer coupled to the one or more first conductors; and one or more second conductors coupled to a first plurality of second terminals.

In another exemplary embodiment, an apparatus comprises: a base; one or more first conductors; a dielectric layer coupled to the one or more first conductors; one or more second conductors; a plurality of diodes, each diode of the plurality of diodes less than about 50 microns in any dimension, a first portion of the plurality of diodes coupled to the one or more first conductors and to the one or more second conductors in a forward bias orientation, and at least one diode of the plurality of diodes coupled to the one or more first conductors and to the one or more second conductors in a reverse bias orientation; and a film substantially surrounding each diode of the plurality of diodes, the film comprising a polymer or a resin and having a thickness between about 10 nm to 300 nm;

In various exemplary embodiments, a diode comprises: a light emitting or absorbing region having a diameter between about 20 and 30 microns and a height between about 2.5 to 7 microns; a first terminal coupled to the light emitting region on a first side, the first terminal having a height between about 1 to 6 microns; and a second terminal coupled to the light emitting region on a second side opposite the first side, the second terminal having a height between about 1 to 6 microns.

In another exemplary embodiment, a diode comprises: a light emitting or absorbing region having a diameter between about 6 and 30 microns and a height between about 1 to 7 microns; a first terminal coupled to the light emitting region on a first side, the first terminal having a height between about 1 to 6 microns; and a second terminal coupled to the light emitting region on a second side opposite the first side, the second terminal having a height between about 1 to 6 microns; wherein the diode is substantially hexagonal laterally, has a diameter between about 10 to 50 microns measured opposing face-to-face and a height between about 5 to 25 microns, and wherein each lateral side of the diode is less than about 10 microns in height, has a substantially sigmoidal curvature and terminates in a curved point.

In another exemplary embodiment, a diode comprises: a light emitting or absorbing region having a diameter between about 6 and 30 microns and a height between about 1 to 7 microns; a first terminal coupled to the light emitting region on a first side, the first terminal having a height between about 1 to 6 microns; and a second terminal coupled to the light emitting region on a second side opposite the first side, the second terminal having a height between about 1 to 6 microns; wherein the diode has a width and a length each between about 10 to 50 microns and a height between about 5 to 25 microns, and wherein each lateral side of the diode is less than about 10 microns in height, has a substantially sigmoidal curvature and terminates in a curvilinear point.

In various exemplary embodiments, a diode comprises: a light emitting or absorbing region having a diameter between about 6 and 30 microns and a height between about 2.5 to 7 microns; a first terminal coupled to the light emitting region on a first side, the first terminal having a height between about 3 to 6 microns; and a second terminal coupled to the light emitting region on a second side opposite the first side, the second terminal having a height between about 3 to 6 microns; wherein the diode has a width and a length each between about 10 to 30 microns and a height between about 5 to 15 microns, and wherein each lateral side of the diode is less than about 10 microns in height, has a substantially sigmoidal curvature and terminates in a curvilinear point.

In another exemplary embodiment, a diode comprises: a light emitting or absorbing region having a diameter between about 20 and 30 microns and a height between 2.5 to 7 microns; a plurality of first terminals spaced apart and coupled to the light emitting region peripherally on a first side, each first terminal of the plurality of first terminals having a height between about 0.5 to 2 microns; and one second terminal coupled centrally to a mesa region of the light emitting region on the first side, the second terminal having a height between 1 to 8 microns.

In another exemplary embodiment, a diode comprises: a light emitting or absorbing region having a mesa region, the mesa region having a height of 0.5 to 2 microns and a diameter between about 6 to 22 microns; a plurality of first terminals spaced apart and coupled to the light emitting region on a first side and peripherally to the mesa region, each first terminal of the plurality of first terminals having a height between about 0.5 to 2 microns; and one second terminal coupled centrally to the mesa region of the light emitting region on the first side, the second terminal having a height between 1 to 8 microns; wherein the diode has a lateral dimension between about 10 to 50 microns and a height between about 5 to 25 microns.

In another exemplary embodiment, a diode comprises: a light emitting or absorbing region having a diameter between about 20 and 30 microns and a height between 2.5 to 7 microns; a plurality of first terminals spaced apart and coupled to the light emitting region peripherally on a first side, each first terminal having a height between about 0.5 to 2 microns; and one second terminal coupled centrally to a mesa region of the light emitting region on the first side, the second terminal having a height between 3 to 6 microns; wherein the diode is substantially hexagonal laterally, has a diameter between about 20 to 30 microns and a height between about 5 to 15 microns, wherein each lateral side of the diode is less than about 10 microns in height, has a substantially sigmoidal curvature and terminates in a curved point.

In another exemplary embodiment, a diode comprises: a light emitting or absorbing region having a mesa region, the mesa region having a height of 0.5 to 2 microns and a diameter between about 6 to 22 microns; a plurality of first terminals spaced apart and coupled to the light emitting region on a first side and peripherally to the mesa region, each first terminal of the plurality of first terminals having a height between about 0.5 to 2 microns; and one second terminal coupled centrally to the mesa region of the light emitting region on the first side, the second terminal having a height between 1 to 8 microns, the second metal terminal having one contact, and the one contact of the second terminal spaced apart from contacts of the plurality of first metal terminals by about 1 to 7 microns in height; wherein the diode is substantially hexagonal laterally, has a diameter between about 10 to 50 microns and a height between about 5 to 25 microns, wherein each lateral side of the diode is less than about 15 microns in height, has a substantially sigmoidal curvature and terminates in a curved point.

An exemplary method of making a liquid or gel suspension of diodes for printing, comprises: adding a viscosity modifier to a plurality of diodes in a first solvent; and mixing the plurality of diodes, the first solvent and the viscosity modifier to form the liquid or gel suspension of the plurality of diodes.

In another exemplary embodiment, a method of making a liquid or gel suspension of diodes for printing comprises: adding a second solvent to a plurality of diodes in a first solvent, the second solvent different from the first solvent; adding a viscosity modifier to the plurality of diodes, the first solvent and the second solvent; adding a plurality of substantially chemically inert particles to the plurality of diodes, the first solvent, the second solvent and the viscosity modifier; and mixing the plurality of diodes, the first solvent, the second solvent, the viscosity modifier, and the plurality of substantially chemically inert particles until the viscosity is at least about 100 centipoise (cps) measured at about 25° C. to form the liquid or gel suspension of the plurality of diodes.

In another exemplary embodiment, a method of making a liquid or gel suspension of diodes for printing comprises: adding a viscosity modifier to a plurality of diodes, a first solvent and a second solvent, the second solvent different from the first solvent, wherein each diode of the plurality of diodes has a lateral dimension between about 10 to 50 microns and a height between about 5 to 25 microns; adding a plurality of substantially chemically inert particles to the plurality of diodes, the first solvent, the second solvent and the viscosity modifier, wherein each particle of the plurality of substantially chemically inert particles has a size between about 10 microns to about 70 microns in any dimension; and mixing the plurality of diodes, the first solvent, the second solvent, the viscosity modifier, and the plurality of substantially chemically inert particles until the viscosity is at least about 1,000 centipoise (cps) measured at about 25° C. to form the liquid or gel suspension of the plurality of diodes.

In an exemplary embodiment, a method of fabricating an electronic device comprises: depositing one or more first conductors; and depositing a plurality of diodes suspended in a mixture of a first solvent and a viscosity modifier.

In another exemplary embodiment, a method comprises: depositing a plurality of diodes suspended in a mixture of first solvent and a viscosity modifier on a first side of an optically transmissive base, each diode of the plurality of diodes having a plurality of first terminals on a first side and one second terminal on the first side, each diode of the plurality of diodes having a lateral dimension between about 10 to 50 microns and a height between 5 to 25 microns; depositing one or more first conductors coupled to the first terminals; depositing at least one dielectric layer coupled to the one or more first conductors; depositing one or more second conductors coupled to the second terminals; and depositing a first phosphor layer on a second side of the optically transmissive base.

In another exemplary embodiment, a method comprises: depositing one or more first conductors on a first side of a base; depositing a plurality of diodes suspended in a mixture of a first solvent and a viscosity modifier over the one or more first conductors, each diode of the plurality of diodes having a first terminal on a first side and a second terminal on a second side, each diode of the plurality of diodes having a lateral dimension between about 10 to 50 microns and a height between 5 to 25 microns; depositing at least one dielectric layer over the plurality of diodes and the one or more first conductors; depositing one or more optically transmissive second conductors over the dielectric layer; and depositing a first phosphor layer.

In another exemplary embodiment, a composition comprises: a plurality of two-terminal integrated circuits, each two-terminal integrated circuit of the plurality of two-terminal integrated circuits less than about 75 microns in any dimension; a first solvent; a second solvent different from the first solvent; and a viscosity modifier; wherein the composition has a viscosity substantially about 50 cps to about 25,000 cps at about 25° C. In various exemplary embodiments, the plurality of two-terminal integrated circuits comprise a two-terminal integrated circuit selected from the group consisting of: diodes, light emitting diodes, photovoltaic diodes, resistors, inductors, capacitors, RFID integrated circuits, sensor integrated circuits, and piezo-electric integrated circuits.

In another exemplary embodiment, an apparatus comprises: a base; a plurality of two-terminal integrated circuits, each two-terminal integrated circuit of the plurality of two-terminal integrated circuits less than about 75 microns in any dimension; at least a trace amount of a first solvent; a film substantially surrounding each diode of the plurality of diodes, the film comprising a methylcellulose resin and having a thickness between about 10 nm to 300 nm; one or more first conductors coupled to the plurality of two-terminal integrated circuits; a first dielectric layer coupled to the one or more first conductors; and one or more second conductors coupled to the plurality of two-terminal integrated circuits.

In another exemplary embodiment, a composition comprises: a plurality of two-terminal integrated circuits, each two-terminal integrated circuit of the plurality of two-terminal integrated circuits less than about 75 microns in any dimension; a first solvent; a second solvent different from the first solvent; a plurality of substantially chemically inert particles having a range of sizes between about 10 to about 100 microns and present in an amount of about 0.1% to 2.5% by weight; and a viscosity modifier; wherein the composition has a viscosity substantially about 50 cps to about 25,000 cps at about 25° C.

An exemplary lighting apparatus is also disclosed, with the exemplary lighting apparatus comprising: a flexible base having an adhesive on a first side; a plurality of first conductors coupled to the base; a plurality of light emitting diodes distributed substantially randomly and in parallel on a first conductor of the plurality of first conductors, at least some of the plurality of light emitting diodes having a first, forward-bias orientation and at least one of the plurality of light emitting diodes having a second, reverse-bias orientation; at least one second conductor coupled to the plurality of diodes and coupled to a second conductor of the plurality of first conductors; a luminescent layer coupled to the at least one second conductor or an intervening stabilization layer; a protective coating coupled to the luminescent layer; and an electrical interface coupled to the plurality of first conductors.

An exemplary apparatus may further comprise a polymer or resin lattice coupled to the plurality of light emitting diodes. The exemplary apparatus may emit light in an amount of at least about 10 lm/W. The plurality of light emitting diodes may comprise an average particle size of from about 20 microns to about 30 microns in diameter. An exemplary base may be selected from the group consisting of flexible materials, porous materials, permeable materials, transparent materials, translucent materials, opaque materials and mixtures thereof. An exemplary base may be selected from the group consisting of plastics, polymer materials, natural rubber, synthetic rubber, natural fabrics, synthetic fabrics, glass, ceramics, silicon-derived materials, silica-derived materials, concrete, stone, extruded polyolefinic films, polymeric non-wovens, cellulosic paper and mixtures thereof. An exemplary base may be sufficient to provide electrical insulation and wherein the protective coating forms a weatherproof seal.

In another exemplary embodiment, the apparatus has an average surface area concentration of the plurality of light emitting diodes from about 5 to 10,000 diodes per square centimeter.

In another exemplary embodiment, the electrical interface comprises at least one interface selected from the group consisting of: ES, E27, SES, E14, L1,PL—2 pin, PL—4 pin, G9 halogen capsule, G4 halogen capsule, GU10, GU5.3, bayonet, and small bayonet.

In another exemplary embodiment, a lighting apparatus comprises: a translucent or transparent housing; an electrical interface coupled to the housing and couplable to a power source; a base; a plurality of first conductors coupled to the base and coupled to the electrical interface; a plurality of light emitting diodes distributed substantially randomly and in parallel on a first conductor of the plurality of first conductors, at least some of the plurality of light emitting diodes having a first, forward-bias orientation and at least one of the plurality of light emitting diodes having a second, reverse-bias orientation; at least one second conductor coupled to the plurality of diodes and coupled to a second conductor of the plurality of first conductors; a luminescent layer coupled to the at least one second conductor or an intervening stabilization layer; and a protective coating coupled to the luminescent layer. In an exemplary embodiment, the housing has a size adapted to fit into a user's hand.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIG. 29 is a cross-sectional view of a wafer having a buffer layer (such as aluminum nitride or silicon nitride), a silicon dioxide layer in a grid pattern, and gallium nitride (GaN) layers.

FIG. 30 is a cross-sectional view of a substrate having a buffer layer and a complex GaN heterostructure (n+ GaN layer, quantum well region, and p+ GaN layer).

FIG. 64 is a cross-sectional view illustrating an exemplary diode wafer embodiment adhered to a holding apparatus.

FIG. 65 is a cross-sectional view illustrating an exemplary diode wafer embodiment adhered to a holding apparatus.

FIG. 66 is a cross-sectional view illustrating an exemplary tenth diode embodiment adhered to a holding apparatus.

FIG. 70 is a flow diagram illustrating an exemplary first method embodiment for diode fabrication.

FIG. 71, divided into

FIG. 72, divided into

FIG. 73, divided into

DETAILED DESCRIPTION OF EXEMPLARY EMBODIMENTS

Figure 1:
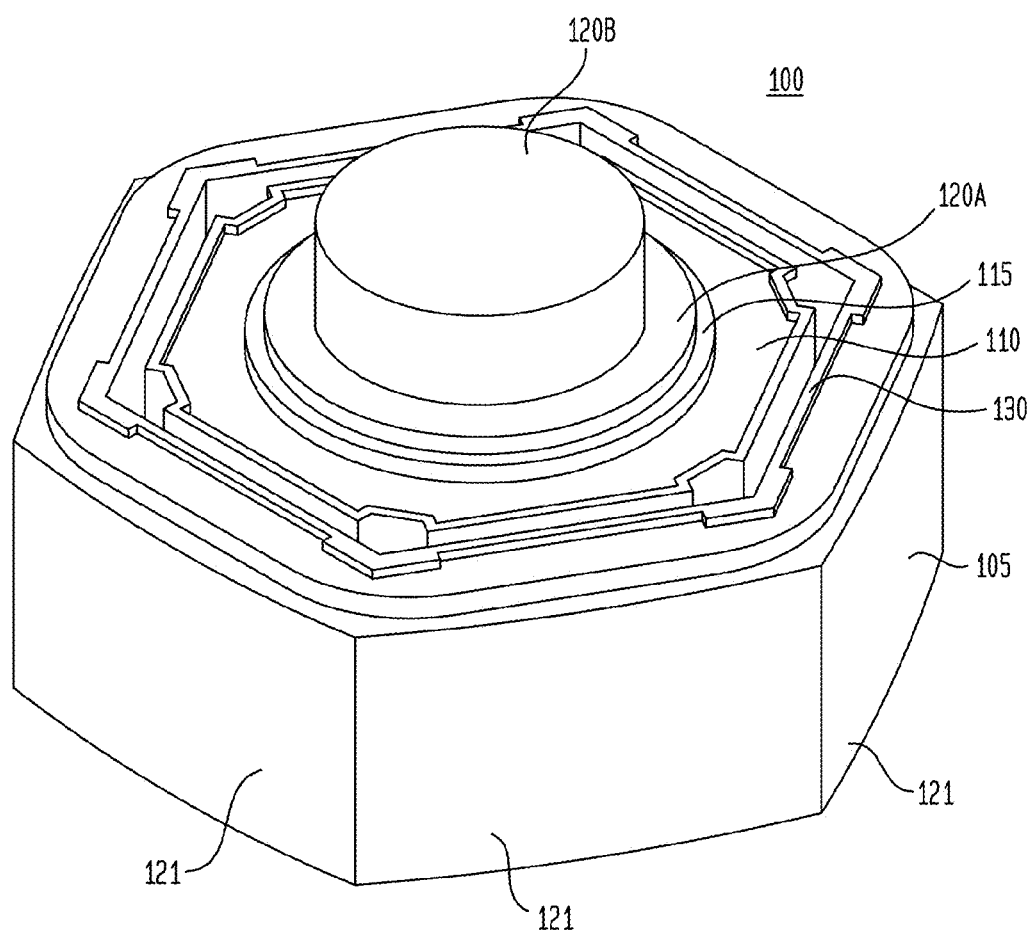
FIG. 1 is a perspective view illustrating an exemplary first diode embodiment.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Exemplary embodiments of the invention provide a liquid and/or gel dispersion and suspension of diodes 100, 100A, 100B, 100C, 100D, 100E, 100F, 100G, 100H, 100I, 100J, 100K, 100L (collectively referred to herein and in the Figures as "diodes 100-100L") which is capable of being printed, and may be referred to equivalently herein as "diode ink", it being understood that "diode ink" means and refers to a liquid and/or gel suspension of diodes or other two-terminal integrated circuits, such as exemplary diodes 100-100L. As described in greater detail below, the diodes 100-100L themselves, prior to inclusion in the diode ink composition, are fully formed semiconductor devices which are capable of functioning when energized to emit light (when embodied as LEDs) or provide power when exposed to a light source (when embodied as photovoltaic diodes). An exemplary method of the invention also comprises a method of manufacturing diode ink which, as discussed in greater detail below, disperses and suspends a plurality of diodes 100-100L in a solvent and viscous resin or polymer mixture, in which the diodes 100-100L or other two-terminal integrated circuits are maintained as dispersed and suspended for a substantial period of time, such as one or more months under room temperature (25° C.) or refrigerated conditions (5-10° C.), especially for the higher viscosity, more gelatinous compositions and the refrigeration-induced gelatinous compositions, and which liquid or gel suspension is capable of being printed to manufacture LED-based devices and photovoltaic devices. While the description is focused on diodes 100-100L as a type of two-terminal integrated circuit, those having skill in the art will recognize that other types of semiconductor devices may be substituted equivalently to form what is referred to more broadly as a "semiconductor device ink", such as any type of transistor (field effect transistor (FET), metal oxide semiconductor field effect transistor (MOSFET), junction field effect transistor (JFET), bipolar junction transistor (BJT), etc.), diac, triac, silicon controlled rectifier, etc., without limitation.

The diode ink (or semiconductor device ink) may be deposited, printed or otherwise applied to form any of various products discussed in greater detail below, such as an apparatus 300, 300A, 300B 300C, 300D, 700, 700A, 700B, 720, 730, 740, 750, 760, 770 embodiment or system 350, 375, 800, 810, or may be deposited, printed or otherwise applied to any product of any kind or to form any product of any kind, including signage or indicia for product packaging, such as a consumer product, a personal product, a business product, an industrial product, an architectural product, a building product, etc.

Figure 2:
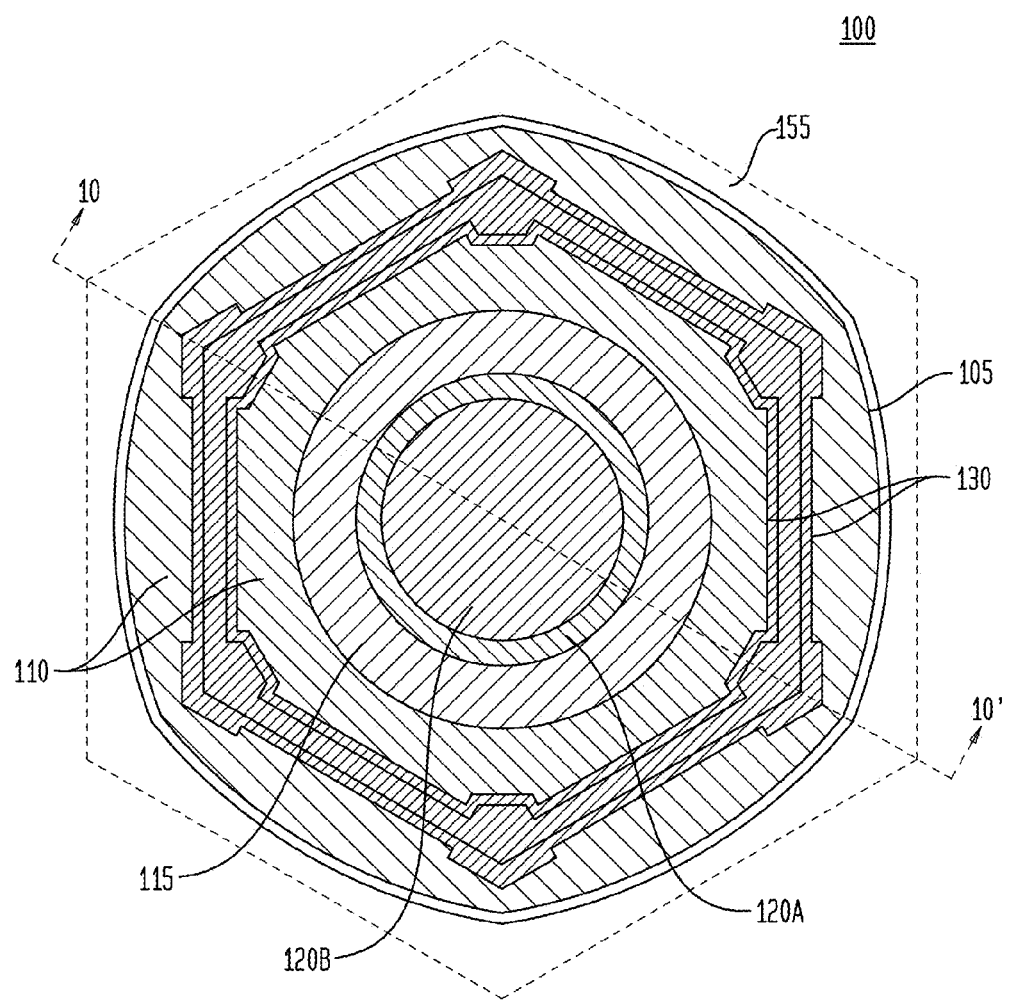
FIG. 2 is a plan (or top) view illustrating the exemplary first diode embodiment.
Figure 3:
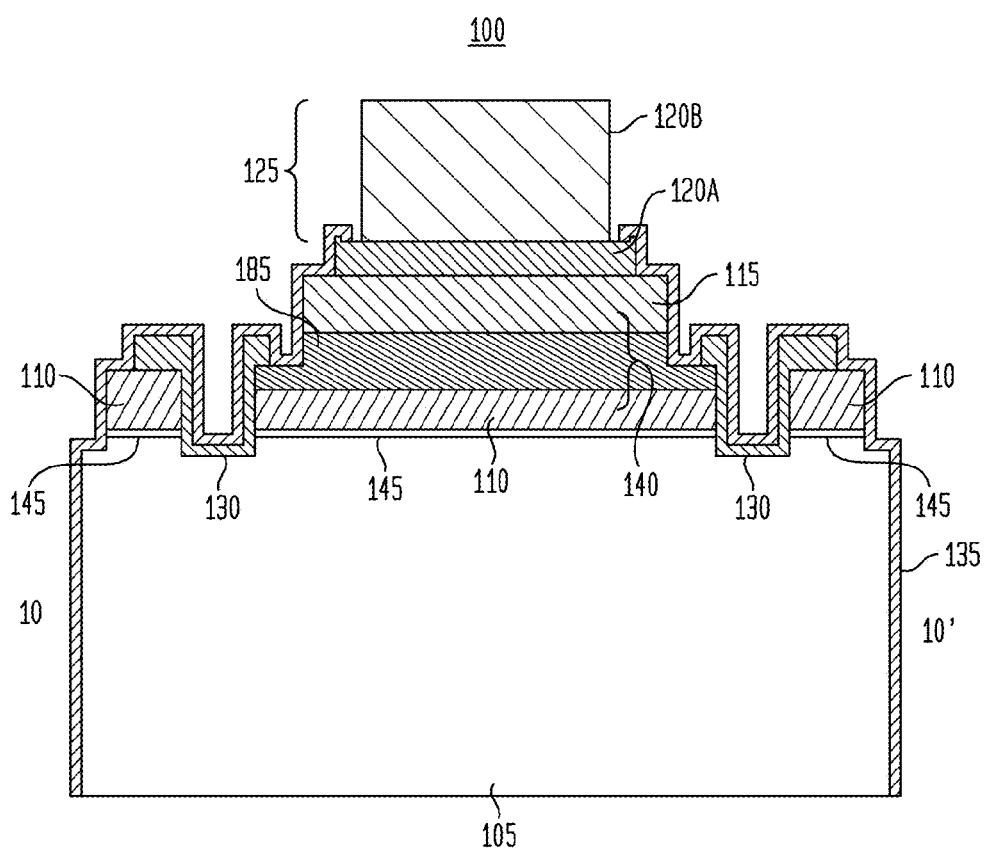
FIG. 3 is a cross-sectional view illustrating the exemplary first diode embodiment.
Figure 4:
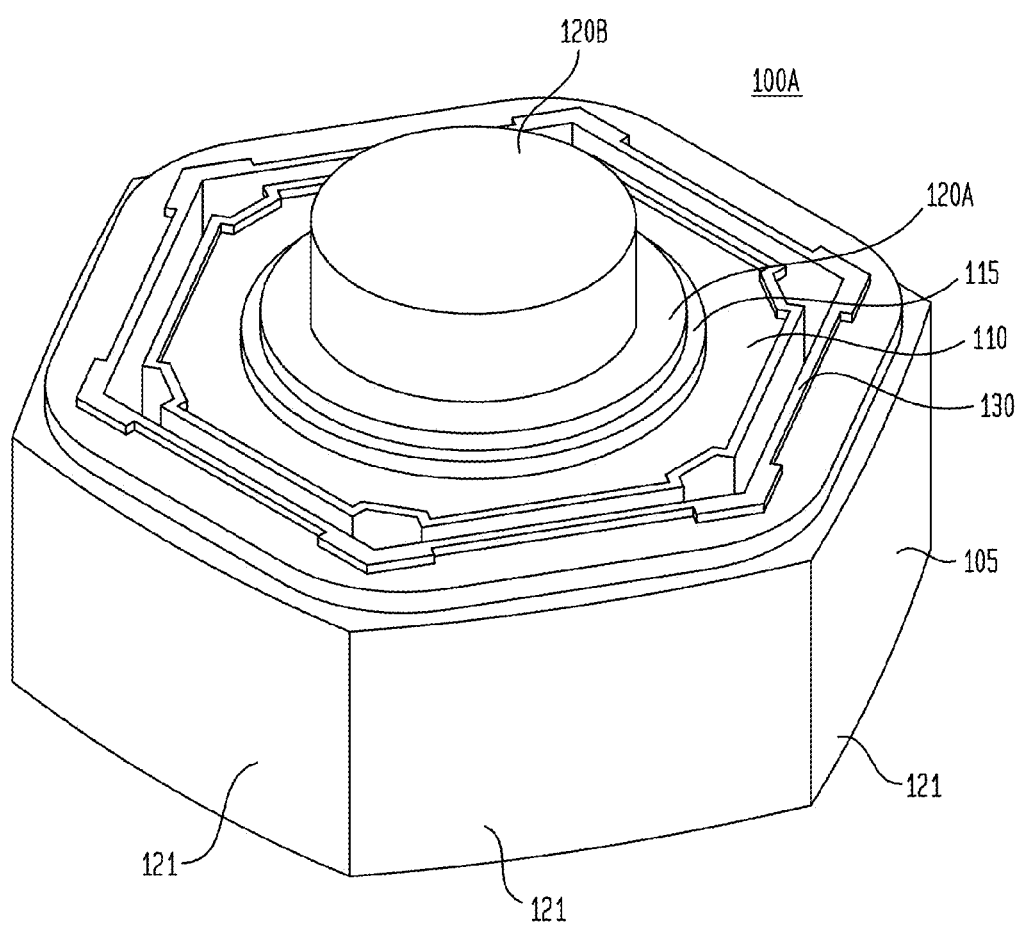
FIG. 4 is a perspective view illustrating an exemplary second diode embodiment.
Figure 5:
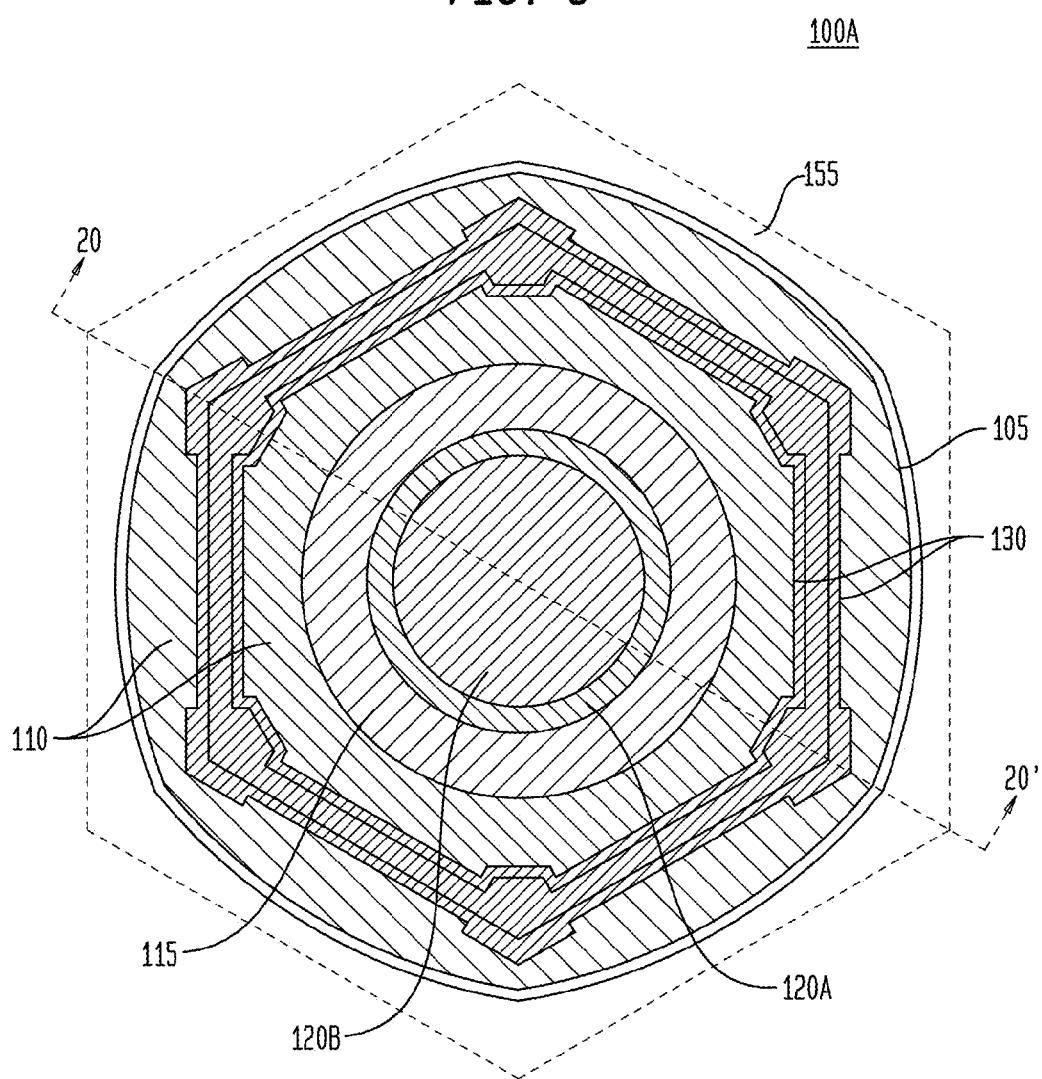
FIG. 5 is a plan (or top) view illustrating the exemplary second diode embodiment.
Figure 6:
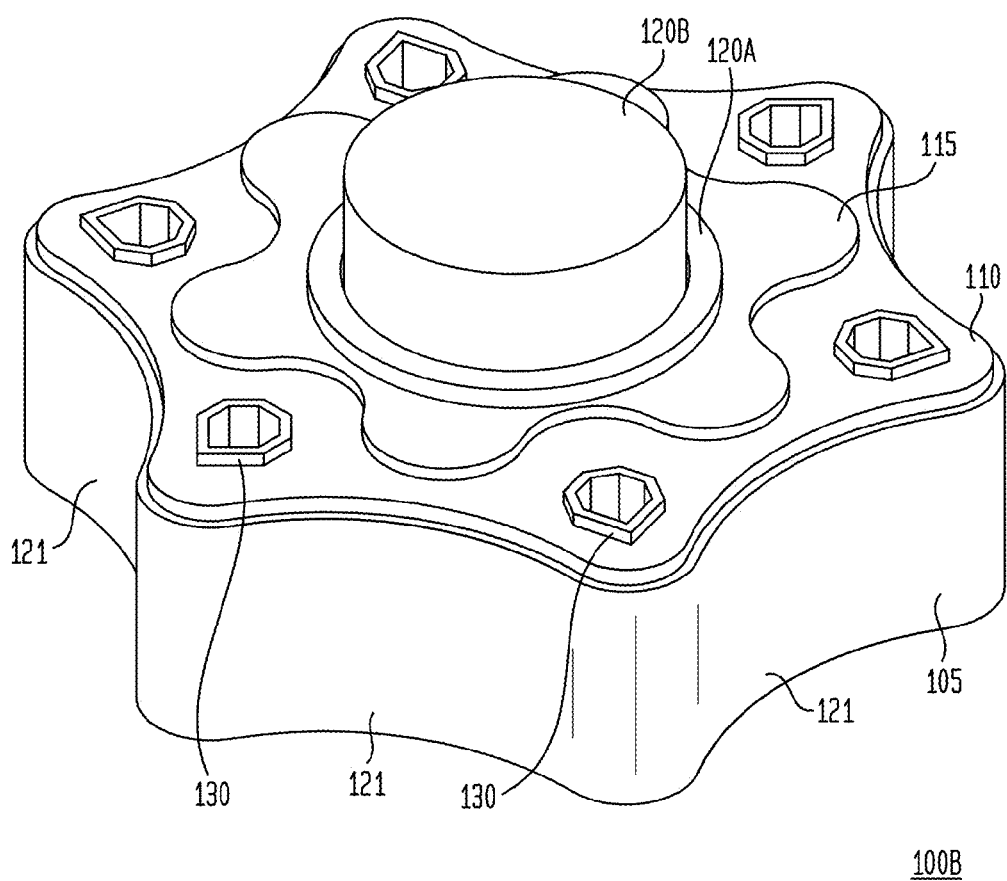
FIG. 6 is a perspective view illustrating an exemplary third diode embodiment.
Figure 7:
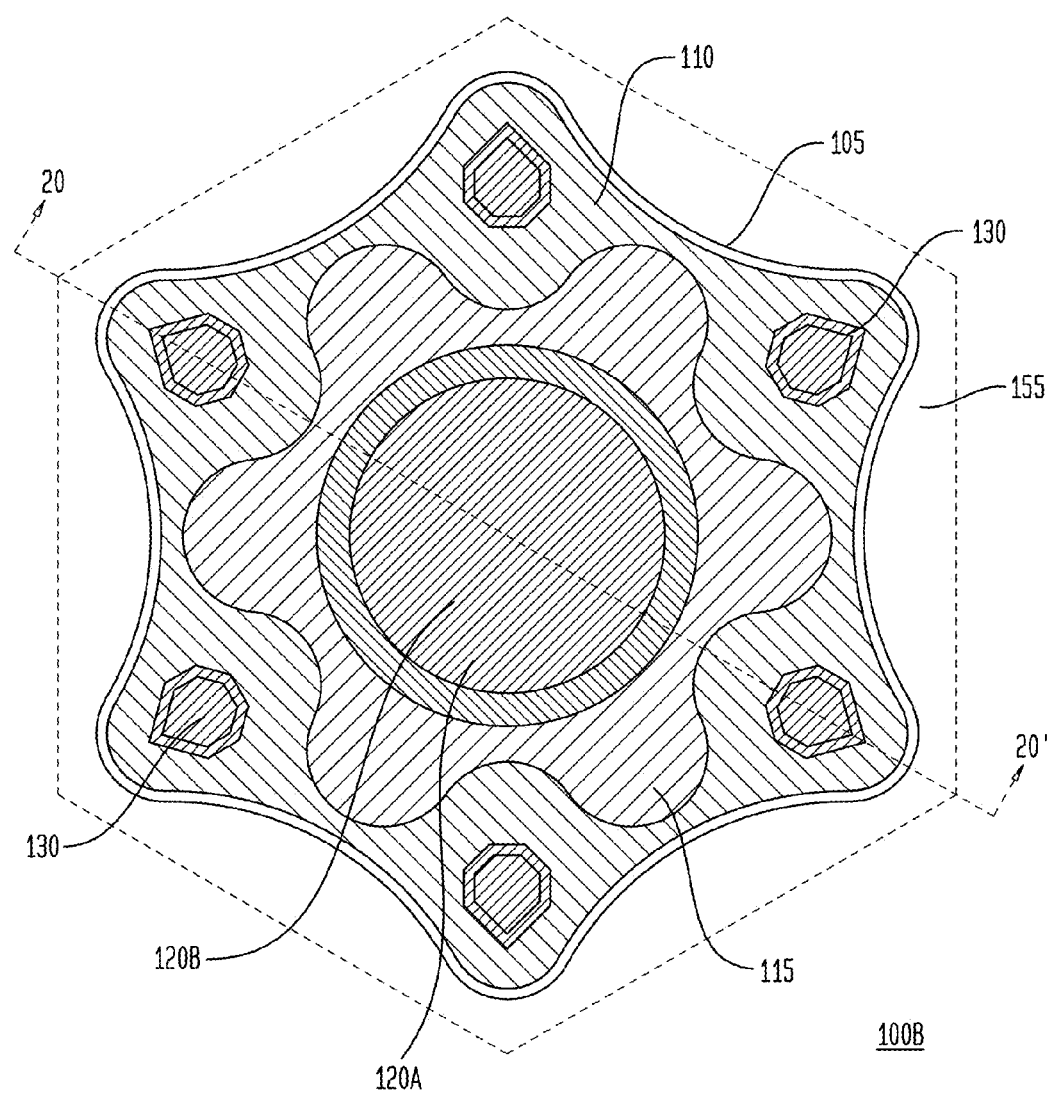
FIG. 7 is a plan (or top) view illustrating the exemplary third diode embodiment.
Figure 8:
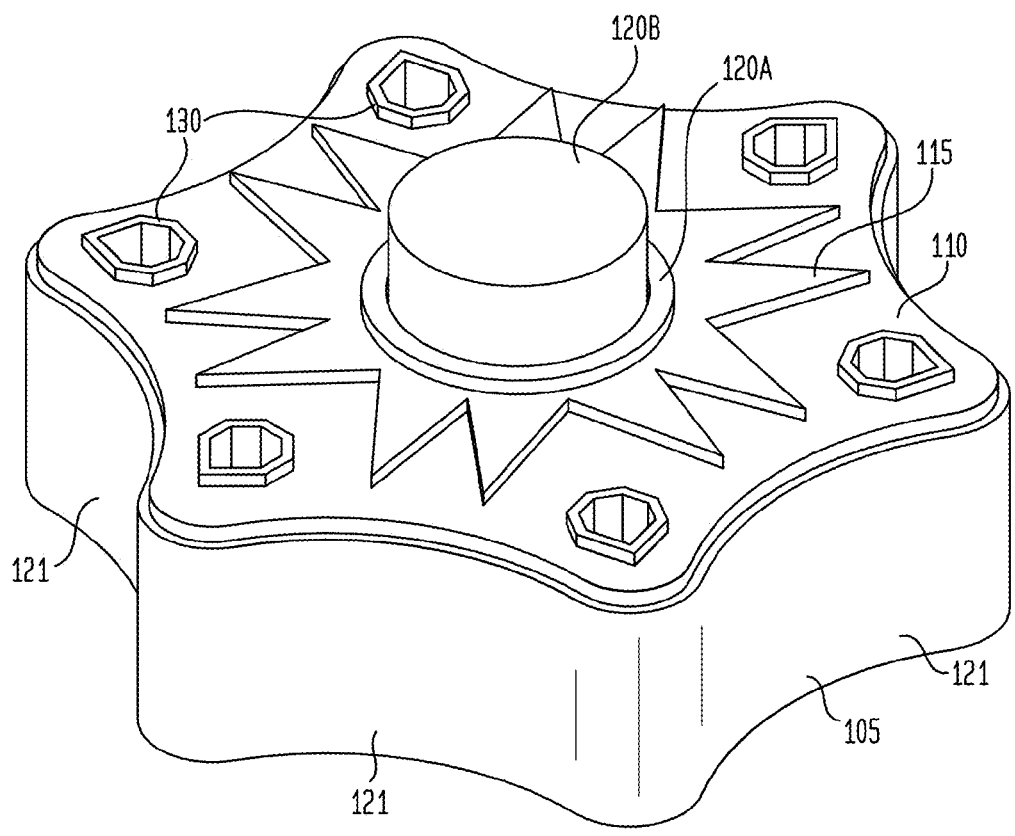
FIG. 8 is a perspective view illustrating an exemplary fourth diode embodiment.
Figure 9:
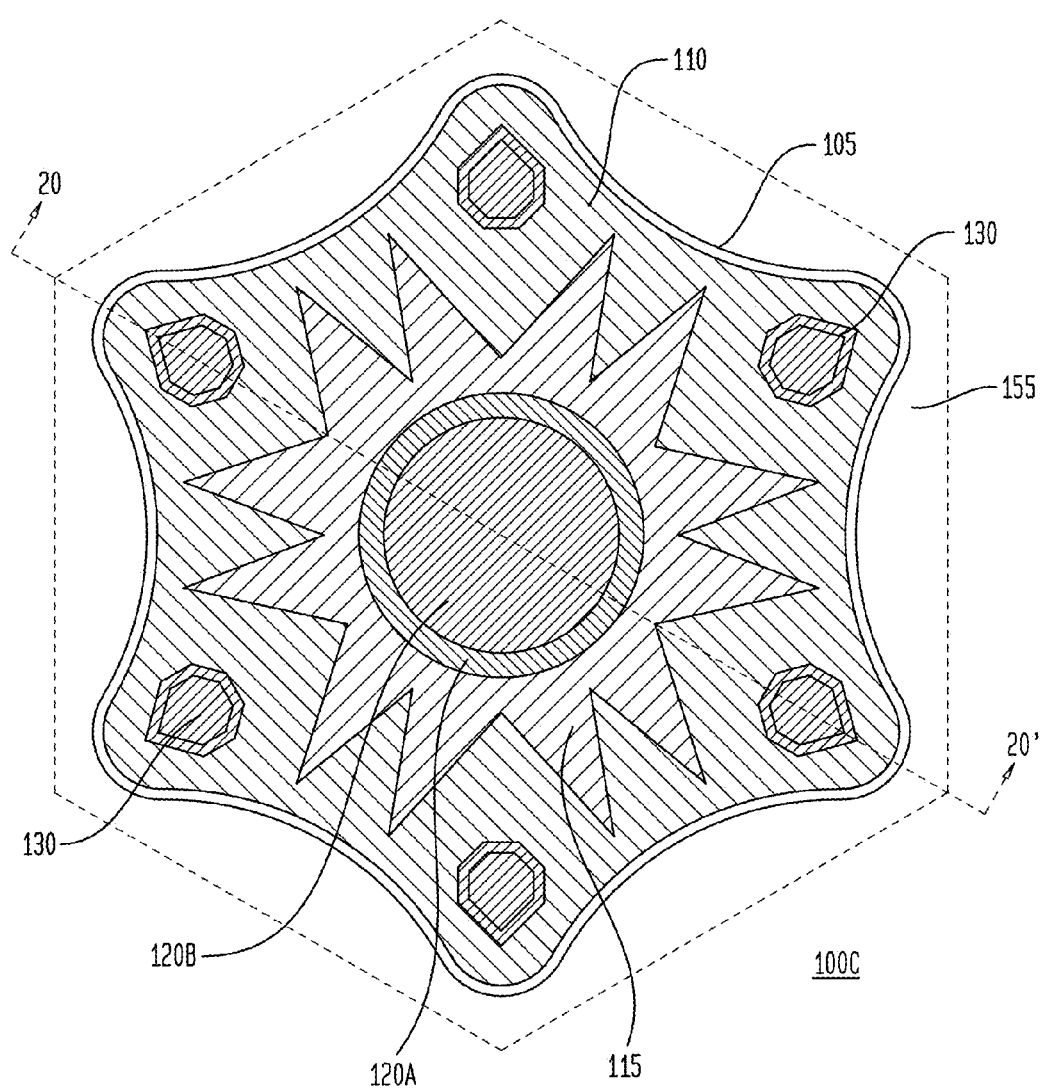
FIG. 9 is a plan (or top) view illustrating the exemplary fourth diode embodiment.
Figure 10:
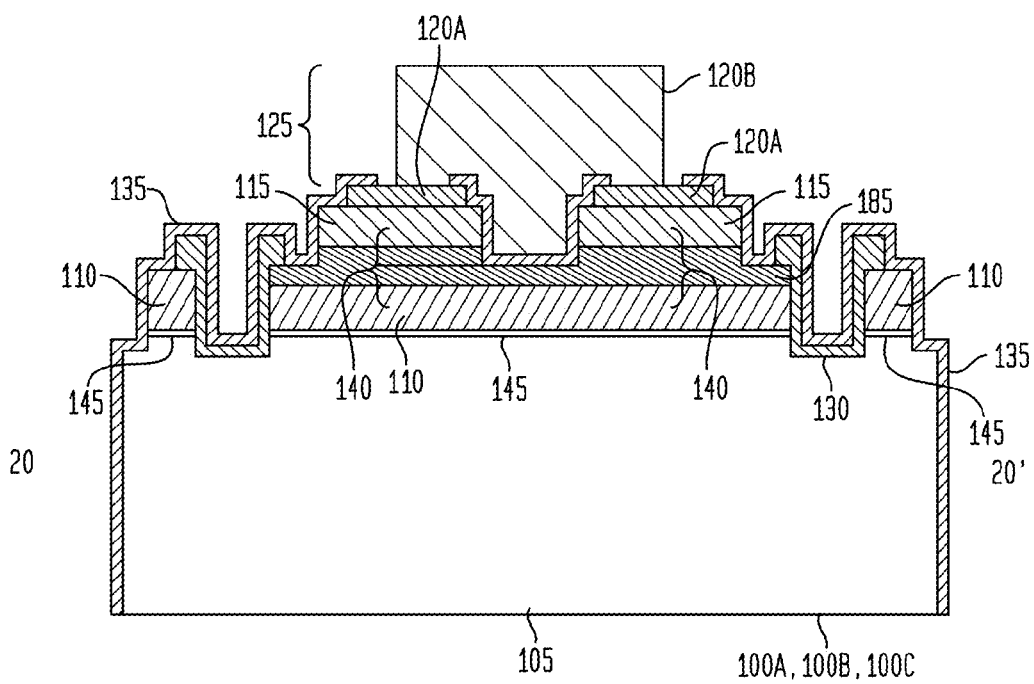
FIG. 10 is a cross-sectional view illustrating an exemplary second, third and/or fourth diode embodiment.
Figure 11:
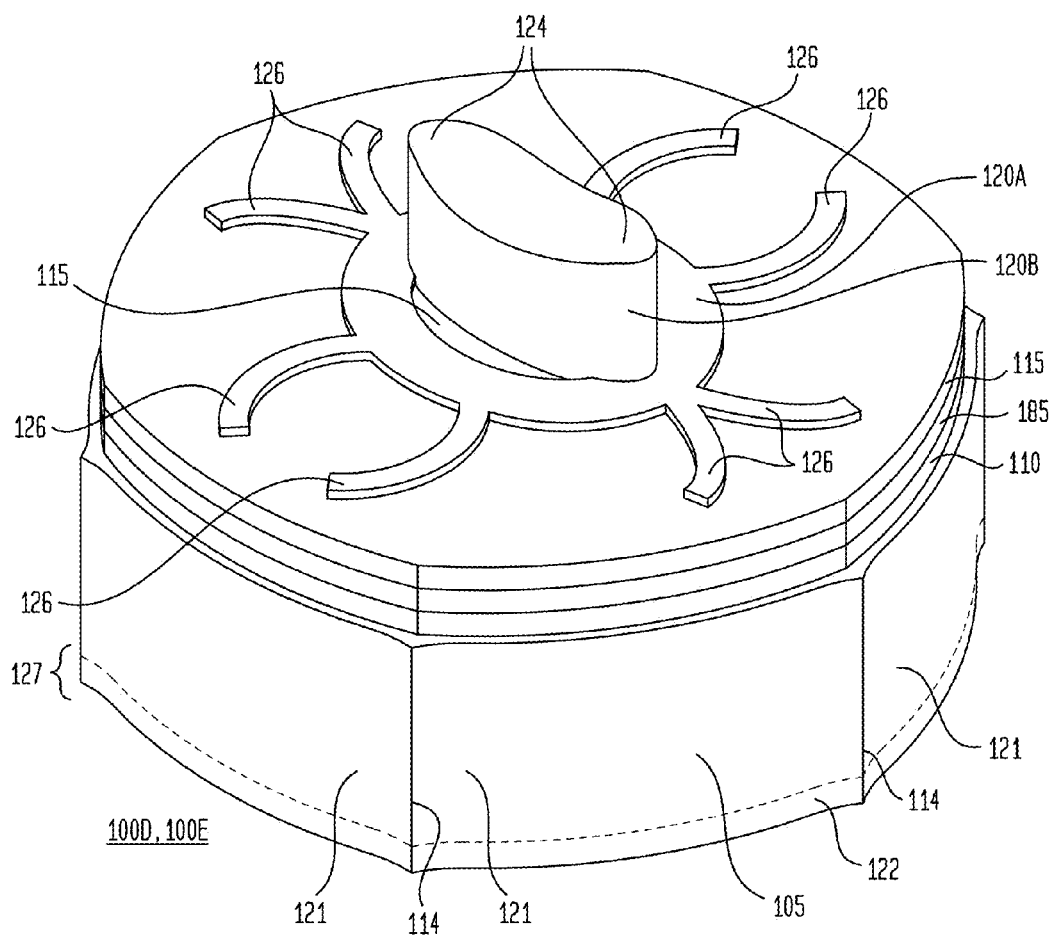
FIG. 11 is a perspective view illustrating exemplary fifth and sixth diode embodiments.
Figure 12:
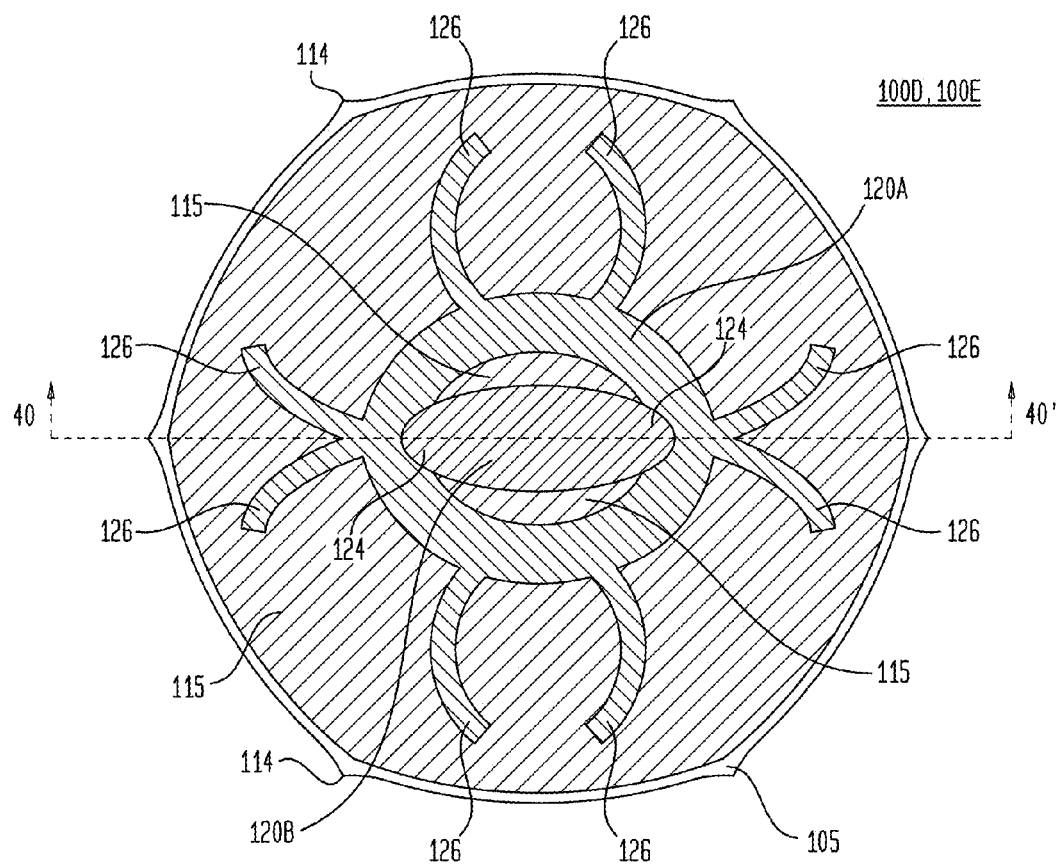
FIG. 12 is a plan (or top) view illustrating the exemplary fifth and sixth diode embodiments.
Figure 13:
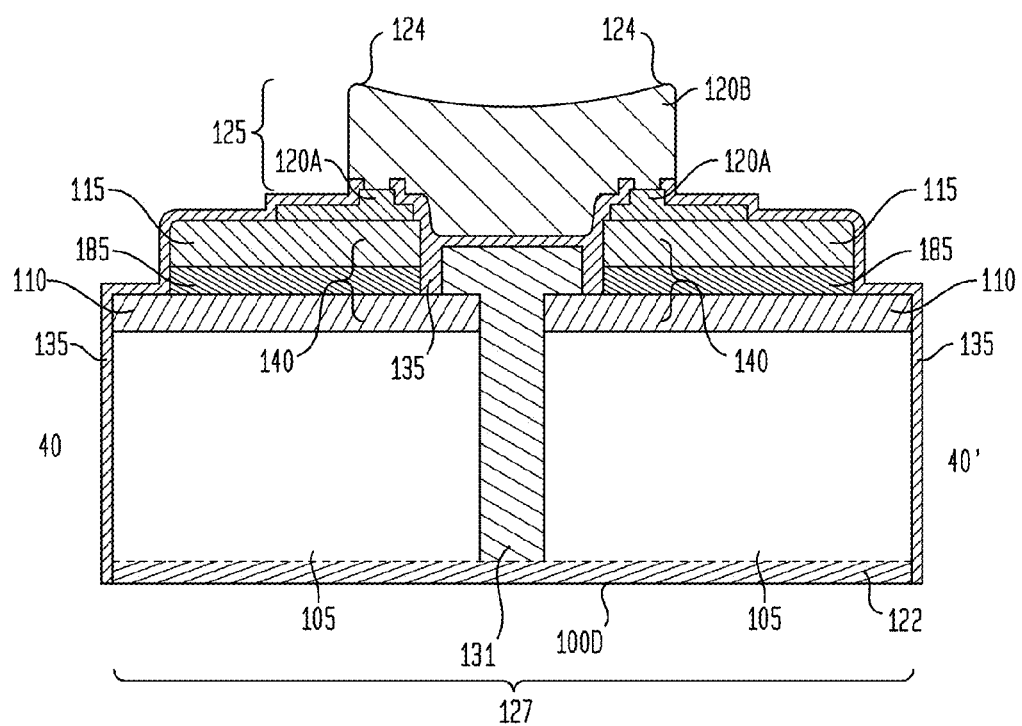
FIG. 13 is a cross-sectional view illustrating the exemplary fifth diode embodiment.
Figure 14:
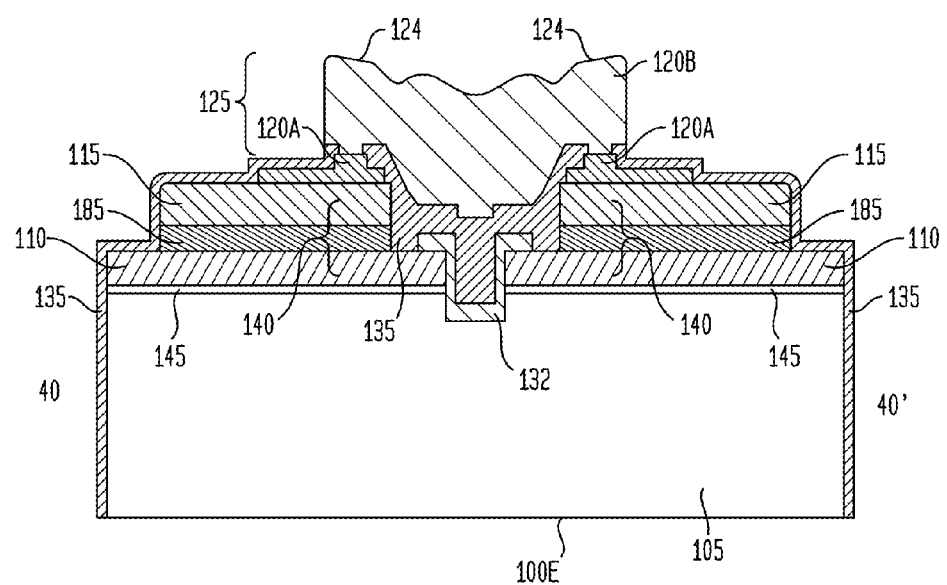
FIG. 14 is a cross-sectional view illustrating the exemplary sixth diode embodiment.
Figure 15:
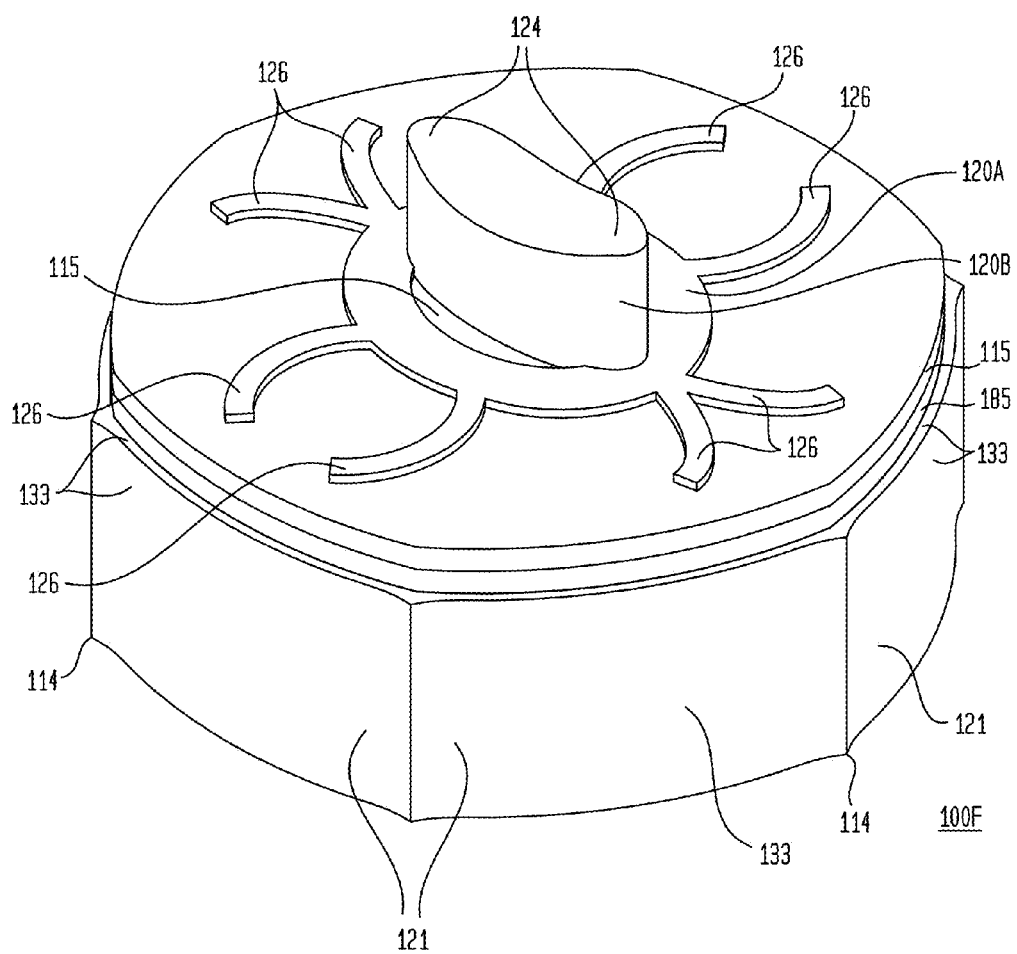
FIG. 15 is a perspective view illustrating an exemplary seventh diode embodiment.
Figure 16:
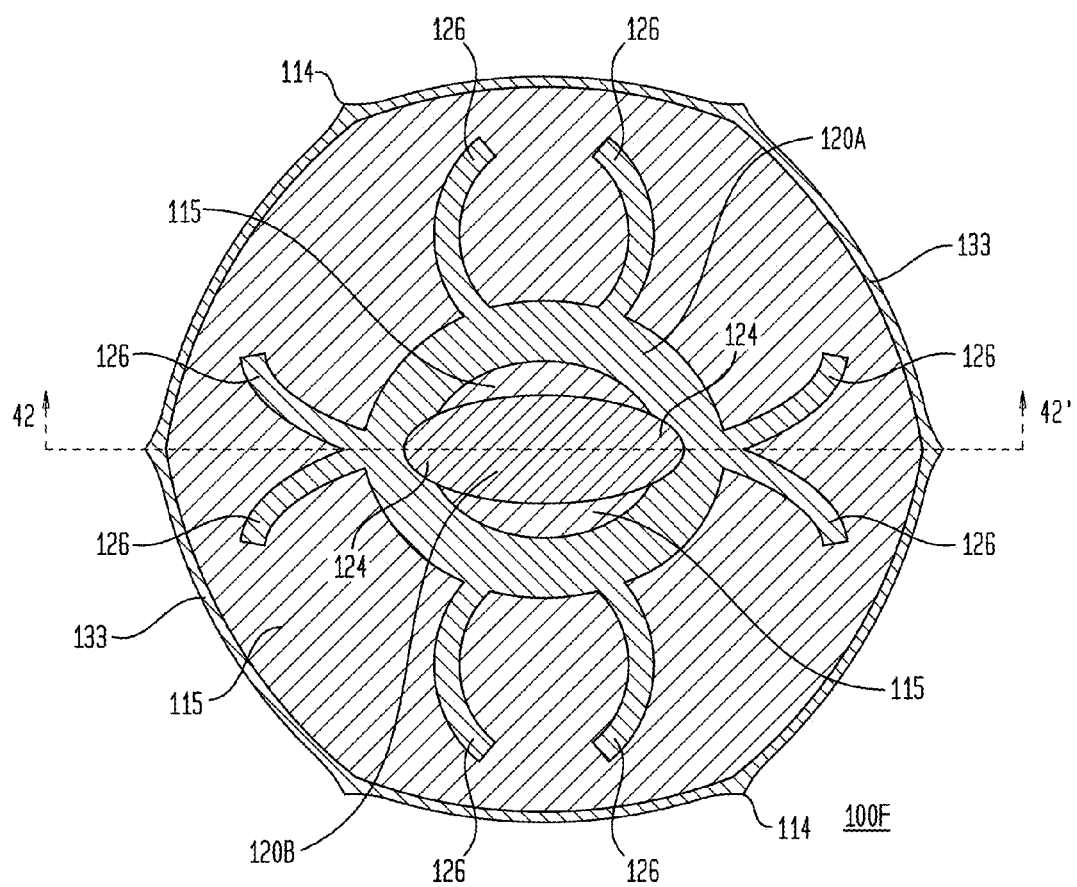
FIG. 16 is a plan (or top) view illustrating the exemplary seventh diode embodiment.
Figure 17:
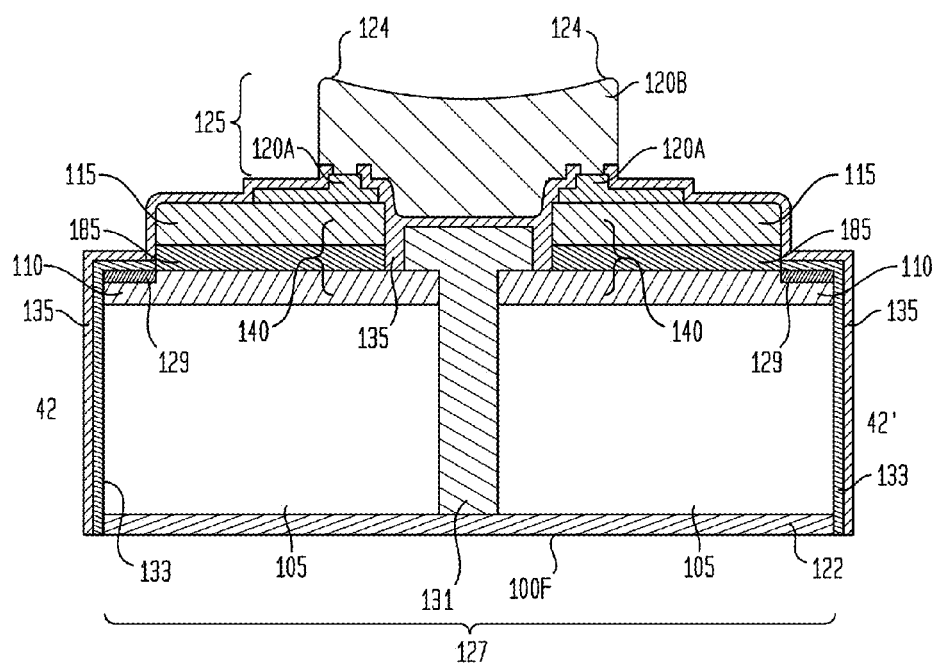
FIG. 17 is a cross-sectional view illustrating the exemplary seventh diode embodiment.
Figure 18:
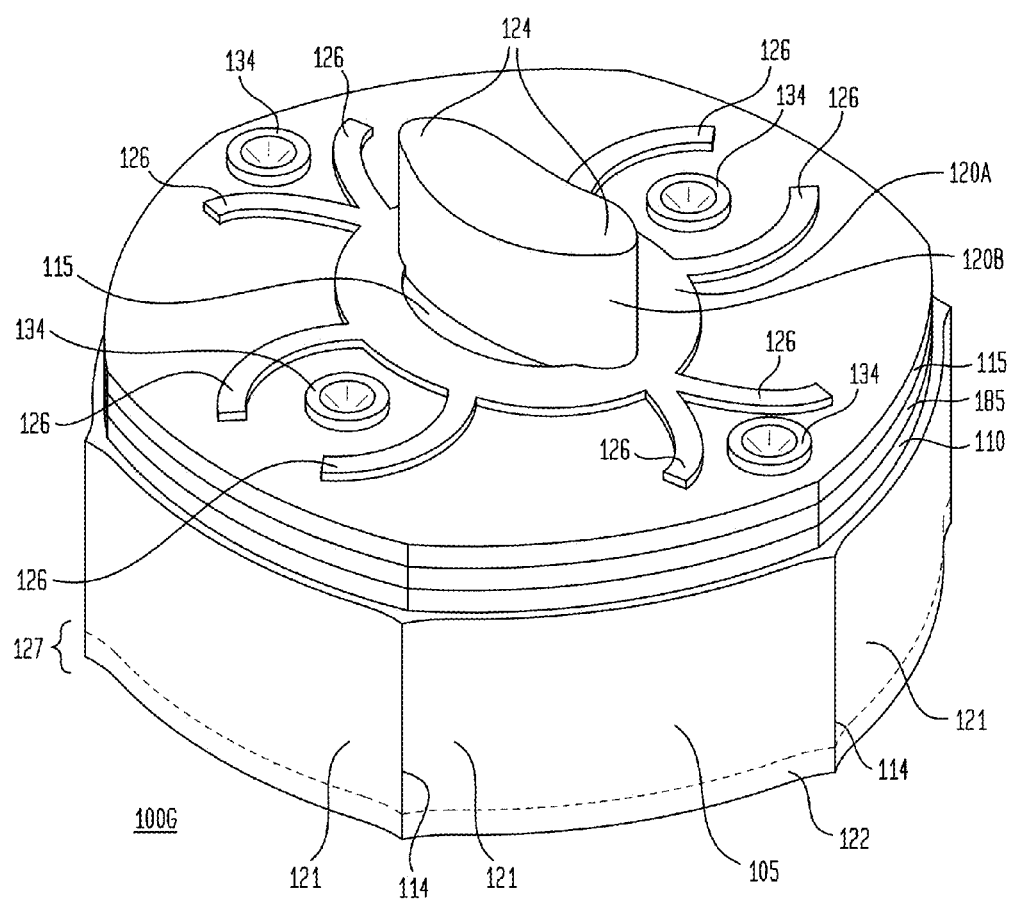
FIG. 18 is a perspective view illustrating an exemplary eighth diode embodiment.
Figure 19:
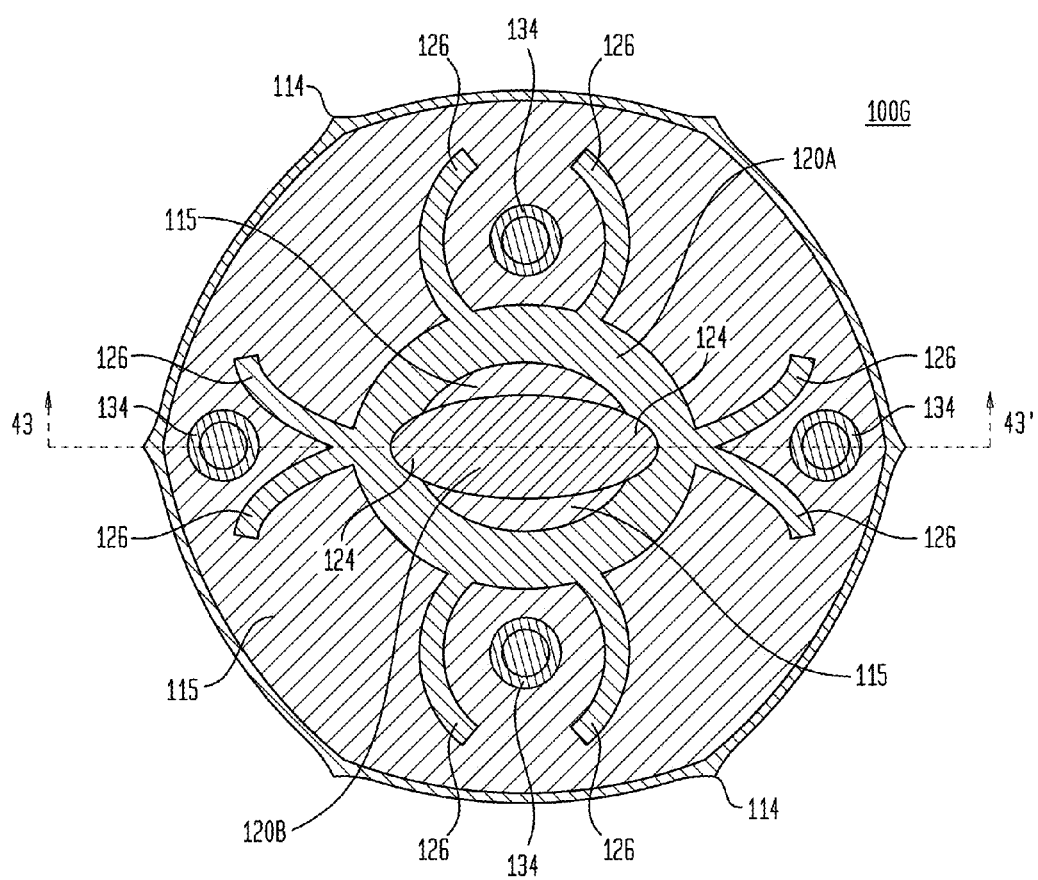
FIG. 19 is a plan (or top) view illustrating the exemplary eighth diode embodiment.
Figure 20:
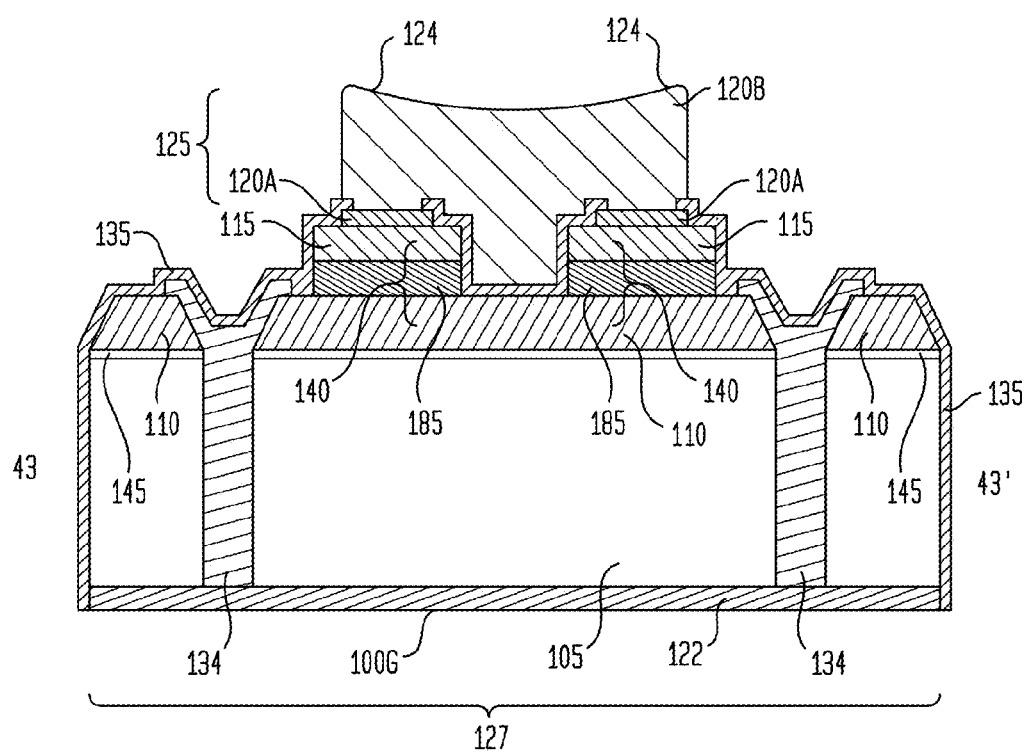
FIG. 20 is a cross-sectional view illustrating the exemplary eighth diode embodiment.
Figure 21:
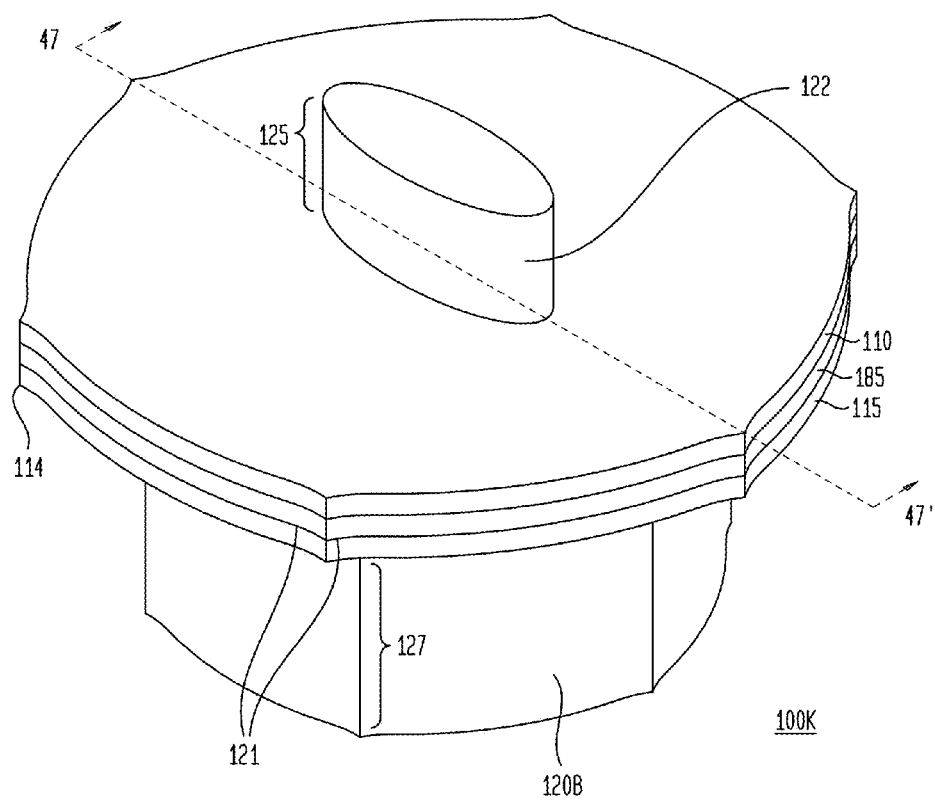
FIG. 21 is a perspective view illustrating an exemplary tenth diode embodiment.
Figure 22:
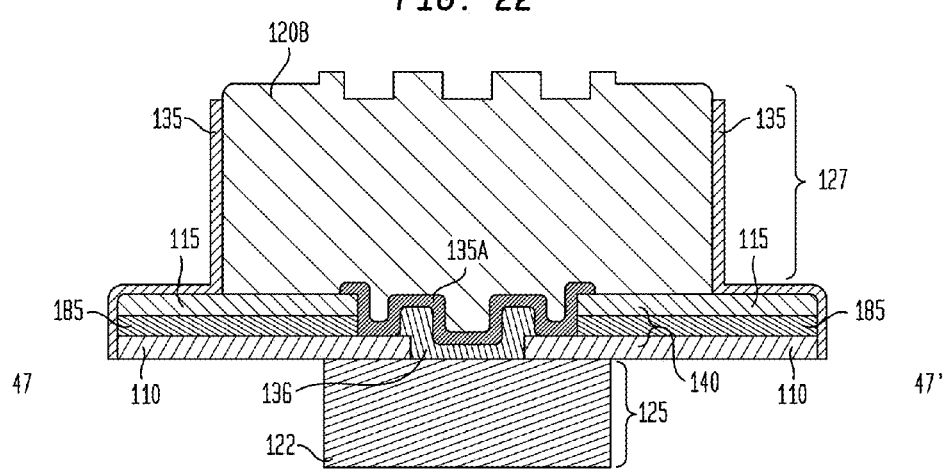
FIG. 22 is a cross-sectional view illustrating the exemplary tenth diode embodiment.
Figure 23:
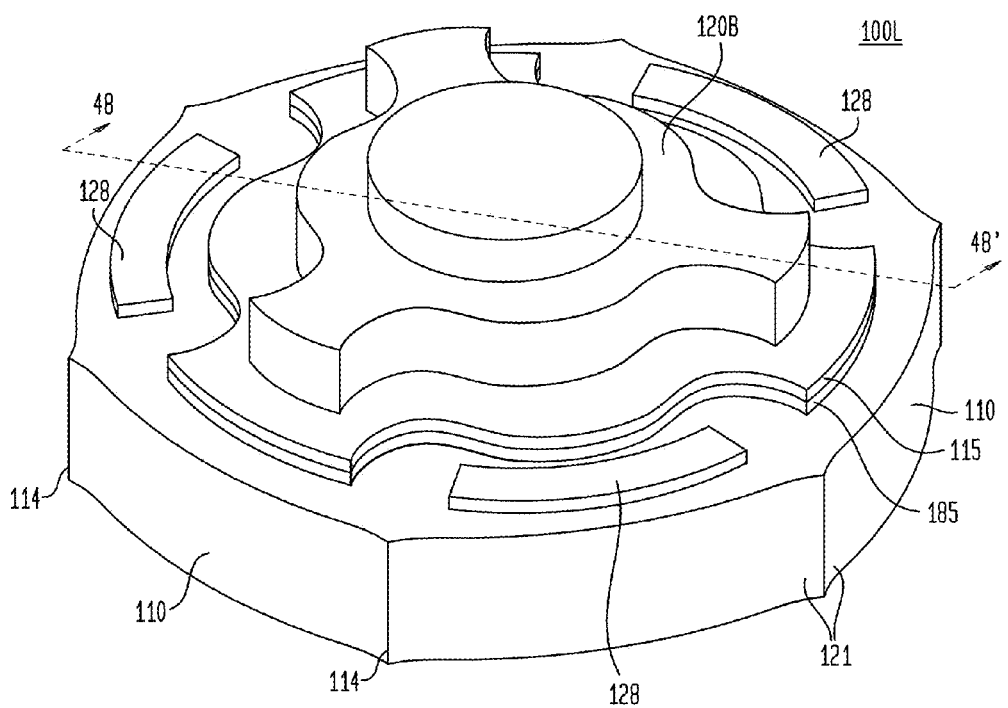
FIG. 23 is a perspective view illustrating an exemplary eleventh diode embodiment.
Figure 24:
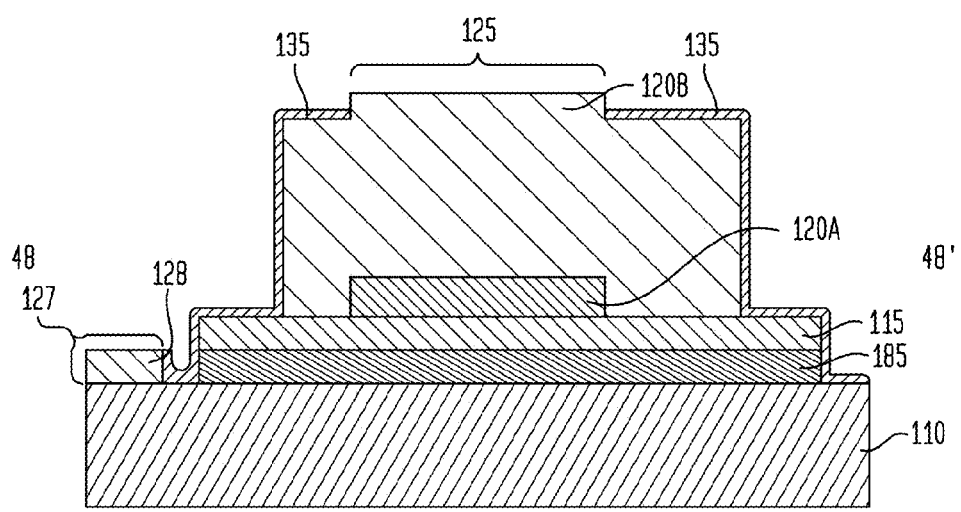
FIG. 24 is a cross-sectional view illustrating the exemplary eleventh diode embodiment.
Figure 44:
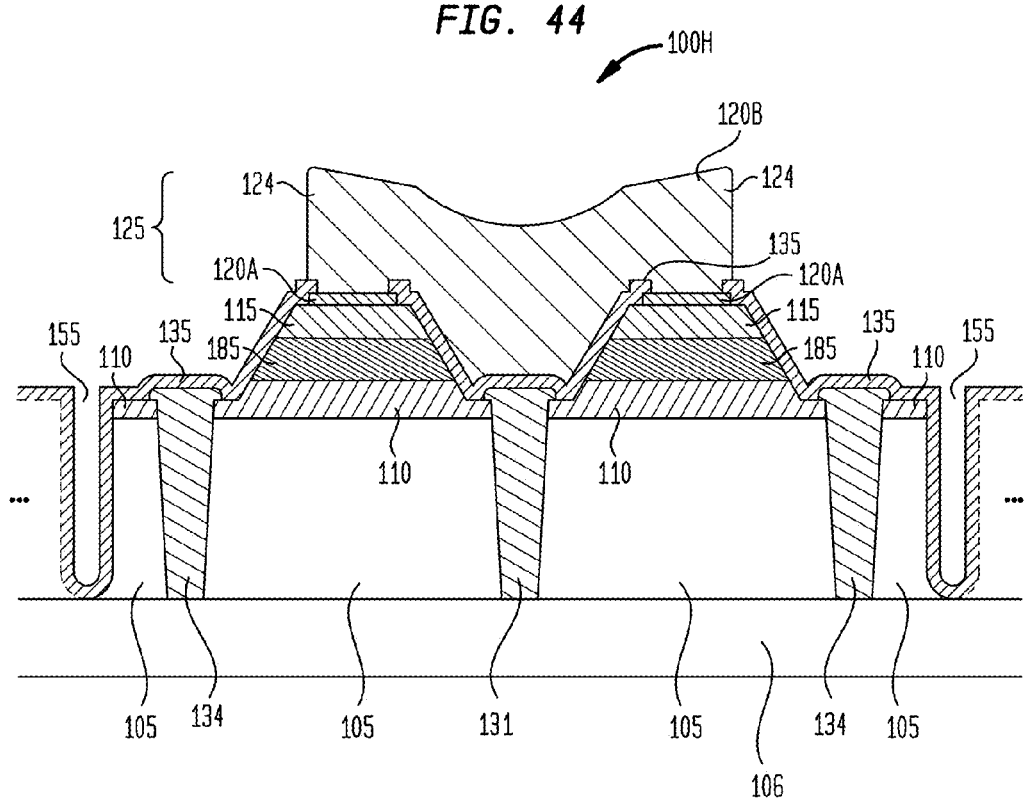
FIG. 44 is a cross-sectional view of a substrate having a mesa-etched complex GaN heterostructure, metallization forming an ohmic contact with the n+ GaN layer and forming through vias, metallization forming an ohmic contact with the p+ GaN layer, lateral etched trenches, passivation layers (such as silicon nitride), and metallization forming a protruding or bump structure.
Figure 50:
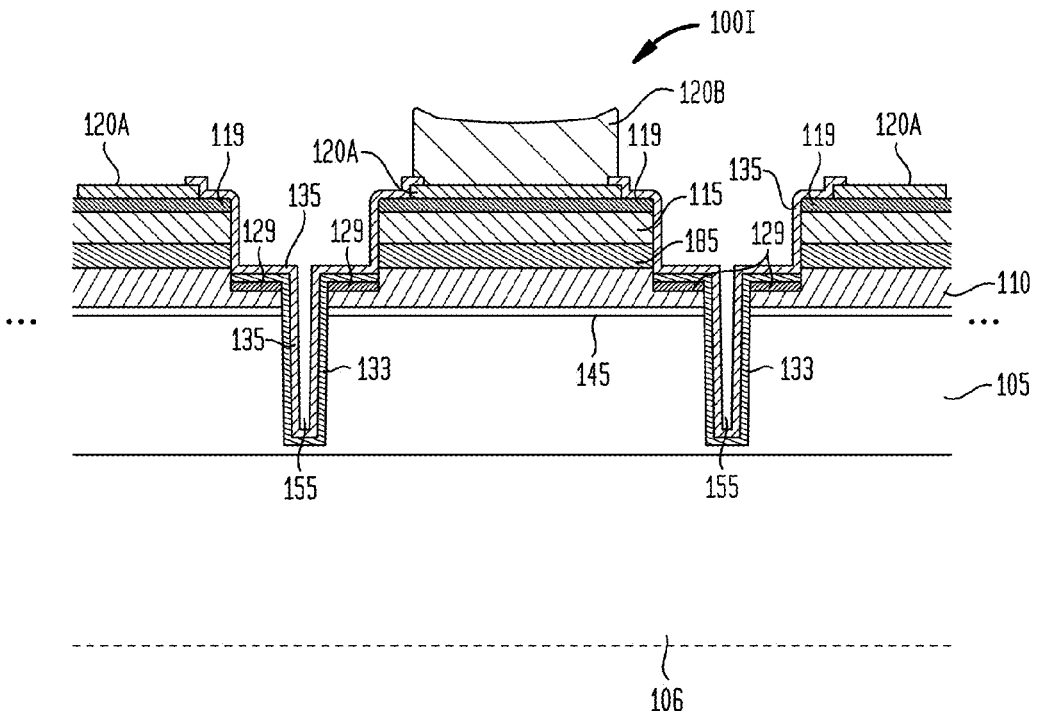
FIG. 50 is a cross-sectional view of a substrate having a buffer layer, a mesa-etched complex GaN heterostructure, metallization forming an ohmic contact with the p+ GaN layer, metallization forming an ohmic contact with the n+ GaN layer, and lateral etched trenches having metallization forming through, perimeter vias, passivation layers (such as silicon nitride), and metallization forming a protruding or bump structure.
Figure 110:
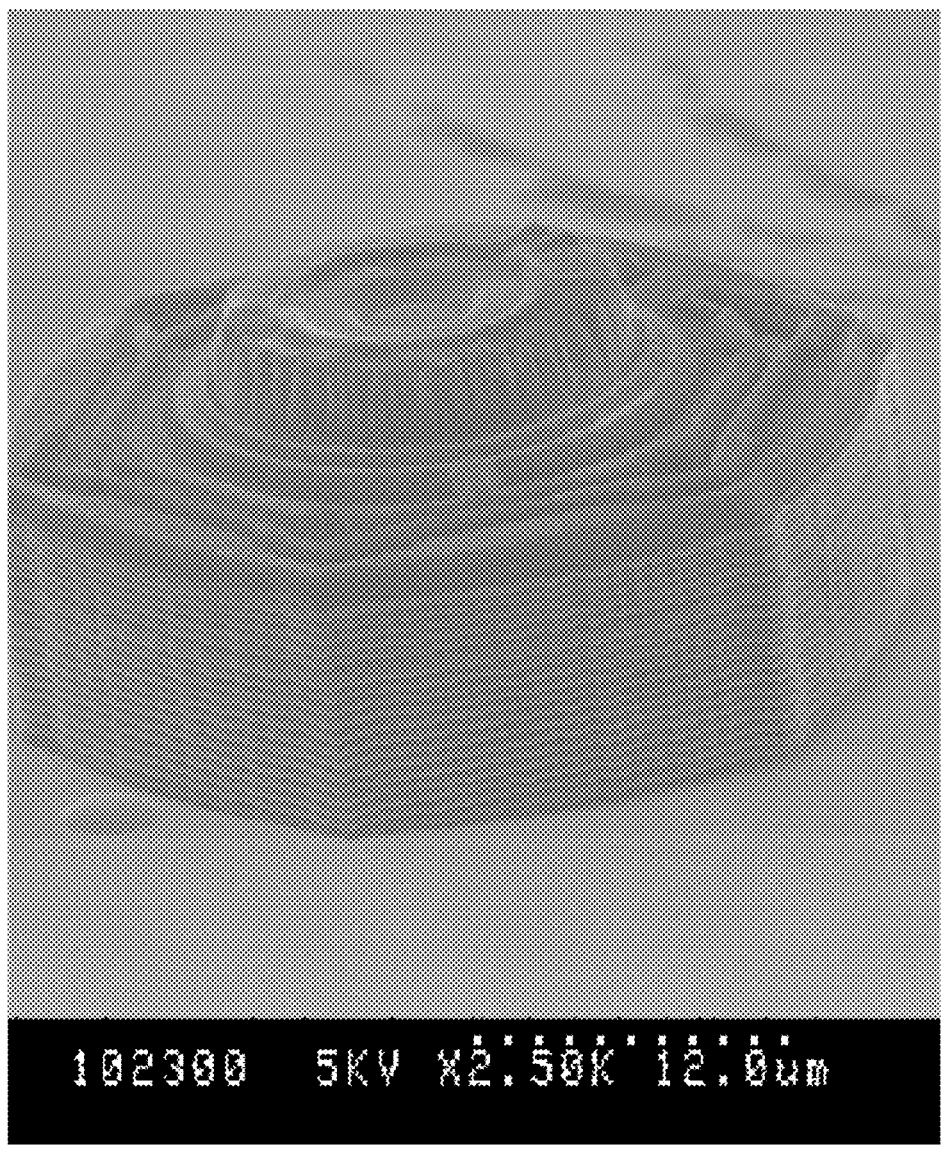
FIG. 110 is a scanning electron micrograph of an exemplary second diode embodiment.
Figure 111:
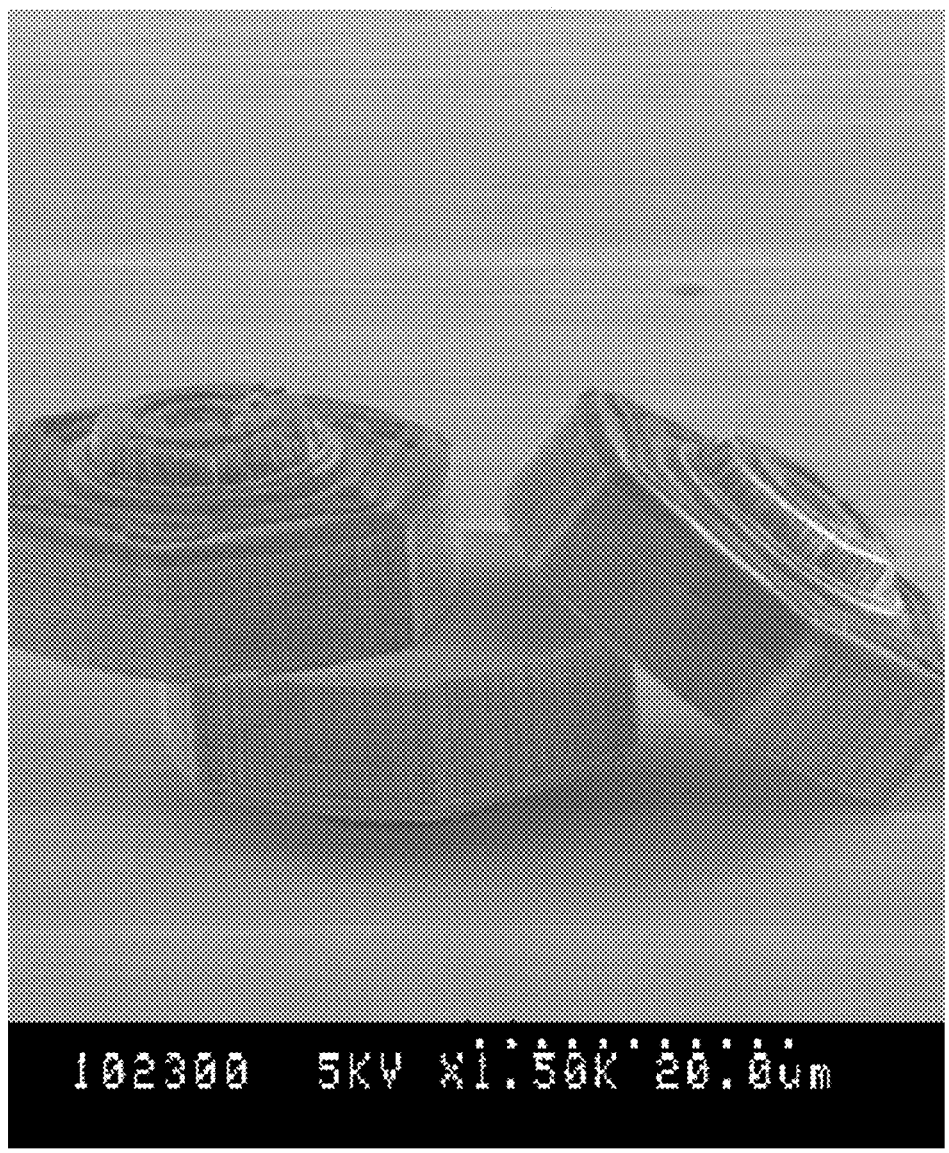
FIG. 111 is a scanning electron micrograph of a plurality of exemplary second diode embodiments.

FIG. 1 is a perspective view illustrating an exemplary first diode 100 embodiment. FIG. 2 is a plan (or top) view illustrating the exemplary first diode 100 embodiment. FIG. 3 is a cross-sectional view (through the 10-10' plane of FIG. 2) illustrating the exemplary first diode 100 embodiment. FIG. 4 is a perspective view illustrating an exemplary second diode 100A embodiment. FIG. 5 is a plan (or top) view illustrating the exemplary second diode 100A embodiment. FIG. 6 is a perspective view illustrating an exemplary third diode 100B embodiment. FIG. 7 is a plan (or top) view illustrating the exemplary third diode 100B embodiment. FIG. 8 is a perspective view illustrating an exemplary fourth diode 100C embodiment. FIG. 9 is a plan (or top) view illustrating the exemplary fourth diode 100C embodiment. FIG. 10 is a cross-sectional view (through the 20-20' plane of FIGS. 5, 7, 9) illustrating exemplary second, third and/or fourth diode 100A, 100B, 100C embodiments. FIG. 11 is a perspective view illustrating exemplary fifth and sixth diode 100D, 100E embodiments. FIG. 12 is a plan (or top) view illustrating the exemplary fifth and sixth diode 100D, 100E embodiments. FIG. 13 is a cross-sectional view (through the 40-40' plane of FIG. 12) illustrating the exemplary fifth diode 100D embodiment. FIG. 14 is a cross-sectional view (through the 40-40' plane of FIG. 12) illustrating the exemplary sixth diode 100E embodiment. FIG. 15 is a perspective view illustrating an exemplary seventh diode 100F embodiment. FIG. 16 is a plan (or top) view illustrating the exemplary seventh diode 100F embodiment. FIG. 17 is a cross-sectional view (through the 42-42' plane of FIG. 16) illustrating the exemplary seventh diode 100F embodiment. FIG. 18 is a perspective view illustrating an exemplary eighth diode 100G embodiment. FIG. 19 is a plan (or top) view illustrating the exemplary eighth diode 100G embodiment. FIG. 20 is a cross-sectional view (through the 43-43' plane of FIG. 19) illustrating the exemplary eighth diode 100G embodiment. FIG. 21 is a perspective view illustrating an exemplary tenth diode 100K embodiment. FIG. 22 is a cross-sectional view (through the 47-47' plane of FIG. 21) illustrating the exemplary tenth diode 100K embodiment. FIG. 23 is a perspective view illustrating an exemplary eleventh diode 100L embodiment. FIG. 24 is a cross-sectional view (through the 48-48' plane of FIG. 23) illustrating the exemplary eleventh diode 100L embodiment. Cross-sectional views of ninth, twelfth and thirteenth diode 100H, 100I, and 100J embodiments are illustrated in FIGS. 44, 50, and 66, respectively, as part of illustrations of exemplary fabrication processes. FIG. 110 is a scanning electron micrograph of an exemplary second diode 100A embodiment. FIG. 111 is a scanning electron micrograph of a plurality of exemplary second diode 100A embodiments.

In the perspective and plan (or top) view diagrams, FIGS. 1, 2, 4-9, 11, 12, 15, 16, 18, 19, 21 and 23, illustration of an outer passivation layer 135 has been omitted in order to provide a view of other underlying layers and structures which would otherwise be covered by such a passivation layer 135 (and therefore not visible). The passivation layer 135 is illustrated in the cross-sectional views of FIGS. 3, 10, 13, 14, 17, 20, 22, 24, 44, 50, 57, 62, 63, and 66-69, and those having skill in the electronic arts will recognize that fabricated diodes 100-100L generally will include at least one such passivation layer 135. In addition, referring to FIGS. 1-69, 74, 76-85, and 87-103, those having skill in the art will also recognize that the various Figures are for purposes of description and explanation, and are not drawn to scale.

As described in greater detail below, the exemplary first through thirteenth diode embodiments 100-100L differ primarily in the shapes, materials, doping and other compositions of the substrates 105 and wafers 150, 150A which may be utilized; the fabricated shape of the light emitting region of the diode; the depth and locations of vias (130, 131, 132, 133, 134, 136) (such as shallow or "blind", deep or "through", center, peripheral, and perimeter); having a first terminal 125 or both a first and second terminal 125, 127 on a first (top or front) side; the use and size of back-side (second side) metallization (122) to form a first terminal 125 or a second terminal 127; the shapes, extent and locations of other contact metals; and may also differ in the shapes or locations of other features, as described in greater detail below. Exemplary methods and method variations for fabricating the exemplary diodes 100-100L are also described below. One or more of the exemplary diodes 100-100L are also available from and may be obtained through NthDegree Technologies Worldwide, Inc. of Tempe, Ariz., USA.

Referring to FIGS. 1-24, exemplary diodes 100-100L are formed using a substrate 105, such as a heavily-doped n+ (n plus) or p+ (p plus) substrate 105, e.g., a heavily doped n+ or p+ silicon substrate, which may be a silicon wafer or may be a more complex substrate or wafer, such as comprising a silicon substrate (105) on insulator ("SOI"), or a gallium nitride (GaN) substrate 105 on a sapphire (106) wafer 150A (illustrated in FIGS. 11-20), for example and without limitation. Other types of substrates (and/or wafers forming or having a substrate) 105 may also be utilized equivalently, including Ga, GaAs, GaN, SiC, $SiO_2$, sapphire, organic semiconductor, etc., for example and without limitation, and as discussed in greater detail below. Accordingly, reference to a substrate 105 or 105A should be understood broadly to also include any types of substrates, such as n+ or p+ silicon, n+ or p+ GaN, such as a n+ or p+ silicon substrate formed using a silicon wafer 150 or the n+ or p+ GaN fabricated on a sapphire wafer 105A (described below with reference to FIGS. 11-20 and 38-50). In the embodiments illustrated in FIGS. 21-24, negligible to no substrate 105, 105A (and buffer layer 145) has remained following substrate removal during fabrication (leaving a complex GaN heterostructure in place, discussed in greater detail below), and either substrate 105, 105A may be utilized, for example and without limitation. When embodied using silicon, the substrate 105 typically has a <111> or <110> crystal structure or orientation, although other crystalline structures may be utilized equivalently. An optional buffer layer 145 is typically fabricated on a silicon substrate 105, such as aluminum nitride or silicon nitride, to facilitate subsequent fabrication of GaN layers having a different lattice constant.

GaN layers are fabricated over the buffer layer 145, such as through epitaxial growth, to form a complex GaN heterostructure, illustrated generally as n+ GaN layer 110, quantum well region 185, and p+ GaN layer 115. In other embodiments, a buffer layer 145 is not or may not be utilized, such as when a complex GaN heterostructure (n+ GaN layer 110, quantum well region 185, and p+ GaN layer 115) is fabricated over a GaN substrate 105 (or directly over a sapphire (106) wafer 105A), as illustrated in FIGS. 15-17 as a more specific option. Those having skill in the electronic arts will understand that there may by many quantum wells within and potentially multiple p+, n+, other GaN layers with a wide variety of dopants, and possibly non-GaN layers with any of various dopants, to form a light emitting (or light absorbing) region 140, with n+ GaN layer 110, quantum well region 185, and p+ GaN layer 115 being merely illustrative and providing a generalized or simplified description of a complex GaN heterostructure or any other semiconductor structure forming one or more light emitting (or light absorbing) regions 140. Those having skill in the electronic arts will also understand that the locations of the n+ GaN layer 110 and p+ GaN layer 115 may be the same or may be reversed equivalently, such as for use of a p+ silicon or GaN substrate 105, and that other compositions and materials may be utilized to form one or more light emitting (or light absorbing) regions 140 (many of which are described below), and all such variations are within the scope of the disclosure. While described with reference to GaN as a set of exemplary materials with different compounds, dopants and structures to form a light emitting or absorbing region 140, those having skill in the art will recognize that any other suitable semiconductor material may be utilized equivalently and is within the scope of the disclosure. In addition, those having skill in the art will recognize that any reference to GaN should not be construed as "pure" GaN but will be understood to mean and include all of the various other compounds, dopants and layers that may be utilized to form a light emitting or absorbing region 140 and/or which allow a light emitting or absorbing region 140 to be deposited, including any intermediate non-GaN layers.

It should also be noted that while many of the various diodes (of diodes 100-100L) are discussed in which silicon and GaN may be or are the selected semiconductors, other inorganic or organic semiconductors may be utilized equivalently and are within the scope of the disclosure. Examples of inorganic semiconductors include, without limitation: silicon, germanium, and mixtures thereof titanium dioxide, silicon dioxide, zinc oxide, indium-tin oxide, antimony-tin oxide, and mixtures thereof; II-VI semiconductors, which are compounds of at least one divalent metal (zinc, cadmium, mercury and lead) and at least one divalent non-metal (oxygen, sulfur, selenium, and tellurium) such as zinc oxide, cadmium selenide, cadmium sulfide, mercury selenide, and mixtures thereof; III-V semiconductors, which are compounds of at least one trivalent metal (aluminum, gallium, indium, and thallium) with at least one trivalent non-metal (nitrogen, phosphorous, arsenic, and antimony) such as gallium arsenide, indium phosphide, and mixtures thereof and group IV semiconductors including hydrogen terminated silicon, carbon, germanium, and alpha-tin, and combinations thereof.

In addition to the GaN light emitting/absorbing region 140 (e.g., a GaN heterostructure deposited over a substrate 105 such as n+ or p+ silicon or deposited over GaN (105) on a silicon wafer 150 or sapphire (106) wafer 150A), the plurality of diodes 100-100L may be comprised of any type of semiconductor element, material or compound, such as silicon, gallium arsenide (GaAs), gallium nitride (GaN), or any inorganic or organic semiconductor material, and in any form, including GaP, InAlGaP, InAlGaP, AlInGaAs, InGaNAs, AlInGASb, also for example and without limitation. Also in addition, the wafer utilized to fabricate the two-terminal integrated circuits also may be of any type or kind, such as silicon, GaAs, GaN, sapphire, silicon carbide, also for example and without limitation.

The scope of this disclosure, therefore, should be understood to encompass any epitaxial or compound semiconductor on a semiconductor substrate, including without limitation any LED or photovoltaic semiconductor fabricated using a semiconductor substrate, of any kind, which is known or becomes known in the art.

In various exemplary embodiments, the n+ or p+ substrate 105 conducts current, which flows to the n+ GaN layer 110 as illustrated. Again, it should be noted that any of the various illustrated layers of the light emitting or absorbing region 140 equivalently may be reversed or ordered differently, such as reversing the locations of the illustrated n+ and p+ GaN layers 110, 115. The current flow path is also through a metal layer forming one or more vias (130) (which may also be utilized to provide an electrical bypass of a very thin (about 25 Angstroms) buffer layer 145 between the n+ or p+ substrate 105 and the n+ GaN layer 110). Additional types of vias 131-134 and 136 which provide other connections to conductive layers are described below. One or more metal layers 120, illustrated as two (or more) separately deposited metal layers 120A and 120B (which also may be used to form vias (130, 131, 132, 133, 134, 136)) provides an ohmic contact with the p+ GaN layer 115, with the second additional metal layer 120B such as die metal utilized to form a "bump" or protruding structure, with metal layers 120A, 120B forming a first electrical terminal (or contact) 125 or second terminal 127 for various diodes 100-100L. Additional metal layers may also be utilized as discussed below. For the illustrated exemplary diode 100, 100A, 100B, 100C embodiments, electrical terminal 125 may be the only ohmic, metallic terminal formed on the diodes 100, 100A, 100B, 100C during fabrication for subsequent power (voltage) delivery (for LED applications) or reception (for photovoltaic applications), with the n+ or p+ substrate 105 utilized to provide the second electrical terminal for a diode 100, 100A, 100B, 100C for power delivery or reception. It should be noted that electrical terminal 125 and the n+ or p+ substrate 105 are on opposing sides, top (first side) and bottom (or back, second side) respectively, and not on the same side, of a diode 100, 100A, 100B, 100C. As an option for these diode 100, 100A, 100B, 100C embodiments and as illustrated for other exemplary diode embodiments, an optional, second ohmic, metallic terminal 127 is formed using metallic layer 122 on the second, back side of a diode (e.g., diode 100D, 100F, 100G, 100J). As an option for the diode 100K embodiment, illustrated in FIGS. 21 and 22, a first ohmic, metallic terminal 125 is formed using metallic layer 122 on the second, back side of a diode 100K, with the diode 100K then flipped over or inverted for use. As another option, illustrated in FIGS. 23 and 24 for exemplary diode 100L, first terminal 125 and second terminal 127 are both on the same, first (top) side of the diode 100L. Silicon nitride passivation 135 (or any other equivalent passivation) is utilized, among other things, for electrical insulation, environmental stability, and possibly additional structural integrity. Not separately illustrated, a plurality of trenches 155 were formed during fabrication along the lateral sides of the diodes 100-100L, as discussed below, which are utilized both to separate the diodes 100-100L from each other on a wafer 150, 150A (singulate), and to separate the diodes 100-100L from the remainder of the wafer 150, 150A.

FIGS. 1-24 also illustrate some of the various shapes and form factors of the one or more light emitting (or light absorbing) regions 140, illustrated as a GaN heterostructure (n+ GaN layer 110, quantum well region 185, and p+ GaN layer 115) and the various shapes and form factors of the substrate 105 and/or complex GaN heterostructure. Also as illustrated, while an exemplary diode 100-100L is substantially hexagonal in the x-y plane (with curved or arced lateral sides 121, concave or convex (or both, forming a more complex sigmoidal shape), as discussed in greater detail below), to provide greater device density per silicon wafer, other diode shapes and forms are considered equivalent and within the scope of the claimed invention, such as square, round, oval, elliptical, rectangular, triangular, octagonal, circular, etc. Also as illustrated in the exemplary embodiments, the hexagonal lateral sides 121 may also be curved or arced slightly, such as convex (FIGS. 1, 2, 4, 5) or concave (FIGS. 6-9), such that when released from the wafer and suspended in liquid, the diodes 100-100L may avoid adhering or sticking to one another. In addition, for apparatus 300, 300A, 300B, 300C, 300D, 700, 700A, 700B, 720, 730, 740, 750, 760, 770 fabrication, the relatively small thickness of the diodes 100-100L is utilized to prevent individual die (individual diodes 100-100L) from standing on their lateral sides or edges (121). Also as illustrated in the exemplary embodiments, the hexagonal lateral sides 121 may also be curved or arced slightly, to be both convex about the center or central portion of each side 121 and concave peripherally/laterally to form a more complex sigmoidal shape (overlapping double "S" shape) resulting in comparatively pointed or projecting vertices 114 (FIGS. 11-24), such that when released from the wafer and suspended in liquid, the diodes 100-100L also may avoid adhering or sticking to one another and may push off one another when rolling or moving against another diode). The variations from a flat surface topology for the diodes 100-100L (i.e., a non-flat surface topology) also helps to prevent the die from adhering to one another when suspended in a liquid or gel. Again, also for apparatus 300, 300A, 300B, 300C, 300D, 700, 700A, 700B, 720, 730, 740, 750, 760, 770 fabrication, the relatively small thickness or height of the diodes 100-100L (or of the light emitting regions for diodes 100K and 100L) (in comparison to their lateral dimensions (diameters or widths/lengths), tends to prevent individual die (individual diodes 100-100L) from standing on their lateral sides or edges (121).

Various shapes and form factors of the light emitting (or light absorbing) regions 140 (n+ GaN layer 110, quantum well region 185 and p+ GaN layer 115) are also illustrated, with FIGS. 1-3 illustrating a substantially circular or disk-shaped light emitting (or light absorbing) region 140 (n+ GaN layer 110, quantum well region 185 and p+ GaN layer 115), and with FIGS. 4 and 5 illustrating a substantially torus-shaped (or toroidal) light emitting (or light absorbing) region 140 (n+ GaN layer 110, quantum well region 185 and p+ GaN layer 115) with the second metal layer 120B extending into the center of the toroid (and potentially providing a reflective surface). In FIGS. 6 and 7, the light emitting (or light absorbing) region 140 (n+ GaN layer 110, quantum well region 185 and p+ GaN layer 115) has a substantially circular inner (lateral) surface and a substantially lobed outer (lateral) surface, while in FIGS. 8 and 9, the light emitting (or light absorbing) region 140 (n+ GaN layer 110, quantum well region 185 and p+ GaN layer 115) also has a substantially circular inner (lateral) surface while the outer (lateral) surface is substantially stellate- or star-shaped. In FIGS. 11-24, the one or more light emitting (or light absorbing) regions 140 have a substantially hexagonal (lateral) surface (which may or may not extend to the perimeter of the die) and may have (at least partially) a substantially circular or elliptical inner (lateral) surface. In other exemplary embodiments not separately illustrated, there may be multiple light emitting (or light absorbing) regions 140, which may be continuous or which may be spaced apart on the die. These various configurations of the one or more light emitting (or light absorbing) regions 140 (n+ GaN layer 110, quantum well region 185 and p+ GaN layer 115) having a circular inner surface may be implemented to increase the potential for light output (for LED applications) and light absorption (for photovoltaic applications). As discussed in greater detail below, the interior and/or exterior surfaces of any of the n+ GaN layers 110 or p+ GaN layers 115 may also have any of various surface textures or surface geometries, for example and without limitation.

In an exemplary embodiment, the first terminal 125 (or second terminal 127 for diode 100K) is comprised of one or more metal layers 120A, 120B and has a bump or protruding structure, to allow a significant portion of a diode 100-100L to be covered by one or more insulating or dielectric layers (following formation of an electrical contact by a first conductor 310 or 310A to the n+ or p+ silicon substrate 105 (or to a second terminal formed by metal layer 122, or to a second terminal formed by a metal layer 128)), while simultaneously providing sufficient structure for contact with the electrical terminal 125 by one or more other conductive layers, such as a second conductor 320 discussed below. In addition, the bump or protruding structure of terminal 125 potentially may also be one of a plurality of factors affecting rotation of a diode 100-100L within the diode ink and its subsequent orientation (top up (forward bias) or bottom up (reverse bias)) in a fabricated apparatus 300, 300A, 300B, 300C, 300D, 700, 700A, 700B, 720, 730, 740, 750, 760, 770 in addition to the curvature of the lateral sides 121 and the thickness (height) of the lateral sides 121.

Referring to FIGS. 11-22, exemplary diodes 100D, 100E, 100F, 100G, 100K, in various combinations, illustrate several additional and optional features. As illustrated, metal layer 120B forming a bump or protruding structure typically fabricated of die metal is substantially elliptical (or oval) (and substantially hexagonal in FIG. 21) in its circumference rather than substantially circular in circumference, although other shapes and form factors of the terminal 125 are also within the scope of the disclosure. In addition, the metal layer 120B forming a bump or protruding structure may have two or more elongated extensions 124, which serve several additional purposes in apparatus 300, 300A, 300B, 300C, 300D, 700, 700A, 700B, 720, 730, 740, 750, 760, 770 fabrication, such as facilitating electrical contact formation with a second conductor 320 and facilitating flow of an insulating dielectric 315 (and/or first conductor 310) off of the terminal 125 (metal layer 120B or metal 122). The elliptical form factor also may allow for additional light emission (or absorption) from or to light emitting (or light absorbing) region 140 along the major axis sides of the elliptical metal layer 120B forming a bump or protruding structure. Metal layer 120A, forming an ohmic contact with p+ GaN layer 115, which also may be deposited as multiple layers in multiple steps, also has elongated extensions over p+ GaN layer 115 for selected embodiments, illustrated as curved metal contact extensions 126 in FIGS. 11, 12, 15, 16, 18 and 19, facilitating current conduction to the p+ GaN layer 115 while simultaneously allowing for (and not blocking excessively) the potential for light emission or light absorption by the light emitting (or light absorbing) regions 140. Innumerable other shapes of the metal contact extensions 126 may be utilized equivalently, such as a grid pattern, other curvilinear shapes, etc. While not separately illustrated, such elongated metal contact extensions may also be utilized in the other embodiments illustrated in FIGS. 1-10 and 21-24. Additional seed or reflective metal layers may also be utilized, as described in greater detail below.

Additional types of via structures (131, 132, 133, 134, 136) are also illustrated in FIGS. 11-22, in addition to the peripheral (i.e., off center), comparatively shallow or "blind" via 130 previously described which extends through the buffer layer 145 and into the substrate 105 but not comparatively deeply into or through the substrate 105 in the fabricated diode 100, 100A, 100B, 100C. As illustrated in FIG. 13 (and FIGS. 44, 66), a center (or centrally located), comparatively deep, "through" via 131 extends completely through the substrate 105, and is utilized to make an ohmic contact with the n+ GaN layer 110 and to conduct current (or otherwise make an electrical contact) between the second (back) side metal layer 122 and the n+ GaN layer 110. As illustrated in FIG. 22, a center (or centrally located), comparatively less deep or more shallow, "through" via 136 extends completely through the complex GaN heterostructure (115, 185, 110), and is utilized to make an ohmic contact with the n+ GaN layer 110 and to conduct current (or otherwise make an electrical contact) between the second (back) side metal layer 122 and the n+ GaN layer 110. As illustrated in FIG. 14, a center (or centrally located), comparatively shallow or blind via 132, also referred to as a "blind" via 132, extends through a buffer layer 145 and into the substrate 105, and it utilized to make an ohmic contact with the n+ GaN layer 110 and to conduct current (or otherwise make an electrical contact) between the n+ GaN layer 110 and the substrate 105. As illustrated in FIGS. 15-17 and 49-50, a perimeter, comparatively deep or through via 133 extends along the lateral sides 121 (although covered by passivation layer 135) from the n+ GaN layer 110 and to the second, back-side of the diode 100F, which in this embodiment also includes second (back) side metal layer 122, completely around the lateral sides of the substrate 105, and it utilized to make an ohmic contact with the n+ GaN layer 110 and to conduct current (or otherwise make an electrical contact) between the second (back) side metal layer 122 and the n+ GaN layer 110. As illustrated in FIGS. 18-20, a peripheral, comparatively deep, through via 134 extends completely through the substrate 105, and it utilized to make an ohmic contact with the n+ GaN layer 110 and to conduct current (or otherwise make an electrical contact) between the second (back) side metal layer 122 and the n+ GaN layer 110. In embodiments which do not utilize a second (back) side metal layer 122, such through via structures (131, 133, 134, 136) may be utilized to make an electrical contact with the conductor 310A (in an apparatus 300, 300A, 300B, 300C, 300D, 720, 730, 760) and to conduct current (or otherwise make an electrical contact) between the conductor 310A and the n+ GaN layer 110. These through via structures (131, 133, 134, 136) are exposed on the second, back side of a diode 110D, 100F, 100G, 100K during fabrication, following singulation of the diodes through either a back side grind and polish or laser lift off (discussed below with reference to FIGS. 64 and 65), and may be left exposed or may be covered by (and form an electrical contact with) second (back) side metal layer 122 (as illustrated in FIG. 66).

The through via structures (131, 133, 134, 136) are considerably narrower than typical vias known in the art. The through via structures (131, 133, 134) are on the order of about 7-9 microns deep (height extending through the substrate 105) (and through via structure 136 is on the order of about 2-4 microns deep (height extending through the complex GaN heterostructure) and about 3-5 microns wide, compared to about a 30 micron or greater width of traditional vias.

An optional second (back) side metal layer 122, forming a second terminal or contact 127 or a first terminal 125 (diode 100K), is also illustrated in FIGS. 11-13, 17, 18, 20-22, 66, and 68. Such a second terminal or contact 127, for example and without limitation, may be utilized to facilitate current conduction to the n+ GaN layer 110, such as through the various through via structures (131, 133, 134, 136), and/or to facilitate forming an electrical contact with the conductor 310A.

Referring to FIGS. 21-22, exemplary diode 100K illustrates several additional and optional features. FIG. 22 illustrates the fabrication layers in cross section, for how the exemplary diode 100K is fabricated; the exemplary diode 100K is then flipped over or inverted to be right side up as illustrated in FIG. 21, for use in exemplary apparatus 300, 300A, 300B, 300C, 300D, 720, 730, 760 embodiments, with light being emitted (in LED embodiments) through the upper n+ GaN layer 110. Accordingly, the first terminal 125 is formed from the second (back) side metal 122, the orientation of the n+ GaN layer 110 and p+ GaN layer 115 are similarly reversed (n+ GaN layer 110 now being the upper layer in FIG. 21) (compared to the other embodiments 100-100J), with the second terminal 127 formed from one or more metal layers 120B. Very little to no substrate 105, 105A or a buffer layer 145 are illustrated, having been substantially removed during fabrication, leaving the complex GaN heterostructure in place (p+ GaN layer 115, quantum well region 185, and p+ GaN layer 115), and potentially some additional GaN layer or substrate as well. The lateral sides or edges (121) are comparatively thinner (or less thick) than other illustrated embodiments, under 10 microns, or more particularly between about 2 to 8 microns, or more particularly between about 2 to 6 microns, or more particularly between about 2 to 4 microns, or more particularly 2.5 to 3.5 microns, or about 3 microns, in exemplary embodiments, also to prevent individual diodes 100K from standing on their lateral sides or edges (121) during apparatus 300, 300A, 300B, 300C, 300D, 720, 730, 760 fabrication.

Figure 25:
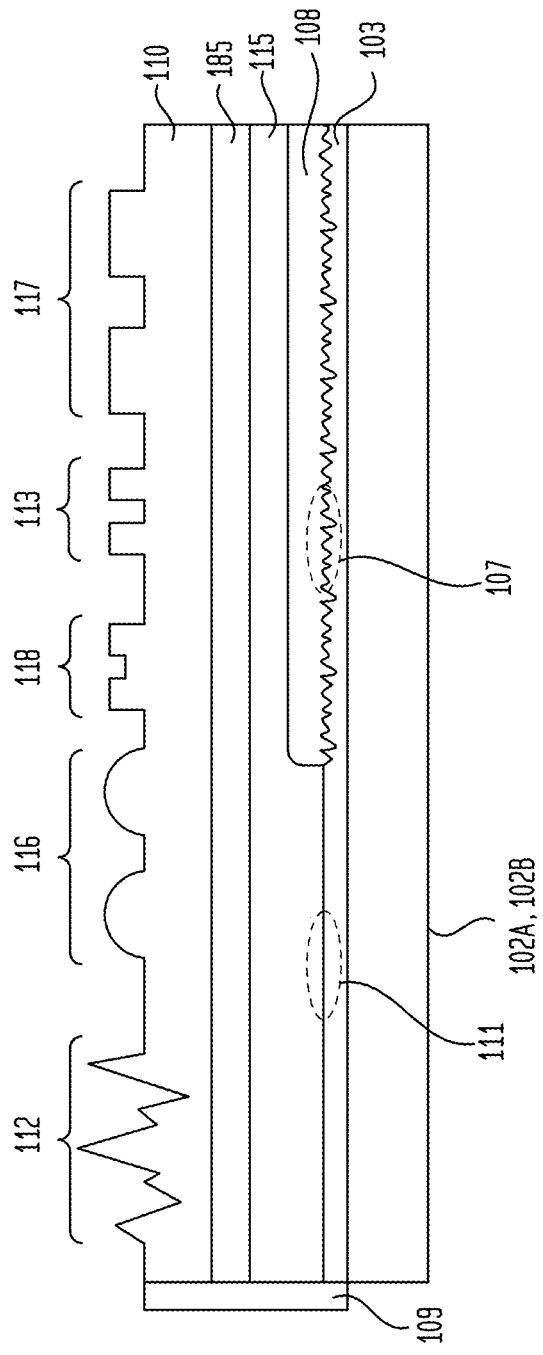
FIG. 25 is a cross-sectional view illustrating a portion of a complex GaN heterostructure and metal layers illustrating optional geometries and textures of the external and/or internal surfaces of the complex GaN heterostructure.

The second (back) side metal 122 forming the first terminal 125 is comparatively thick, between about 3 to 6 microns, or 4.5 to about 5.5 microns, or about 5 microns, to provide a height of the diode 100K between about 11 to 15 microns, or 12 to 14 microns, or about 13 microns, in exemplary embodiments, to allow for deposition of dielectric layers 315 and contact with a second conductor 320, and elliptically shaped, such as having a major axis about 14 microns and a minor axis about 6 microns, for example and without limitation. The second (back) side metal 122 forming the first terminal 125 also does not extend across the entire back side, for ease of back side alignment and diode 100K singulation. The second terminal 127 is formed from metal layer(s) 120B, and is also generally between about 3 to 6 microns in thickness, or 4.5 to about 5.5 microns in thickness, or about 5 microns in thickness, in exemplary embodiments. Also as illustrated, an insulating (passivation) layer 135A is also utilized to electrically insulate or isolate metal layer 120B from via 136, and may be deposited as a separate step from the deposition of passivation (nitride) layer 135 about the periphery, so is illustrated as 135A. In exemplary embodiments, the width (side to side across the generally hexagonal shape, rather than vertex to vertex) of the diode 100K is between about 10 to 50 microns, or more particularly between about 20 to 30 microns, or more particularly between about 22 to 28 microns, or more particularly between about 25 to 27 microns, or more particularly between about 25.5 to 26.5 microns, or more particularly about 26 microns, for example and without limitation. Not separately illustrated, a metal layer 120A may also be included in fabrication second terminal 127. During diode 100K fabrication (and in other exemplary diode 100-100L embodiments), the top GaN layer (illustrated as p+ GaN layer 115, but also may be other types of GaN layers, as illustrated in FIG. 25) also may be metallized and alloyed with a very thin, optically reflective metal layer (illustrated as silver layer 103 in FIG. 25), and/or an optically transmissive metal layer (not separately illustrated) such as about a 100 Angstrom thickness of nickel-gold or nickel-gold-nickel, to facilitate formation of an ohmic contact (and potentially provide for light reflection toward the n+ GaN layer 110), some of which is then removed with other GaN layers, such as during GaN mesa formation.

Figure 80:
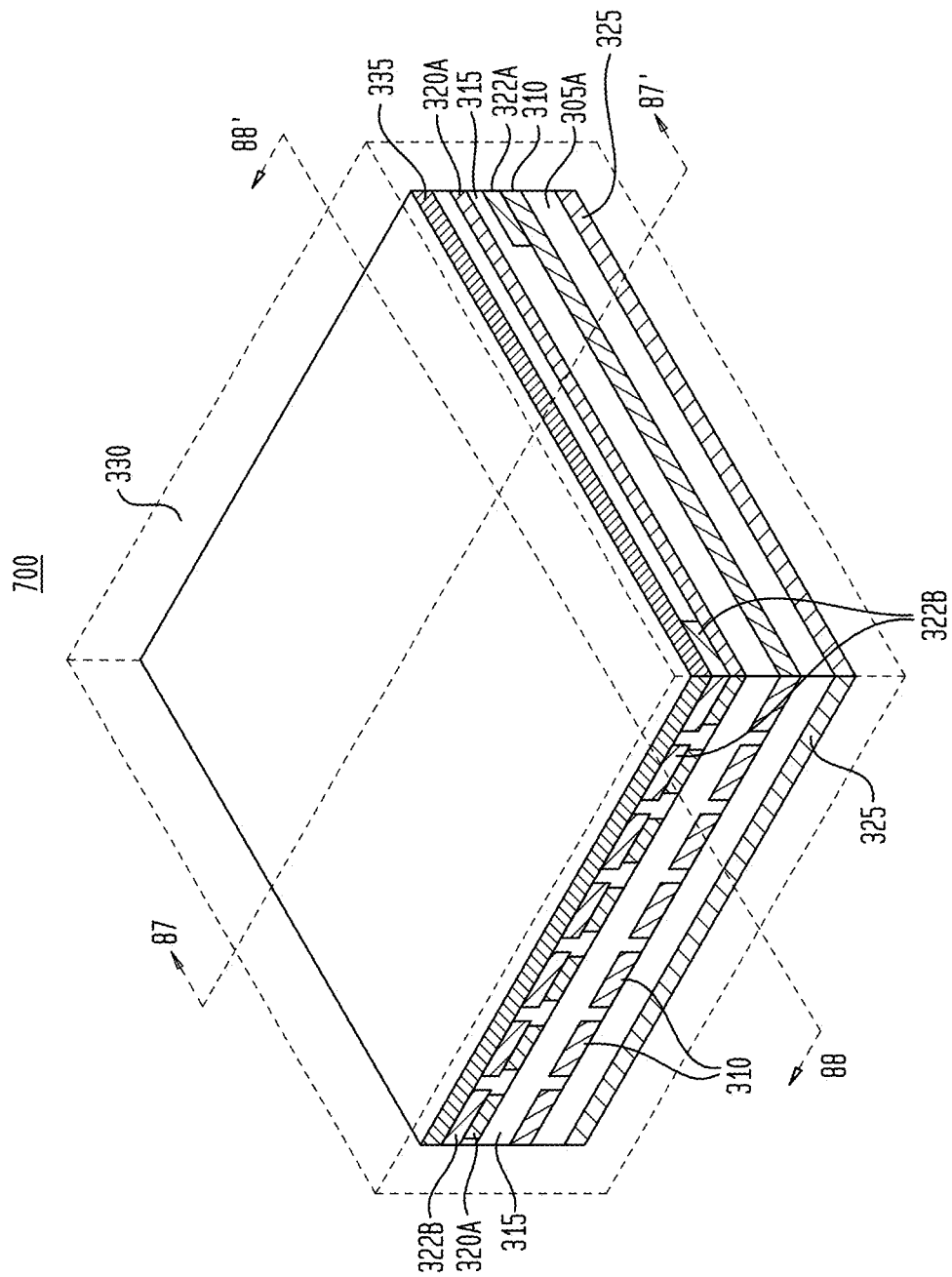
FIG. 80 is a perspective view of an exemplary second apparatus embodiment.
Figure 81:
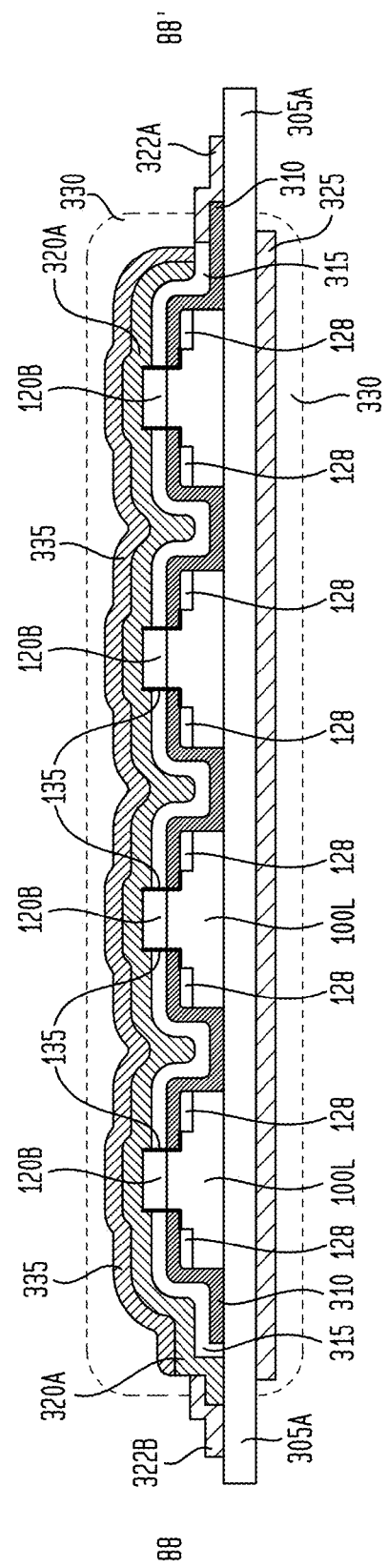
FIG. 81 is a first cross-sectional view of an exemplary second apparatus embodiment.
Figure 82:
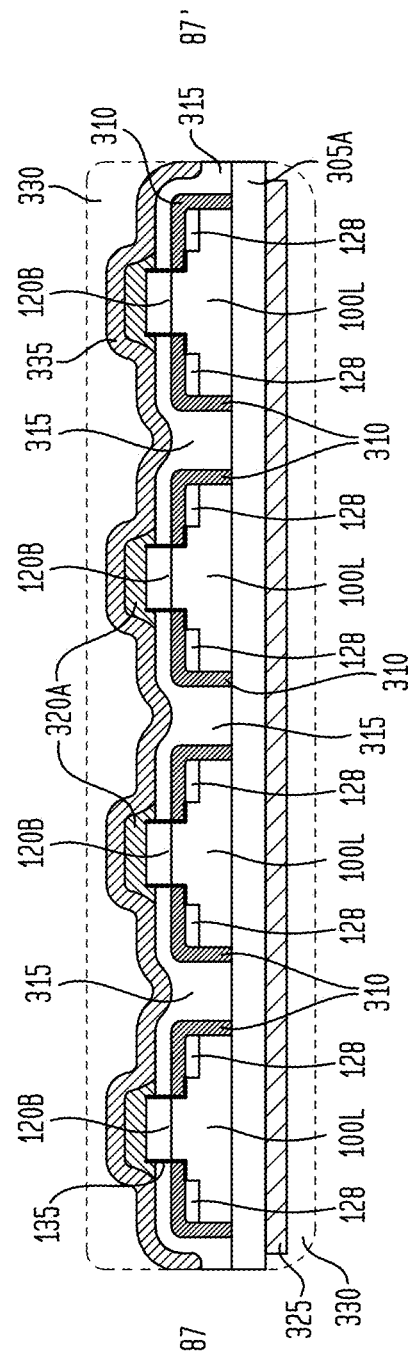
FIG. 82 is a second cross-sectional view of an exemplary second apparatus embodiment.

Referring to FIGS. 23 and 24, the exemplary eleventh diode 100L embodiment differs from all of the other illustrated diode 100-100K embodiments in having both first and second terminals 125, 127 on the same (upper or top) side of the diode 100L. When utilized in exemplary apparatus 700, 700A, 700B, 740, 750, 770 embodiments, light will be emitted (in LED embodiments) or absorbed (for photovoltaic embodiments) through the (lower) n+ GaN layer 110, typically through a substantially optically transparent base 305A, as illustrated in FIGS. 80-82. As a consequence of having both first and second terminals 125, 127 on the same (upper or top) side of the diode 100L, this exemplary diode 100L does not utilize any second (back) side metal 122, and generally does not require any of the various via structures previously discussed. Very little to no substrate 105, 105A or a buffer layer 145 are illustrated, also having been substantially removed during fabrication, leaving the complex GaN heterostructure in place (p+ GaN layer 115, quantum well region 185, and p+ GaN layer 115), and potentially some additional GaN as well. The lateral sides or edges (121) are also comparatively thinner (or less thick) than other illustrated embodiments, between about 2 to 4 microns, or more particularly 2.5 to 3.5 microns, or about 3 microns, in exemplary embodiments, also to prevent individual diodes 100L from standing on their lateral sides or edges (121) during apparatus 700, 700A, 700B, 740, 750, 770 fabrication. Not separately illustrated, during diode 100L fabrication (and in other exemplary diode 100-100K embodiments), the top GaN layer (illustrated as p+ GaN layer 115, but also may be other types of GaN layers, as illustrated in FIG. 25) also may be metallized and alloyed with a very thin, optically reflective metal layer (illustrated as silver layer 103 in FIG. 25), and/or an optically transmissive metal layer (not separately illustrated) such as about a 100 Angstrom thickness of nickel-gold or nickel-gold-nickel, to facilitate formation of an ohmic contact (and potentially provide for light reflection toward the n+ GaN layer 110), some of which is then removed with other GaN layers, such as during GaN mesa formation.

As illustrated in FIGS. 23 and 24, a GaN mesa (p+ GaN layer 115 and quantum well layer 185) is generally atypically shaped, somewhat like a triangle having flattened vertices (e.g., formed by providing a plurality (three) carve-out sections from a hexagonal or circular shape), to provide room on the upper surface of the n+ GaN layer 110 for metal contacts 128 (three are illustrated), which form second terminals 127 on the upper or top side of the diode 100L. The GaN mesa generally has a height of between about 0.5 to 1.5 microns, or more particularly 0.8 to 1.2 microns, or more particularly 0.9 to 1.1 microns, or more particularly about 1.0 microns in various exemplary embodiments. The metal contacts 128 may be formed from via metal, approximately about 0.75 to 1.5 microns in height, or more particularly about 0.9 to 1.1 microns in height, or more particularly about 1.0 microns in height, such as about 100 Angstroms of titanium, 500 nm of aluminum, 500 nm of nickel, and 100 nm of gold, and about 2.5 to 3.5 microns in width (measured radially). The first terminal 125, formed from metal layers 120A and 120B, is shaped similarly to but smaller than the GaN mesa, generally having a height of between about 4 to 8 microns, or more particularly, 5 to 7 microns, or more particularly about 6 microns in various exemplary embodiments, to allow for deposition of a first conductor 310A in contact with metal contacts 128 and to allow for deposition of dielectric layers 315, followed by contact of the first terminal 125 with a second conductor 320 (illustrated in FIGS. 80-82). In this exemplary embodiment, the first terminal 125, formed from metal layers 120A and 120B, is also passivated (135), which in addition to providing insulation and protection from contacting a first conductor 310, may also serve to aid structural integrity of the first terminal 125, which is useful to protect against various forces exerted in the printing process. In exemplary embodiments, the width (side to side across the generally hexagonal shape, rather than vertex to vertex) of the diode 100L is between about 10 to 50 microns, or more particularly between about 20 to 30 microns, or more particularly between about 22 to 28 microns, or more particularly between about 25 to 27 microns, or more particularly between about 25.5 to 26.5 microns, or more particularly about 26 microns. The height of the diode 100L generally is between about 8 to 15 microns, or more particularly 9 to 12 microns, or more particularly about 10.5 to 11.5 microns, in exemplary embodiments.

It should be noted that the sizes of two-terminal devices more generally may be larger, such as between about 10 to 75 microns in diameter (width or length, depending on the shape, also measured face-to-face), and between about 5 to 25 microns in height.

FIG. 25 is a cross-sectional diagram through a portion of a complex GaN heterostructure (or GaN mesa) (n+ GaN layer 110, quantum well region 185, p+ GaN layer 115) and metal layers 120A, 120B, illustrating optional geometries and textures of the external and/or internal surfaces of the complex GaN heterostructure (e.g., the surfaces of either the p+ GaN layer 115 or n+ GaN layer 110 or additional silver or mirror layer (103). Any of the various features illustrated in FIG. 25 may be applied as an option to any of the various exemplary diodes 100-100L. As illustrated in FIGS. 1-24, the external and/or internal surfaces of the complex GaN heterostructure may be comparatively smooth. As illustrated in FIG. 25, any of the various external and/or internal surfaces of the complex GaN heterostructure may be fabricated to have any of various textures, geometries, mirrors, reflectors, or other surface treatments. For example and without limitation, the external (upper or top) surface of the complex GaN heterostructure (illustrated as n+ GaN layer 110) may be etched to provide a surface roughness 112 (illustrated as jagged conical or pyramidal structures), such as to decrease internal reflection and increase light extraction within the diode 100-100L embodiments. In addition, the external surfaces of the complex GaN heterostructure (e.g., the surfaces of either the p+ GaN layer 115 or n+ GaN layer 110) may be masked and etched or otherwise fabricated to have various geometrical structures, such as domes or lens shapes 116; toroids, honeycomb, or waffle shapes 118; stripes 113, or other geometries (e.g., hexagons, triangles, etc.) 117, also for example and without limitation. Also in addition, the lateral sides 121 may also include various mirrors or reflectors 109, such as a dielectric reflector (e.g., $SiO_2/Si_3N_4$) or metallic reflectors. A wide variety of surface treatments and reflectors have been described, for example, in Fujii et al. U.S. Pat. No. 7,704,763 issued Apr. 27, 2010, Chu et al. U.S. Pat. No. 7,897,420 issued Mar. 1, 2011, Kang et al. U.S. Patent Application Publication No. 2010/0295014 A1 published Nov. 25, 2010, and Shum U.S. Pat. No. 7,825,425 issued Nov. 2, 2010, all incorporated herein by reference. Additional surface textures and geometries are illustrated in FIGS. 104-108.

Continuing to refer to FIG. 25, the internal surfaces of the complex GaN heterostructure (or more generally, diodes 100-100L) may also be fabricated to have any of various textures, geometries, mirrors, reflectors, or other surface treatments. As illustrated, for example and without limitation, a reflective layer 103 may be utilized to provide reflection of light out toward the exposed surface of the diodes 100-100L and increased light extraction, such as by using a silver layer applied during fabrication (prior to fabrication of metal layers 102A, 102B), which may be either smooth (111) or have a textured (107) surface. Also for example and without limitation, an internal surface of the complex GaN heterostructure may also be smooth or have a textured surface, such as by using the additional layer 108 which may be, for example, a diffuse n-type InGaN material. In addition, any of these various optional surface geometry and textures may be utilized alone or in combination with each other, such as a double-diffuse structure having both the external surface texture 112 with an internal surface texture (107) and/or reflective layer 103. Various optional layers may also be utilized for additional reasons, such as to provide better ohmic contact using an n-type InGaN material in a layer 108, independently of any surface treatment which may or may not be utilized.

The diodes 100-100L are generally less than about 450 microns in all dimensions, and more specifically less than about 200 microns in all dimensions, and more specifically less than about 100 microns in all dimensions, and more specifically less than 50 microns in all dimensions. In the illustrated exemplary embodiments, the diodes 100-100L are generally on the order of about 10 to 50 microns in width, or more specifically about 20 to 30 microns in width, and about 5 to 25 microns in height, or more particularly between 5 to 15 microns in height, or from about 25 to 28 microns in diameter (measured side face to face rather than apex to apex) and 10 to 15 microns in height. In exemplary embodiments, the height of the diodes 100-100L excluding the metal layer 120B or 122 forming the bump or protruding structure (i.e., the height of the lateral sides 121 including the GaN heterostructure), depending upon the embodiment, is on the order of about 2 to 15 microns, or more specifically about 2 to 4 microns, or more specifically 7 to 12 microns, or more specifically 8 to 11 microns, or more specifically 9 to 10 microns, or more specifically less than 10 to 30 microns, while the height of the metal layer 120B forming the bump or protruding structure is generally on the order of about 3 to 7 microns. As the dimensions of the diodes are engineered to within a selected tolerance during device fabrication, the dimensions of the diodes may be measured, for example and without limitation, using a light microscope (which may also include measuring software), a scanning electron microscope (SEM), or a Horiba LA-920 (e.g., using Fraunhofer diffraction and light scattering to measure particle sizes (and distributions of particle sizes) while the particles are in a dilute solution, which could be in a diode ink or any other liquid or gel. All sizes or other measurements of diodes 100-100L should be considered averages (e.g., mean and/or median) of a plurality of diodes 100-100L, and will vary considerably depending upon the selected embodiment (e.g., diodes 110-100J, or 100K, or 100L, will generally all have different respective sizes).

The diodes 100-100L may be fabricated using any semiconductor fabrication techniques which are known currently or which are developed in the future. FIGS. 26-66 illustrate a plurality of exemplary methods of fabricating exemplary diodes 100-100L and illustrate several additional exemplary diodes 100H, 100I and 100J (in cross-section). Those having skill in the art will recognize that many of the various steps of diode 100-100L fabrication may occur in any of various orders, may be omitted or included in other sequences, and may result in innumerable diode structures, in addition to those illustrated. For example, FIGS. 38-44 illustrate creation of a diode 100H which includes both central and peripheral through (or deep) vias 131 and 134, respectively, combining features of diodes 100D and 100G, with or without optional second (back) side metal layer 122, while FIGS. 45-50 illustrate creation of a diode 100I which includes a perimeter via 133, with or without optional second (back) side metal layer 122, and which may be combined with the other illustrated fabrication steps to include central or peripheral through vias 131 and 134, for example, such as to form a diode 100F.

Figure 26:
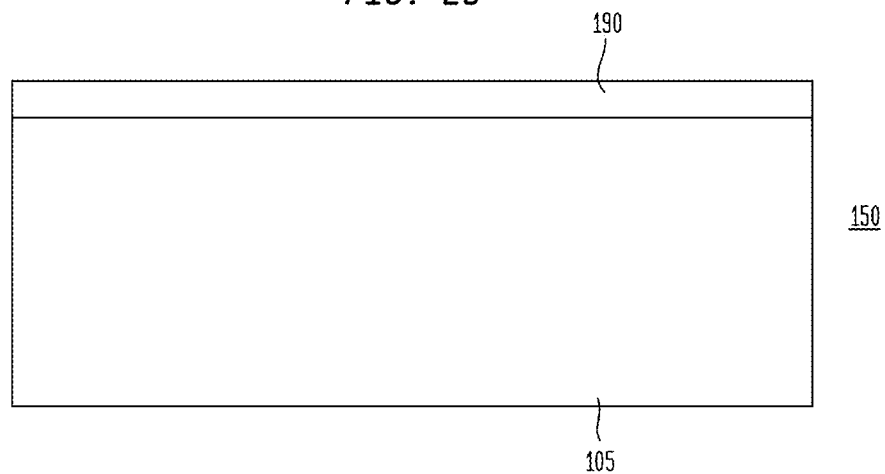
FIG. 26 is a cross-sectional view of a wafer having an oxide layer, such as silicon dioxide.
Figure 27:
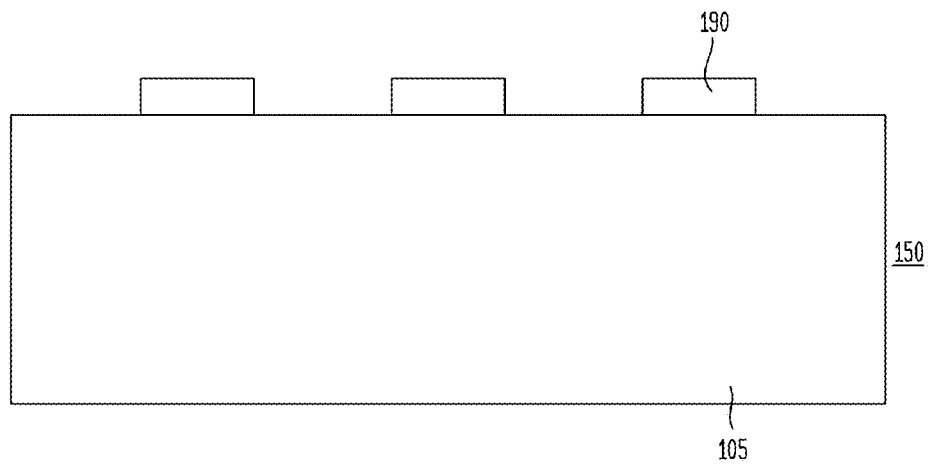
FIG. 27 is a cross-sectional view of a wafer having an oxide layer etched in a grid pattern.
Figure 28:
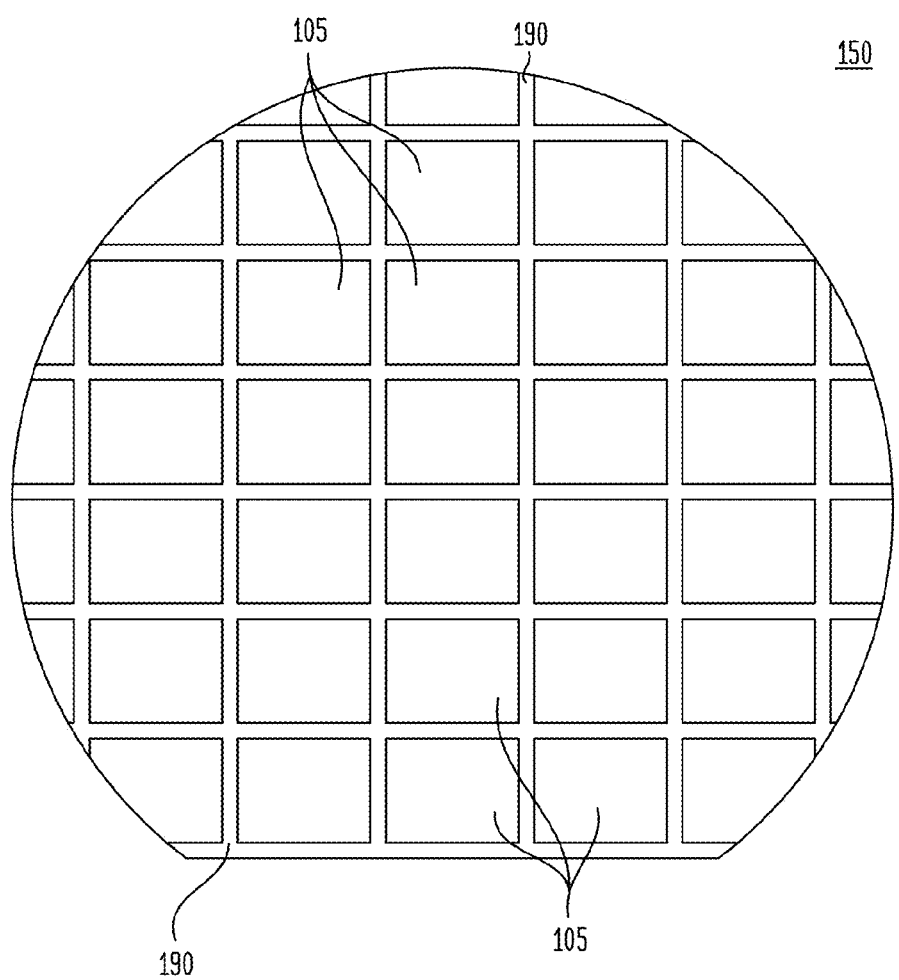
FIG. 28 is a plan (or top) view of a wafer having an oxide layer etched in a grid pattern.

FIGS. 26, 27 and 29-37 are cross-sectional views illustrating an exemplary method of diode 100, 100A, 100B, 100C fabrication in accordance with the teachings of the present invention, with FIGS. 26-29 illustrating fabrication at the wafer 150 level and FIGS. 30-37 illustrating fabrication at the diode 100, 100A, 100B, 100C level. The various illustrated fabrication steps may also be utilized to form other diodes 100D-100L, with FIGS. 26-32 applicable to any of the diodes 100-100L, depending upon the selected substrate 105, 105A. FIG. 26 and FIG. 27 are cross-sectional views of a wafer 150 (such as a silicon wafer) having a silicon dioxide (or "oxide") layer 190. FIG. 28 is a plan (or top) view of a silicon wafer 150 having a silicon dioxide layer 190 etched in a grid pattern. The oxide layer 190 (generally about 0.1 microns thick) is deposited or grown over the wafer 150, as shown in FIG. 26. As illustrated in FIG. 27, through appropriate or standard mask and/or photoresist layers and etching as known in the art, portions of the oxide layer 190 have been removed, leaving oxide 190 in a grid pattern (also referred to as "streets"), as illustrated in FIG. 28.

FIG. 29 is a cross-sectional view of a wafer 150 (such as a silicon wafer) having a buffer layer 145, a silicon dioxide (or "oxide") layer 190, and GaN layers (typically epitaxially grown or deposited to a thickness of about 1.25-2.50 microns in an exemplary embodiment, although lesser or greater thicknesses are also within the scope of the disclosure), illustrated as polycrystalline GaN 195 over the oxide 190, and n+ GaN layer 110, quantum well region 185 and p+ GaN layer 115 forming a complex GaN heterostructure as mentioned above. As indicated above, a buffer layer 145 (such as aluminum nitride or silicon nitride and generally about 25 Angstroms thick) is deposited on the silicon wafer 150 to facilitate subsequent GaN deposition. The polycrystalline GaN 195 grown or deposited over the oxide 190 is utilized to reduce the stress and/or strain (e.g., due to thermal mismatch of the GaN and a silicon wafer) in the complex GaN heterostructure (n+ GaN layer 110, quantum well region 185 and p+ GaN layer 115), which typically has a single crystal structure. Other equivalent methods within the scope of the invention to provide such stress and/or strain reduction, for example and without limitation, include roughening the surface of the silicon wafer 150 and/or buffer layer 145 in selected areas, so that corresponding GaN regions will not be a single crystal, or etching trenches in the silicon wafer 150, such that there is also no continuous GaN crystal across the entire wafer 150. Such street formation and stress reduction fabrication steps may be omitted in other exemplary fabrication methods, such as when other substrates are utilized, such as GaN (a substrate 105) on a sapphire wafer 150A. The GaN deposition or growth to form a complex GaN heterostructure may be provided through any selected process as known or becomes known in the art and/or may be proprietary to the device fabricator. In an exemplary embodiment, a complex GaN heterostructure comprised of n+ GaN layer 110, quantum well region 185 and p+ GaN layer 115 is available from Blue Photonics Inc. of Walnut, Calif., USA and other vendors, for example and without limitation.

Figure 31:
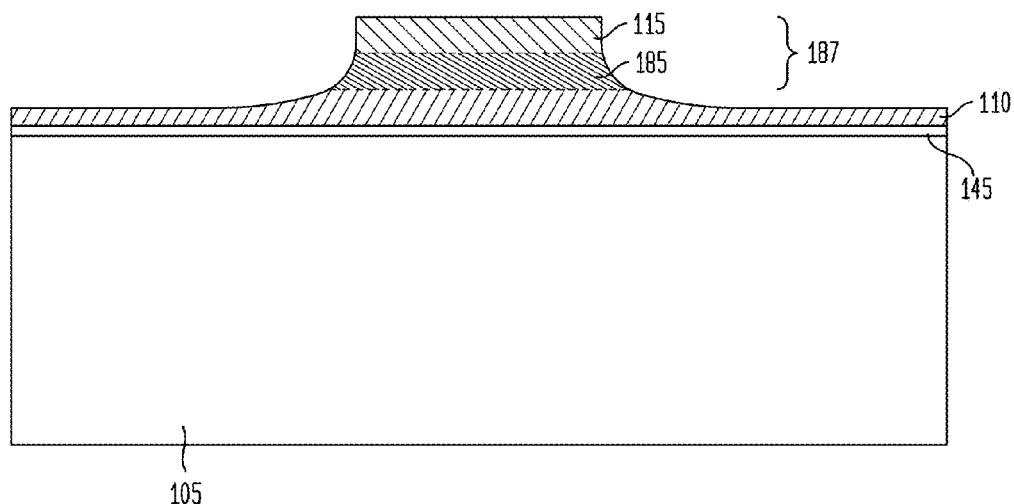
FIG. 31 is a cross-sectional view of a substrate having a buffer layer and a first mesa-etched complex GaN heterostructure.
Figure 32:
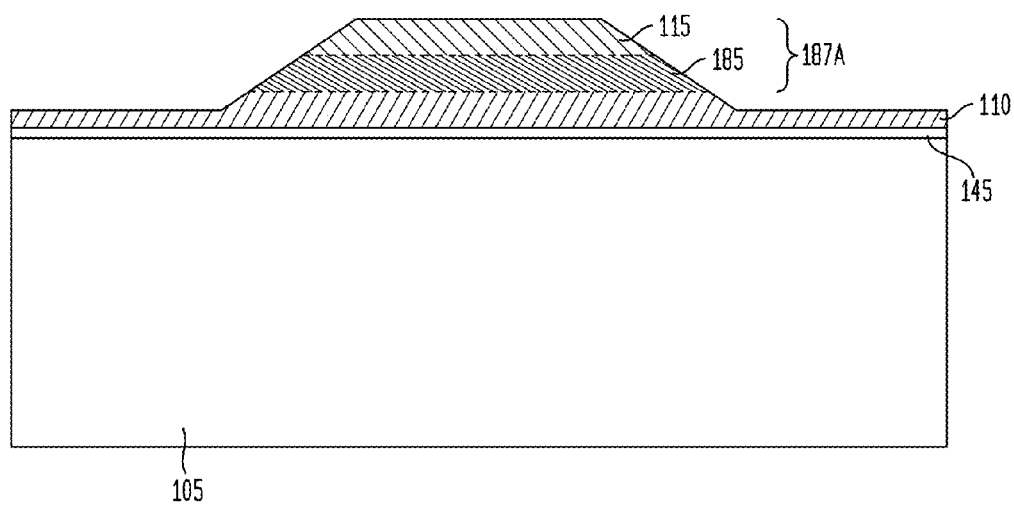
FIG. 32 is a cross-sectional view of a substrate having a buffer layer and a second mesa-etched complex GaN heterostructure.
Figure 33:
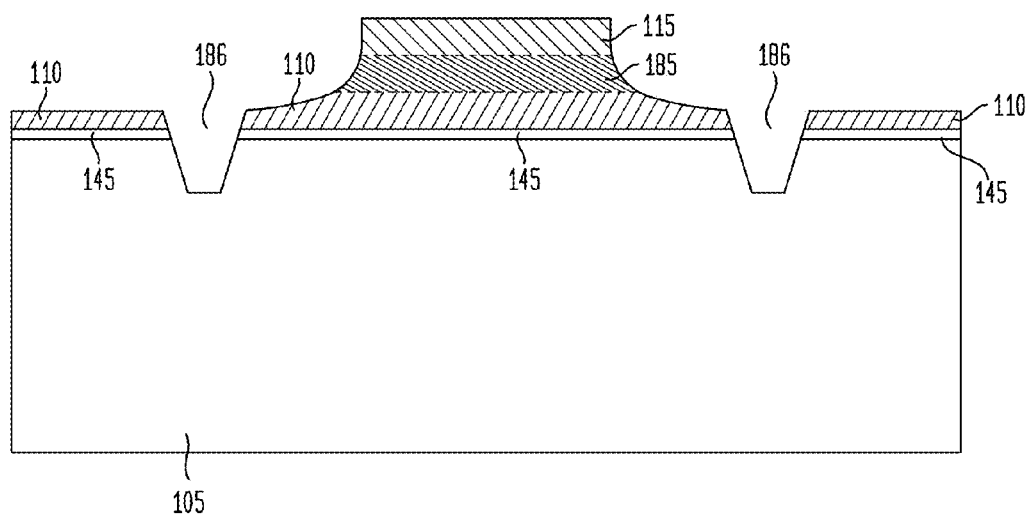
FIG. 33 is a cross-sectional view of a substrate having a buffer layer, a mesa-etched complex GaN heterostructure, and etched substrate for via connections.

FIG. 30 is a cross-sectional view of a substrate 105 having buffer layer 145 and the complex GaN heterostructure (n+ GaN layer 110, quantum well region 185 and p+ GaN layer 115) in accordance with the teachings of the present invention, illustrating a much smaller portion of the wafer 150 (such as region 191 of FIG. 29), to illustrate fabrication of a single diode 100-100L. Through appropriate or standard mask and/or photoresist layers and etching as known in the art, the complex GaN heterostructure (n+ GaN layer 110, quantum well region 185 and p+ GaN layer 115) is etched to form a GaN mesa structure 187, as illustrated in FIGS. 31 and 32, with FIG. 32 illustrating the GaN mesa structure 187A having comparatively more angled sides, which potentially may facilitate light production and/or absorption. Other GaN mesa structures 187 may also be implemented, such as a partially or substantially toroidal GaN mesa structure 187, as illustrated in FIGS. 10, 13, 14, 17, 20, 22, 39-44, and 66. Following the GaN mesa etch, also through appropriate or standard mask and/or photoresist layers and etching as known or becomes known in the art, a (shallow or blind) via etch is performed, as illustrated in FIG. 33, creating a comparatively shallow trench 186 through the GaN layers and buffer layer 145 and into the silicon substrate 105.

Figure 34:
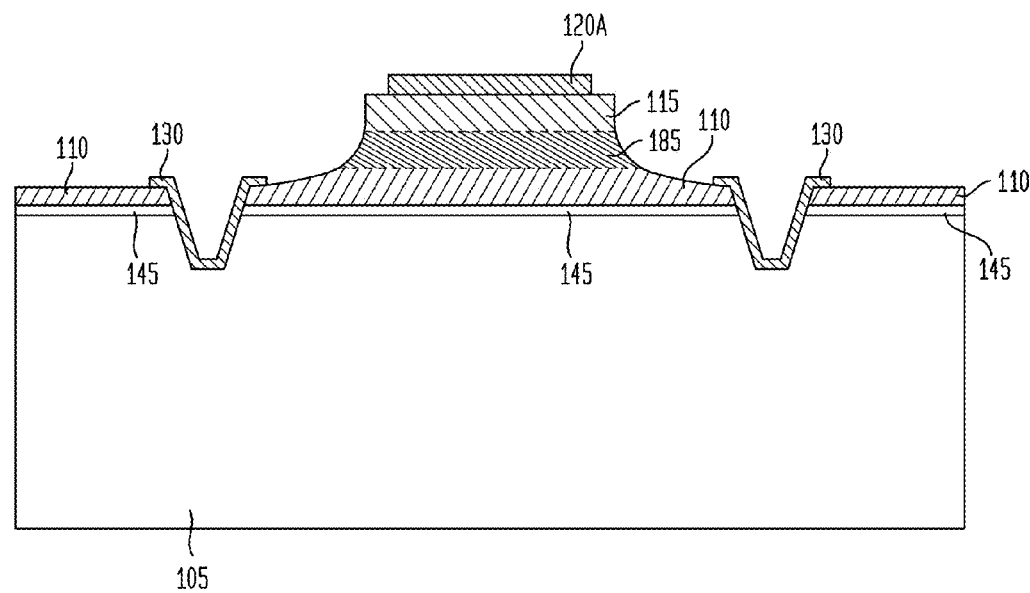
FIG. 34 is a cross-sectional view of a substrate having a buffer layer, a mesa-etched complex GaN heterostructure, metallization forming an ohmic contact with the p+ GaN layer, and metallization forming vias.

Also through appropriate or standard mask and/or photoresist layers and etching as known in the art, metallization layers are then deposited, forming a metal contact 120A to p+ GaN layer 115 and forming vias 130, as illustrated in FIG. 34. In exemplary embodiments, several layers of metal are deposited, a first or initial layer to form an ohmic contact to p+ GaN layer 115, typically comprising two metal layers about 50 to 200 Angstroms each, of nickel followed by gold, followed by annealing at about 450-500° C. in an oxidizing atmosphere of about 20% oxygen and 80% nitrogen, resulting in nickel rising to the top with a layer of nickel oxide, and forming a metal layer (as part of 120A) having a comparatively good ohmic contact with the p+ GaN layer 115. As another example, during diode 100L fabrication (and in other exemplary diode 100-100K embodiments), the top GaN layer (illustrated as p+ GaN layer 115, but also may be other types of GaN layers, as illustrated in FIG. 25) also may be metallized and alloyed with a very thin, optically reflective metal layer (illustrated as silver layer 103 in FIG. 25), and/or an optically transmissive metal layer (not separately illustrated) such as about a 100 Angstrom thickness of nickel-gold or nickel-gold-nickel, to facilitate formation of an ohmic contact (and potentially provide for light reflection toward the n+ GaN layer 110), some of which is then removed with other GaN layers, such as during GaN mesa formation. Another metallization layer may also be deposited, such as to form thicker interconnect metal to contour and fully form metal layer 120A (e.g., for current distribution) and to form the vias 130. In another exemplary embodiment (illustrated in FIGS. 45-50), the metal contact 120A forming an ohmic contact to p+ GaN layer 115 may be formed prior to the GaN mesa etch, followed by the GaN mesa etch, via etch, etc. Innumerable other metallization processes and corresponding materials comprising metal layers 120A and 120B are also within the scope of the disclosure, with different fabrication facilities often utilizing different processes and material selections. For example and without limitation, either or both metal layers 120A and 120B may be formed by deposition of titanium to form an adhesion or seed layer, typically 50-200 Angstroms thick, followed by deposition of 2-4 microns of nickel and a thin layer or "flash" of gold (a "flash" of gold being a layer of about 50-500 Angstroms thick), 3-5 microns of aluminum, followed by nickel (about 0.5 microns, physical vapor deposition or plating) and a "flash" of gold, or by deposition of titanium, followed by gold, followed by nickel (typically 3-5 microns thick for 120B), followed by gold, or by deposition of aluminum followed by nickel followed by gold, etc. In addition, the height of the metal layer 120B forming a bump or protruding structure may also be varied, typically between about 3.5-5.5 microns in exemplary embodiments, depending upon the thickness of the substrate 105 (e.g., about 7-8 microns of GaN versus about 10 microns of silicon), for the resulting diodes 100-100L to have a substantially uniform height and form factor.

Figure 35:
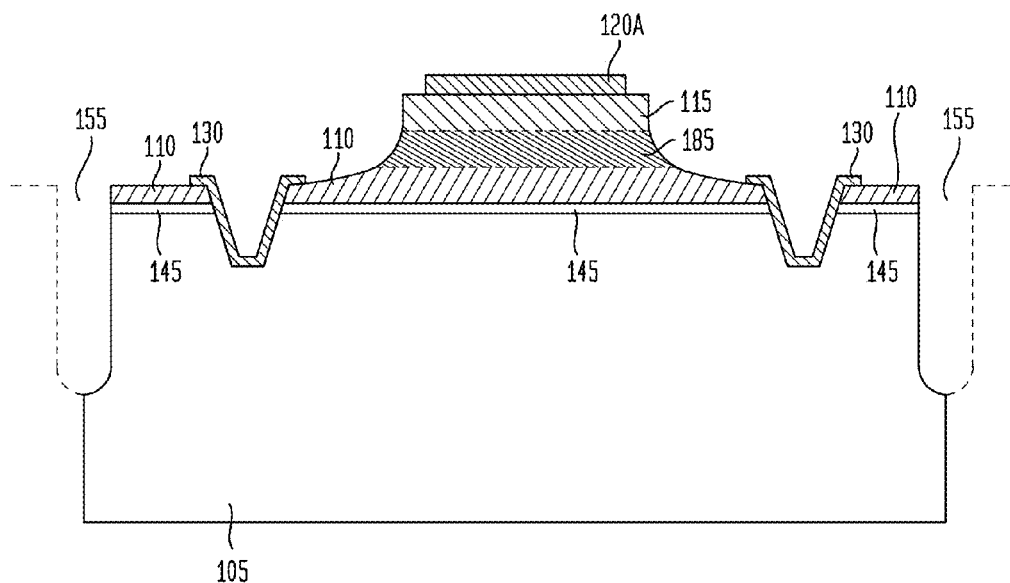
FIG. 35 is a cross-sectional view of a substrate having a buffer layer, a mesa-etched complex GaN heterostructure, metallization forming an ohmic contact with the p+ GaN layer, metallization forming vias, and lateral etched trenches.
Figure 36:
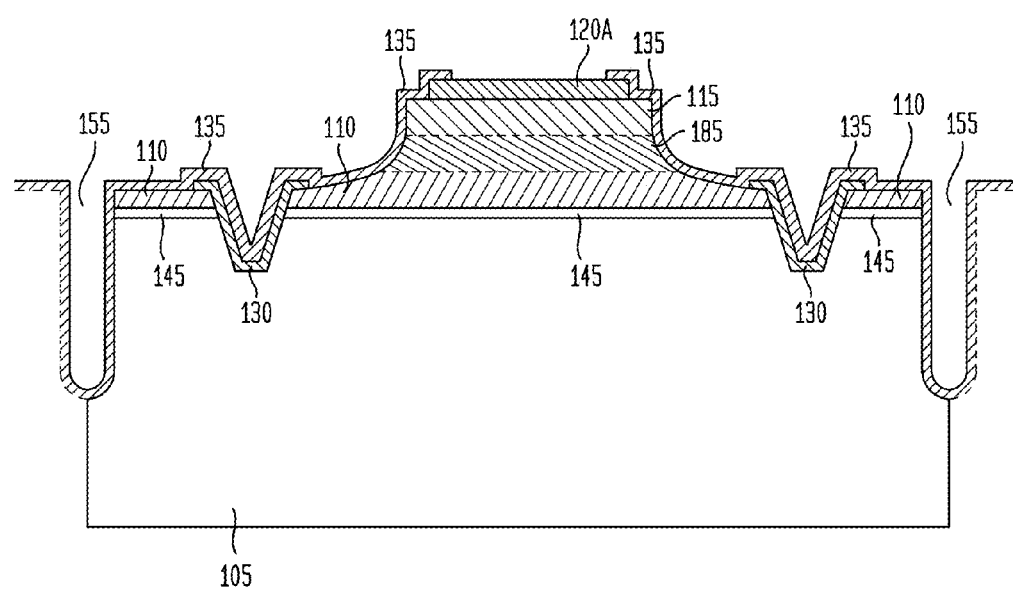
FIG. 36 is a cross-sectional view of a substrate having a buffer layer, a mesa-etched complex GaN heterostructure, metallization forming an ohmic contact with the p+ GaN layer, metallization forming vias, lateral etched trenches, and passivation layers (such as silicon nitride).
Figure 37:
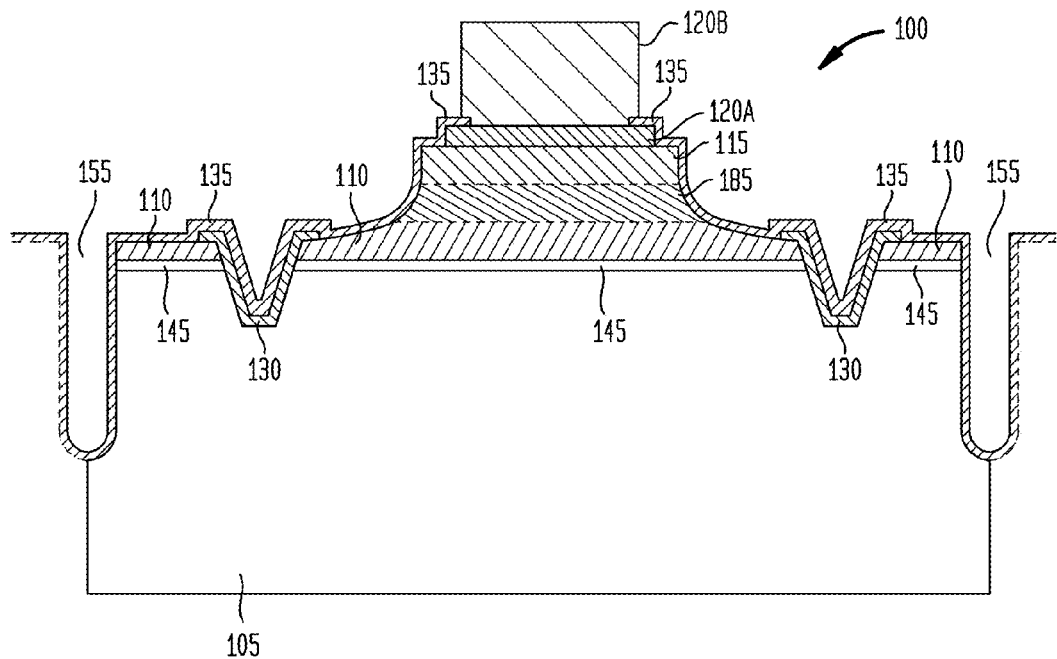
FIG. 37 is a cross-sectional view of a substrate having a buffer layer, a mesa-etched complex GaN heterostructure, metallization forming an ohmic contact with the p+ GaN layer, metallization forming vias, lateral etched trenches, passivation layers, and metallization forming a protruding or bump structure.
Figure 40:
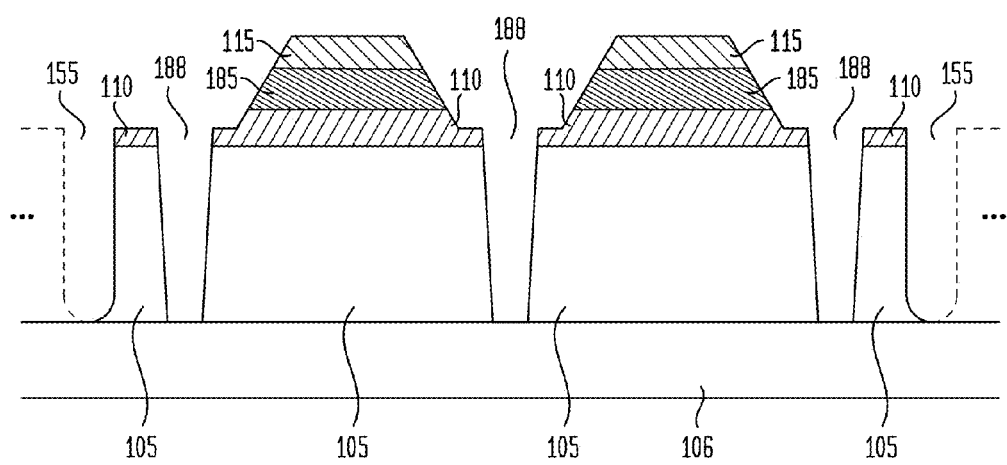
FIG. 40 is a cross-sectional view of a substrate having a mesa-etched complex GaN heterostructure, an etched substrate for via connections, and lateral etched trenches.
Figure 48:
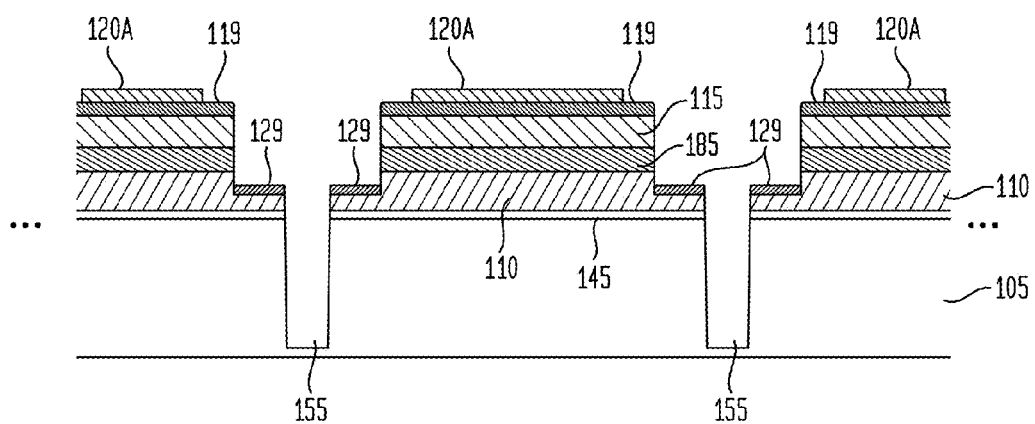
FIG. 48 is a cross-sectional view of a substrate having a buffer layer, a mesa-etched complex GaN heterostructure, metallization forming an ohmic contact with the n+ GaN layer, and lateral etched trenches.

For subsequent singulation of the diodes 100-100L from each other and from the wafer 150, through appropriate or standard mask and/or photoresist layers and etching as known in the art, as illustrated in FIG. 35 and other FIGS. 40 and 48, trenches 155 are formed around the periphery of each diode 100-100L (e.g., also as illustrated in FIGS. 2, 5, 7 and 9). The trenches 155 are generally about 3-5 microns wide and 10-12 microns deep. Also using appropriate or standard mask and/or photoresist layers and etching as known in the art, nitride passivation layer 135 is then grown or deposited, as illustrated in FIG. 36, generally to a thickness of about 0.35-1.0 microns, such as by plasma-enhanced chemical vapor deposition (PECVD) of silicon nitride, for example and without limitation, followed by photoresist and etching steps to remove unwanted regions of silicon nitride. In other exemplary embodiments, the side walls of such singulation trenches may or may not be passivated. Through appropriate or standard mask and/or photoresist layers and etching as known in the art, metal layer 120B having a bump or protruding structure is then formed, typically having a height of 3-5 microns tall, as illustrated in FIG. 37. In an exemplary embodiment, formation of metal layer 120B is performed in several steps, using a metal seed layer, followed by more metal deposition using electroplating or a lift off process, removing the resist and clearing the field of the seed layer. Other than subsequent singulation of the diodes (in this case diodes 100, 100A, 100B, 100C) from the wafer 150, as described below, the diodes 100, 100A, 100B, 100C are otherwise complete, and it should be noted that these completed diodes 100, 100A, 100B, 100C have only one metal contact or terminal on the upper surface of each diode 100, 100A, 100B, 100C (first terminal 125). As an option, a second (back) side metal layer 122 may be fabricated, as described below and as mentioned above with reference to other exemplary diodes, such as to form a second terminal 127.

Figure 38:
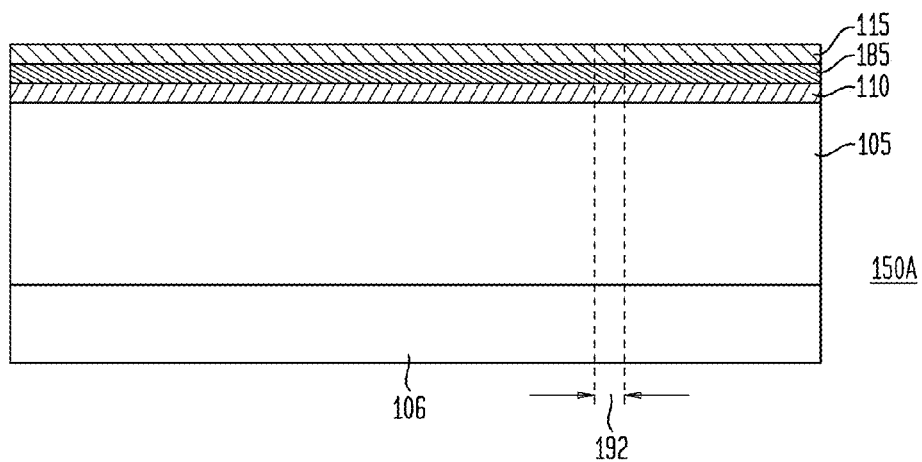
FIG. 38 is a cross-sectional view of a substrate having a complex GaN heterostructure (n+ GaN layer, quantum well region, and p+ GaN layer).

FIGS. 38-44 illustrate another exemplary method of diode 100-100L fabrication, with FIG. 38 illustrating fabrication at the wafer 150A level and FIGS. 39-44 illustrating fabrication at the diode 100-100L level. FIG. 38 is a cross-sectional view of a wafer 150A having a substrate 105 and having a complex GaN heterostructure (n+ GaN layer 110, quantum well region 185, and p+ GaN layer 115). In this exemplary embodiment, a comparatively thick layer of GaN is grown or deposited (to form a substrate 105) on sapphire (106) (of the sapphire wafer 150A), followed by deposition or growth of the GaN heterostructure (n+ GaN layer 110, quantum well region 185, and p+ GaN layer 115).

Figure 39:
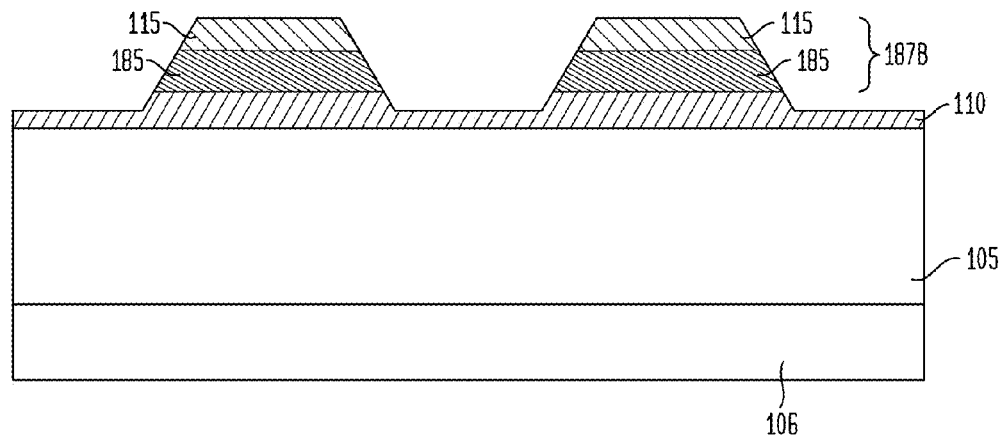
FIG. 39 is a cross-sectional view of a substrate having a third mesa-etched complex GaN heterostructure.

FIG. 39 is a cross-sectional view of a substrate 105 having a third mesa-etched complex GaN heterostructure, illustrating a much smaller portion of the wafer 150A (such as region 192 of FIG. 38), to illustrate fabrication of a single diode (e.g., diode 100H, 100K). Through appropriate or standard mask and/or photoresist layers and etching as known in the art, the complex GaN heterostructure (n+ GaN layer 110, quantum well region 185 and p+ GaN layer 115) is etched to form a GaN mesa structure 187B. Following the GaN mesa etch, also through appropriate or standard mask and/or photoresist layers and etching as known or becomes known in the art, a (through or deep) via trench and a singulation trench etch is performed, as illustrated in FIG. 40, creating one or more comparatively deep via trenches 188 through the non-mesa portion of the GaN heterostructure (n+ GaN layer 110) and though the GaN substrate 105 to the sapphire (106) of the wafer 150A and creating singulation trenches 155 described above. As illustrated, a center via trench 188 and a plurality of peripheral via trenches 188 have been formed. For a diode 100K embodiment, a shallow or blind via etch may also be performed in the center of the mesa structure 187B, without formation of any peripheral vias or trenches.

Figure 41:
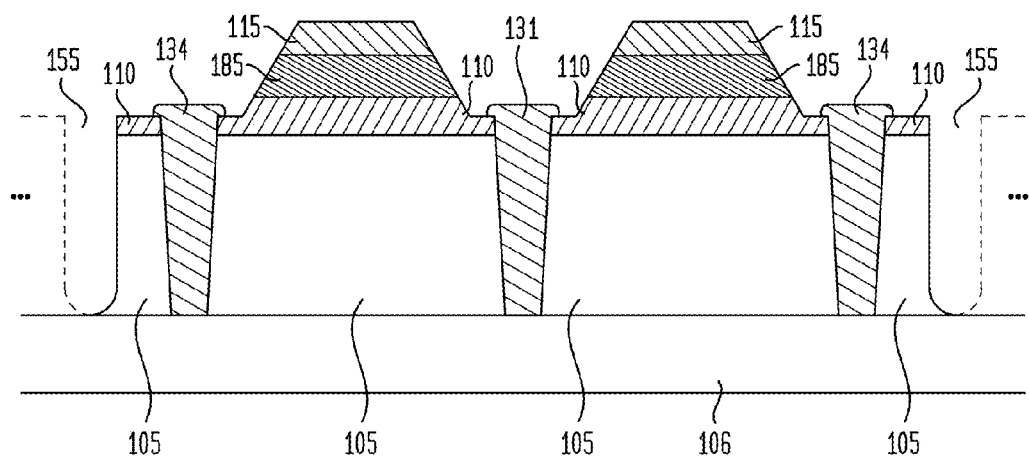
FIG. 41 is a cross-sectional view of a substrate having a mesa-etched complex GaN heterostructure, metallization forming an ohmic contact with the n+ GaN layer and forming through vias, and lateral etched trenches.

Also through appropriate or standard mask and/or photoresist layers and etching as known in the art, metallization layers are then deposited, forming a center through via 131 and a plurality of peripheral through vias 134, which also form an ohmic contact with the n+ GaN layer 110, as illustrated in FIG. 41. In exemplary embodiments, several layers of metal are deposited to form the through vias 131, 134. For example, titanium and tungsten may be sputtered to coat the sides and bottom of the trenches 188, to form a seed layer, followed by plating with nickel, to form solid metal vias 131, 134.

Figure 42:
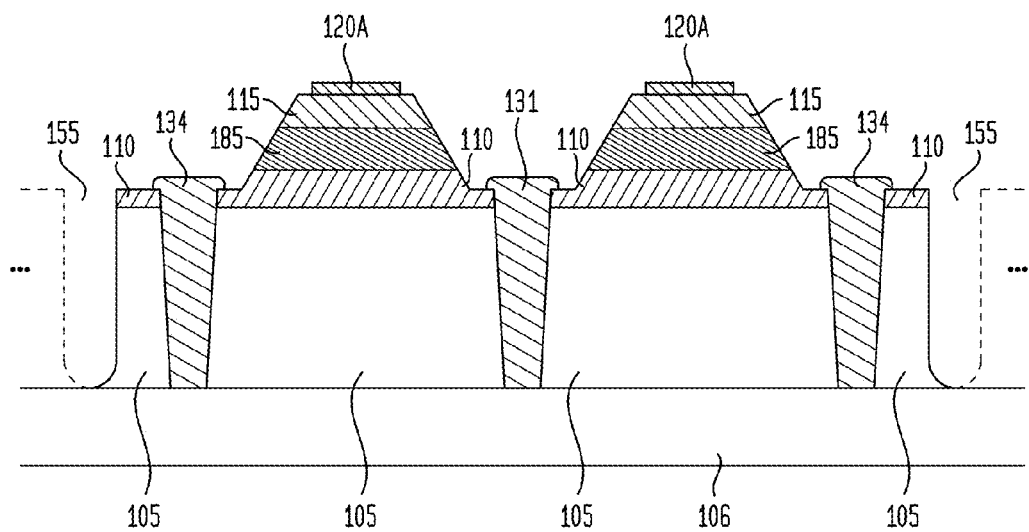
FIG. 42 is a cross-sectional view of a substrate having a mesa-etched complex GaN heterostructure, metallization forming an ohmic contact with the n+ GaN layer and forming through vias, metallization forming an ohmic contact with the p+ GaN layer, and lateral etched trenches.
Figure 43:
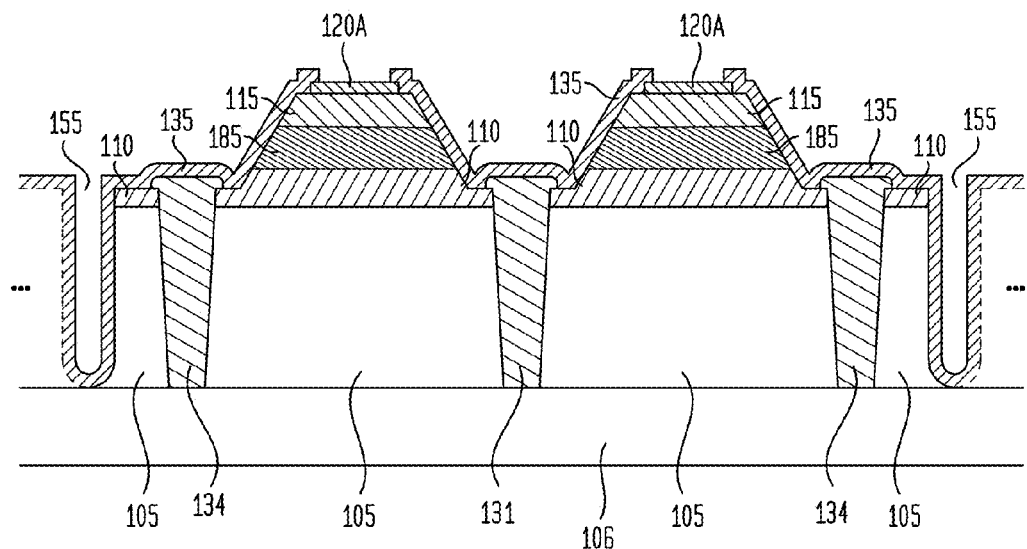
FIG. 43 is a cross-sectional view of a substrate having a mesa-etched complex GaN heterostructure, metallization forming an ohmic contact with the n+ GaN layer and forming through vias, metallization forming an ohmic contact with the p+ GaN layer, lateral etched trenches, and passivation layers (such as silicon nitride).

Also through appropriate or standard mask and/or photoresist layers and etching as known in the art, metallization layers are then deposited, forming a metal layer 120A providing an ohmic contact to p+ GaN layer 115, as illustrated in FIG. 42. In exemplary embodiments, several layers of metal may be deposited as previously described to form metal layer 120A and an ohmic contact to p+ GaN layer 115. Also using appropriate or standard mask and/or photoresist layers and etching as known in the art, nitride passivation layer 135 is then grown or deposited, as illustrated in FIG. 43, generally to a thickness of about 0.35-1.0 microns, such as by plasma-enhanced chemical vapor deposition (PECVD) of silicon nitride or silicon oxynitride, for example and without limitation, followed by photoresist and etching steps to remove unwanted regions of silicon nitride. Through appropriate or standard mask and/or photoresist layers and etching as known in the art, metal layer 120B having a bump or protruding structure is then formed, as illustrated in FIG. 44. In an exemplary embodiment, formation of metal layer 120B is performed in several steps, using a metal seed layer, followed by more metal deposition using electroplating or a lift off process, removing the resist and clearing the field of the seed layer, also as described above. Other than subsequent singulation of the diodes (in this case diode 100H) from the wafer 150A, as described below, the diodes 100H are otherwise complete, and it should be noted that these completed diodes 100H also have only one metal contact or terminal on the upper surface of each diode 100H (also a first terminal 125). Also as an option, a second (back) side metal layer 122 may be fabricated, as described below and as mentioned above with reference to other exemplary diodes, such as to form a second terminal 127.

Figure 45:
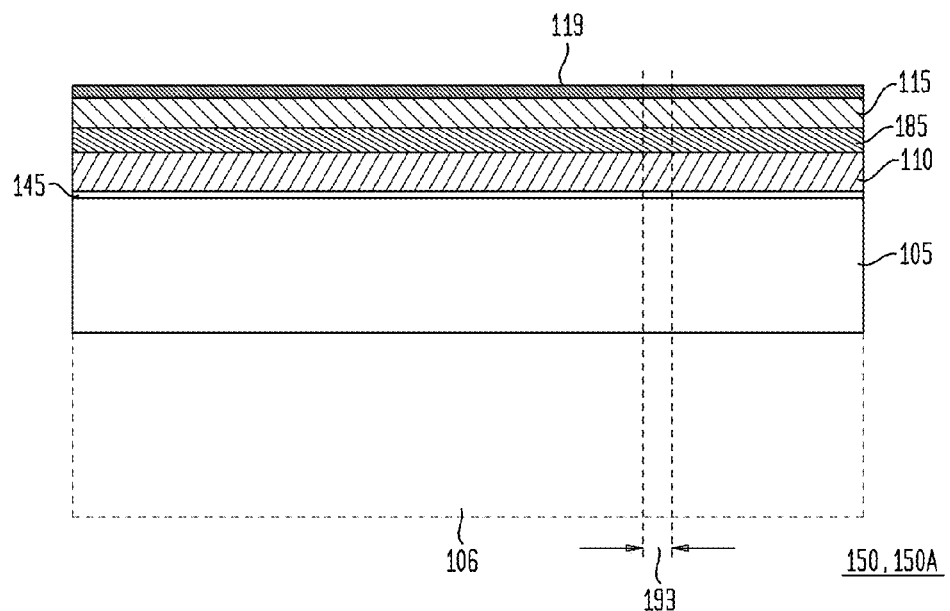
FIG. 45 is a cross-sectional view of a substrate having a buffer layer, a complex GaN heterostructure (n+ GaN layer, quantum well region, and p+ GaN layer), and metallization forming an ohmic contact with the p+ GaN layer.

FIGS. 45-50 illustrate another exemplary method of diode 100-100L fabrication, with FIG. 45 illustrating fabrication at the wafer 150 or 150A level and FIGS. 46-50 illustrating fabrication at the diode 100-100L level. FIG. 45 is a cross-sectional view of a substrate 105 having a buffer layer 145, a complex GaN heterostructure (n+GaN layer 110, quantum well region 185, and p+ GaN layer 115), and metallization (metal layer 120A) forming an ohmic contact with the p+ GaN layer. As mentioned above, buffer layer 145 is typically fabricated when the substrate 105 is silicon (e.g., using a silicon wafer 150), and may be omitted for other substrates, such as a GaN substrate 105. In addition, sapphire 106 is illustrated as an option, such as for a thick GaN substrate 105 grown or deposited on a sapphire wafer 150A. Also as mentioned above, a metal layer 119 (as a seed layer for subsequent deposition of metal layer 120A) has been deposited at an earlier step, following deposition or growth of the GaN heterostructure (n+ GaN layer 110, quantum well region 185, and p+ GaN layer 115), rather than at a later step of diode fabrication. For example, metal layer 119 may be nickel with a flash of gold having a total thickness of about a few hundred Angstroms, or may be metallized and alloyed with a very thin, optically reflective metal layer (illustrated as silver layer 103 in FIG. 25) and/or an optically transmissive metal layer, such as about a 100 Angstrom thickness of nickel-gold or nickel-gold-nickel, to facilitate formation of an ohmic contact (and potentially provide for light reflection toward the n+ GaN layer 110), some of which is then removed with other GaN layers, such as during GaN mesa formation.

Figure 46:
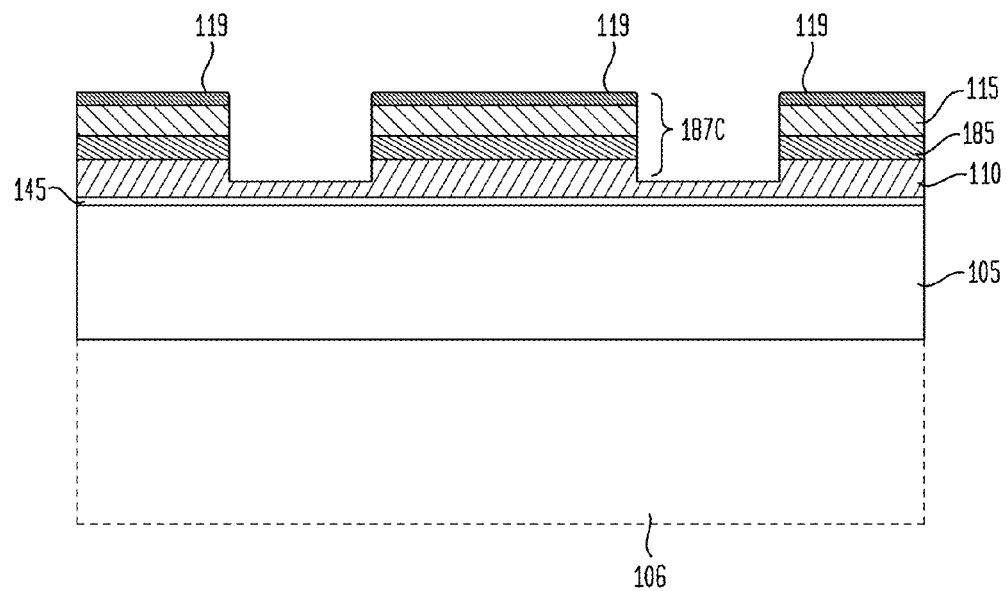
FIG. 46 is a cross-sectional view of a substrate having a buffer layer, a fourth mesa-etched complex GaN heterostructure, and metallization forming an ohmic contact with the p+ GaN layer.
Figure 47:
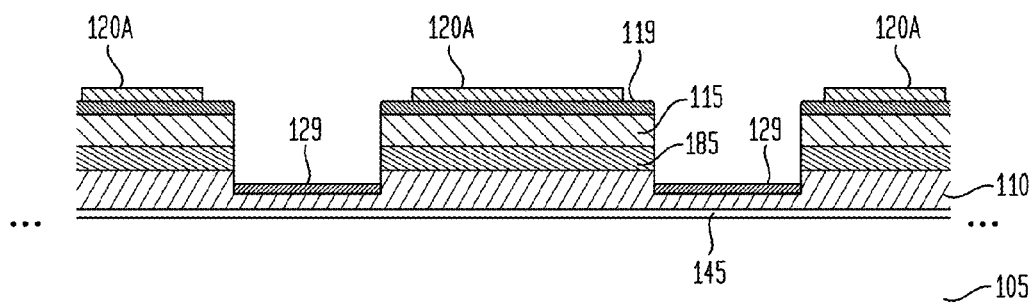
FIG. 47 is a cross-sectional view of a substrate having a buffer layer, a mesa-etched complex GaN heterostructure, metallization forming an ohmic contact with the p+ GaN layer, and metallization forming an ohmic contact with the n+ GaN layer.

FIG. 46 is a cross-sectional view of a substrate having a buffer layer, a fourth mesa-etched complex GaN heterostructure, and metallization (metal layer 119) forming an ohmic contact with the p+ GaN layer, illustrating a much smaller portion of the wafer 150 or 150A (such as region 193 of FIG. 45), to illustrate fabrication of a single diode (e.g., diode 100I). Through appropriate or standard mask and/or photoresist layers and etching as known in the art, the complex GaN heterostructure (n+ GaN layer 110, quantum well region 185 and p+ GaN layer 115) (with metal layer 119) is etched to form a GaN mesa structure 187C (with metal layer 119). Following the GaN mesa etch, also through appropriate or standard mask and/or photoresist layers as known or becomes known in the art, metallization is deposited (using any of the processes and metals previously described, such as titanium and aluminum, followed by annealing) to form metal layer 120A and also to form a metal layer 129 having an ohmic contact with the n+ GaN layer 110, as illustrated in FIG. 47.

Following the metallization, also through appropriate or standard mask and/or photoresist layers and etching as known or becomes known in the art, a singulation trench etch is performed, as illustrated in FIG. 48, through the non-mesa portion of the GaN heterostructure (n+ GaN layer 110) and though or comparatively deeply into the substrate 105 (e.g., through the GaN substrate 105 to the sapphire (106) of the wafer 150A or through part of the silicon substrate 105 as previously described) and creating singulation trenches 155 described above.

Figure 49:
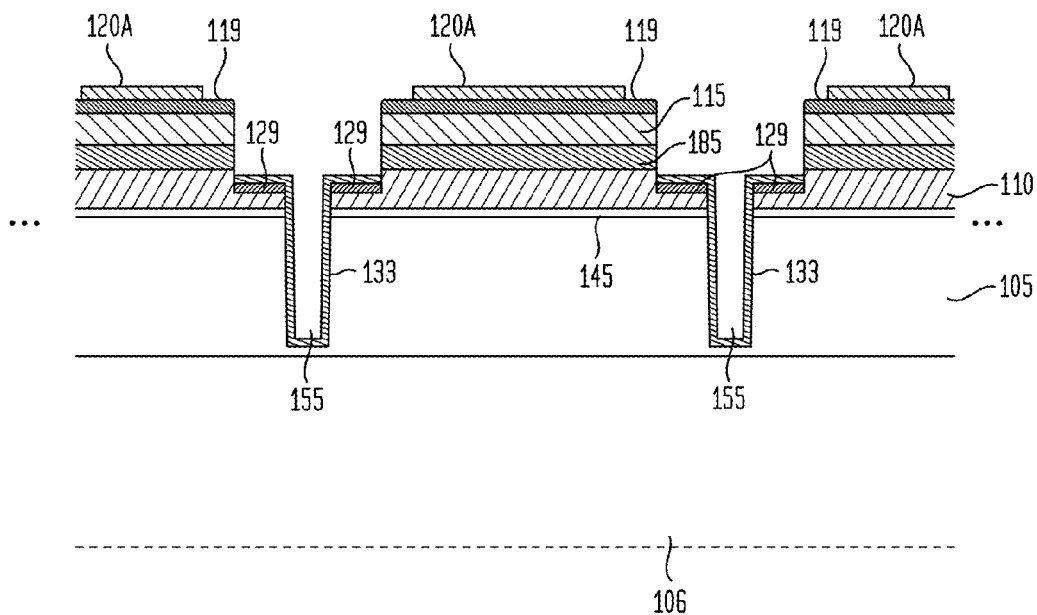
FIG. 49 is a cross-sectional view of a substrate having a buffer layer, a mesa-etched complex GaN heterostructure, metallization forming an ohmic contact with the p+ GaN layer, metallization forming an ohmic contact with the n+ GaN layer, and lateral etched trenches having metallization forming through, perimeter vias.

Also through appropriate or standard mask and/or photoresist layers and etching as known in the art, metallization layers are then deposited within trenches 155, forming a through or deep perimeter via 133 (providing conduction around the entire outside or lateral perimeter of the diode (100I), which also form an ohmic contact with the n+ GaN layer 110, as illustrated in FIG. 49. In exemplary embodiments, several layers of metal also may be deposited to form the through perimeter via 133. For example, titanium and tungsten may be sputtered to coat the sides and bottom of the trenches 155, to form a seed layer, followed by plating with nickel, to form a solid metal perimeter via 133.

Again also using appropriate or standard mask and/or photoresist layers and etching as known in the art, nitride passivation layer 135 is then grown or deposited, as illustrated in FIG. 50, generally to a thickness of about 0.35-1.0 microns, such as by plasma-enhanced chemical vapor deposition (PECVD) of silicon nitride, for example and without limitation, followed by photoresist and etching steps to remove unwanted regions of silicon nitride. Through appropriate or standard mask and/or photoresist layers and etching as known in the art, metal layer 120B having a bump or protruding structure is then formed as previously described, as illustrated in FIG. 50. Other than subsequent singulation of the diodes (in this case diode 100I) from the wafer 150 or 150A, as described below, the diodes 100I are otherwise complete, and it should be noted that these completed diodes 100I also have only one metal contact or terminal on the upper surface of each diode 100I (also a first terminal 125). Also as an option, a second (back) side metal layer 122 may be fabricated, as described below and as mentioned above with reference to other exemplary diodes, such as to form a second terminal 127.

Figure 51:
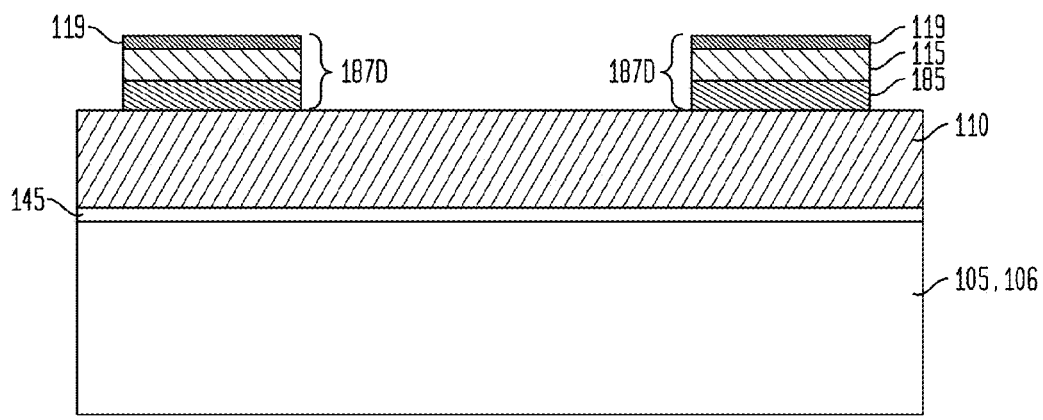
FIG. 51 is a cross-sectional view of a substrate having a buffer layer, a fifth mesa-etched complex GaN heterostructure, and metallization forming an ohmic contact with the p+ GaN layer.

FIGS. 51-57, 67 and 68 illustrate another exemplary method of diode 100K fabrication, subsequent to the fabrication at the wafer 150 or 150A level illustrated in FIG. 45. FIG. 51 is a cross-sectional view of a substrate having a buffer layer, a fifth mesa-etched complex GaN heterostructure 187D, and metallization forming an ohmic contact with the p+ GaN layer. As mentioned above, buffer layer 145 is typically fabricated when the substrate 105 is silicon (e.g., using a silicon wafer 150), and may be omitted for other substrates, such as a GaN substrate 105. In addition, sapphire 106 is illustrated as an option, such as for a thick GaN substrate 105 grown or deposited on a sapphire wafer 150A, in which case the buffer layer 145 may be omitted. Also as mentioned above, a metal layer 119 (as a seed layer for subsequent deposition of metal layer 120A) has been deposited at an earlier step, following deposition or growth of the GaN heterostructure (n+ GaN layer 110, quantum well region 185, and p+ GaN layer 115), rather than at a later step of diode fabrication. For example, metal layer 119 may be nickel with a flash of gold having a total thickness of about a few hundred Angstroms, or may be metallized and alloyed with a very thin, optically reflective metal layer (illustrated as silver layer 103 in FIG. 25) and/or an optically transmissive metal layer, such as about a 100 Angstrom thickness of nickel, nickel-gold or nickel-gold-nickel, to facilitate formation of an ohmic contact with the p+ GaN layer 115 (and potentially provide for light reflection toward the n+ GaN layer 110), some of which is then removed with other GaN layers, such as during GaN mesa formation. Through appropriate or standard mask and/or photoresist layers and etching as known in the art, the complex GaN heterostructure (n+ GaN layer 110, quantum well region 185 and p+ GaN layer 115) (with metal layer 119) is etched to form about a 1 micron deep GaN mesa structure 187D (with metal layer 119) having generally a toroidal shape, with an inner circular diameter of about 14 microns and an outer, generally hexagonal diameter of about 26 microns (measured side face-to-face).

Figure 52:
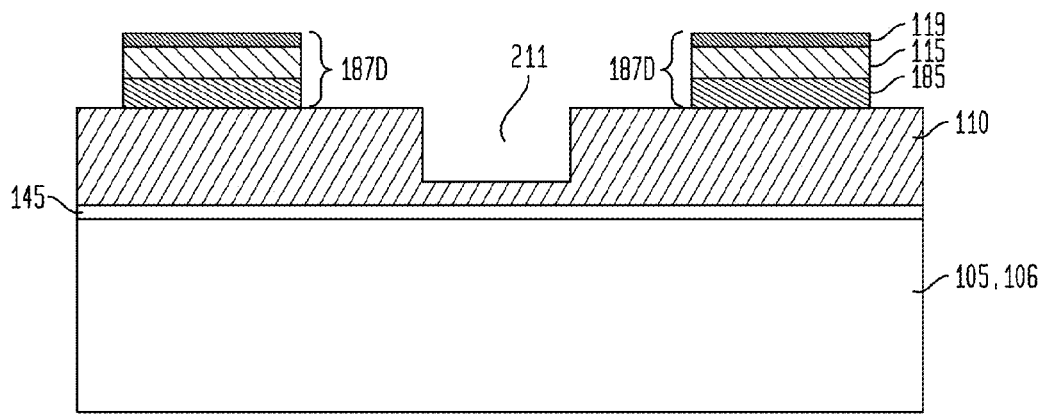
FIG. 52 is a cross-sectional view of a substrate having a buffer layer, a mesa-etched complex GaN heterostructure, metallization forming an ohmic contact with the p+ GaN layer, and etched GaN heterostructure for a center via connection.

Following the GaN mesa etch (187D), also through appropriate or standard mask and/or photoresist layers and etching as known or becomes known in the art, a blind or shallow via trench as illustrated in FIG. 52, creating a comparatively shallow, central via trench 211 into the non-mesa portion of the GaN heterostructure (n+ GaN layer 110). As illustrated, a circular, center via trench 211 about 2 microns deep has been formed and 6 microns in diameter.

Figure 53:
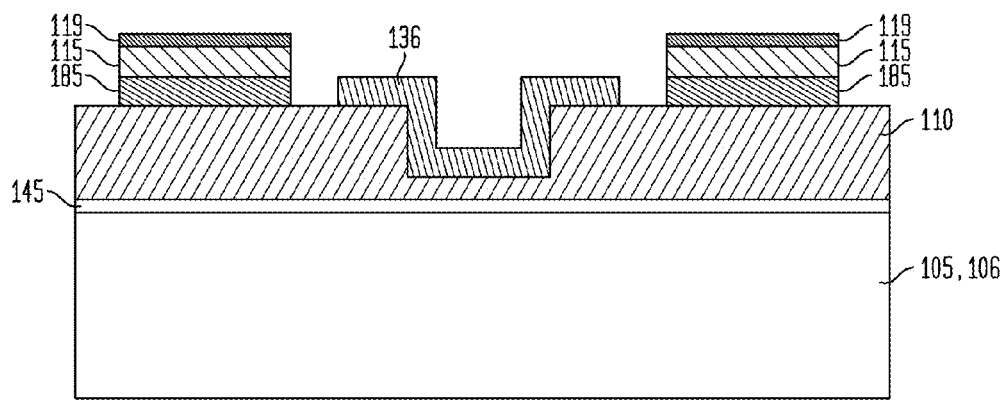
FIG. 53 is a cross-sectional view of a substrate having a buffer layer, a mesa-etched complex GaN heterostructure, metallization forming an ohmic contact with the p+ GaN layer, and metallization forming a center via and an ohmic contact with the n+ GaN layer.
Figure 54:
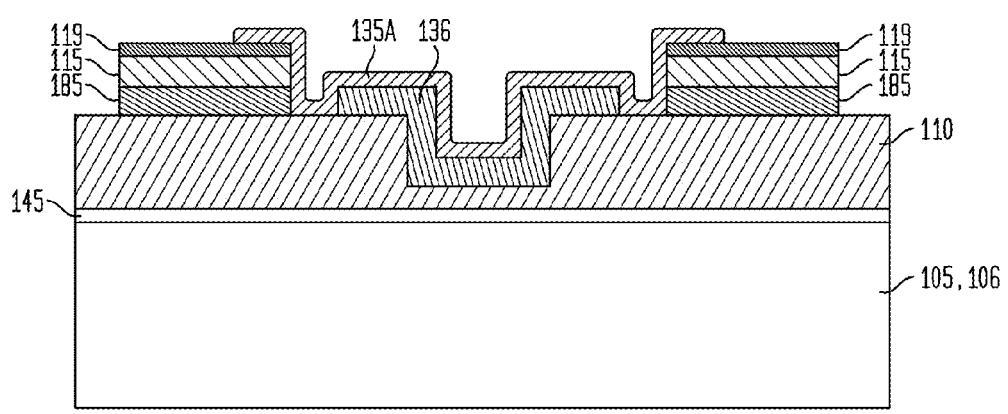
FIG. 54 is a cross-sectional view of a substrate having a buffer layer, a mesa-etched complex GaN heterostructure, metallization forming an ohmic contact with the p+ GaN layer, metallization forming a center via and an ohmic contact with the n+ GaN layer, and a first passivation layer (such as silicon nitride).

Through appropriate or standard mask and/or photoresist layers and etching as known in the art, metallization layers are then deposited, forming a center via 136, which also forms an ohmic contact with the n+ GaN layer 110, as illustrated in FIG. 53. In exemplary embodiments, several layers of metal (e.g., via metal) are deposited to form the center via 136. For example, about 100 Angstroms of titanium and about 1.5-2 microns of aluminum may be sputtered or plated to coat the sides, bottom, and part of the top of the trench 211, followed by alloying at about 550° C., to form a solid metal via 136, about 10 microns in the maximum diameter on top of the n+ GaN layer 110. Also using appropriate or standard mask and/or photoresist layers and etching as known in the art, a first nitride passivation layer 135A is then grown or deposited, as illustrated in FIG. 54, generally to a thickness of about 0.35-1.0 microns, or more particularly about 0.5 microns, and a maximum diameter of about 18 microns, such as by plasma-enhanced chemical vapor deposition (PECVD) of silicon nitride or silicon oxynitride, for example and without limitation, followed by photoresist and etching steps to remove unwanted regions of silicon nitride.

Figure 55:
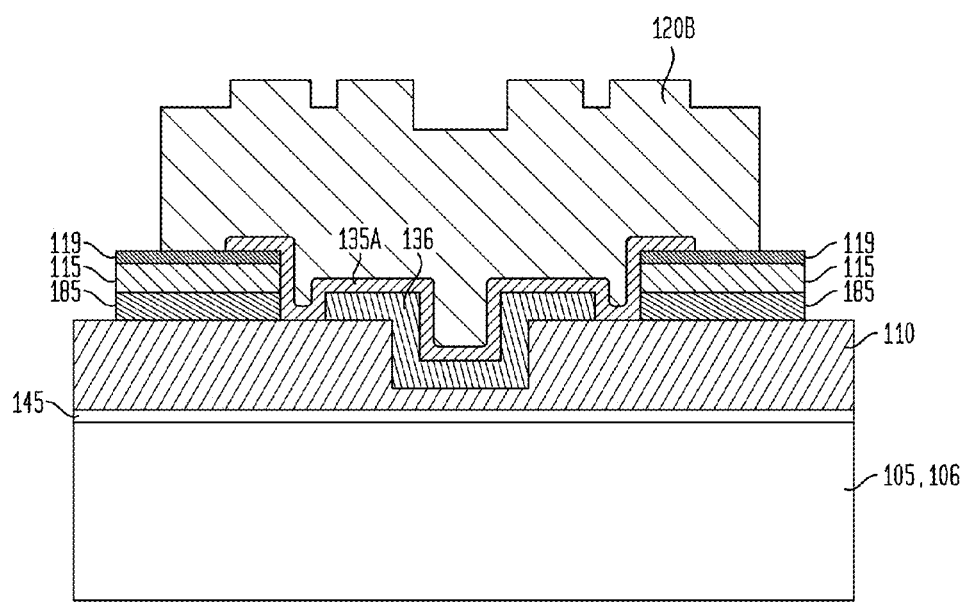
FIG. 55 is a cross-sectional view of a substrate having a buffer layer, a mesa-etched complex GaN heterostructure, metallization forming an ohmic contact with the p+ GaN layer, metallization forming a center via and an ohmic contact with the n+ GaN layer, a first passivation layer (such as silicon nitride), and metallization forming a protruding or bump structure.

Also through appropriate or standard mask and/or photoresist layers and etching as known in the art, metallization layers are then deposited, forming a metal layer 120B having a bump or protruding structure for contact to p+ GaN layer 115, as illustrated in FIG. 55, typically formed using die metal. In exemplary embodiments, several layers of metal may be deposited as previously described herein to form metal layers 120A and/or 120B for contact to p+ GaN layer 115, and in the interest of brevity, will not be repeated here. In an exemplary embodiment, the metal layer 120B is generally hexagonal in shape and has a diameter of about 22 microns (measured side face-to-face), and is comprised of about 100 Angstroms of nickel, about 4.5 microns of Aluminum, about 0.5 microns of nickel, and about 100 nm of gold.

Figure 56:
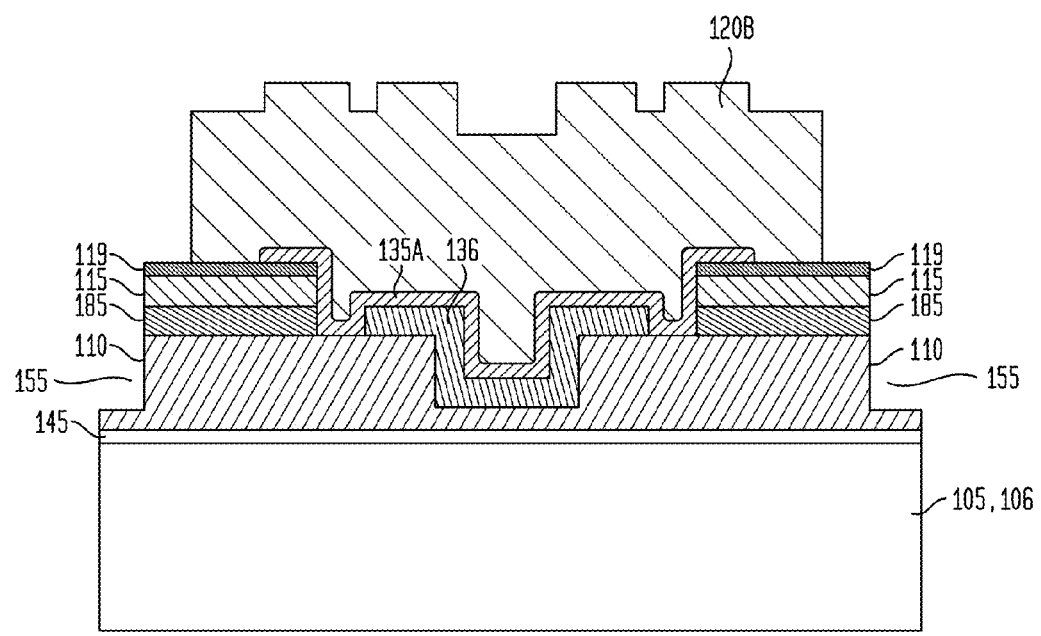
FIG. 56 is a cross-sectional view of a substrate having a buffer layer, a mesa-etched complex GaN heterostructure, metallization forming an ohmic contact with the p+ GaN layer, metallization forming a center via and an ohmic contact with the n+ GaN layer, a first passivation layer (such as silicon nitride), metallization forming a protruding or bump structure, and lateral (or perimeter) etched trenches.

Following the metallization, also through appropriate or standard mask and/or photoresist layers and etching as known or becomes known in the art, a singulation trench etch is performed, as illustrated in FIG. 56, using methods described previously, through a portion of the GaN heterostructure (into but not completely through the n+ GaN layer 110), generally about 2 microns deep in an exemplary embodiment, and creating singulation trenches 155 described above.

Figure 57:
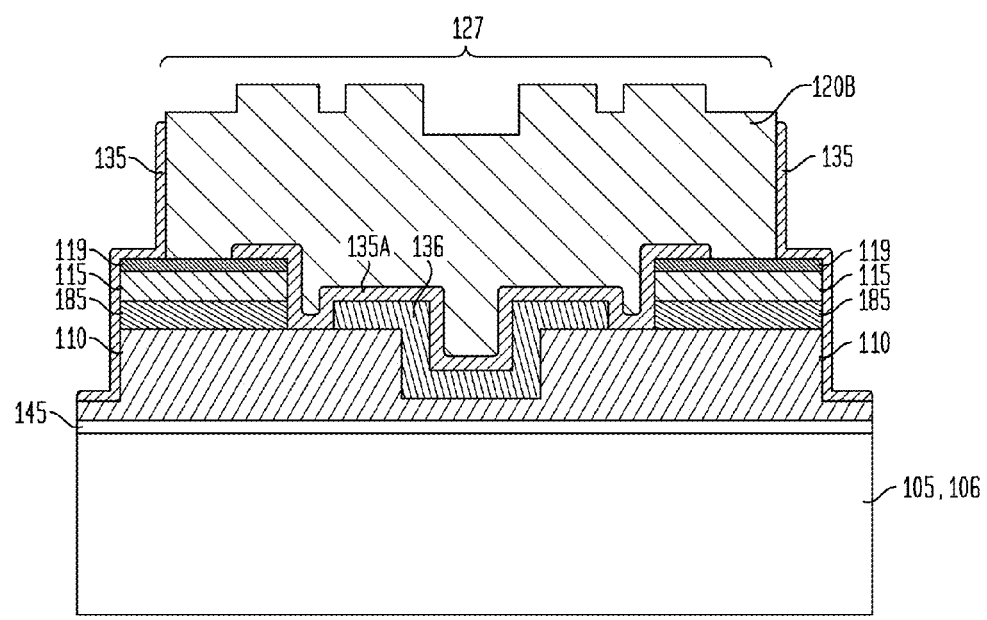
FIG. 57 is a cross-sectional view of a substrate having a buffer layer, a mesa-etched complex GaN heterostructure, metallization forming an ohmic contact with the p+ GaN layer, metallization forming a center via and an ohmic contact with the n+ GaN layer, a first passivation layer (such as silicon nitride), metallization forming a protruding or bump structure, lateral (or perimeter) etched trenches, and a second passivation layer (such as silicon nitride).

A second nitride passivation layer 135 is then grown or deposited, as illustrated in FIG. 57, generally to a thickness of about 0.35-1.0 microns, or more particularly about 0.5 microns, such as by plasma-enhanced chemical vapor deposition (PECVD) of silicon nitride or silicon oxynitride, for example and without limitation. Then using appropriate or standard mask and/or photoresist layers and etching as known in the art, unwanted regions of silicon nitride are removed, such as to clear the top of metal layer 102B, which will form a second terminal 127.

Subsequent substrate removal, singulation and fabrication of a second (back) side metal layer 122 are described below with reference to FIGS. 64, 65, 67 and 68.

Figure 58:
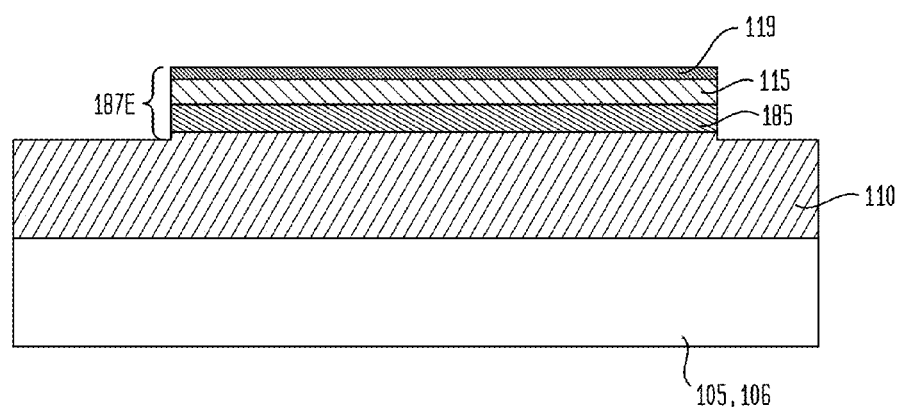
FIG. 58 is a cross-sectional view of a substrate having a buffer layer, a sixth mesa-etched complex GaN heterostructure, and metallization forming an ohmic contact with the p+ GaN layer.

FIGS. 58-63 and 69 illustrate another exemplary method of diode 100L fabrication, subsequent to the fabrication at the wafer 150 or 150A level illustrated in FIG. 45. FIG. 58 is a cross-sectional view of a substrate having a buffer layer, a sixth mesa-etched complex GaN heterostructure 187E, and metallization forming an ohmic contact with the p+ GaN layer. As mentioned above, buffer layer 145 is typically fabricated when the substrate 105 is silicon (e.g., using a silicon wafer 150), and may be omitted for other substrates, such as a GaN substrate 105. In addition, sapphire 106 is illustrated as an option, such as for a thick GaN substrate 105 grown or deposited on a sapphire wafer 150A, in which case the buffer layer 145 may be omitted. Also as mentioned above, a metal layer 119 (as a seed layer for subsequent deposition of metal layer 120A) has been deposited at an earlier step, following deposition or growth of the GaN heterostructure (n+ GaN layer 110, quantum well region 185, and p+ GaN layer 115), rather than at a later step of diode fabrication. For example, metal layer 119 may be nickel with a flash of gold having a total thickness of about a few hundred Angstroms, or may be metallized and alloyed with a very thin, optically reflective metal layer (illustrated as silver layer 103 in FIG. 25) and/or an optically transmissive metal layer, such as about a 100 Angstrom to about a 2.5 nm thickness of nickel, nickel-gold or nickel-gold-nickel, to facilitate formation of an ohmic contact with p+ GaN layer 115 (and potentially provide for light reflection toward the n+ GaN layer 110), some of which is then removed with other GaN layers, such as during GaN mesa formation. In an exemplary embodiment, about 2 to 3 nm, or more particularly about 2.5 nm, of nickel or nickel and gold are deposited and alloyed at 500° C. to form metal layer 119 in ohmic contact with p+ GaN layer 115. Through appropriate or standard mask and/or photoresist layers and etching as known in the art, the complex GaN heterostructure (n+ GaN layer 110, quantum well region 185 and p+ GaN layer 115) (with metal layer 119) is etched to form about a 1 micron deep GaN mesa structure 187E (with metal layer 119) having the flattened triangular shape discussed above, with a first radius of about 8 microns to the cut-out area leaving room for the contacts 128, and a second radius of about 11 microns to the triangle apex/sides.

Figure 59:
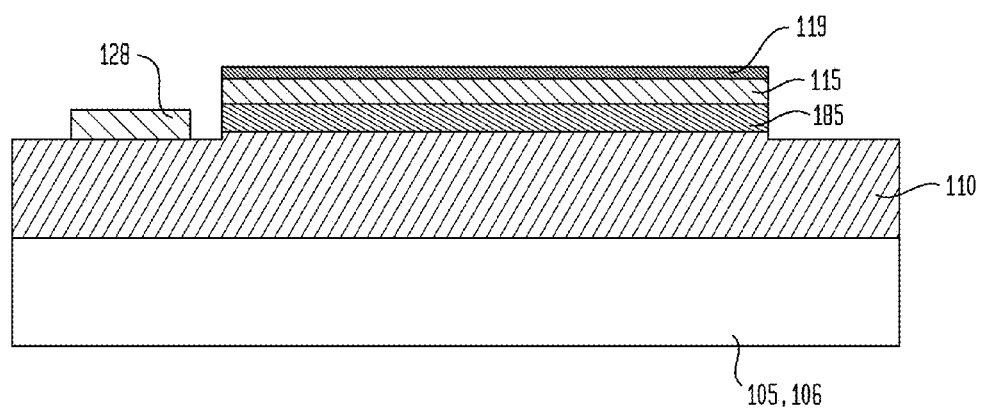
FIG. 59 is a cross-sectional view of a substrate having a buffer layer, a mesa-etched complex GaN heterostructure, metallization forming an ohmic contact with the p+ GaN layer, and metallization forming an ohmic contact with the n+ GaN layer.

Following the GaN mesa etch (187E), also through appropriate or standard mask and/or photoresist layers and etching as known in the art, first metallization layers are then deposited, forming contacts 128, which also form an ohmic contact with the n+ GaN layer 110, as illustrated in FIG. 59. In exemplary embodiments, several layers of via metal are deposited to form the contacts 128, which are utilized as a second terminal 127. For example and without limitation, about 100 Angstroms of titanium, about 500 nm of aluminum, 500 nm of nickel, and 100 nm of gold may be sputtered or plated, to form solid metal contacts 128, each about 1.1 microns thick, about 3 microns wide measured radially, and extending about the periphery of the n+ GaN layer 110 as illustrated in FIG. 23. In an exemplary embodiment, also as illustrated in FIG. 23, three contacts 128 are formed.

Figure 60:
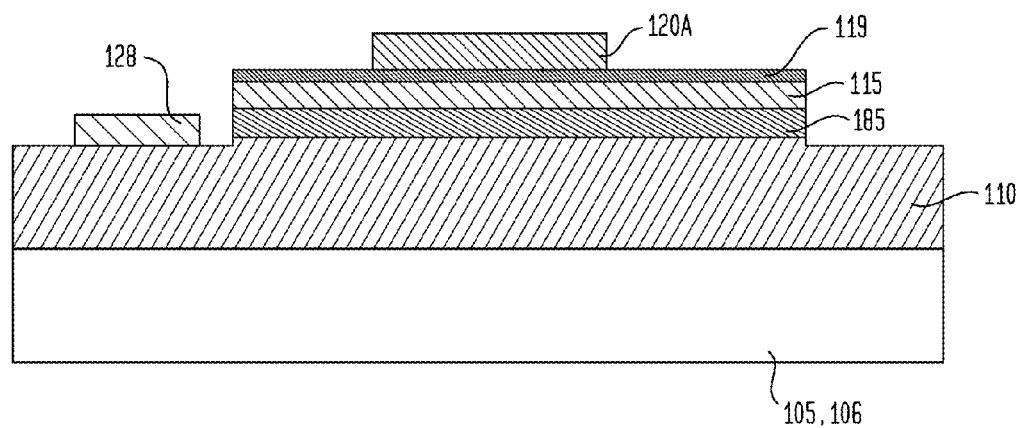
FIG. 60 is a cross-sectional view of a substrate having a buffer layer, a mesa-etched complex GaN heterostructure, metallization forming an ohmic contact with the p+ GaN layer, metallization forming an ohmic contact with the n+ GaN layer, and additional metallization for contact with the p+ GaN layer.

Following the deposition of contacts 128, also through appropriate or standard mask and/or photoresist layers as known or becomes known in the art, additional metallization is deposited (using any of the processes and metals previously described, such as titanium and aluminum, followed by annealing) to form metal layer 120A as part of the ohmic contact for p+ GaN layer 115, as illustrated in FIG. 60. For example, in an exemplary embodiment, about 200 nm of silver (forming a reflective or mirror layer), 200 nm of nickel, about 500 nm of aluminum, and 200 nm of nickel may be sputtered or plated, to form centrally located metal layer 120A about 1.1 microns thick and about 8 microns in diameter.

Figure 61:
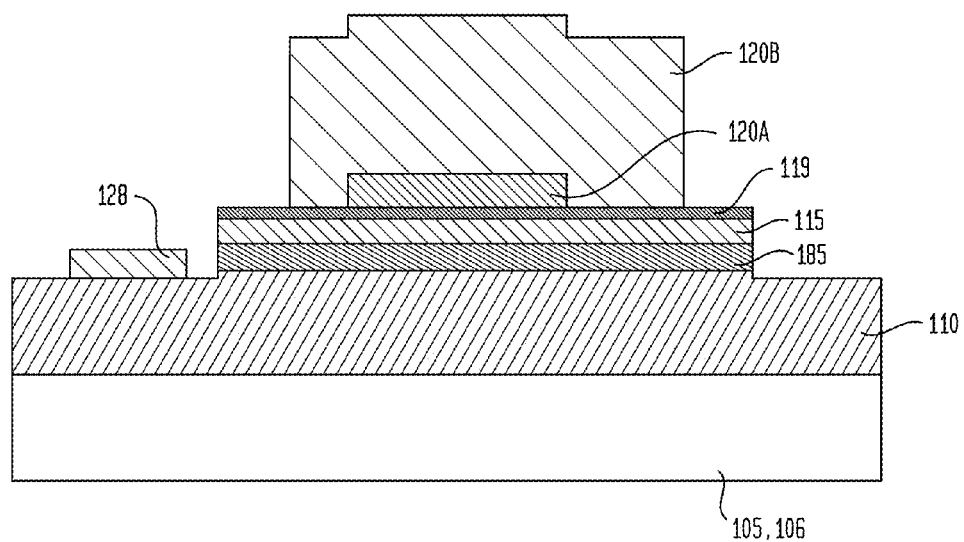
FIG. 61 is a cross-sectional view of a substrate having a buffer layer, a mesa-etched complex GaN heterostructure, metallization forming an ohmic contact with the p+ GaN layer, metallization forming an ohmic contact with the n+ GaN layer, additional metallization for contact with the p+ GaN layer, and metallization forming a protruding or bump structure.

Also through appropriate or standard mask and/or photoresist layers and etching as known in the art, additional metallization layers are then deposited, forming a metal layer 120B having a bump or protruding structure for contact to p+ GaN layer 115, as illustrated in FIG. 61, typically using die metal. In exemplary embodiments, several layers of metal may be deposited as previously described herein to form metal layers 120A and/or 120B for contact to p+ GaN layer 115, and in the interest of brevity, will not be repeated here. In an exemplary embodiment, the metal layer 120B generally has the flattened triangle shape illustrated in FIG. 23, with a first radius of about 6 microns to the cut-out area (for the contacts 128), a second radius of about 9 microns to the triangle apex/sides, which are each about 3.7 microns in width, and is comprised of about 200 nm of silver (also forming a reflective or mirror layer over the p+ GaN layer 115), about 200 nm of nickel, about 200 nm of aluminum, about 250 nm of nickel, about 200 nm of aluminum, about 250 nm of nickel, and about 100 nm of gold, each added as a successive layer, followed by alloying at 550° C. for about 10 minutes in a nitrogen environment, for a total height of about 5 microns, in addition to the about 1.1 micron height of metal layer 120A. It should be noted that this provide an approximately 5 micron separation in height between the first and second terminals 125, 127.

Figure 62:
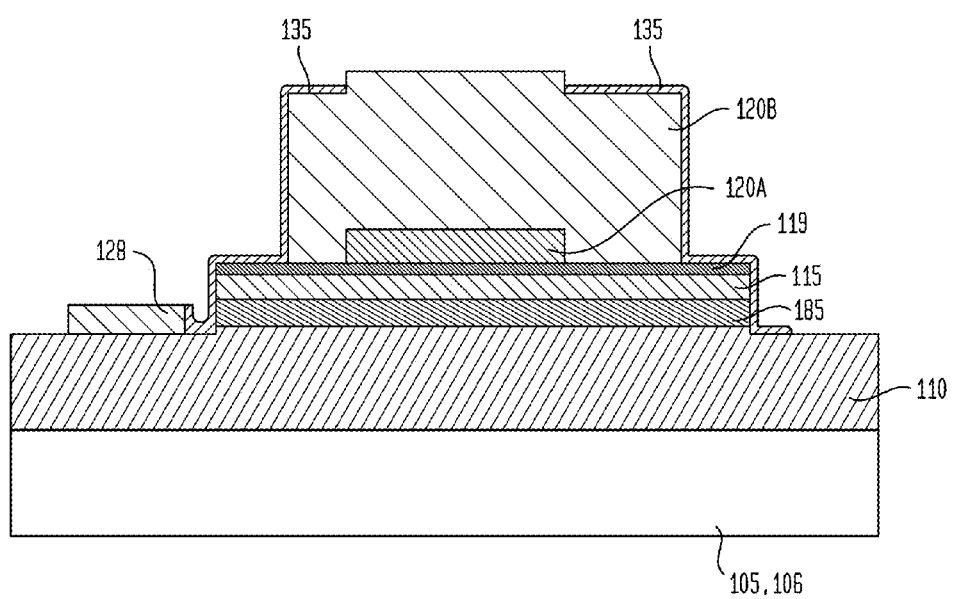
FIG. 62 is a cross-sectional view of a substrate having a buffer layer, a mesa-etched complex GaN heterostructure, metallization forming an ohmic contact with the p+ GaN layer, metallization forming an ohmic contact with the n+ GaN layer, additional metallization for contact with the p+ GaN layer, metallization forming a protruding or bump structure, and passivation layers (such as silicon nitride).

A second nitride passivation layer 135 is then grown or deposited, as illustrated in FIG. 62, generally to a thickness of about 0.35-1.0 microns, or more particularly about 0.5 microns, such as by plasma-enhanced chemical vapor deposition (PECVD) of silicon nitride or silicon oxynitride, for example and without limitation. Then using appropriate or standard mask and/or photoresist layers and etching as known in the art, unwanted regions of silicon nitride are removed, such as to clear the top of metal layer 102B, which will form a first terminal 125.

Figure 63:
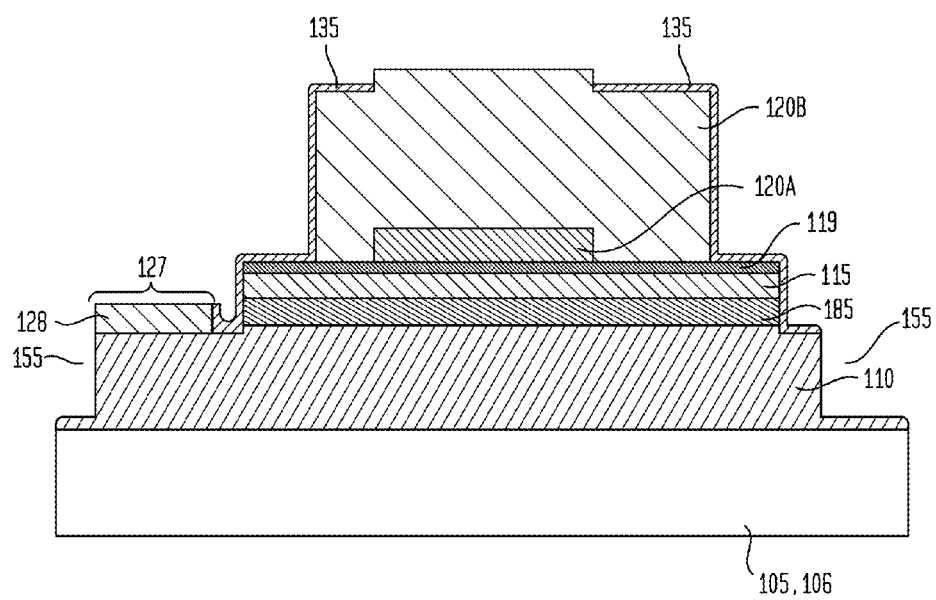
FIG. 63 is a cross-sectional view of a substrate having a buffer layer, a mesa-etched complex GaN heterostructure, metallization forming an ohmic contact with the p+ GaN layer, metallization forming an ohmic contact with the n+ GaN layer, additional metallization for contact with the p+ GaN layer, metallization forming a protruding or bump structure, passivation layers (such as silicon nitride), and lateral (or perimeter) etched trenches.

Following the passivation, also through appropriate or standard mask and/or photoresist layers and etching as known or becomes known in the art, a singulation trench etch is performed, as illustrated in FIG. 63, using methods described previously, through a portion of the GaN heterostructure (into but not completely through the n+ GaN layer 110), generally about 2-3.5 microns deep in an exemplary embodiment, and creating singulation trenches 155 described above.

Subsequent substrate removal and singulation are described below with reference to FIGS. 64, 65, 67 and 69.

Numerous variations of the methodology for fabrication of diodes 100-100L may be readily apparent in light of the teachings of the disclosure, all of which are considered equivalent and within the scope of the disclosure. In other exemplary embodiments, such trench 155 formation and (nitride) passivation layer formation may be performed earlier or later in the device fabrication process. For example, trenches 155 may be formed later in fabrication, after formation of metal layer 120B, and may leave exposed substrate 105, or may be followed by a second passivation. Also for example, trenches 155 may be formed earlier in fabrication, such as after the GaN mesa etch, followed by deposition of (nitride) passivation layer 135. In the latter example, to maintain planarization during the balance of the device fabrication process, the passivated trenches 155 may be filled in with oxide, photoresist or other material (deposition of the layer followed by removal of unwanted areas using a photoresist mask and etch or an unmasked etch process) or may be filled in (and potentially refilled following metal contact 120A formation) with resist. In another example, silicon nitride 135 deposition (followed by mask and etch steps) may be performed following the GaN mesa etch and before metal contact 120A deposition.

FIG. 64 is a cross-sectional view illustrating an exemplary silicon wafer 150 embodiment having a plurality of diodes 100-100L adhered to a holding apparatus 160 (such as a holding, handle or holder wafer). FIG. 65 is a cross-sectional view illustrating an exemplary diode sapphire wafer 150A embodiment adhered to a holding apparatus 160. As illustrated in FIGS. 64 and 65, the diode wafer 150, 150A containing a plurality of unreleased diodes 100-100L (illustrated generally for purposes of explication and without any significant feature detail) is adhered, using any known, commercially available wafer adhesive or wafer bond 165, to a holding apparatus 160 (such as a wafer holder) on the first side of the diode wafer 150, 150A having the fabricated diodes 100-100L. As illustrated and as described above, singulation or individuation trenches 155 between each diode 100-100L have been formed during wafer processing, such as through etching, and is then utilized to separate each diode 100-100L from adjacent diodes 100-100L without a mechanical process such as sawing. As illustrated in FIG. 64, while the diode wafer 150 is still adhered to the holding apparatus 160, the second, backside 180 of the diode wafer 150 is then etched (e.g., wet or dry etched) or mechanically ground and polished to a level (illustrated as a dashed line), or both, either to expose the trenches 155, or to leave some additional substrate which may then be removed through etching, for example and without limitation. When sufficiently etched or ground and polished, or both (and/or with any additional etching), each individual diode 100-100L has been released from each other and any remaining diode wafer 150, while still adhered with the adhesive 165 to the holding apparatus 160. As illustrated in FIG. 65, also while the diode wafer 150A is still adhered to the holding apparatus 160, the second, backside 180 of the diode wafer 150A is then exposed to laser light (illustrated as one or more laser beams 162) which then cleaves (illustrated as a dashed line) the GaN substrate 105 from the sapphire 106 of the wafer 150A (also referred to as laser lift-off), which also may be followed by any further chemical-mechanical polishing and any needed etching (e.g., wet or dry etching), thereby releasing each individual diode 100-100L from each other and the wafer 150A, while still adhered with the adhesive 165 to the holding apparatus 160. In this exemplary embodiment, the wafer 150A may then be ground and/or polished and re-used.

An epoxy bead (not separately illustrated) is also generally applied about the periphery of the wafer 150, to prevent non-diode fragments from the edge of the wafer from being released into the diode (100-100L) fluid during the diode release process discussed below.

FIG. 66 is a cross-sectional view illustrating an exemplary diode 100J embodiment adhered to a holding apparatus. Following singulation of the diodes 100-100K (as described above with reference to FIGS. 64 and 65), and while the diodes 100-100K are still adhered with adhesive 165 to the holding apparatus 160, the second, back side of the diode 100-100K is exposed. As illustrated in FIG. 66, metallization may then be deposited to the second, back side, such as through vapor deposition (angled to avoid filling the trenches 155), forming second, back side metal layer 122 and a diode 100J embodiment. Also as illustrated, diode 100J has one center through via 131 having an ohmic contact with the n+ GaN layer 110 and contact with the second, back side metal layer 122 for current conduction between the n+ GaN layer 110 and the second, back side metal layer 122. Exemplary diode 100D is quite similar, with exemplary diode 100J having the second, back side metal layer 122 to form a second terminal 127. As previously mentioned, the second, back side metal layer 122 (or the substrate 105 or any of the various through vias 131, 133, 134) may be used to make an electrical connection with a first conductor 310 in an apparatus 300, 300A, 300B, 300C, 300D, 720, 730, 760 for energizing the diode 100-100K.

Figure 67:
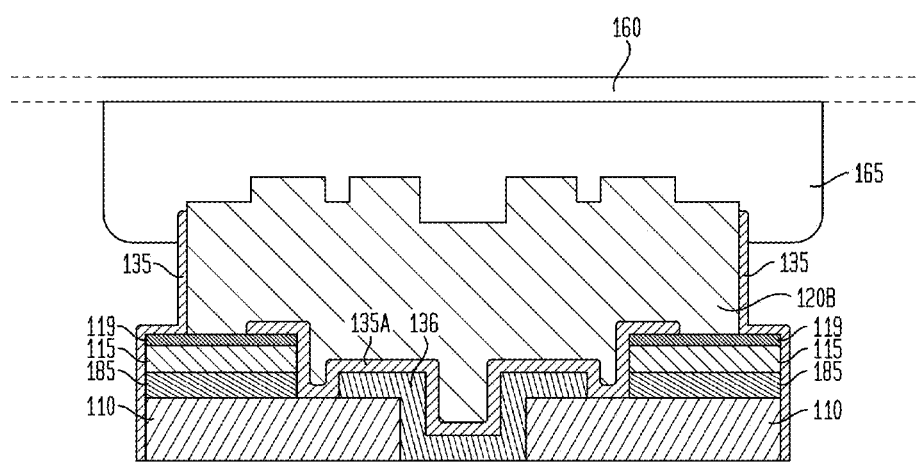
FIG. 67 is a cross-sectional view illustrating an exemplary tenth diode embodiment prior to back side metallization adhered to a holding apparatus.
Figure 68:
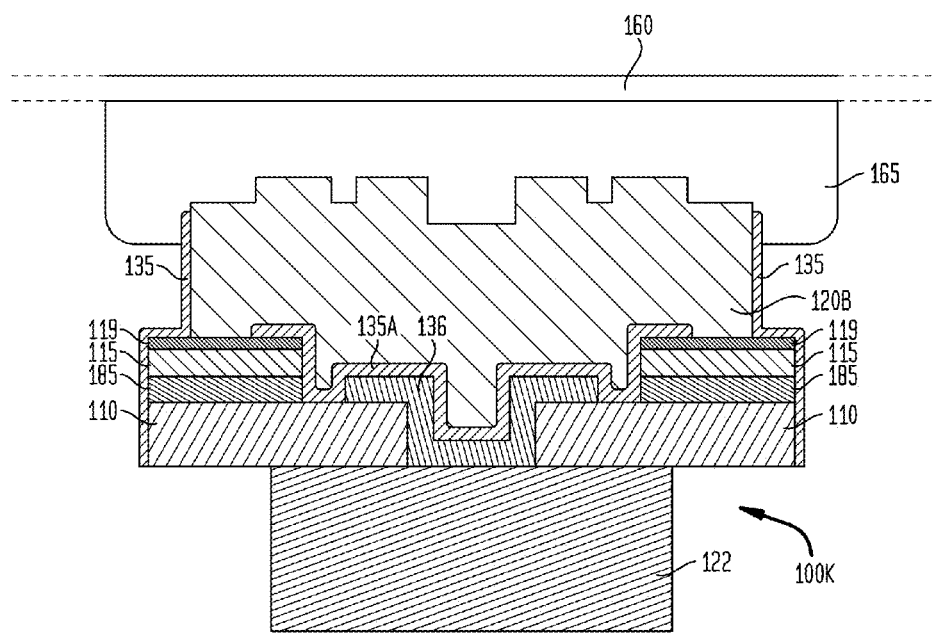
FIG. 68 is a cross-sectional view illustrating an exemplary diode embodiment adhered to a holding apparatus.

FIG. 67 is a cross-sectional view illustrating an exemplary tenth diode embodiment prior to back side metallization adhered to a holding apparatus 160. As illustrated in FIG. 67, the exemplary diode-in-process has been singulated, with any substrate 105, 105A removed as described above and also with an etching step (e.g., wet or dry etching), exposing a surface of the n+ GaN layer 110 and the via 136, leaving about a 2-6 micron (or more particulary about a 2-4 micron, or more particularly about a 3 micron) depth of the complex GaN heterostructure. Using appropriate or standard mask and/or photoresist layers and etching as known in the art metallization is then deposited to the second, back side, such as through sputtering, plating or vapor deposition, forming second, back side metal layer 122 and a diode 100K embodiment as illustrated in FIG. 68. In an exemplary embodiment, the metal layer 122 is elliptically-shaped, as illustrated in FIG. 21, generally about 12-16 microns in width for the major axis, about 4-8 microns width for the minor axis, and about 4-6 microns in depth, or more particularly generally about 14 microns in width for the major axis, about 6 microns width for the minor axis, and about 5 microns in depth, and is comprised of about 100 Angstroms of titanium, about 4.5 microns of aluminum, about 0.5 microns of nickel, and 100 nm of gold. Also as illustrated for diode 100K, what was originally a comparatively shallow center via is now a through via 136 having an ohmic contact with the n+ GaN layer 110 and contact with the second, back side metal layer 122 for current conduction between the n+ GaN layer 110 and the second, back side metal layer 122. As previously mentioned, for this exemplary diode 100K embodiment, the diode 100K is then flipped over or inverted, and the second, back side metal layer 122 forms a first terminal 125 and may be used to make an electrical connection with a second conductor 320 in an apparatus 300, 300A, 300B, 300C, 300D, 720, 730, 760 for energizing the diode 100K.

Figure 69:
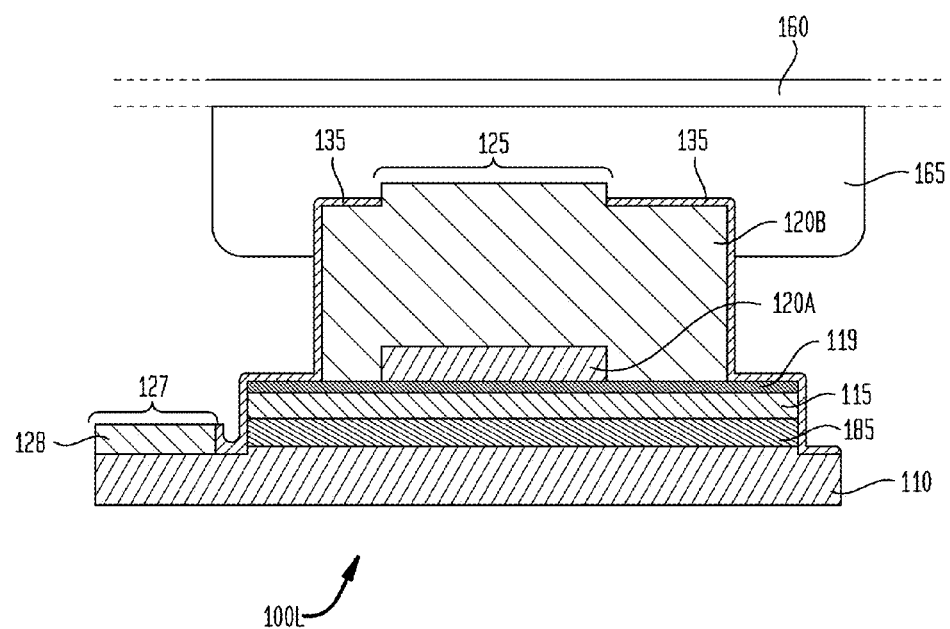
FIG. 69 is a cross-sectional view illustrating an exemplary eleventh diode embodiment adhered to a holding apparatus.

FIG. 69 is a cross-sectional view illustrating an exemplary eleventh diode 100L embodiment adhered to a holding apparatus. As illustrated in FIG. 69, the exemplary diode 100L has been singulated, with any substrate 105, 105A removed as described above and with an etching step, exposing a surface of the n+ GaN layer 110, leaving about a 2-6 micron (or more particularly about a 3 to 5 micron, or more particularly about a 4 to 5 micron, or more particularly about a 4.5 micron) depth of the complex GaN heterostructure.

Following singulation of the diodes 100-100L, they may be utilized, such as to form a diode ink, discussed below with reference to FIGS. 74 and 75.

Figure 104:
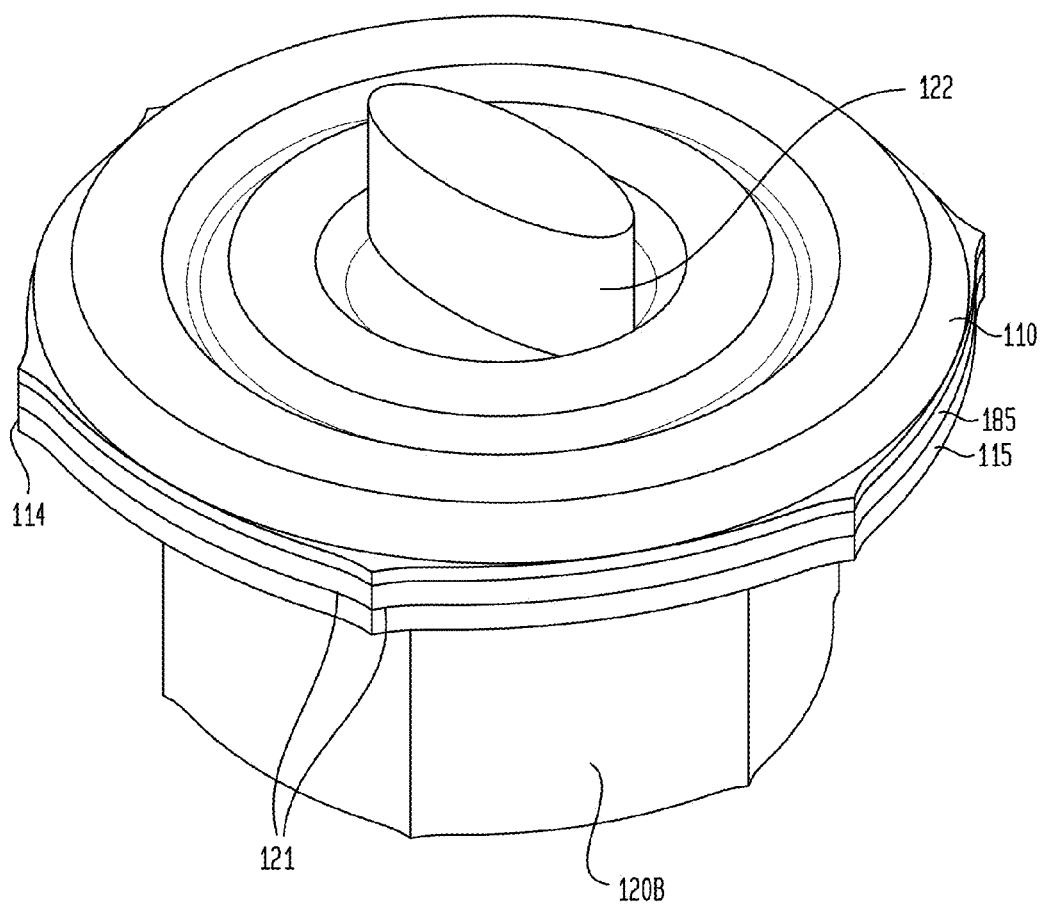
FIG. 104 is a perspective view illustrating an exemplary first surface geometry of an exemplary light emitting or absorbing region.
Figure 105:
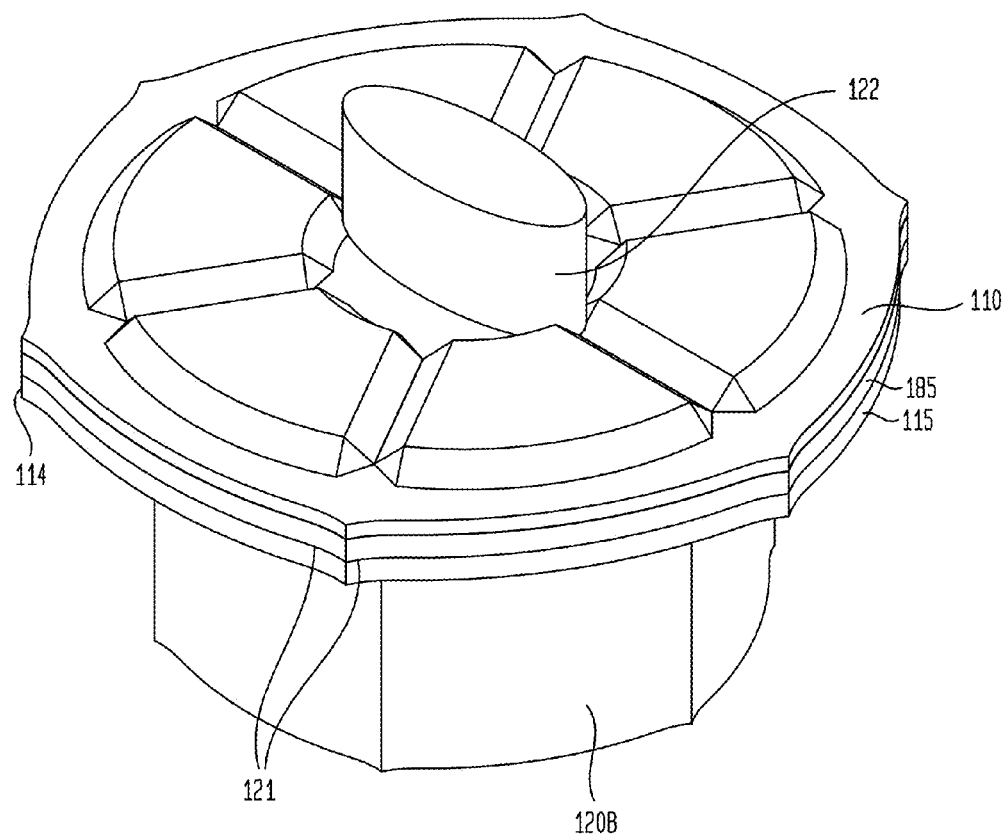
FIG. 105 is a perspective view illustrating an exemplary second surface geometry of an exemplary light emitting or absorbing region.

It should also be noted that various surface geometries and/or textures may also be fabricated for any of the various diodes 100-100L, to help reduce internal reflection and increase light extraction when implemented as LEDs. Any of these various surface geometries may also have any of the various surface textures previously discussed with reference to FIG. 25. FIG. 104 is a perspective view illustrating an exemplary first surface geometry of an exemplary light emitting or absorbing region, implemented as a plurality of concentric rings or toroidal shapes on the upper, light emitting (or absorbing) surface of a diode 100K. Such a geometry is typically etched into the second, back side of the diode 100K before or after the addition of the back side metal 122, through appropriate or standard mask and/or photoresist layers and etching as known or becomes known in the art. FIG. 105 is a perspective view illustrating an exemplary second surface geometry of an exemplary light emitting or absorbing region, implemented as a plurality of substantially curvilinear trapezoidal shapes on the upper, light emitting (or absorbing) surface of a diode 100K. Such a geometry also is typically etched into the second, back side of the diode 100K before or after the addition of the back side metal 122, also through appropriate or standard mask and/or photoresist layers and etching as known or becomes known in the art.

Figure 106:
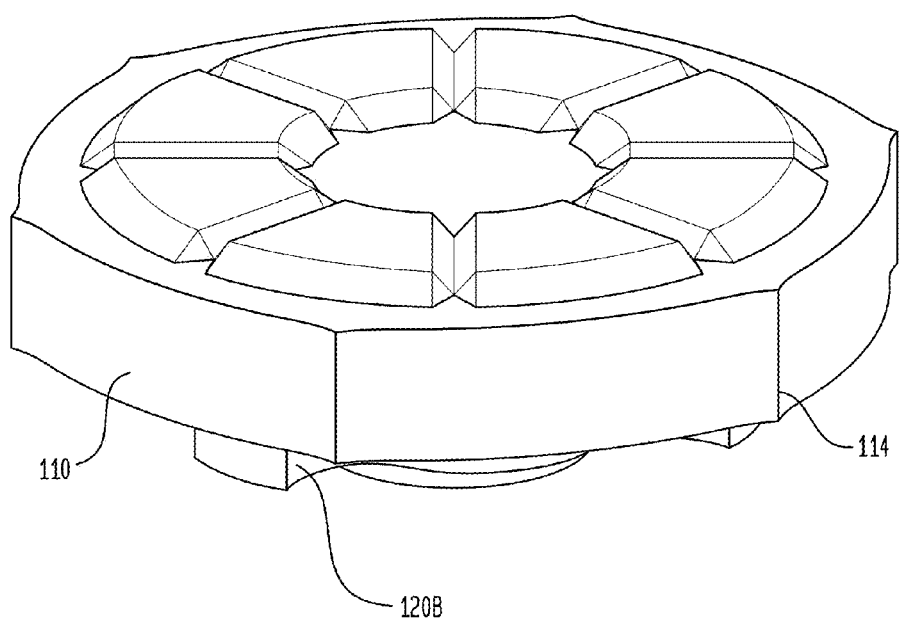
FIG. 106 is a perspective view illustrating an exemplary third surface geometry of an exemplary light emitting or absorbing region.
Figure 107:
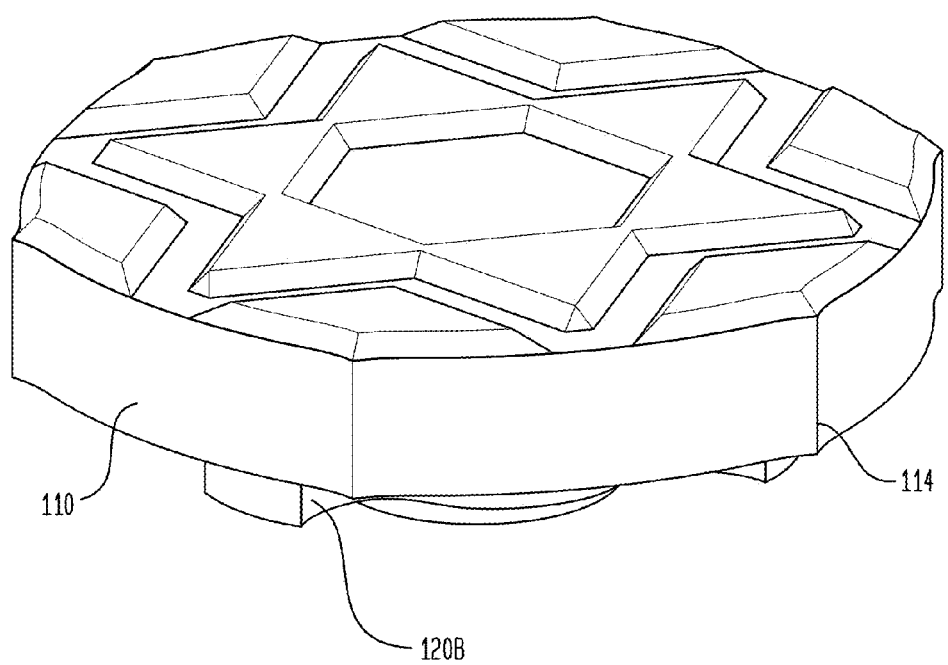
FIG. 107 is a perspective view illustrating an exemplary fourth surface geometry of an exemplary light emitting or absorbing region.
Figure 108:
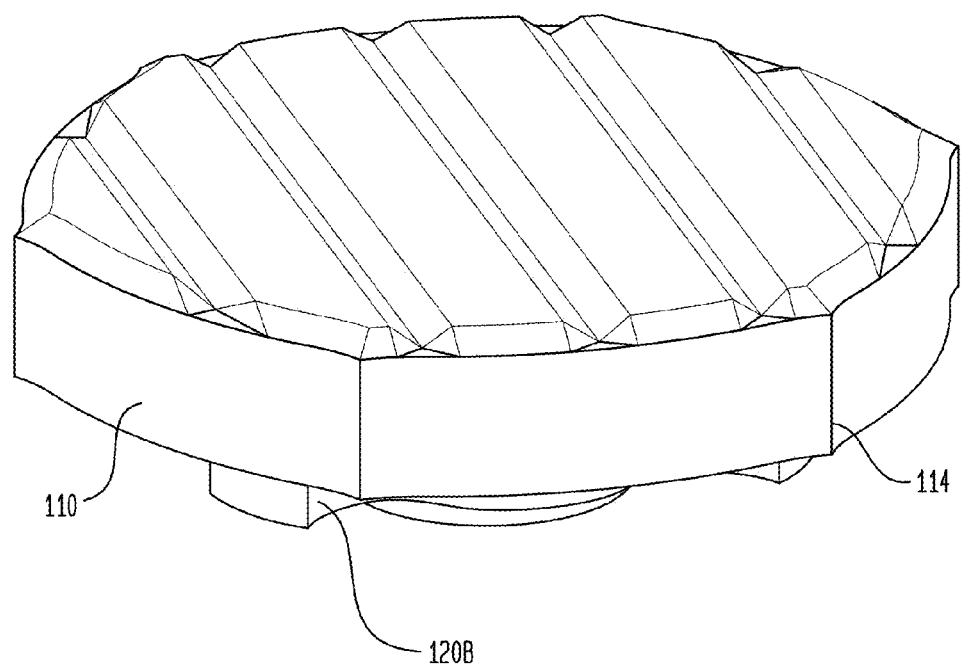
FIG. 108 is a perspective view illustrating an exemplary fifth surface geometry of an exemplary light emitting or absorbing region.

FIG. 106 is a perspective view illustrating an exemplary third surface geometry of an exemplary light emitting or absorbing region, implemented as a plurality of substantially curvilinear trapezoidal shapes on the lower (or bottom), light emitting (or absorbing) surface of a diode 100L. FIG. 107 is a perspective view illustrating an exemplary fourth surface geometry of an exemplary light emitting or absorbing region, implemented as substantially star or stellate shapes on the lower (or bottom), light emitting (or absorbing) surface of a diode 100L. FIG. 108 is a perspective view illustrating an exemplary fifth surface geometry of an exemplary light emitting or absorbing region, implemented as a plurality of substantially parallel bar or stripe shapes on the lower (or bottom), light emitting (or absorbing) surface of a diode 100L. Such geometries also are typically etched into the second, back side of the diode 100L as part of the substrate removal process and/or the diode singulation process previously discussed with reference to FIG. 69, through appropriate or standard mask and/or photoresist layers and etching as known or becomes known in the art.

FIGS. 70, 71, 72 and 73 are flow diagrams illustrating exemplary first, second, third and fourth method embodiments for diode 100-100L fabrication, respectively, and provide a useful summary. It should be noted that many of the steps of these methods may be performed in any of various orders, and that steps of one exemplary method may also be utilized in the other exemplary methods. Accordingly, each of the methods will refer generally to fabrication of any of the diodes 100-100L, rather than fabrication of a specific diode 100-100L embodiment, and those having skill in the art will recognize which steps may be "mixed and matched" to create any selected diode 100-100L embodiment.

Referring to FIG. 70, beginning with start step 240, an oxide layer is grown or deposited on a semiconductor wafer, step 245, such as a silicon wafer. The oxide layer is etched, step 250, such as to form a grid or other pattern. A buffer layer and a light emitting or absorbing region (such as a GaN heterostructure) is grown or deposited, step 255, and then etched to form a mesa structure for each diode 100-100L, step 260. The wafer 150 is then etched to form via trenches into the substrate 105 for each diode 100-100L, step 265. One or more metallization layers are then deposited to form a metal contact and vias for each diode 100-100L, step 270. Singulation trenches are then etched between diodes 100-100L, step 275. A passivation layer is then grown or deposited, step 280. A bump or protruding metal structure is then deposited or grown on the metal contact, step 285, and the method may end, return step 290. It should be noted that many of these fabrication steps may be performed by different entities and agents, and that the method may include the other variations and ordering of steps discussed above.

Figure 71A:
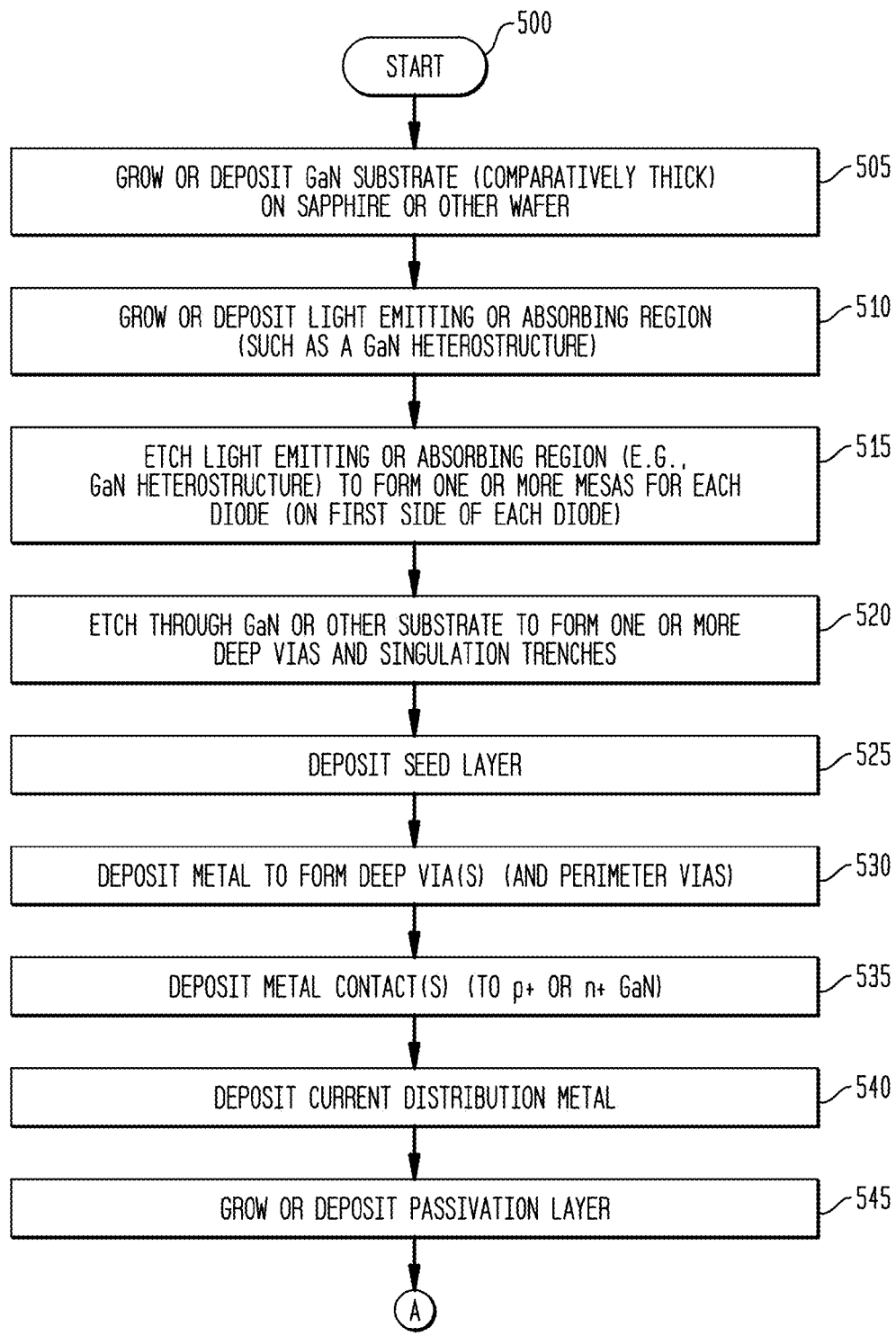
FIG. 71A and FIG. 71B, is a flow diagram illustrating an exemplary second method embodiment for diode fabrication.
Figure 71B:
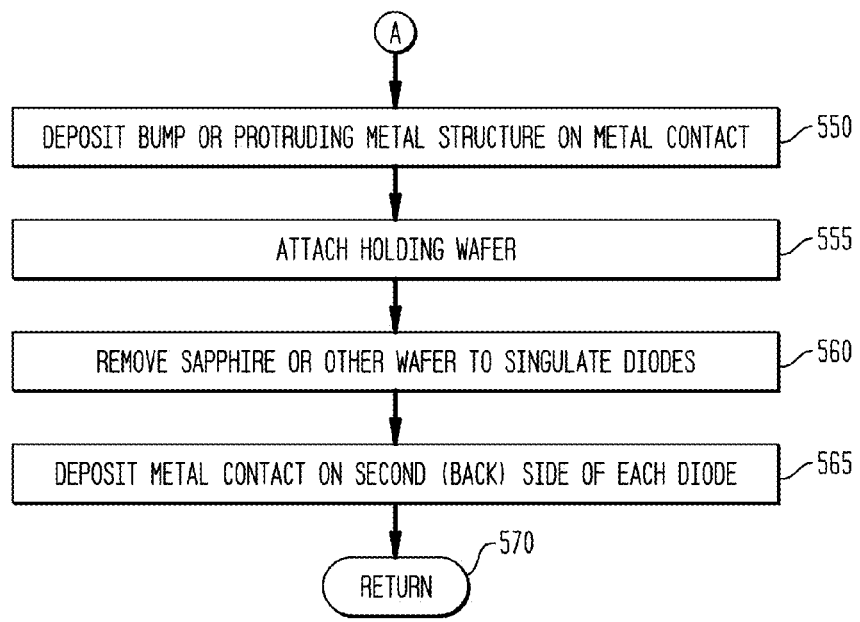

Referring to FIG. 71, beginning with start step 500, a comparatively thick GaN layer (e.g., 7-8 microns) is grown or deposited on a wafer, step 505, such as a sapphire wafer 150A. A light emitting or absorbing region (such as a GaN hetero structure) is grown or deposited, step 510, and then etched to form a mesa structure for each diode 100-100L (on a first side of each diode 100-100L), step 515. The wafer 150 is then etched to form one or more through or deep via trenches and singulation trenches into the substrate 105 for each diode 100-100L, step 520. One or more metallization layers are then deposited to form through vias for each diode 100-100L, which may be center, peripheral or perimeter through vias (131, 134, 133, respectively), typically by depositing a seed layer, step 525, followed by additional metal deposition using any of the methods described above. Metal is also deposited to form one or more metal contacts to the GaN heterostructure (such as to the p+ GaN layer 115 or to the n+ GaN layer 110), step 535, and to form any additional current distribution metal (e.g., 120A, 126), step 540. A passivation layer is then grown or deposited, step 545, with areas etched or removed as previously described and illustrated. A bump or protruding metal structure (120B) is then deposited or grown on the metal contact(s), step 550. The wafer 150A is then attached to a holding wafer, step 555, and the sapphire or other wafer is removed (e.g., through laser cleaving) to singulate or individuate the diodes 100-100L, step 560. Metal is then deposited on the second, back side of the diodes 100-100L to form the second, back side metal layer 122, step 565, and the method may end, return step 570. It also should be noted that many of these fabrication steps may be performed by different entities and agents, and that the method may include the other variations and ordering of steps discussed above.

Figure 72A:
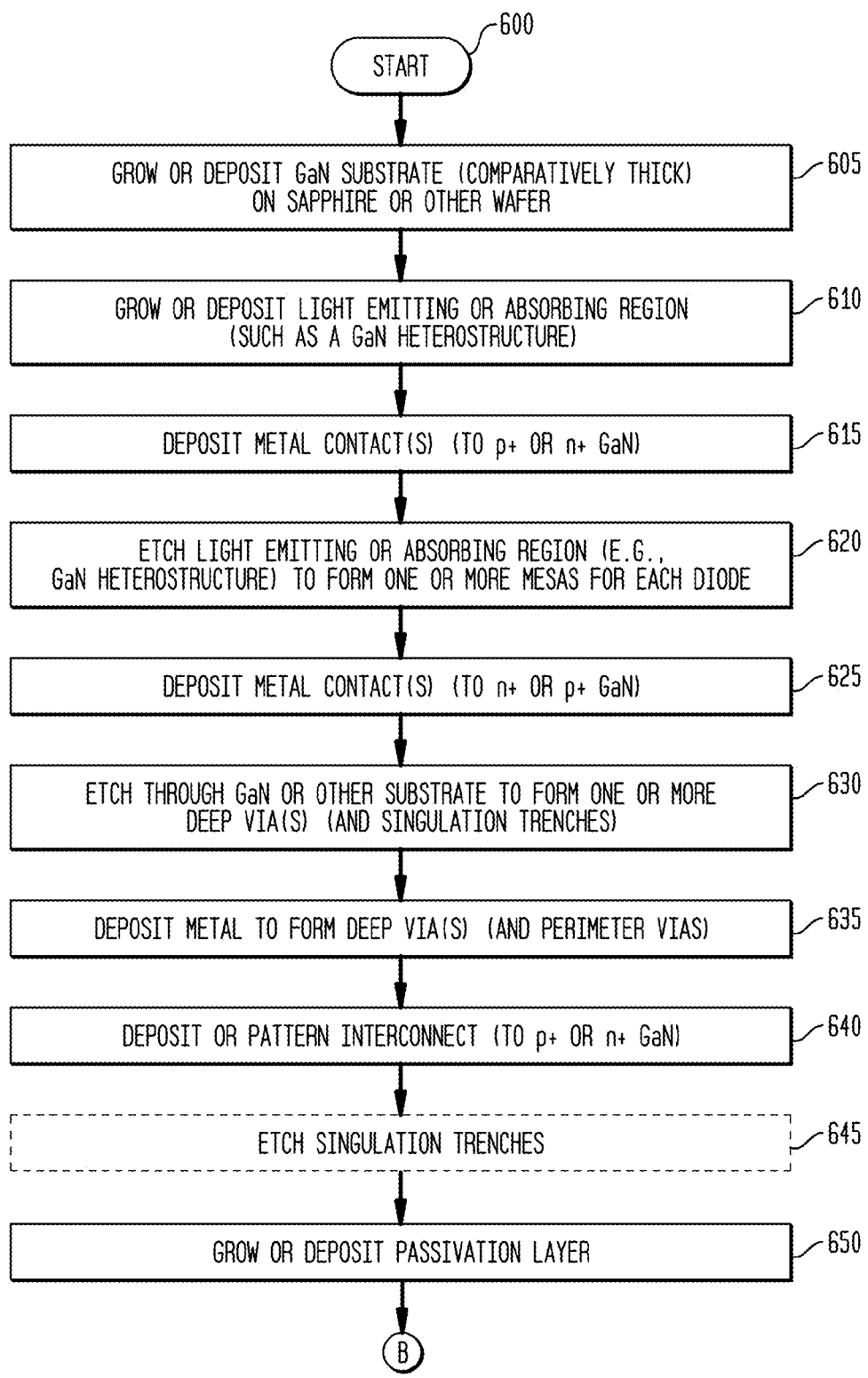
FIG. 72A and FIG. 72B, is a flow diagram illustrating an exemplary third method embodiment for diode fabrication.
Figure 72B:
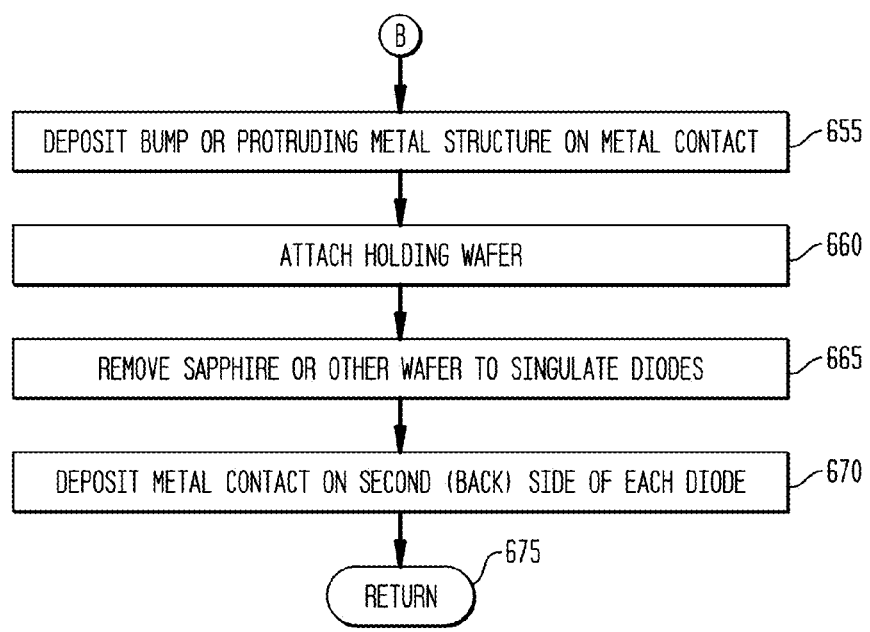

Referring to FIG. 72, beginning with start step 600, a comparatively thick GaN layer (e.g., 7-8 microns) is grown or deposited on a wafer 150, step 605, such as a sapphire wafer 150A. A light emitting or absorbing region (such as a GaN heterostructure) is grown or deposited, step 610. Metal is deposited to form one or more metal contacts to the GaN heterostructure (such as to the p+ GaN layer 115 as illustrated in FIG. 45), step 615. The light emitting or absorbing region (such as the GaN hetero structure) with the metal contact layer (119) are then etched to form a mesa structure for each diode 100-100L (on a first side of each diode 100-100L), step 620. Metal is deposited to form one or more metal contacts to the GaN heterostructure (such as n+ metal contact layer 129 to the n+ GaN layer 110 as illustrated in FIG. 47), step 625. The wafer 150A is then etched to form one or more through or deep via trenches and/or singulation trenches into the substrate 105 for each diode 100-100L, step 630. One or more metallization layers are then deposited to form through vias for each diode 100-100L, step 635, which may be center, peripheral or perimeter through vias (131, 134, 133, respectively), using any of the metal deposition methods described above. Metal is also deposited to form one or more metal contacts to the GaN heterostructure (such as the p+ GaN layer 115 or to the n+ GaN layer 110), and to form any additional current distribution metal (e.g., 120A, 126), step 640. If singulation trenches were not previously created (in step 630), then singulation trenches are etched, step 645. A passivation layer is then grown or deposited, step 650, with areas etched or removed as previously described and illustrated. A bump or protruding metal structure (120B) is then deposited or grown on the metal contact(s), step 655. The wafer 150, 150A is then attached to a holding wafer, step 660, and the sapphire or other wafer is removed (e.g., through laser cleaving or back side grinding and polishing) to singulate or individuate the diodes 100-100L, step 665. Metal is then deposited on the second, back side of the diodes 100-100L to form the second, back side conductive (e.g., metal) layer 122, step 670, and the method may end, return step 675. It also should be noted that many of these fabrication steps may be performed by different entities and agents, and that the method may include the other variations and ordering of steps discussed above.

Figure 73A:
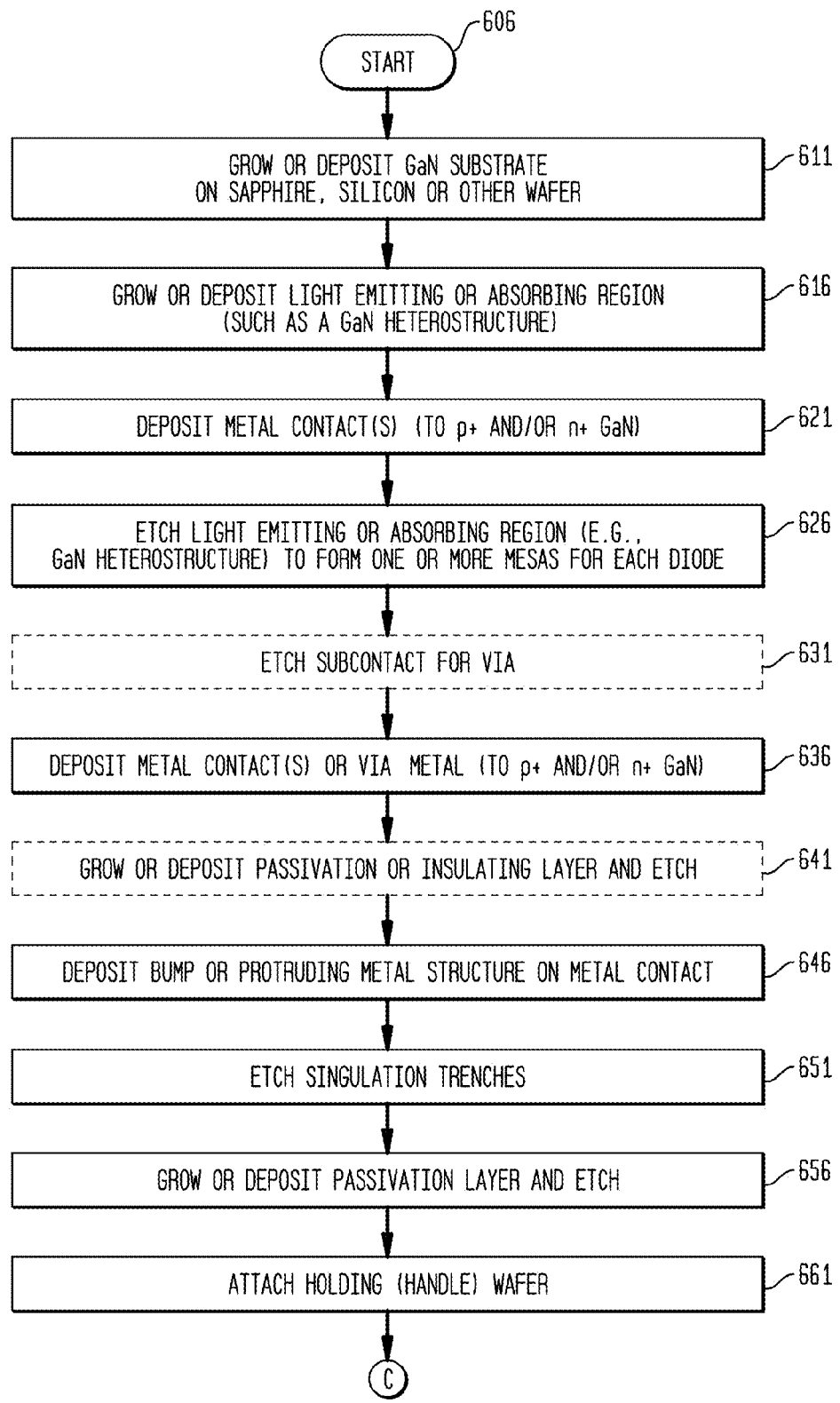
FIG. 73A and FIG. 73B, is a flow diagram illustrating an exemplary fourth method embodiment for diode fabrication.
Figure 73B:
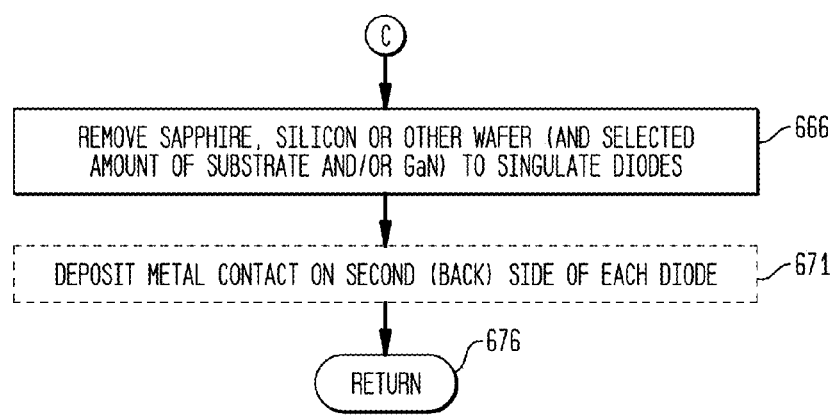

Referring to FIG. 73, beginning with start step 611, a comparatively thick GaN layer (e.g., 7-8 microns) is grown or deposited on a wafer 150, step 611, such as a sapphire wafer 150A or over a buffer layer 145 of a silicon wafer 150. A light emitting or absorbing region (such as a GaN heterostructure) is grown or deposited, step 616. Metal is deposited to form one or more metal contacts to the GaN heterostructure (such as to the p+ GaN layer 115 as illustrated in FIG. 45), step 621. The light emitting or absorbing region (such as the GaN heterostructure) with the metal contact layer (119) are then etched to form a mesa structure for each diode 100-100L (on a first side of each diode 100-100L), step 626. For a diode 100K embodiment, the GaN heterostructure is then etched to form a center via trench for each diode 100K, step 631, and otherwise step 631 may be omitted. One or more metallization layers are then deposited to form a center via 136 for each diode 100K or a metal contact 128 for a diode 100L, using any of the metal deposition methods described above, step 636. For a diode 100K embodiment, a passivation layer 135A is then grown or deposited, step 641, with areas etched or removed as previously described and illustrated, and otherwise step 641 may be omitted. Metal is also deposited to form one or more metal contacts to the GaN heterostructure (such as the p+ GaN layer 115), such as metal layer 120B or metal layers 120A and 120B, step 646. If singulation trenches were not previously created, then singulation trenches are etched, step 651. A passivation layer is then grown or deposited, step 656, with areas etched or removed as previously described and illustrated. It should be noted that steps 656 and 651 occur in an opposite order for diode 100L fabrication, with passivation occurring followed by etching singulation trenches. The wafer 150, 150A is then attached to a holding wafer, step 661, and the silicon, sapphire or other wafer is removed (e.g., through laser cleaving or back side grinding and polishing) to singulate or individuate the diodes 100-100L, step 666, with any additional GaN removal, such as through etching. For a diode 100K embodiment, metal is then deposited on the second, back side of the diodes 100K to form the second, back side conductive (e.g., metal) layer 122, step 671, and the method may end, return step 676. It also should be noted that many of these fabrication steps may be performed by different entities and agents, and that the method may include the other variations and ordering of steps discussed above. For example, steps 611 and 612 may be carried out be a specialized vendor.

Figure 74:
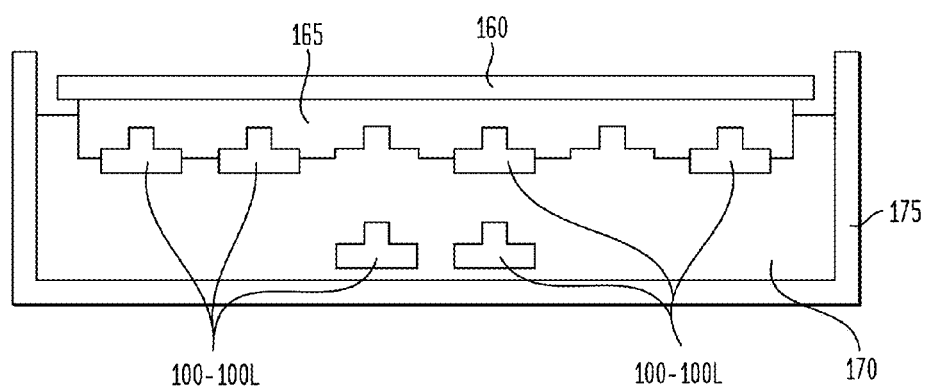
FIG. 74 is a cross-sectional view illustrating an exemplary ground and polished diode wafer embodiment adhered to a holding apparatus and suspended in a dish with adhesive solvent.

FIG. 74 is a cross-sectional view illustrating individual diodes 100-100L (also illustrated generally for purposes of explication and without any significant feature detail) which are no longer coupled together on the diode wafer 150, 150A (as the second side of the diode wafer 150, 150A has now been ground or polished, cleaved (laser lift-off), and/or etched, to fully expose the singulation (individuation) trenches 155), but which are adhered with wafer adhesive 165 to a holding apparatus 160 and suspended or submerged in a dish 175 with wafer adhesive solvent 170. Any suitable dish 175 may be utilized, such as a petri dish, with an exemplary method utilizing a polytetrafluoroethylene (PTFE or Teflon) dish 175. The wafer adhesive solvent 170 may be any commercially available wafer adhesive solvent or wafer bond remover, including without limitation 2-dodecene wafer bond remover available from Brewer Science, Inc. of Rolla, Mo. USA, for example, or any other comparatively long chain alkane or alkene or shorter chain heptane or heptene. The diodes 100-100L adhered to the holding apparatus 160 are submerged in the wafer adhesive solvent 170 for about five to about fifteen minutes, typically at room temperature (e.g., about 65° F.-75° F. or a higher temperature, and may also be sonicated in exemplary embodiments. As the wafer adhesive solvent 170 dissolves the adhesive 165, the diodes 100-100L separate from the adhesive 165 and holding apparatus 160 and mostly or generally sink to the bottom of the dish 175, individually or in groups or clumps. When all or most diodes 100-100L have been released from the holding apparatus 160 and have settled to the bottom of the dish 175, the holding apparatus 160 and a portion of the currently used wafer adhesive solvent 170 are removed from the dish 175. More wafer adhesive solvent 170 is then added (about 120-140 ml), and the mixture of wafer adhesive solvent 170 and diodes 100-100L is agitated (e.g., using a sonicator or an impeller mixer) for about five to fifteen minutes, typically at room or higher temperature, followed by once again allowing the diodes 100-100L to settle to the bottom of the dish 175. This process is then repeated generally at least once more, such that when all or most diodes 100-100L have settled to the bottom of the dish 175, a portion of the currently used wafer adhesive solvent 170 is removed from the dish 175 and more (about 120-140 ml) wafer adhesive solvent 170 is then added, followed by agitating the mixture of wafer adhesive solvent 170 and diodes 100-100L for about five to fifteen minutes, at room or higher temperature, followed by once again allowing the diodes 100-100L to settle to the bottom of the dish 175 and removing a portion of the remaining wafer adhesive solvent 170. At this stage, a sufficient amount of any residual wafer adhesive 165 generally will have been removed from the diodes 100-100L, or the wafer adhesive solvent 170 process repeated, to no longer potentially interfere with the printing or functioning of the diodes 100-100L.

Removal of the wafer adhesive solvent 170 (having the dissolved wafer adhesive 165), or of any of the other solvents, solutions or other liquids discussed below, may be accomplished in any of various ways. For example, wafer adhesive solvent 170 or other liquids may be removed by vacuum, aspiration, suction, pumping, etc., such as through a pipette. Also for example, wafer adhesive solvent 170 or other liquids may be removed by filtering the mixture of diodes 100-100L and wafer adhesive solvent 170 (or other liquids), such as by using a screen or porous silicon membrane having an appropriate opening or pore size. It should also be mentioned that all of the various fluids used in the diode ink (and dielectric ink discussed below) are filtered to remove particles larger than about 10 microns.

Diode Ink Example 1

A composition comprising:
a plurality of diodes 100-100L; and
a solvent.

Substantially all or most of the wafer adhesive solvent 170 is then removed. A solvent, and more particularly a polar solvent such as isopropyl alcohol ("IPA") in an exemplary embodiment and for example, is added to the mixture of wafer adhesive solvent 170 and diodes 100-100L, followed by agitating the mixture of IPA, wafer adhesive solvent 170 and diodes 100-100L for about five to fifteen minutes, generally at room temperature (although a higher temperature may be utilized equivalently), followed by once again allowing the diodes 100-100L to settle to the bottom of the dish 175 and removing a portion of the mixture of IPA and wafer adhesive solvent 170. More IPA is added (120-140 ml), and the process is repeated two or more times, namely, agitating the mixture of IPA, wafer adhesive solvent 170 and diodes 100-100L for about five to fifteen minutes, generally at room temperature, followed by once again allowing the diodes 100-100L to settle to the bottom of the dish 175, removing a portion of the mixture of IPA and wafer adhesive solvent 170 and adding more IPA. In an exemplary embodiment, the resulting mixture is about 100-110 ml of IPA with approximately 9-10 million diodes 100-100L from a four inch wafer (approximately 9.7 million diodes 100-100L per four inch wafer 150), and is then transferred to another, larger container, such as a PTFE jar, which may include additional washing of diodes into the jar with additional IPA, for example. One or more solvents may be used equivalently, for example and without limitation: water; alcohols such as methanol, ethanol, N-propanol ("NPA") (including 1-propanol, 2-propanol (IPA), 1-methoxy-2-propanol), butanol (including 1-butanol, 2-butanol (isobutanol)), pentanol (including 1-pentanol, 2-pentanol, 3-pentanol), octanol, N-octanol (including 1-octanol, 2-octanol, 3-octanol), tetrahydrofurfuryl alcohol (THFA), cyclohexanol, terpineol; ethers such as methyl ethyl ether, diethyl ether, ethyl propyl ether, and polyethers; esters such ethyl acetate, dimethyl adipate, propylene glycol monomethyl ether acetate, dimethyl glutarate, dimethyl succinate, glycerin acetate; glycols such as ethylene glycols, diethylene glycol, polyethylene glycols, propylene glycols, dipropylene glycols, glycol ethers, glycol ether acetates; carbonates such as propylene carbonate; glycerols such as glycerin; acetonitrile, tetrahydrofuran (THF), dimethyl formamide (DMF), N-methyl formamide (NMF), dimethyl sulfoxide (DMSO); and mixtures thereof. The resulting mixture of diodes 100-100L and a solvent such as IPA is a first example of a diode ink, as Example 1 above, and may be provided as a stand-alone composition, for example, for subsequent modification or use in printing, also for example. In other exemplary embodiments discussed below, the resulting mixture of diodes 100-100L and a solvent such as IPA is an intermediate mixture which is further modified to form a diode ink for use in printing, as described below.

In various exemplary embodiments, the selection of a first (or second) solvent is based upon at least two properties or characteristics. A first characteristic of the solvent is its ability to be soluble in or to solubilize a viscosity modifier or an adhesive viscosity modifier such as hydroxy propyl methylcellulose resin, methoxy propyl methylcellulose resin, or other cellulose resin or methylcellulose resin. A second characteristic or property is its evaporation rate, which should be slow enough to allow sufficient screen residence (for screen printing) of the diode ink or to meet other printing parameters. In various exemplary embodiments, an exemplary evaporation rate is less than one (<1, as a relative rate compared with butyl acetate), or more specifically, between 0.0001 and 0.9999.

Diode Ink Example 2

A composition comprising:
a plurality of diodes 100-100L; and
a viscosity modifier.

Diode Ink Example 3

A composition comprising:
a plurality of diodes 100-100L; and
a solvating agent.

Diode Ink Example 4

A composition comprising:
a plurality of diodes 100-100L; and
a wetting solvent.

Diode Ink Example 5

A composition comprising:
a plurality of diodes 100-100L;
a solvent; and
a viscosity modifier.

Diode Ink Example 6

A composition comprising:
a plurality of diodes 100-100L;
a solvent; and
an adhesive viscosity modifier.

Diode Ink Example 7

A composition comprising:
a plurality of diodes 100-100L;
a solvent; and
a viscosity modifier;
wherein the composition is opaque when wet and substantially optically transmissive or otherwise clear when dried.

Diode Ink Example 8

A composition comprising:
a plurality of diodes 100-100L;
a first, polar solvent;
a viscosity modifier; and
a second, nonpolar solvent (or rewetting agent).

Diode Ink Example 9

A composition comprising:
a plurality of diodes 100-100L, each diode of the plurality of diodes 100-100L having a size less than 450 microns in any
dimension; and
a solvent.

Diode Ink Example 10

A composition comprising:
a plurality of diodes 100-100L; and
at least one substantially non-insulating carrier or solvent.

Diode Ink Example 11

A composition comprising:
a plurality of diodes 100-100L;
a solvent; and
a viscosity modifier;
wherein the composition has a dewetting or contact angle greater than 25 degrees, or greater than 40 degrees.

Referring to Diode Ink Examples 1-11, there are a wide variety of exemplary diode ink compositions within the scope of the present invention. Generally, as in Example 1, a liquid suspension of diodes (100-100L) comprises a plurality of diodes (100-100L) and a first solvent (such as IPA discussed above or N-propanol, 1-methoxy-2-propanol, dipropylene glycol, 1-octanol (or more generally, N-octanol), or diethylene glycol discussed below); as in Examples 2, a liquid suspension of diodes (100-100L) comprises a plurality of diodes (100-100L) and a viscosity modifier (such those discussed below, which may also be an adhesive viscosity modifier as in Example 6); and as in Examples 3 and 4, a liquid suspension of diodes (100-100L) comprises a plurality of diodes (100-100L) and a solvating agent or a wetting solvent (such as one of the second solvents discussed, below, e.g., a dibasic ester). More particularly, such as in Examples 2, 5, 6, 7 and 8, a liquid suspension of diodes (100-100L) comprises a plurality of diodes (100-100L) (and/or plurality of diodes (100-100L)) and a first solvent (such as N-propanol, 1-octanol, 1-methoxy-2-propanol, dipropylene glycol, terpineol or diethylene glycol)), and a viscosity modifier (or equivalently, a viscous compound, a viscous agent, a viscous polymer, a viscous resin, a viscous binder, a thickener, and/or a rheology modifier) or an adhesive viscosity modifier (discussed in greater detail below), to provide a diode ink having a viscosity between about 1,000 centipoise (cps) and 25,000 cps at room temperature (about 25° C.) (or between about 20,000 cps to 60,000 cps at a refrigerated temperature (e.g., 5-10° C.)), such as an E-10 viscosity modifier described below, for example and without limitation. Depending upon the viscosity, the resulting composition may be referred to equivalently as a liquid or as a gel suspension of diodes or other two-terminal integrated circuits, and any reference to liquid or gel herein shall be understood to mean and include the other.

In addition, the resulting viscosity of the diode ink will generally vary depending upon the type of printing process to be utilized and may also vary depending upon the diode composition, such as a silicon substrate 105 or a GaN substrate 105. For example, a diode ink for screen printing in which the diodes 100-100L have a silicon substrate 105 may have a viscosity between about 1,000 centipoise (cps) and 25,000 cps at room temperature, or more specifically between about 6,000 centipoise (cps) and 15,000 cps at room temperature, or more specifically between about 6,000 centipoise (cps) and 15,000 cps at room temperature, or more specifically between about 8,000 centipoise (cps) and 12,000 cps at room temperature, or more specifically between about 9,000 centipoise (cps) and 11,000 cps at room temperature. For another example, a diode ink for screen printing in which the diodes 100-100L have a GaN substrate 105 may have a viscosity between about 10,000 centipoise (cps) and 25,000 cps at room temperature, or more specifically between about 15,000 centipoise (cps) and 22,000 cps at room temperature, or more specifically between about 17,500 centipoise (cps) and 20,500 cps at room temperature, or more specifically between about 18,000 centipoise (cps) and 20,000 cps at room temperature. Also for example, a diode ink for flexographic printing in which the diodes 100-100L have a silicon substrate 105 may have a viscosity between about 1,000 centipoise (cps) and 10,000 cps at room temperature, or more specifically between about 1,500 centipoise (cps) and 4,000 cps at room temperature, or more specifically between about 1,700 centipoise (cps) and 3,000 cps at room temperature, or more specifically between about 1,800 centipoise (cps) and 2,200 cps at room temperature. Also for example, a diode ink for flexographic printing in which the diodes 100-100L have a GaN substrate 105 may have a viscosity between about 1,000 centipoise (cps) and 10,000 cps at room temperature, or more specifically between about 2,000 centipoise (cps) and 6,000 cps at room temperature, or more specifically between about 2,500 centipoise (cps) and 4,500 cps at room temperature, or more specifically between about 2,000 centipoise (cps) and 4,000 cps at room temperature.

Viscosity may be measured in a wide variety of ways. For purposes of comparison, the various specified and/or claimed ranges of viscosity herein have been measured using a Brookfield viscometer (available from Brookfield Engineering Laboratories of Middleboro, Mass., USA) at a shear stress of about 200 pascals (or more generally between 190 and 210 pascals), in a water jacket at about 25° C., using a spindle SC4-27 at a speed of about 10 rpm (or more generally between 1 and 30 rpm, particularly for refrigerated fluids, for example and without limitation).

One or more thickeners (as a viscosity modifier) may be used, for example and without limitation: clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxylethylcellulose, cellulose ether, cellulose ethyl ether, chitosan; polymers such as acrylate and (meth)acrylate polymers and copolymers; glycols such as ethylene glycols, diethylene glycol, polyethylene glycols, propylene glycols, dipropylene glycols, glycol ethers, glycol ether acetates; fumed silica (such as Cabosil), silica powders and modified ureas such as BYK® 420 (available from BYK Chemie GmbH); and mixtures thereof. Other viscosity modifiers may be used, as well as particle addition to control viscosity, as described in Lewis et al., Patent Application Publication Pub. No. US 2003/0091647. Other viscosity modifiers discussed below with reference to dielectric inks may also be utilized, including without limitation polyvinyl pyrrolidone, polyethylene glycol, polyvinyl acetate (PVA), polyvinyl alcohols, polyacrylic acids, polyethylene oxides, polyvinyl butyral (PVB); diethylene glycol, propylene glycol, 2-ethyl oxazoline.

Referring to Diode Ink Example 6, the liquid suspension of diodes (100-100L) may further comprise an adhesive viscosity modifier, namely, any of the viscosity modifiers mentioned above which have the additional property of adhesion. Such an adhesive viscosity modifier provides for both adhering the diodes (100-100L) to a first conductor (e.g., 310A) or to a base 305, 305A during apparatus (300, 300A, 300B, 300C, 300D, 700, 700A, 700B, 720, 730, 740, 750, 760, 770) fabrication (e.g., printing), and then further provides for an infrastructure (e.g., polymeric) (when dried or cured) for holding the diodes (100-100L) in place in an apparatus (300, 300A, 300B, 300C, 300D, 700, 700A, 700B, 720, 730, 740, 750, 760, 770). While providing such adhesion, such a viscosity modifier should also have some capability to de-wet from the contacts of the diodes (100-100L), such as the terminals 125 and/or 127. Such adhesive, viscosity and de-wetting properties are among the reasons methylcellulose, methoxy propyl methylcellulose, or hydroxy propyl methylcellulose resins have been utilized in various exemplary embodiments. Other suitable viscosity modifiers may also be selected empirically.

Additional properties of the viscosity modifier or adhesive viscosity modifier are also useful and within the scope of the disclosure. First, such a viscosity modifier should prevent the suspended diodes (100-100L) from settling out at a selected temperature. Second, such a viscosity modifier should aid in orienting the diodes (100-100L) and printing the diodes (100-100L) in a uniform manner during apparatus (300, 300A, 300B, 300C, 300D, 700, 700A, 700B, 720, 730, 740, 750, 760, 770) fabrication. Third, in some embodiments, the viscosity modifier should also serve to cushion or otherwise protect the diodes (100-100L) during the printing process, while in other embodiments, otherwise inert particles such as glass beads are added which serve to protect the diodes 100-100L during the printing process (Diode Ink Examples 17-19, discussed below).

Figure 83:
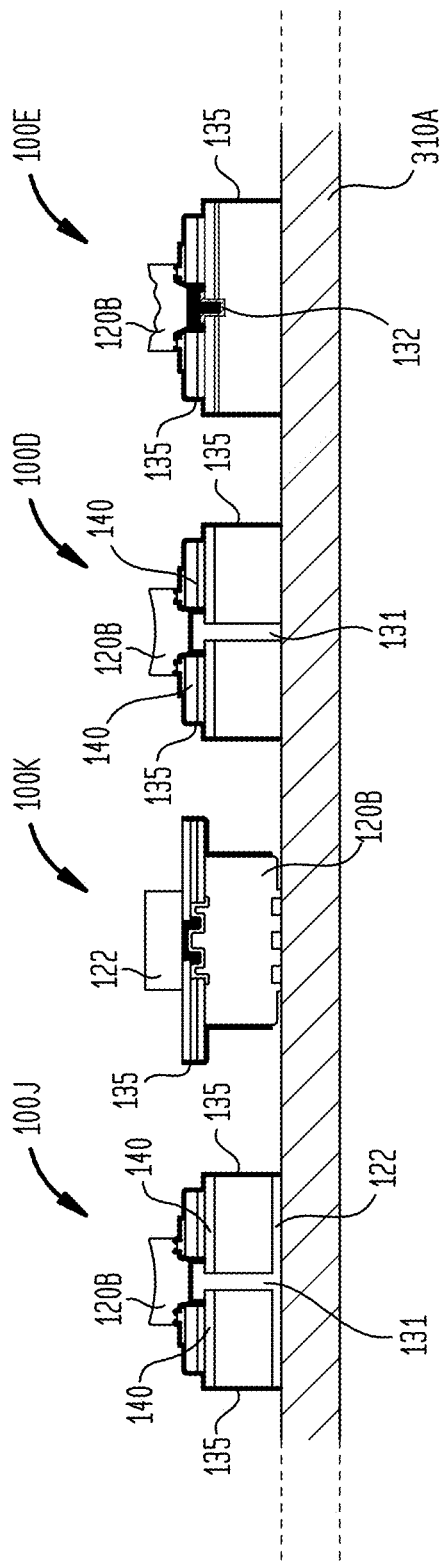
FIG. 83 is a second cross-sectional view of exemplary diodes coupled to a first conductor.

Referring to Diode Ink Examples 3, 4 and 8, the liquid suspension of diodes (100-100L) may further comprise a second solvent (Example 8) or a solvating agent (Example 3) or a wetting solvent (Example 4), with many examples discussed in greater detail below. Such a (first or second) solvent is selected as a wetting (equivalently, solvating) or rewetting agent for facilitating ohmic contact between a first conductor (e.g., 310A, which may be comprised of a conductive polymer such as a silver ink, a carbon ink, or mixture of silver and carbon ink) and the diodes 100-100L (through the substrate 105, a through via structures (131, 133, 134), and/or a second, back side metal layer 122, as illustrated in FIG. 83), following printing and drying of the diode ink during subsequent device manufacture, such as a nonpolar resin solvent, including one or more dibasic esters, also for example and without limitation. For example, when the diode ink is printed over a first conductor 310, the wetting or solvating agent partially dissolves the first conductor 310; as the wetting or solvating agent subsequently dissipates, the first conductor 310 rehardens and forms a contact with the diodes (100-100L).

The balance of the liquid or gel suspension of diodes (100-100L) is generally another, third solvent, such as deionized water, and any descriptions of percentages herein may assume that the balance of the liquid or gel suspension of diodes (100-100L) is such a third solvent such as water, and all described percentages are based on weight, rather than volume or some other measure. It should also be noted that the various diode ink suspensions may all be mixed in a typical atmospheric setting, without requiring any particular composition of air or other contained or filtered environment.

Solvent selection may also be based upon the polarity of the solvent. In an exemplary embodiment, a first solvent such as an alcohol may be selected as a polar or hydrophilic solvent, to facilitate de-wetting off of the diodes (100-100L) and other conductors (e.g., 310) during apparatus 300, 300A, 300B, 300C, 300D, 700, 700A, 700B, 720, 730, 740, 750, 760, 770 fabrication, while concomitantly being able to be soluble in or solubilize a viscosity modifier.

Another useful property of an exemplary diode ink is illustrated by Example 7. For this exemplary embodiment, the diode ink may be opaque when wet during printing, to aid in various printing processes such as registration. When dried or cured, however, the dried or cured diode ink is substantially optically transmissive or otherwise clear at selected wavelengths, such as to substantially not interfere with the emission of visible light generated by the diodes (100-100L). In other exemplary embodiments, however, the diode ink may also be substantially optically transmissive or clear.

Another way to characterize an exemplary diode ink is based upon the size of the diodes (100-100L), as illustrated by Example 9, in which the diodes 100-100L are generally less than about 450 microns in any dimension, and more specifically less than about 200 microns in any dimension, and more specifically less than about 100 microns in any dimension, and more specifically less than 50 microns in any dimension, and more specifically less than 30 microns in any dimension. In the illustrated exemplary embodiments, the diodes 100-100L are generally on the order of about 10 to 50 microns in width, or more specifically about 20 to 30 microns in width, and about 5 to 25 microns in height, or from about 25 to 28 microns in diameter (measured side face to face rather than apex to apex) and 8 to 15 microns in height or 9 to 12 microns in height. In some exemplary embodiments, the height of the diodes 100-100L excluding the metal layer 120B forming the bump or protruding structure (i.e., the height of the lateral sides 121 including the GaN heterostructure) is on the order of about 5 to 15 microns, or more specifically 7 to 12 microns, or more specifically 8 to 11 microns, or more specifically 9 to 10 microns, or more specifically less than 10 to 30 microns, while the height of the metal layer 120B forming the bump or protruding structure is generally on the order of about 3 to 7 microns.

In other exemplary embodiments, the height of the diodes (e.g. 100L) excluding the metal layer 120B forming the bump or protruding structure and the back side metal 122 (i.e., the height of the lateral sides 121 including the GaN heterostructure) is on the order of about less than about 10 microns, or more specifically less than about 8 microns, or more specifically between about 2 to 6 microns, or more specifically between about 3 to 5 microns, or more specifically about 4.5 microns, while the height of the metal layer 120B forming the bump or protruding structure is generally on the order of between about 3 to 7 microns, or more specifically on the order of between about 5 to 7 microns, while the overall height of the diodes 100L is on the order of about less than about 15 microns, or more specifically less than about 12 microns, or more specifically between about 9 to 11 microns, or more specifically between about 10 to 11 microns, or more specifically about 10.5 microns.

In other exemplary embodiments, the height of the diodes (e.g. 100K) excluding the metal layer 120B and the back side metal 122 forming the bump or protruding structure (i.e., the height of the lateral sides 121 including the GaN heterostructure) is on the order of about less than about 10 microns, or more specifically less than about 8 microns, or more specifically between about 2 to 6 microns, or more specifically about 2 to 4 microns, or more specifically about 3.0 microns, while the heights of the metal layer 120B and back side metal 122 forming the bump or protruding structure is generally on the order of between about 3 to 7 microns, or more specifically on the order of between about 4 to 6 microns, or more specifically about 5 microns, while the overall height of the diodes 100K is on the order of about less than about 15 microns, or more specifically less than about 14 microns, or more specifically between about 12 to 14 microns, or more specifically about 13 microns. In other exemplary embodiments, the height of the diode 100K without including the height of the back side metal 122 forming the bump or protruding structure but including the metal layer 120B is on the order of about 5 to 10 microns.

The diode ink may also be characterized by its electrical properties, as illustrated in Example 10. In this exemplary embodiment, the diodes (100-100L) are suspended in at least one substantially non-insulating carrier or solvent, in contrast with an insulating binder, for example.

The diode ink may also be characterized by its surface properties, as illustrated in Example 11. In this exemplary embodiment, the diode ink has a dewetting or contact angle greater than 25 degrees, or greater than 40 degrees, depending upon the surface energy of the substrate utilized for measurement, such as between 34 and 42 dynes, for example.

Diode Ink Example 12

A composition comprising:
a plurality of diodes 100-100L;
a first solvent comprising about 5% to 50% N-propanol, terpineol or diethylene glycol, ethanol, tetrahydrofurfuryl alcohol, and/or cyclohexanol, or mixtures thereof;
a viscosity modifier comprising about 0.75% to 5.0% methoxy propyl methylcellulose resin, or hydroxy propyl methylcellulose resin, or other cellulose or methylcellulose resin, or mixtures thereof;
a second solvent (or rewetting agent) comprising about 0.5% to 10% of a nonpolar resin solvent such as a dibasic ester; and
with the balance comprising a third solvent such as water.

Diode Ink Example 13

A composition comprising:
a plurality of diodes 100-100L;
a first solvent comprising about 15% to 40% N-propanol, terpineol or diethylene glycol, ethanol, tetrahydrofurfuryl alcohol, and/or cyclohexanol, or mixtures thereof;
a viscosity modifier comprising about 1.25% to 2.5% methoxy propyl methylcellulose resin, or hydroxy propyl methylcellulose resin, or other cellulose or methylcellulose resin, or mixtures thereof;
a second solvent (or rewetting agent) comprising about 0.5% to 10% of a nonpolar resin solvent such as a dibasic ester; and
with the balance comprising a third solvent such as water.

Diode Ink Example 14

A composition comprising:
a plurality of diodes 100-100L;
a first solvent comprising about 17.5% to 22.5% N-propanol, terpineol or diethylene glycol, ethanol, tetrahydrofurfuryl alcohol, and/or cyclohexanol or mixtures thereof;
a viscosity modifier comprising about 1.5% to 2.25% methoxy propyl methylcellulose resin, or hydroxy propyl methylcellulose resin, or other cellulose or methylcellulose resin, or mixtures thereof;
a second solvent (or rewetting agent) comprising between about 0.0% to 6.0% of at least one dibasic ester; and
with the balance comprising a third solvent such as water, wherein the viscosity of the composition is substantially between about 5,000 cps to about 20,000 cps at 25° C.

Diode Ink Example 15

A composition comprising:
a plurality of diodes 100-100L;
a first solvent comprising about 20% to 40% N-propanol, terpineol or diethylene glycol, ethanol, tetrahydrofurfuryl alcohol, and/or cyclohexanol, or mixtures thereof;
a viscosity modifier comprising about 1.25% to 1.75% methoxy propyl methylcellulose resin, or hydroxy propyl methylcellulose resin, or other cellulose or methylcellulose resin, or mixtures thereof;
a second solvent (or rewetting agent) comprising between about 0% to 6.0% of at least one dibasic ester; and
with the balance comprising a third solvent such as water, wherein the viscosity of the composition is substantially between about 1,000 cps to about 5,000 cps at 25° C.

Diode Ink Example 16

A composition comprising:
a plurality of diodes 100-100L having a diameter (width and/or length) between about 10 to 50 microns and a height between 5 to 25 microns;
a solvent; and
a viscosity modifier.

Diode Ink Example 17

A composition comprising:
a plurality of diodes 100-100L;
a solvent;
a viscosity modifier; and
at least one mechanical stabilizer or spacer.

Diode Ink Example 18

A composition comprising:
a plurality of diodes 100-100L having a diameter (width and/or length) between about 10 to 50 microns and a height between 5 to 25 microns;
a solvent;
a viscosity modifier; and
a plurality of inert particles having a range of sizes between about 10 to 50 microns.

Diode Ink Example 19

A composition comprising:
a plurality of diodes 100-100L having a diameter (width and/or length) between about 20 to 30 microns and a height between about 9 to 15 microns;
a solvent;
a viscosity modifier; and
a plurality of substantially optically transparent and chemically inert particles having a range of sizes between about 15 to about 25 microns.

Diode Ink Example 20

A composition comprising:
a plurality of diodes 100-100L having a diameter (width and/or length) between about 10 to 50 microns and a height between 5 to 25 microns;
a first solvent comprising an alcohol;
a second solvent comprising a glycol;
a viscosity modifier comprising about 0.10% to 2.5% methoxy propyl methylcellulose resin, or hydroxy propyl methylcellulose resin, or other cellulose or methylcellulose resin, or mixtures thereof; and
a plurality of substantially optically transparent and chemically inert particles having a range of sizes between about 10 to about 50 microns.

Diode Ink Example 21

A composition comprising:
a plurality of diodes 100-100L having a diameter (width and/or length) between about 10 to 50 microns and a height between 5 to 25 microns;
a mixture of at least a first solvent and a second solvent different from the first solvent and comprising about 15% to 99.99% of at least two solvents selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof; and
a viscosity modifier comprising about 0.10% to 2.5% methoxy propyl methylcellulose resin, or hydroxy propyl methylcellulose resin, or other cellulose or methylcellulose resin, or mixtures thereof.

Diode Ink Example 22

A composition comprising:
a plurality of diodes 100-100L having a diameter (width and/or length) between about 10 to 50 microns and a height between 5 to 25 microns;
a mixture of at least a first solvent and a second solvent different from the first solvent and comprising about 15% to 99.99% of at least two solvents selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof
a viscosity modifier comprising about 0.10% to 2.5% methoxy propyl methylcellulose resin, or hydroxy propyl methylcellulose resin, or other cellulose or methylcellulose resin, or mixtures thereof;
about 0.01% to 2.5% of a plurality of substantially optically transparent and chemically inert particles having a range of sizes between about 10 to about 50 microns.

Diode Ink Example 23

A composition comprising:
a plurality of diodes 100-100L having a diameter (width and/or length) between about 10 to 50 microns and a height between 5 to 25 microns;
a mixture of at least a first solvent and a second solvent different from the first solvent and comprising about 15% to 50.0% of at least two solvents selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a viscosity modifier comprising about 1.0% to 2.5% methoxy propyl methylcellulose resin, or hydroxy propyl methylcellulose resin, or other cellulose or methylcellulose resin, or mixtures thereof;
about 0.01% to 2.5% of a plurality of substantially optically transparent and chemically inert particles having a range of sizes between about 10 to about 50 microns; and
with the balance comprising a third solvent such as water.

Diode Ink Example 24

A composition comprising:
a plurality of diodes 100-100L having a diameter (width and/or length) between about 10 to 50 microns and a height between 5 to 25 microns;
a first solvent comprising about 15% to 40% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a second solvent different from the first solvent and comprising about 2% to 10% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a third solvent different from the first and second solvents and comprising about 0.01% to 2.5% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a viscosity modifier comprising about 1.0% to 2.5% methoxy propyl methylcellulose resin, or hydroxy propyl methylcellulose resin, or other cellulose or methylcellulose resin, or mixtures thereof; and
with the balance comprising a third solvent such as water.

Diode Ink Example 25

A composition comprising:
a plurality of diodes 100-100L having a diameter (width and/or length) between about 10 to 50 microns and a height between 5 to 25 microns;
a first solvent comprising about 15% to 30% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a second solvent different from the first solvent and comprising about 3% to 8% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a third solvent different from the first and second solvents and comprising about 0.01% to 2.5% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a viscosity modifier comprising about 1.25% to 2.5% methoxy propyl methylcellulose resin, or hydroxy propyl methylcellulose resin, or other cellulose or methylcellulose resin, or mixtures thereof;
about 0.01% to 2.5% of a plurality of substantially optically transparent and chemically inert particles having a range of sizes between about 10 to about 50 microns; and
with the balance comprising a third solvent such as water.

Diode Ink Example 26

A composition comprising:
a plurality of diodes 100-100L having a diameter (width and/or length) between about 10 to 50 microns and a height between 5 to 25 microns;
a first solvent comprising about 40% to 60% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof;
a second solvent different from the first solvent and comprising about 40% to 60% of a solvent selected from the group consisting of: N-propanol, isopropanol, dipropylene glycol, diethylene glycol, propylene glycol, 1-methoxy-2-propanol, N-octanol, ethanol, tetrahydrofurfuryl alcohol, cyclohexanol, and mixtures thereof; and
a viscosity modifier comprising about 0.10% to 1.25% methoxy propyl methylcellulose resin, or hydroxy propyl methylcellulose resin, or other cellulose or methylcellulose resin, or mixtures thereof.

Diode Ink Example 27

A composition comprising:
a plurality of diodes 100-100L having a diameter (width and/or length) between about 10 to 50 microns and a height between 5 to 25 microns;
a first solvent comprising about 40% to 60% of a solvent selected from the group consisting of: N-propanol, isopropanol, dipropylene glycol, diethylene glycol, propylene glycol, 1-methoxy-2-propanol, 1-octanol, ethanol, tetrahydrofurfuryl alcohol, cyclohexanol, and mixtures thereof;
a second solvent different from the first solvent and comprising about 40% to 60% of a solvent selected from the group consisting of: N-propanol, isopropanol, dipropylene glycol, diethylene glycol, propylene glycol, 1-methoxy-2-propanol, 1-octanol, ethanol, tetrahydrofurfuryl alcohol, cyclohexanol, and mixtures thereof;
a viscosity modifier comprising about 0.10% to 1.25% methoxy propyl methylcellulose resin, or hydroxy propyl methylcellulose resin, or other cellulose or methylcellulose resin, or mixtures thereof; and
about 0.01% to 2.5% of a plurality of substantially optically transparent and chemically inert particles having a range of sizes between about 10 to 50 microns.

Referring to Diode Ink Examples 12-27, in an exemplary embodiment, another alcohol as the first solvent, N-propanol ("NPA") (and/or N-octanol (e.g., 1-octanol (or any of various secondary or tertiary octanol isomers), 1-methoxy-2-propanol, terpineol, diethylene glycol, dipropylene glycol, tetrahydrofurfuryl alcohol, or cyclohexanol), is substituted for substantially all or most of the IPA. With the diodes 100-100L generally or mostly settled at the bottom of the container, IPA is removed, NPA is added, the mixture of IPA, NPA and diodes 100-100L is agitated or mixed at room temperature, followed by once again allowing the diodes 100-100L to settle to the bottom of the container, and removing a portion of the mixture of IPA and NPA, and adding more NPA (about 120-140 ml). This process of adding NPA and removing a mixture of IPA and NPA, is generally repeated twice, resulting in a mixture of predominantly NPA, diodes 100-100L, trace or otherwise small amounts of IPA, and potentially residual wafer adhesive and wafer adhesive solvent 170, generally also in trace or otherwise small amounts. In an exemplary embodiment, the residual or trace amounts of IPA remaining are less than about 1%, and more generally about 0.4%. Also in an exemplary embodiment, the final percentage of NPA in an exemplary diode ink, if any, is between about 0.5% to 50%, or more specifically about 1.0% to 10%, or more specifically about 3% to 7%, or in other embodiments, more specifically about 15% to 40%, or more specifically about 17.5% to 22.5%, or more specifically about 25% to about 35%, depending upon the type of printing to be utilized. When terpineol and/or diethylene glycol are utilized with or instead of NPA, a typical concentration of terpineol is about 0.5% to 2.0%, and a typical concentration of diethylene glycol is about 15% to 25%. The IPA, NPA, rewetting agents, deionized water (and other compounds and mixtures utilized to form exemplary diode inks) may also be filtered to about 25 microns or smaller to remove particle contaminants which are larger than or on the same scale as the diodes 100-100L.

The mixture of substantially NPA or another first solvent and diodes 100-100L is then added to and mixed or stirred briefly with a viscosity modifier, for example, such as a methoxy propyl methylcellulose resin, hydroxy propyl methylcellulose resin, or other cellulose or methylcellulose resin. In an exemplary embodiment, E-3 and E-10 methylcellulose resins available from The Dow Chemical Company (www.dow.com) and Hercules Chemical Company, Inc. (www.herchem.com) are utilized, resulting in a final percentage in an exemplary diode ink of about 0.10% to 5.0%, or more specifically about 0.2% to 1.25%, or more specifically about 0.3% to 0.7%, or more specifically about 0.4% to 0.6%, or more specifically about 1.25% to 2.5%, or more specifically 1.5% to 2.0%, or more specifically less than or equal to 2.0%. In an exemplary embodiment, about a 3.0% E-10 formulation is utilized and is diluted with deionized and filtered water to result in the final percentage in the completed composition. Other viscosity modifiers may be utilized equivalently, including those discussed above and those discussed below with reference to dielectric inks. The viscosity modifier provides sufficient viscosity for the diodes 100-100L that they are substantially dispersed and maintained in suspension and do not settle out of the liquid or gel suspension, particularly under refrigeration.

As mentioned above, a second solvent (or a first solvent for Examples 3 and 4), generally a nonpolar resin solvent such as one or more dibasic esters, may then added. In an exemplary embodiment, a mixture of two dibasic esters is utilized to reach a final percentage of about 0.0% to about 10%, or more specifically about 0.5% to about 6.0%, or more specifically about 1.0% to about 5.0%, or more specifically about 2.0% to about 4.0%, or more specifically about 2.5% to about 3.5%, such as dimethyl glutarate or such as a mixture of about two thirds (⅔) dimethyl glutarate and about one third (⅓) dimethyl succinate at a final percentage of about 3.73%, e.g., respectively using DBE-5 or DBE-9 available from Invista USA of Wilmington, Del., USA, which also has trace or otherwise small amounts of impurities such as about 0.2% of dimethyl adipate and 0.04% water). A third solvent such as deionized water is also added, to adjust the relative percentages and reduce viscosity, as may be necessary or desirable. In addition to dibasic esters, other second solvents which may be utilized equivalently include, for example and without limitation, water; alcohols such as methanol, ethanol, N-propanol (including 1-propanol, 2-propanol (isopropanol), 1-methoxy-2-propanol), isobutanol, butanol (including 1-butanol, 2-butanol), pentanol (including 1-pentanol, 2-pentanol, 3-pentanol), N-octanol (including 1-octanol, 2-octanol, 3-octanol), tetrahydrofurfuryl alcohol, cyclohexanol; ethers such as methyl ethyl ether, diethyl ether, ethyl propyl ether, and polyethers; esters such ethyl acetate, dimethyl adipate, propylene glycol monomethyl ether acetate (and dimethyl glutarate and dimethyl succinate as mentioned above); glycols such as ethylene glycols, diethylene glycol, polyethylene glycols, propylene glycols, dipropylene glycols, glycol ethers, glycol ether acetates; carbonates such as propylene carbonate; glycerols such as glycerin; acetonitrile, tetrahydrofuran (THF), dimethyl formamide (DMF), N-methyl formamide (NMF), dimethyl sulfoxide (DMSO); and mixtures thereof. In an exemplary embodiment, molar ratios of the amount of first solvent to the amount of second solvent are in the range of at least about 2 to 1, and more specifically in the range of at least about 5 to 1, and more specifically in the range of at least about 12 to 1 or higher; in other instances, the functionality of the two solvents may be combined into a single agent, with one polar or nonpolar solvent utilized in an exemplary embodiment. Also in addition to the dibasic esters discussed above, exemplary dissolving, wetting or solvating agents, for example and without limitation, also as mentioned below, include propylene glycol monomethyl ether acetate ($C_6H_{12}O_3$) (sold by Eastman under the name "PM Acetate"), used in an approximately 1:8 molar ratio (or 22:78 by weight) with 1-propanol (or isopropanol) to form the suspending medium, and a variety of dibasic esters, and mixtures thereof, such as dimethyl succinate, dimethyl adipate and dimethyl glutarate (which are available in varying mixtures from Invista under the product names DBE, DBE-2, DBE-3, DBE-4, DBE-5, DBE-6, DBE-9 and DBE-IB). In an exemplary embodiment, DBE-9 has been utilized. The molar ratios of solvents will vary based upon the selected solvents, with 1:8 and 1:12 being typical ratios.

Referring to Diode Ink Examples 17-20, 22, 25 and 27, one or more mechanical stabilizers or spacers are included, such as chemically inert particles and/or optically transparent particles, such as glass beads typically comprised of a silicate or borosilicate glass, for example and without limitation. In various exemplary embodiments, about 0.01% to 2.5%, or more particularly about 0.05% to 1.0%, or more particularly about 0.1% to 0.3% by weight of glass spheres or beads are utilized, having an average size or range of sizes between about 10 to 30 microns, or more particularly between about 12 to 28 microns, or more particularly between about 15 to 25 microns. These particles provide mechanical stability and/or spacing during the printing process, such as acting as sheet spacers while printed sheets are fed into a printing press, as the diodes 100-100L are initially held in place only through a comparatively thin film of dried or cured diode ink (illustrated in FIGS. 89 and 90). In general, the concentration of inert particles is sufficiently low such that the number of inert particles per unit area (of the apparatus area, following deposition) is less than the density of diodes 100-100L per unit area. The inert particles provide mechanical stability and spacing, tending to prevent diodes 100-100L from being dislodged and lost when printed sheets are slid over one another as they are fed into a printing press when either a conductive layer (310) and/or a dielectric layer (315) are being deposited, providing stability analogously to ball bearings. Following deposition of a conductive layer (310) and/or a dielectric layer (315), the diodes 100-100L are effectively held or locked in place, with a significantly diminished likelihood of being dislodged. The inert particles are also held or locked in place, but perform no further function in a completed apparatus 300, 700, 720, 730, 740, 750, 760, 770 and are effectively electrically and chemically inert. A plurality of inert particles 292 are illustrated in cross-section in FIG. 94, and although not separately illustrated in the other Figures, may be included in any of the other illustrated apparatuses.

Diode Ink Examples 20-27 are illustrated to provide additional and more specific examples of diode ink compositions which have been effective for fabrication of various apparatus 300, 700, 720, 730, 740, 750, 760, 770 embodiments. Diode Ink Example 20 and other Examples having cellulose or methylcellulose resins such as hydroxy propyl methylcellulose resin may also include additional solvents not mentioned separately, such as water or 1-methoxy-2-propanol, for example and without limitation.

While generally the various diode inks are mixed in the order described above, it should also be noted that the various first solvent, viscosity modifier, second solvent, and third solvent (such as water) may be added or mixed together in other orders, any and all of which are within the scope of the disclosure. For example, deionized water (as a third solvent) may be added first, followed by 1-propanol and DBE-9, followed by a viscosity modifier, and then followed by additional water, as may be needed, to adjust relative percentages and viscosity, also for example.

The mixture of substantially a first solvent such as NPA, diodes 100-100L, a viscosity modifier, a second solvent, and a third solvent (if any) such as water are then mixed or agitated, such as by using an impeller mixer, at a comparatively low speed to avoid incorporating air into the mixture, for about 25-30 minutes at room temperature in an air atmosphere. In an exemplary embodiment, the resulting volume of diode ink is typically on the order of about one-half to one liter (per wafer) containing 9-10 million diodes 100-100L, and the concentration of diodes 100-100L may be adjusted up or down as desired, such as depending upon the concentration desired for a selected printed LED or photovoltaic device, described below, with exemplary viscosity ranges described above for different types of printing and different types of diodes 100-100L. A first solvent such as NPA also tends to act as a preservative and inhibits bacterial and fungal growth for storage of the resulting diode ink. When other first solvents are to be utilized, a separate preserving, inhibiting or fungicidal agent may also be added. For an exemplary embodiment, additional surfactants or non-foaming agents for printing may be utilized as an option, but are not required for proper functioning and exemplary printing.

The concentration of diodes 100-100L may be adjusted according to the apparatus requirements. For example, for lighting applications, a lower surface brightness lamp may utilize about 25 diodes 100-100L per square cm, using a diode ink having a concentration of diodes 100-100L of about 12,500 diodes per ml ($cm^3$). For another exemplary embodiment, one wafer 150 may contain about 7.2 million diodes 100-100L, for about 570 ml of diode ink. Each milliliter of diode ink may be used to cover about 500 square centimeters when printed, with 570 ml of diode ink covering about 28.8 square meters. Also for example, for a very high surface brightness lamp, using about 100 diodes 100-100L per square cm, would require a concentration of diodes 100-100L of about 50,000 per ml ($cm^3$).

Figure 75:
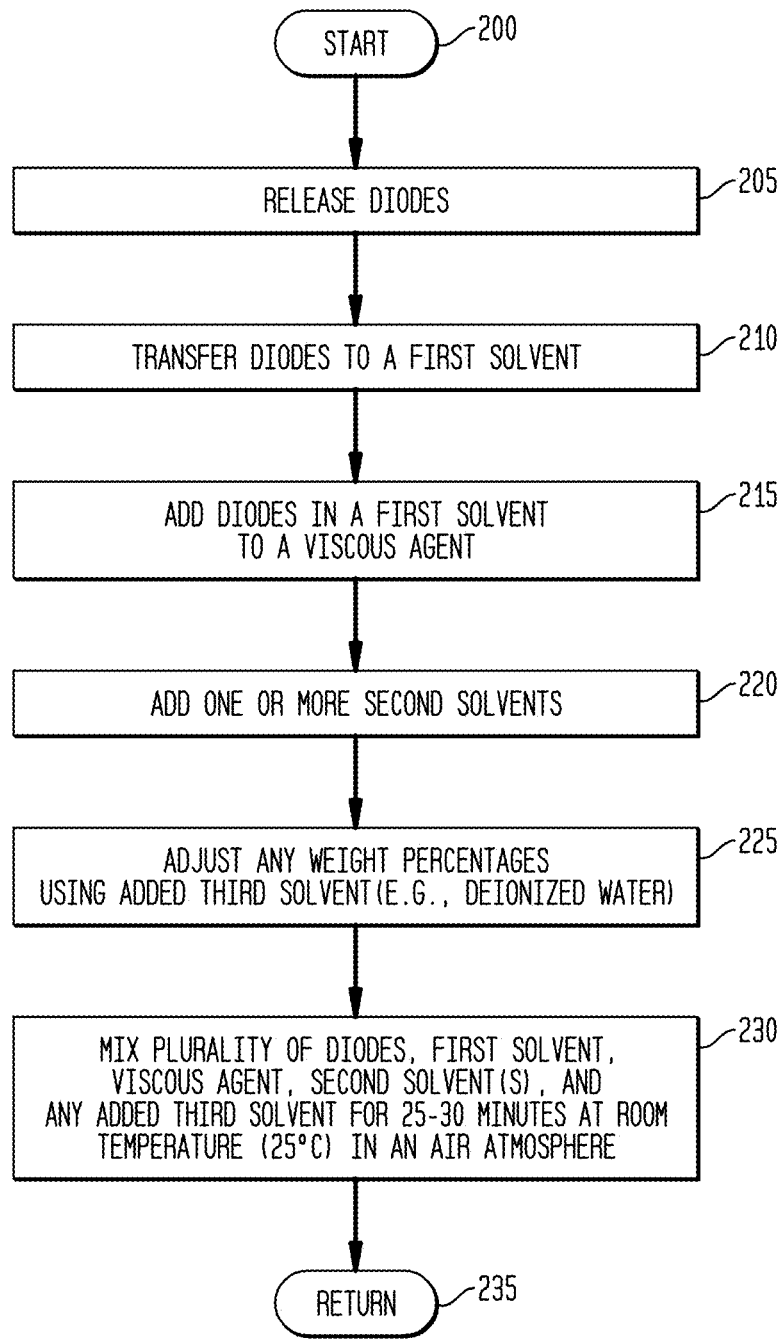
FIG. 75 is a flow diagram illustrating an exemplary method embodiment for diode suspension fabrication.

FIG. 75 is a flow diagram illustrating an exemplary method embodiment for manufacturing diode ink, and provides a useful summary. The method begins, start step 200, with releasing the diodes 100-100L from the wafer 150, 150A, step 205. As discussed above, this step involves attaching the wafer on a first, diode side to a wafer holder with a wafer bond adhesive, using laser lift-off, grinding and/or polishing and/or etching of the second, back side of the wafer to reveal the singulation trenches and remove any additional substrate or GaN as desired or specified, and dissolving the wafer bond adhesive to release the diodes 100-100L into a solvent such as IPA or into another solvent such as NPA or any of the other solvents described herein. When IPA is utilized, the method includes optional step 210, of transferring the diodes 100-100L to a (first) solvent such as NPA. The method then adds the diodes 100-100L in the first solvent to a viscosity modifier such as methylcellulose, step 215, and adds one or more second solvents, such as one or two dibasic esters, such as dimethyl glutarate and/or dimethyl succinate, step 220. Any weight percentages may be adjusted using a third solvent such as deionized water, step 225. In step 230, the method then mixes the plurality of diodes 100-100L, first solvent, viscosity modifier, second solvent (and a plurality of chemically and electrically inert particles, such as glass beads) and any additional deionized water for about 25-30 minutes at room temperature (about 25° C.) in an air atmosphere, with a resulting viscosity between about 1,000 cps to about 25,000 cps. The method may then end, return step 235. It should also be noted that steps 215, 220, and 225 may occur in other orders, as described above, and may be repeated as needed, and that optional, additional mixing steps may also be utilized.

Figure 76:
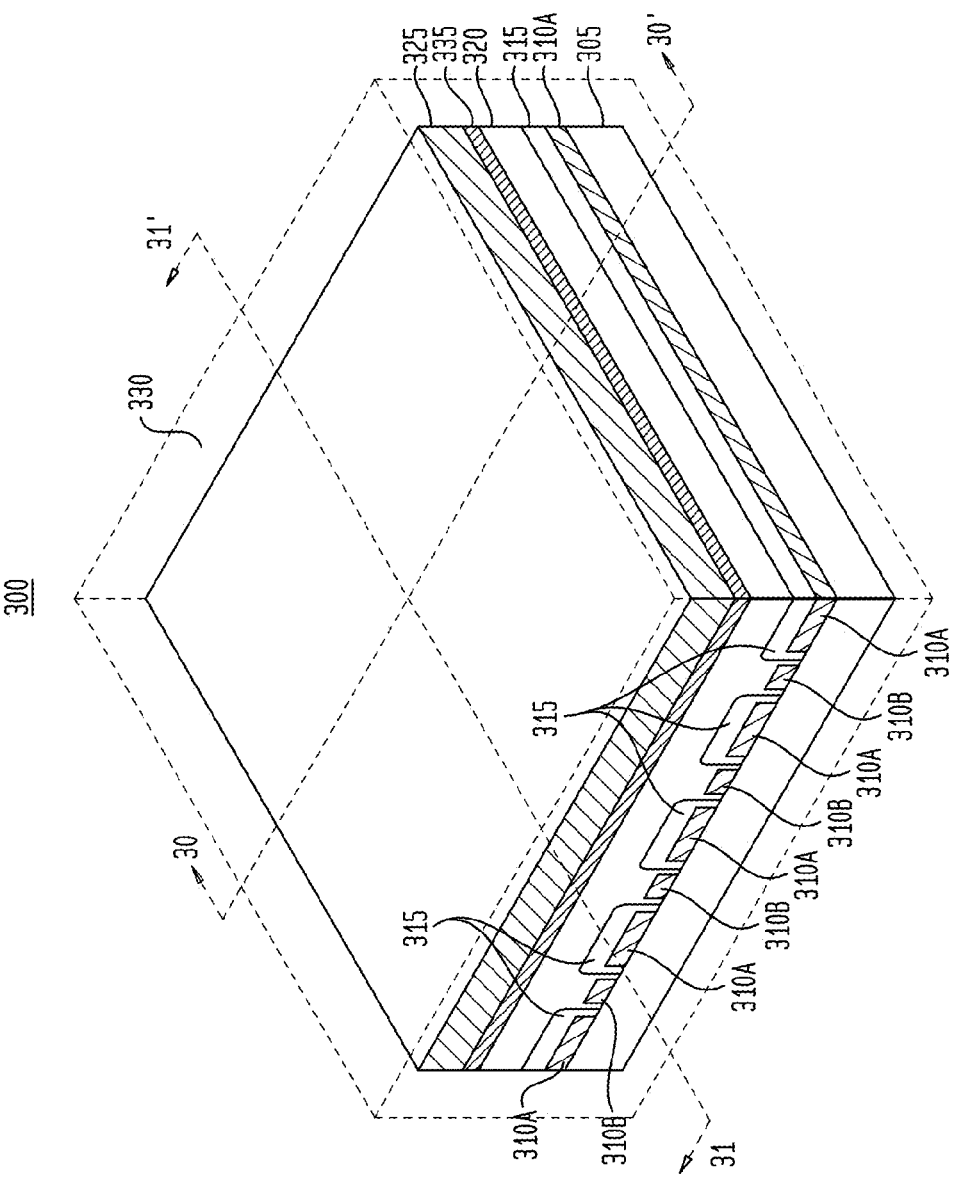
FIG. 76 is a perspective view of an exemplary first apparatus embodiment.
Figure 77:
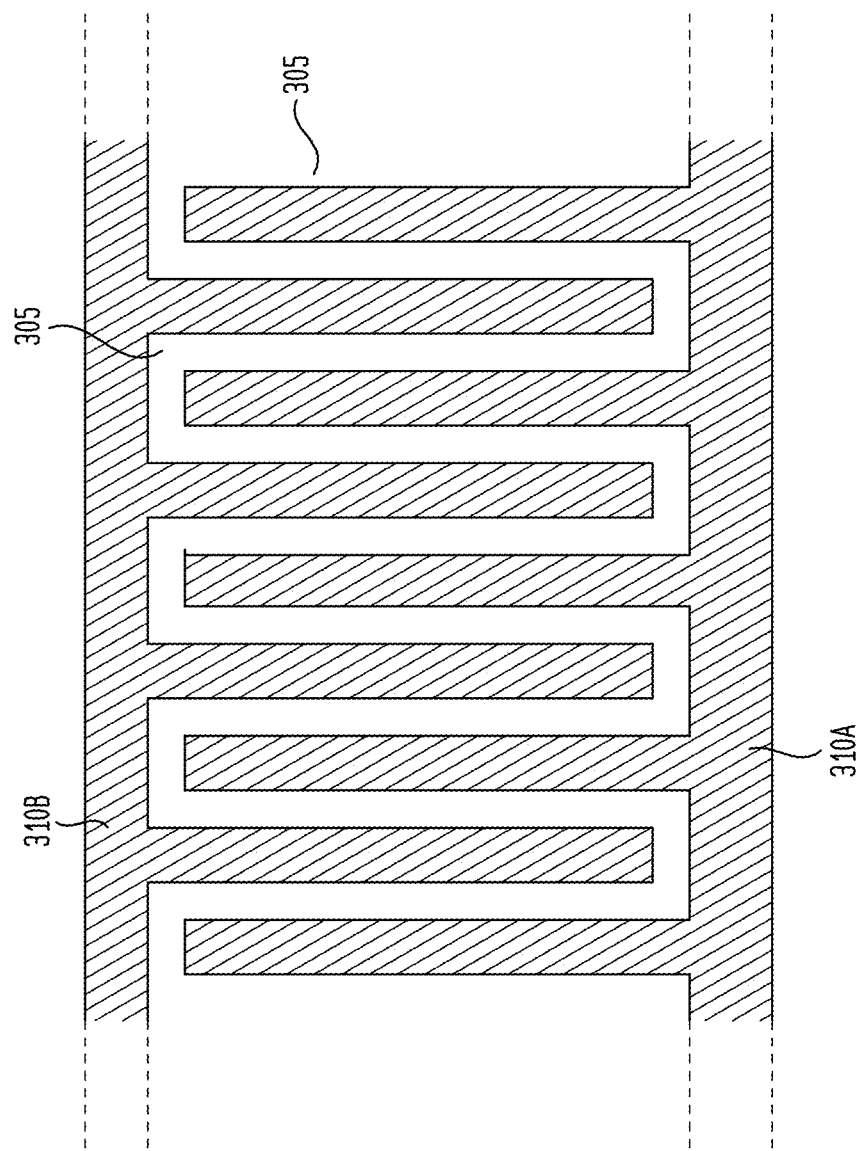
FIG. 77 is a plan (or top) view illustrating an exemplary first electrode structure of a first conductive layer for an exemplary apparatus embodiment.
Figure 78:
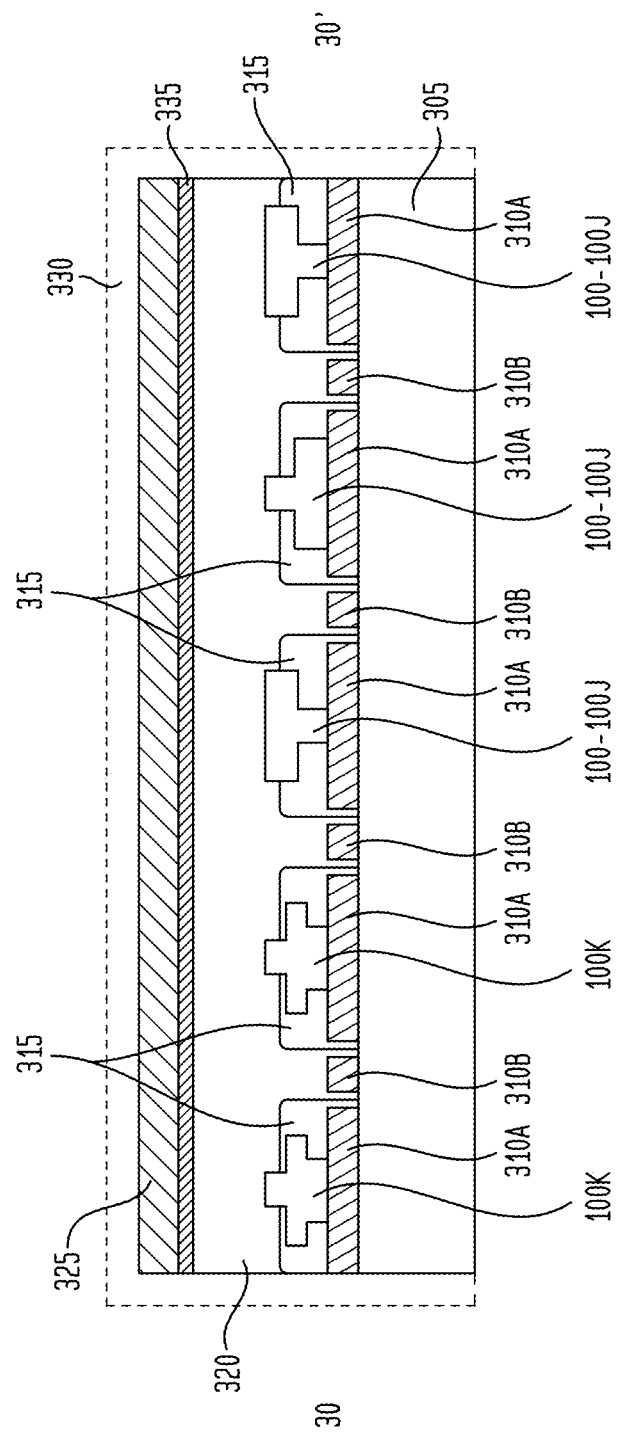
FIG. 78 is a first cross-sectional view of an exemplary first apparatus embodiment.
Figure 79:
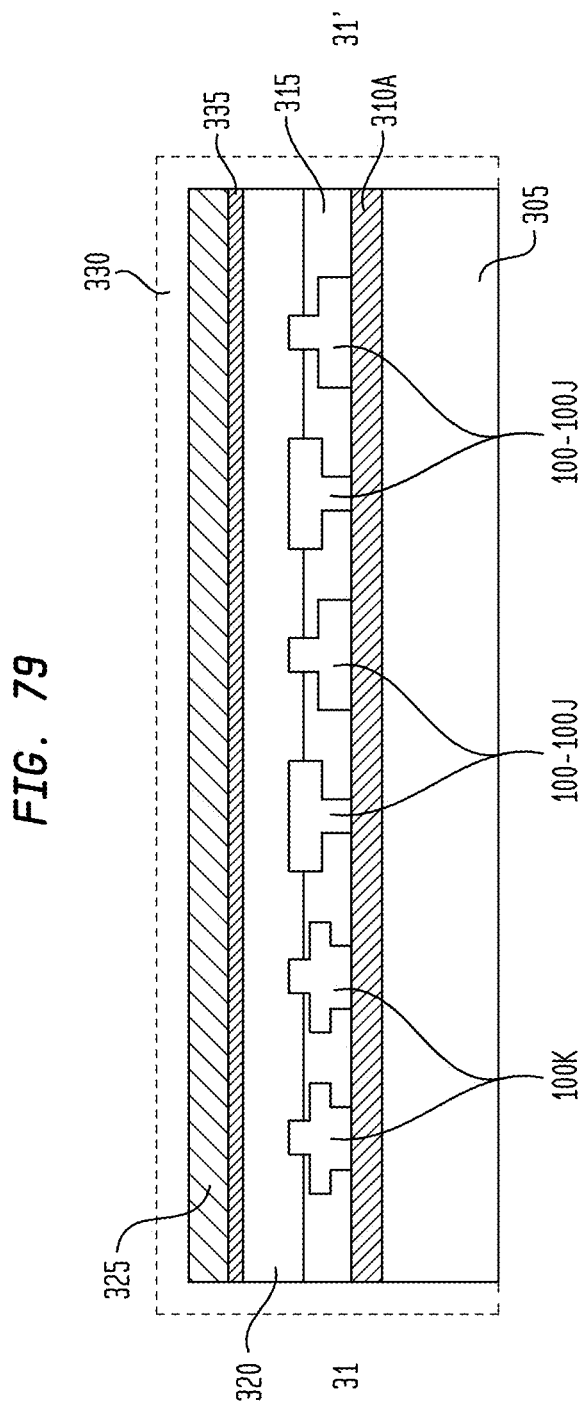
FIG. 79 is a second cross-sectional view of an exemplary first apparatus embodiment.
Figure 87:
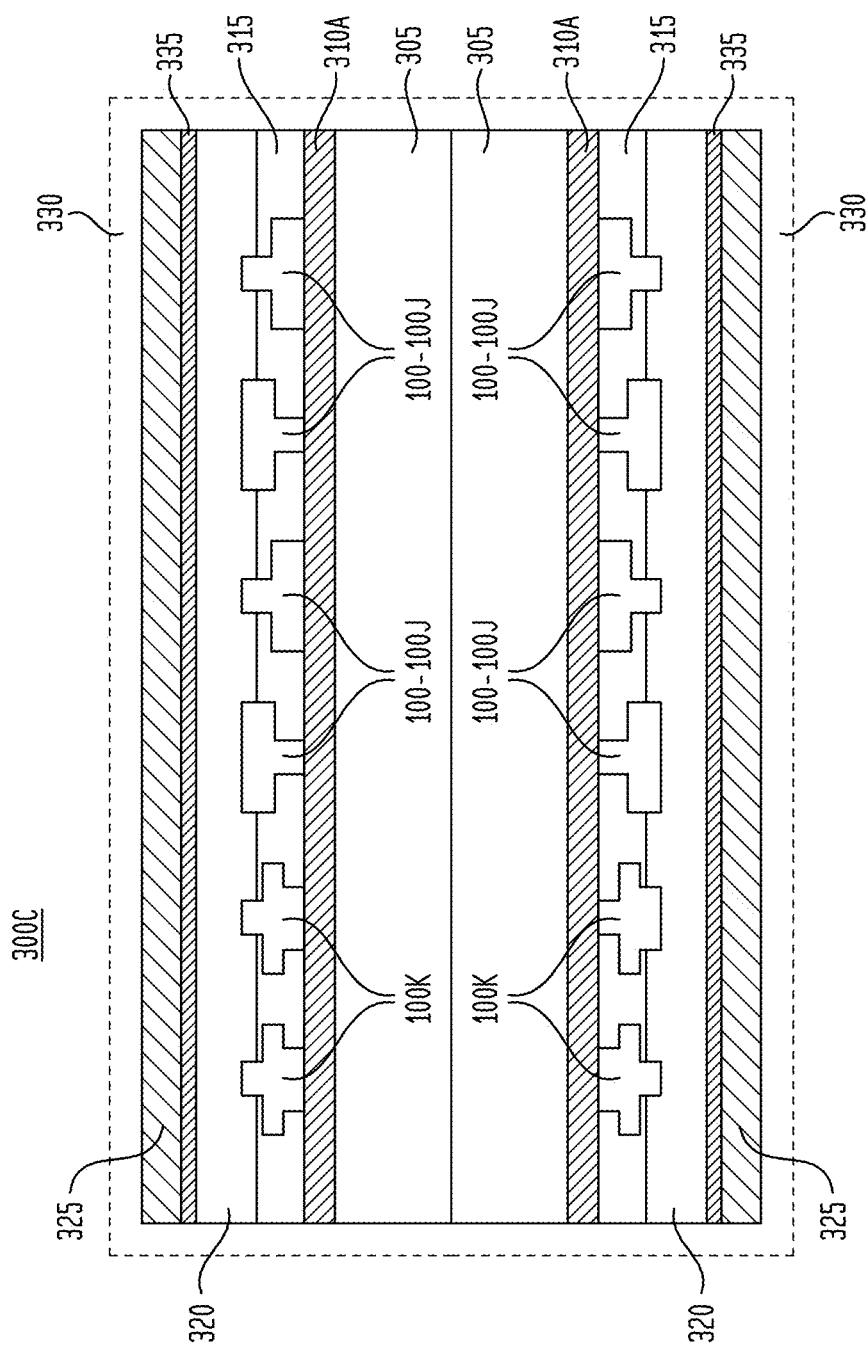
FIG. 87 is a cross-sectional view of an exemplary third apparatus embodiment to provide light emission from two sides.
Figure 88:
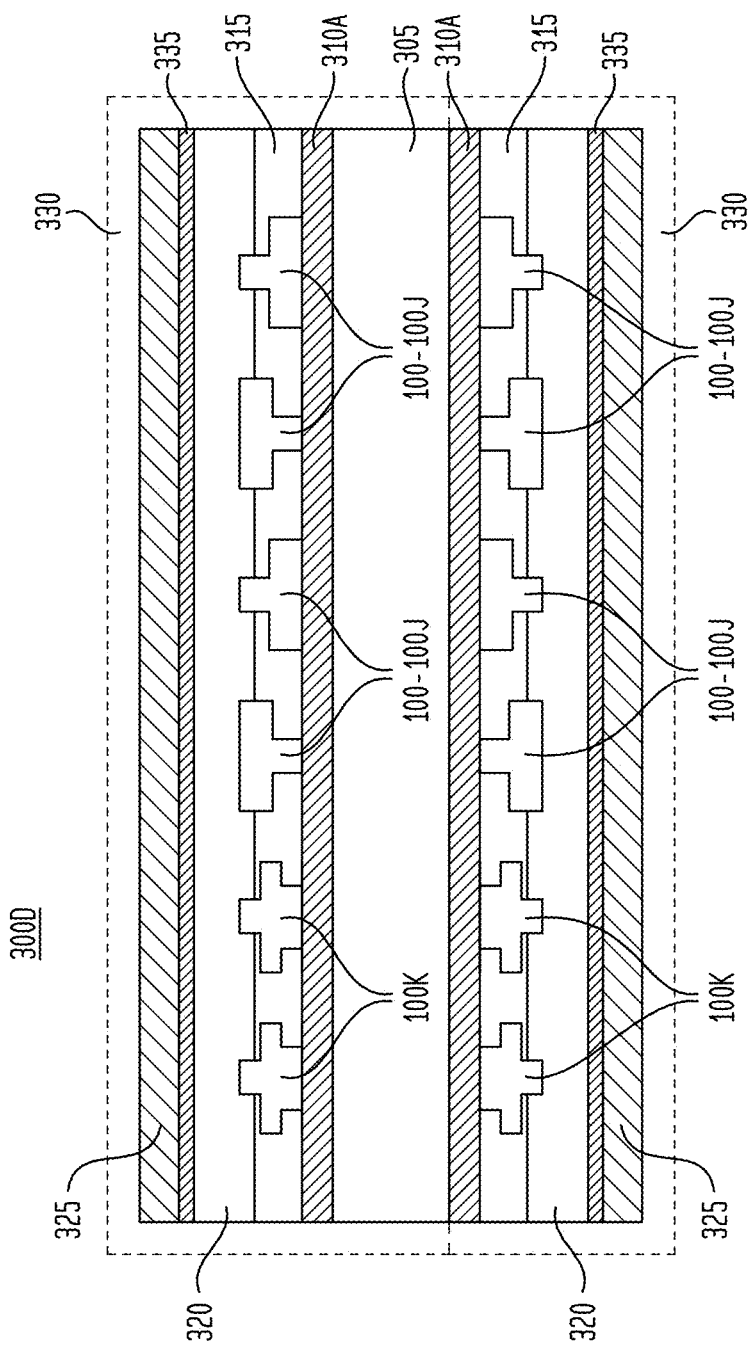
FIG. 88 is a cross-sectional view of an exemplary fourth apparatus embodiment to provide light emission from two sides.
Figure 89:
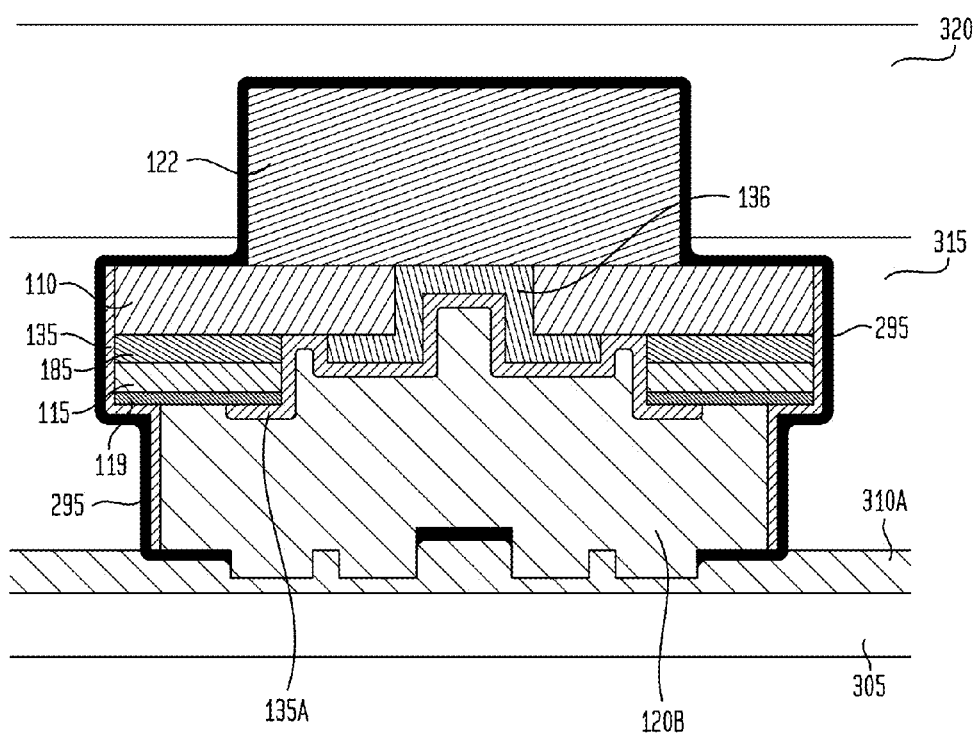
FIG. 89 is a partial cross-sectional view in greater detail of an exemplary first apparatus embodiment.
Figure 90:
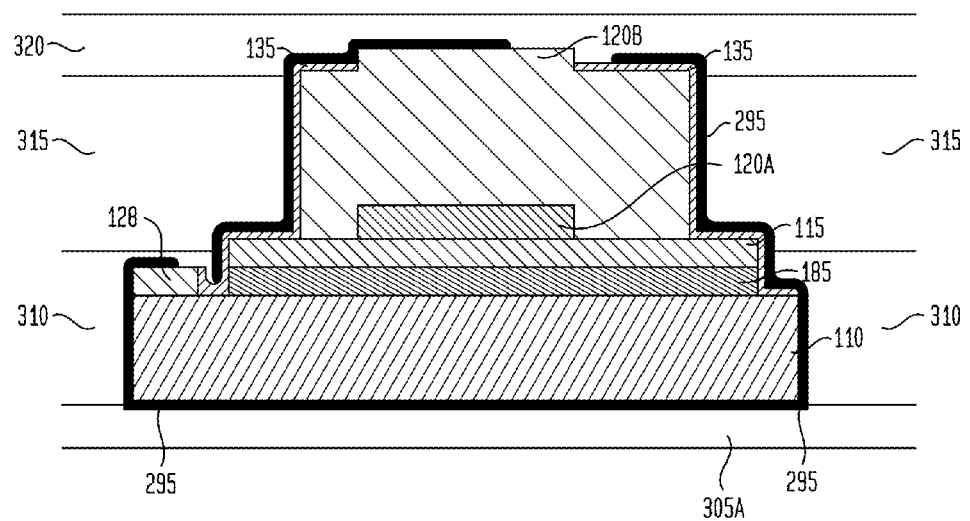
FIG. 90 is a partial cross-sectional view in greater detail of an exemplary second apparatus embodiment.
Figure 91:
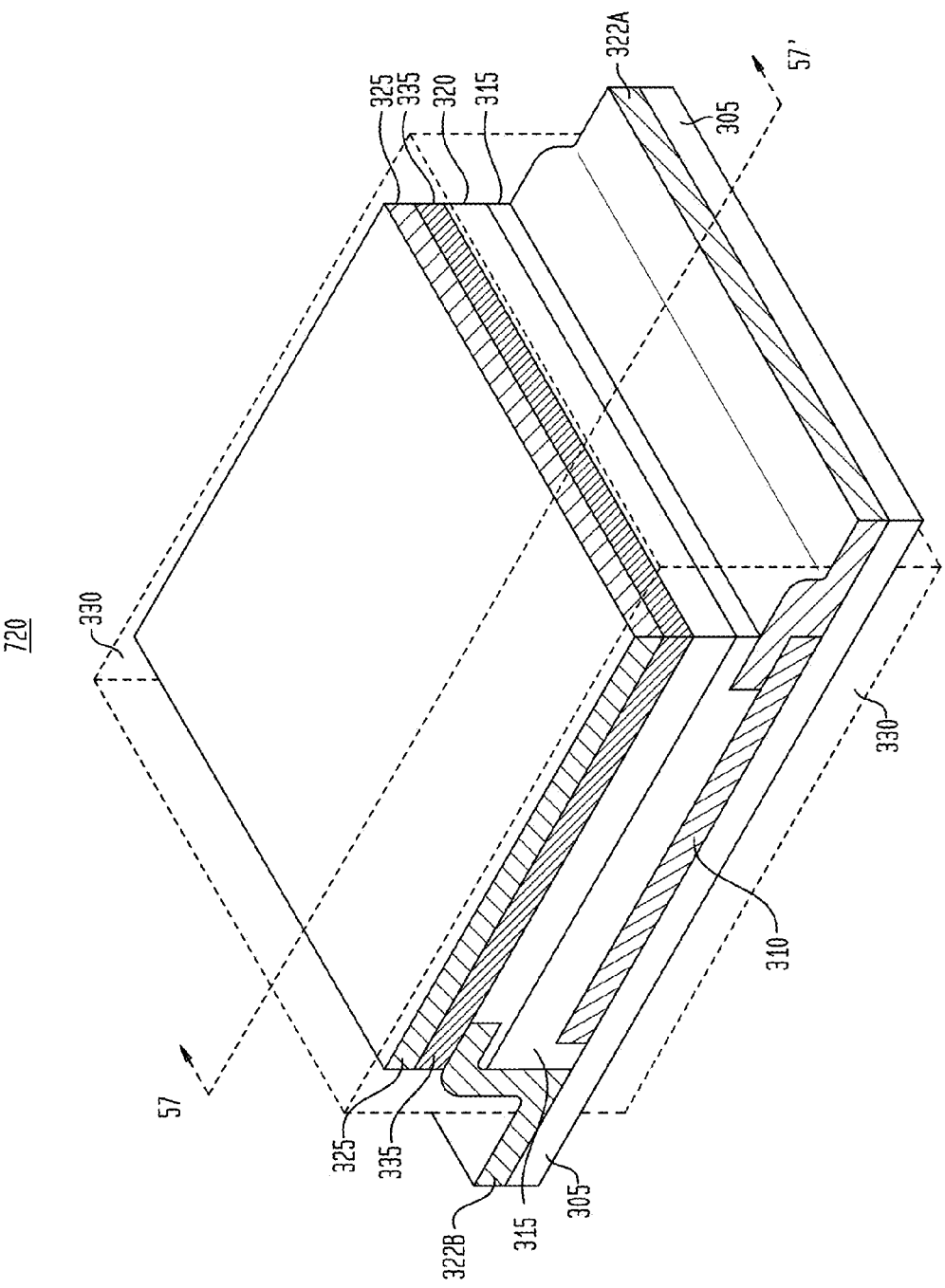
FIG. 91 is a perspective view of an exemplary fifth apparatus embodiment.
Figure 92:
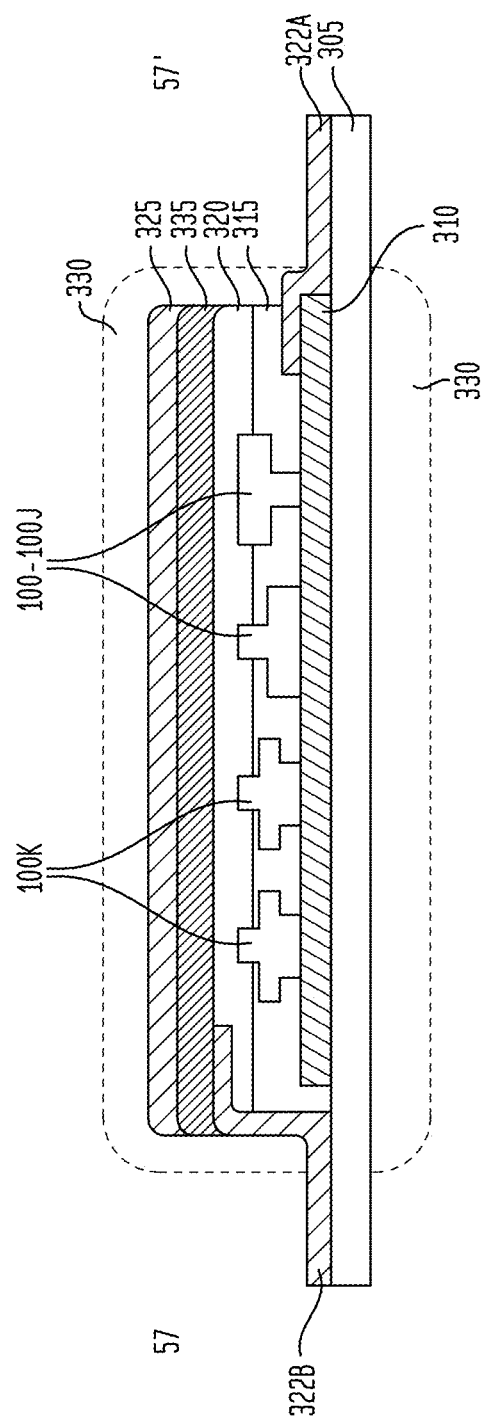
FIG. 92 is a cross-sectional view of an exemplary fifth apparatus embodiment.
Figure 93:
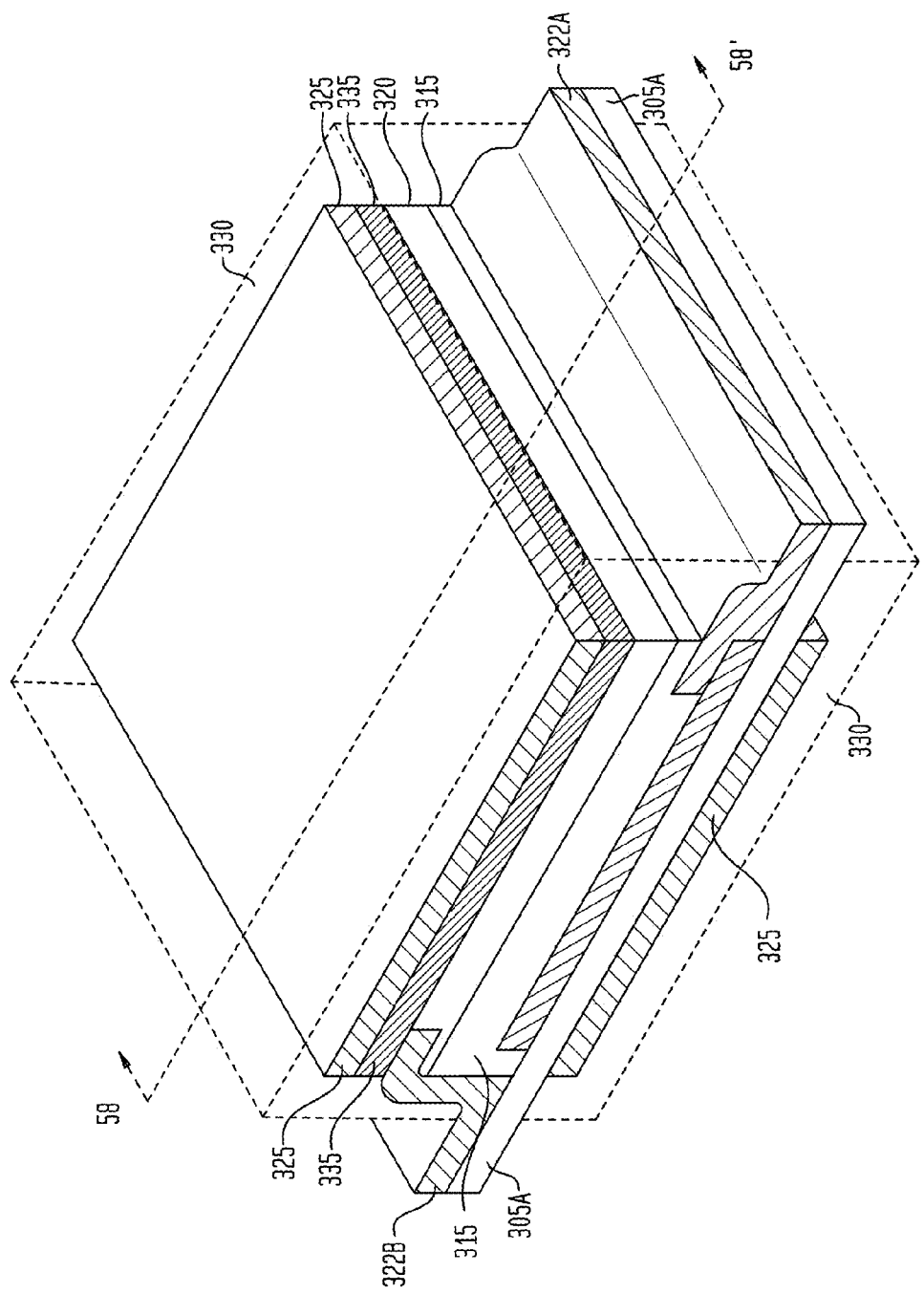
FIG. 93 is a perspective view of an exemplary sixth apparatus embodiment.
Figure 94:
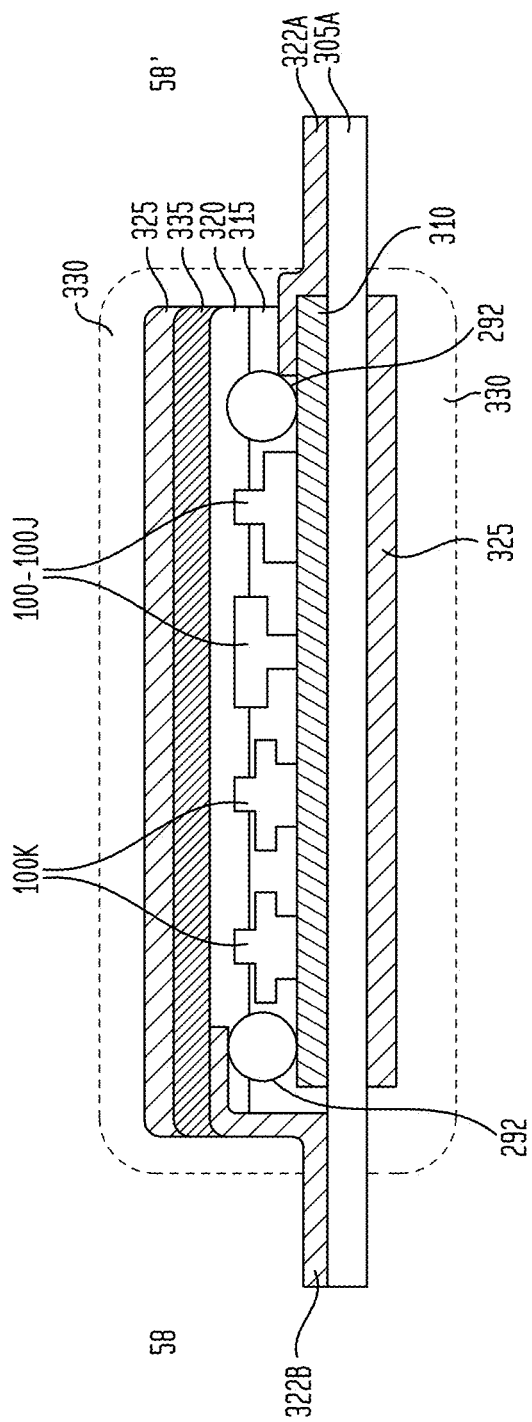
FIG. 94 is a cross-sectional view of an exemplary sixth apparatus embodiment.
Figure 95:
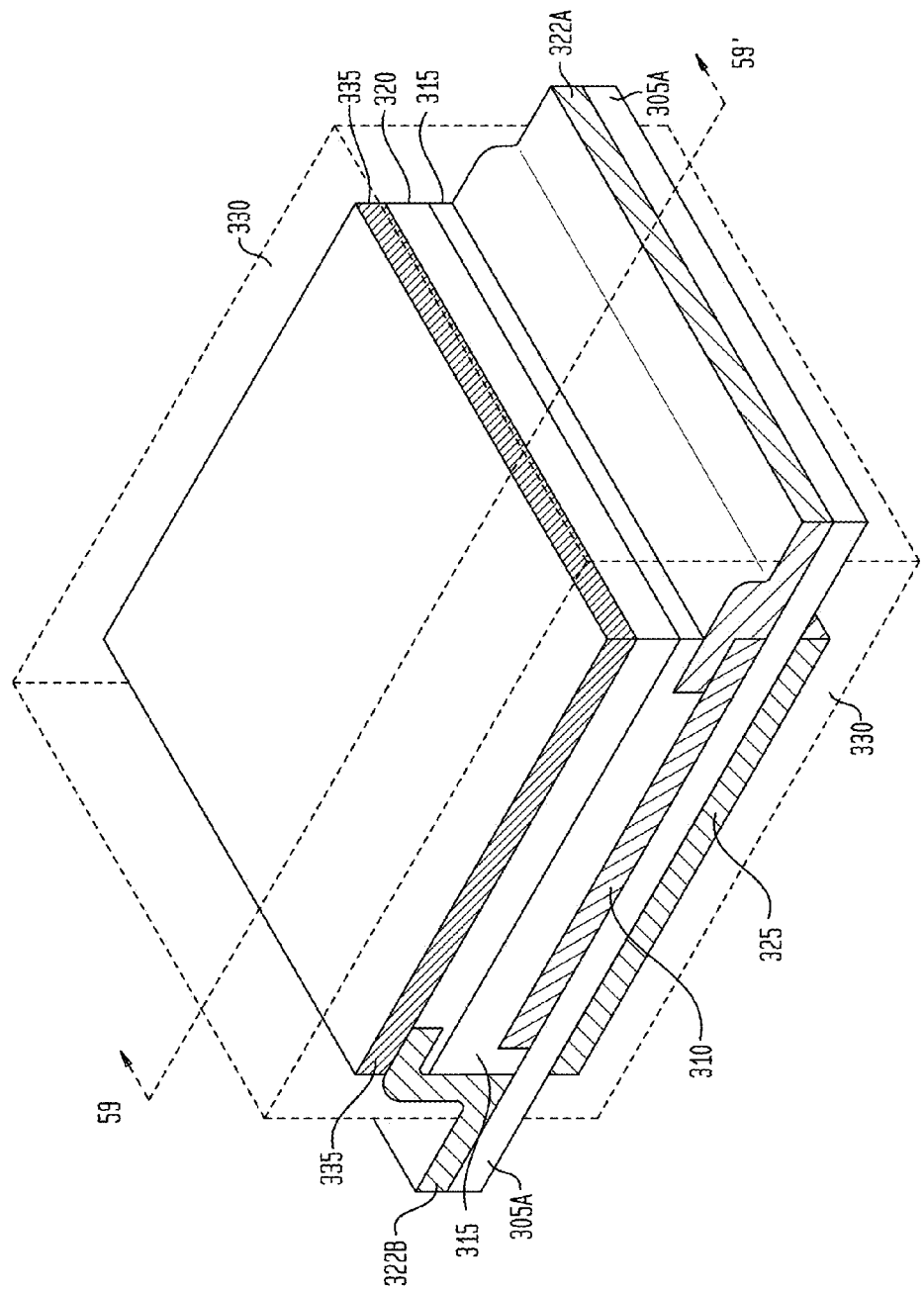
FIG. 95 is a perspective view of an exemplary seventh apparatus embodiment.
Figure 96:
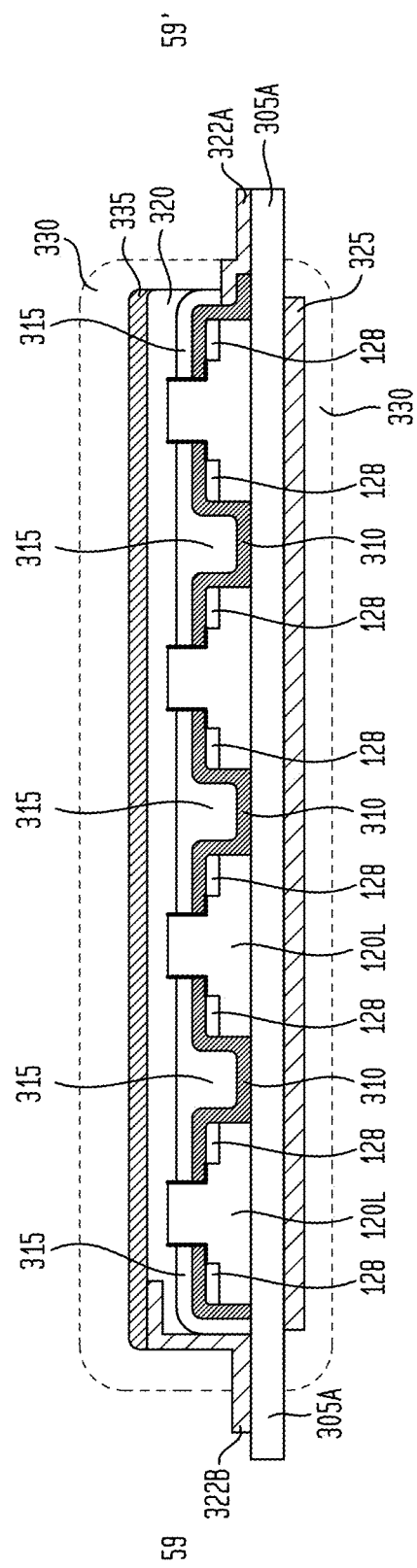
FIG. 96 is a cross-sectional view of an exemplary seventh apparatus embodiment.
Figure 97:
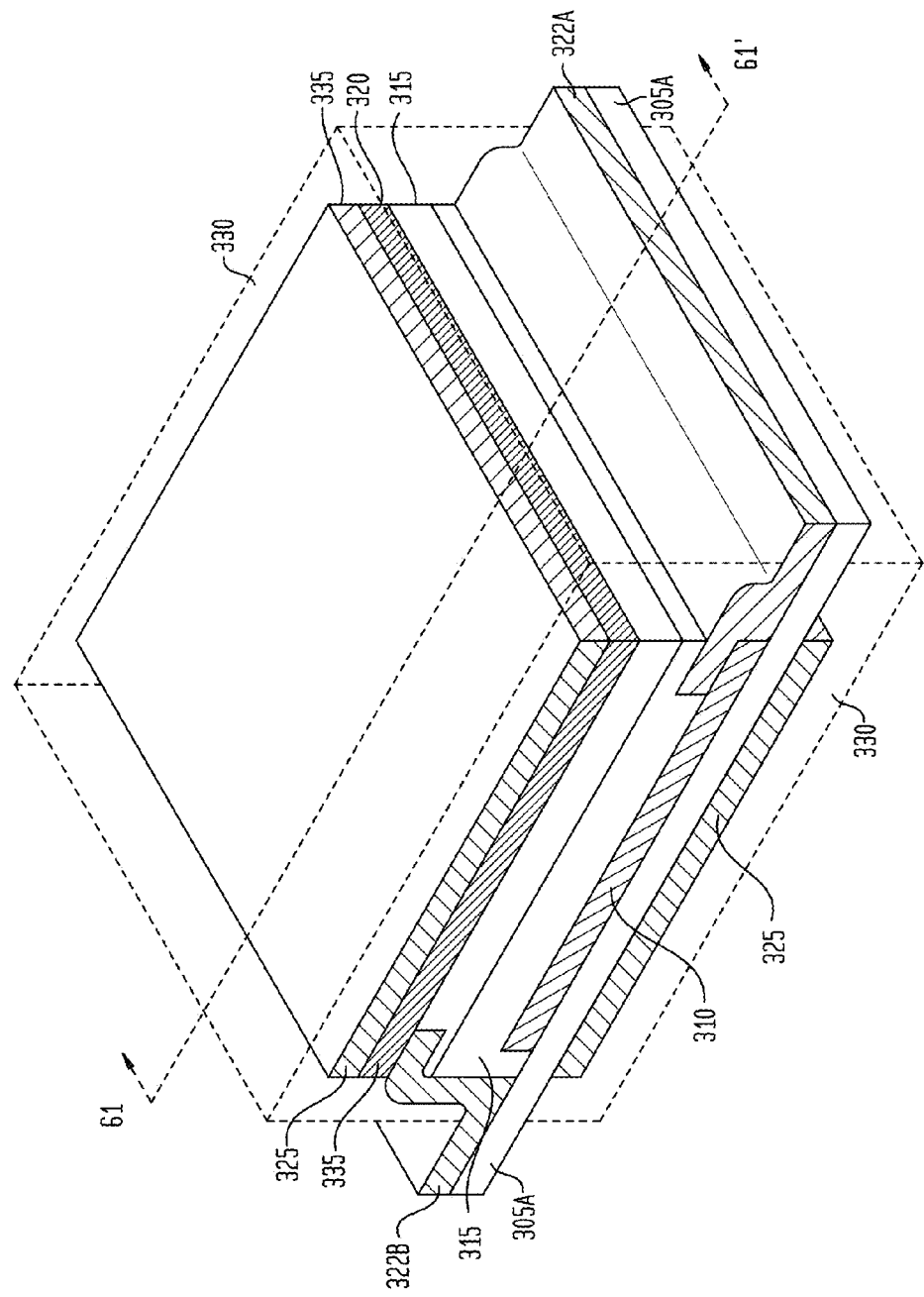
FIG. 97 is a perspective view of an exemplary eighth apparatus embodiment.
Figure 98:
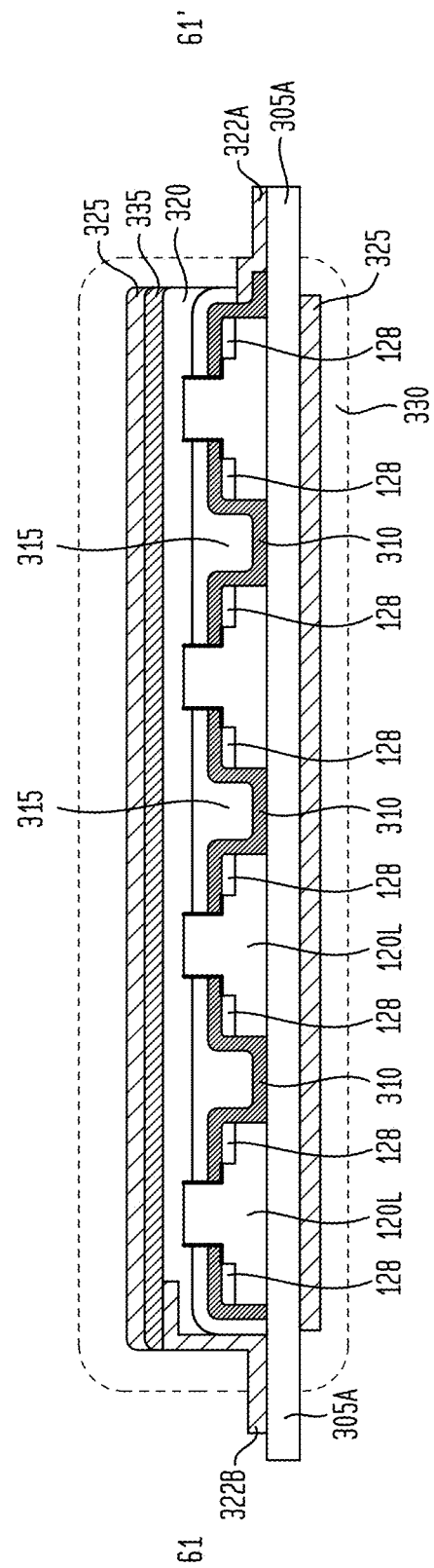
FIG. 98 is a cross-sectional view of an exemplary eighth apparatus embodiment.
Figure 99:
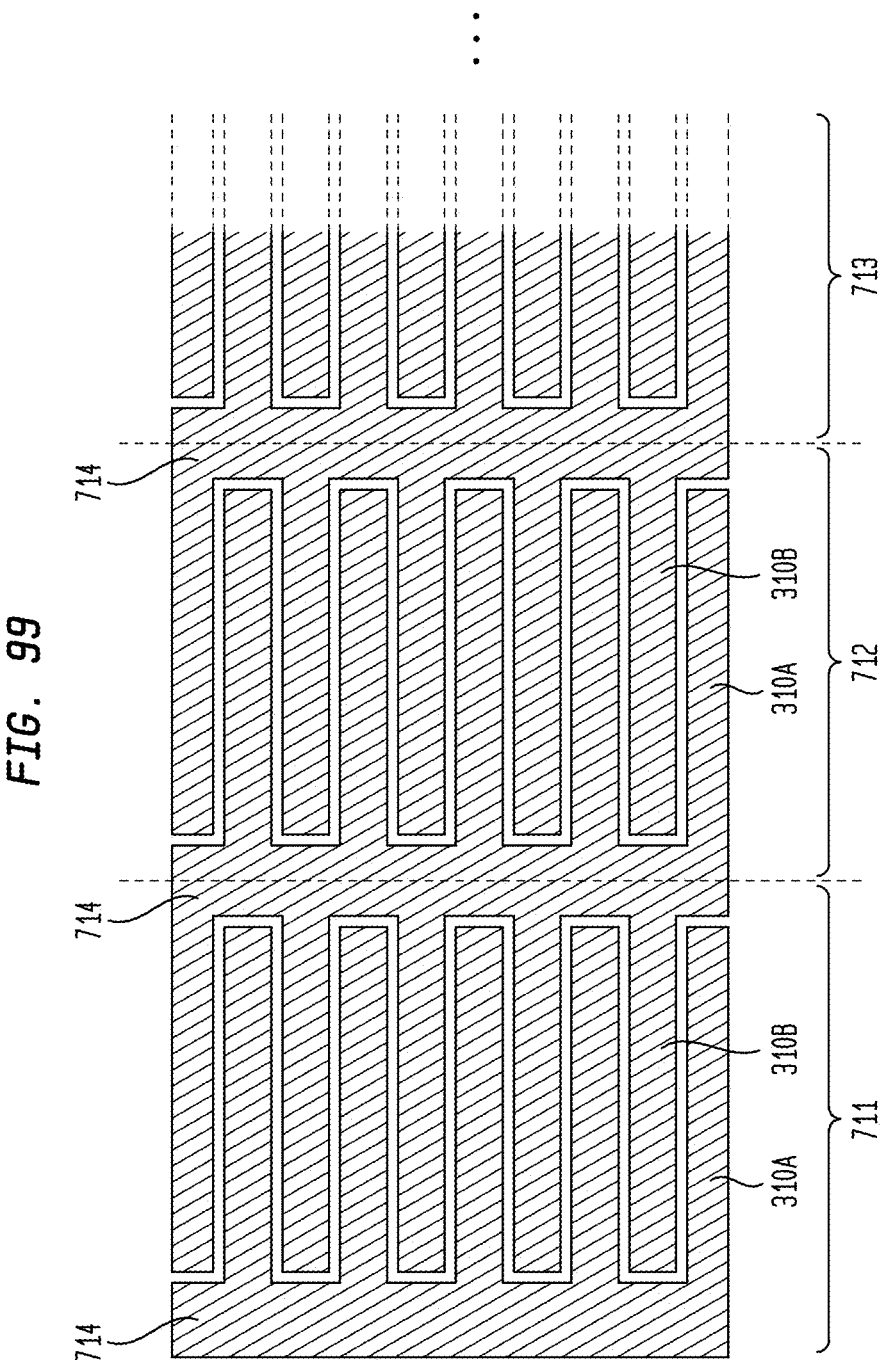
FIG. 99 is a plan (or top) view illustrating an exemplary second electrode structure of a first conductive layer for an exemplary apparatus embodiment.
Figure 101:
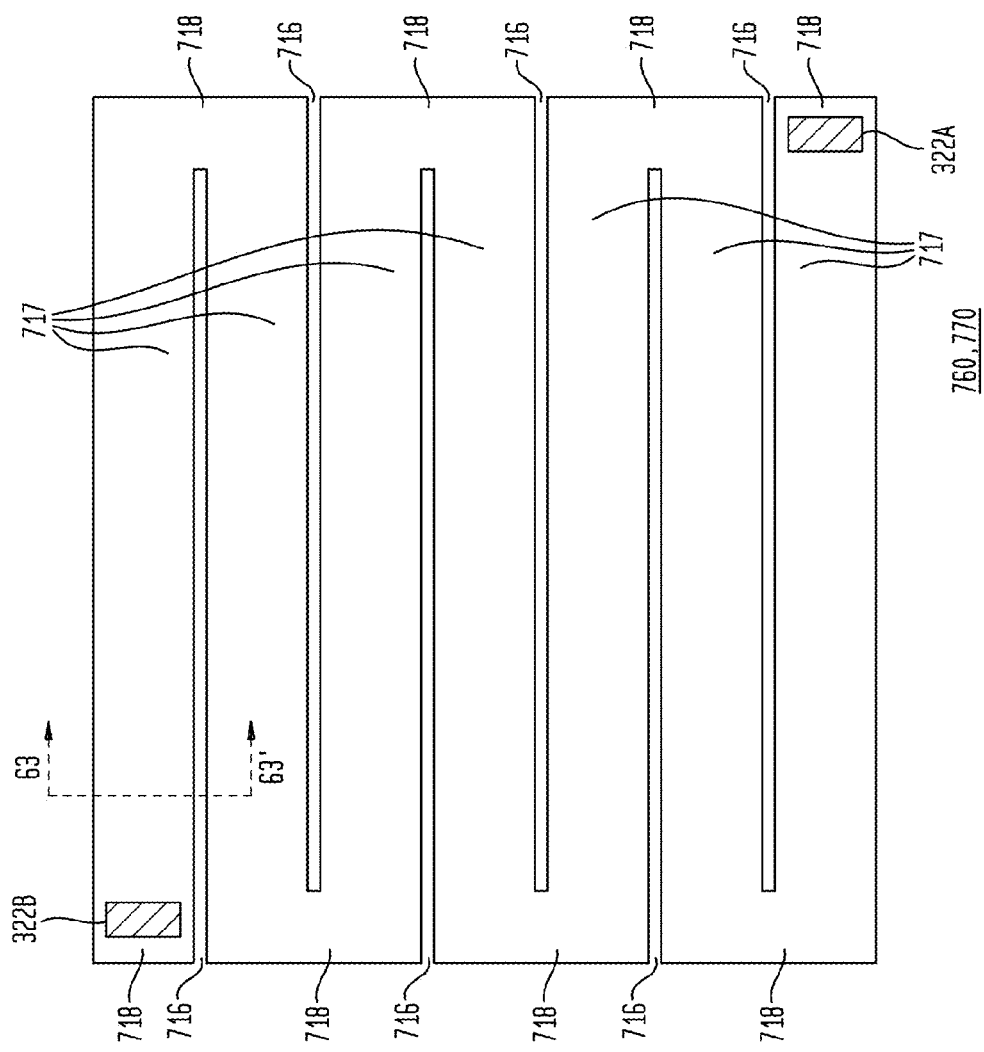
FIG. 101 is a plan (or top) view of exemplary ninth and tenth apparatus embodiments.
Figure 102:
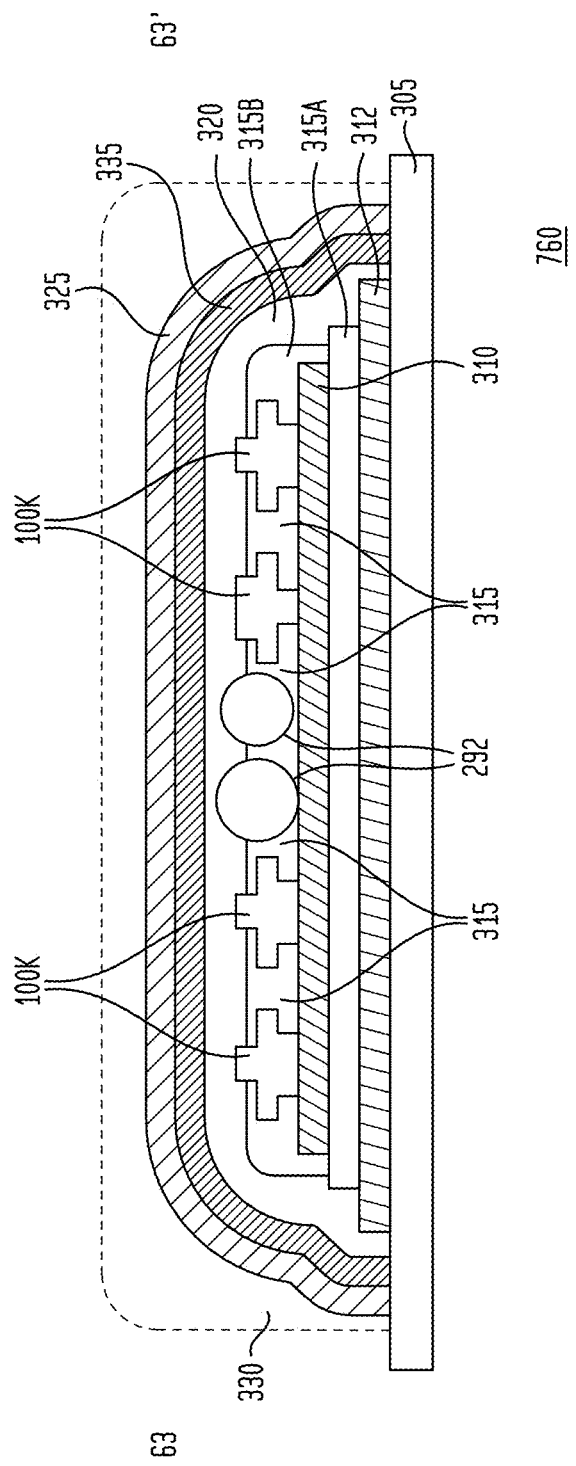
FIG. 102 is a cross-sectional view of an exemplary ninth apparatus embodiment.
Figure 103:
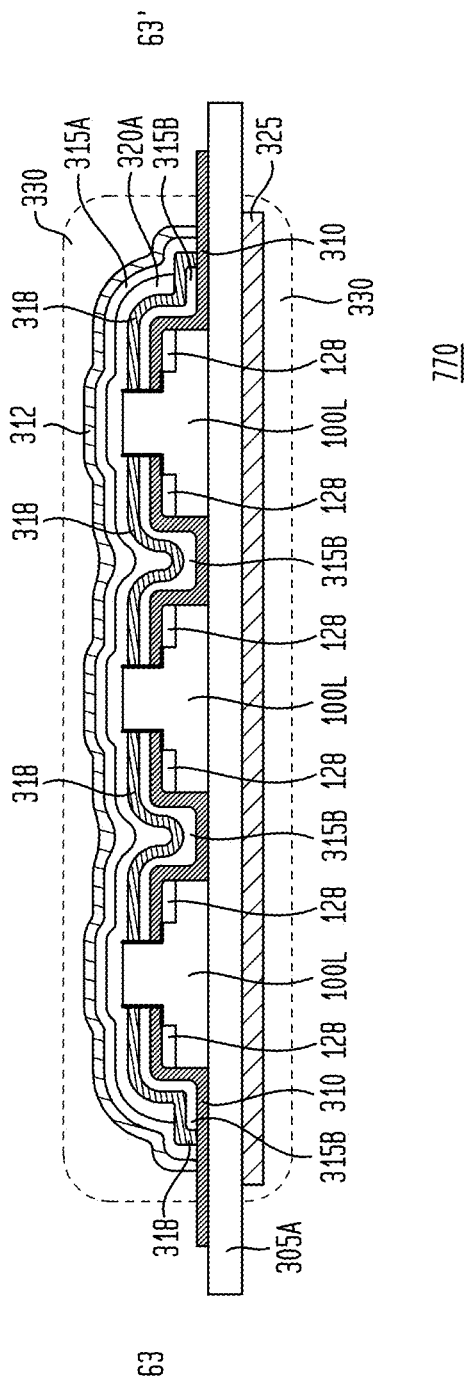
FIG. 103 is a cross-sectional view of an exemplary tenth apparatus embodiment.
Figure 109:
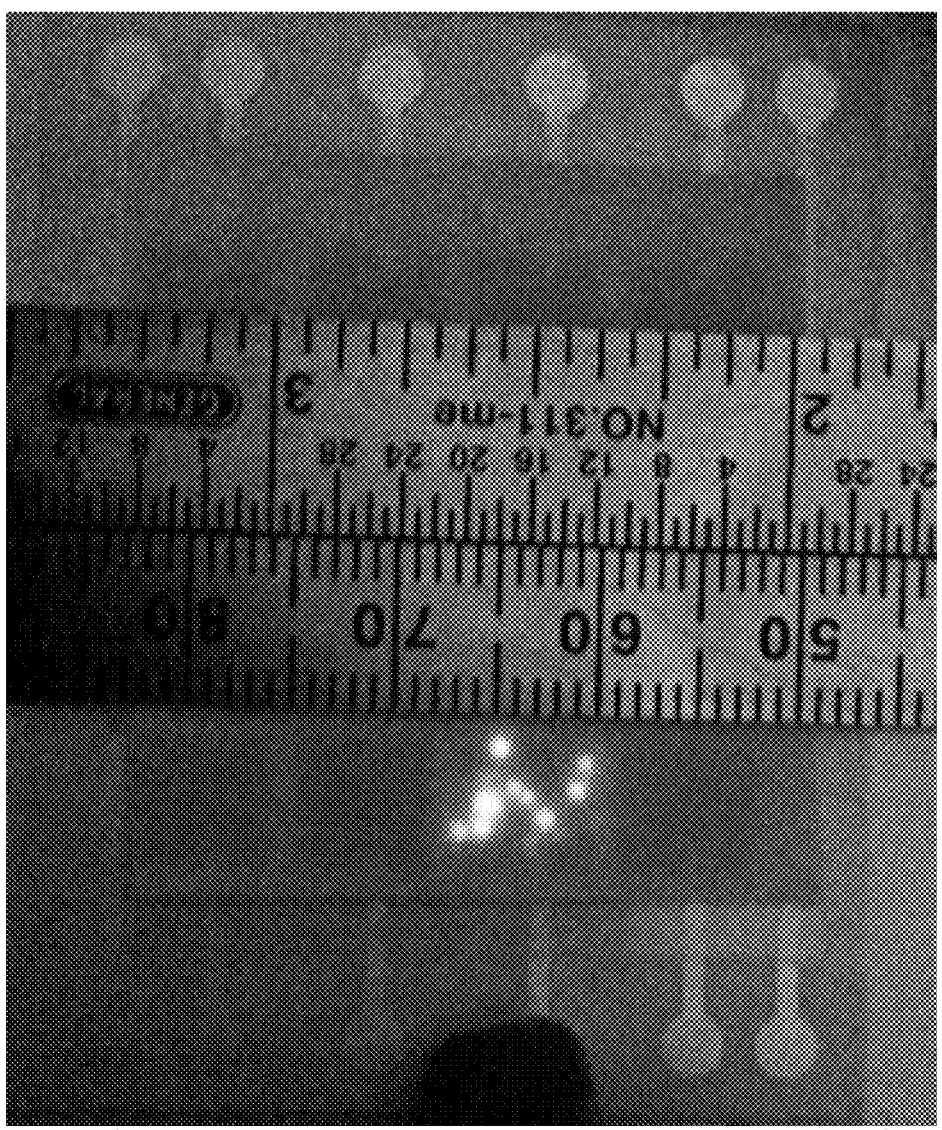
FIG. 109 is a photograph of an energized exemplary apparatus embodiment emitting light.

FIG. 76 is a perspective view of an exemplary apparatus 300 embodiment. FIG. 77 is a plan (or top) view illustrating an exemplary electrode structure of a first conductive layer for an exemplary apparatus embodiment. FIG. 78 is a first cross-sectional view (through the 30-30' plane of FIG. 76) of an exemplary apparatus 300 embodiment. FIG. 79 is a second cross-sectional view (through the 31-31' plane of FIG. 76) of an exemplary apparatus 300 embodiment. FIG. 80 is a perspective view of an exemplary second apparatus 700 embodiment. FIG. 81 is a first cross-sectional view (through the 88-88' plane of FIG. 80) of an exemplary second apparatus 700 embodiment. FIG. 82 is a second cross-sectional view (through the 87-87' plane of FIG. 80) of an exemplary second apparatus 700 embodiment. FIG. 83 is a second cross-sectional view of exemplary diodes 100J, 100K, 100D and 100E coupled to a first conductor 310A. FIG. 87 is a cross-sectional view of an exemplary third apparatus 300C embodiment to provide light emission from two sides. FIG. 88 is a cross-sectional view of an exemplary fourth apparatus 300D embodiment to provide light emission from two sides. FIG. 89 is a partial cross-sectional view in greater detail of an exemplary first apparatus embodiment. FIG. 90 is a partial cross-sectional view in greater detail of an exemplary second apparatus embodiment. FIG. 91 is a perspective view of an exemplary fifth apparatus 720 embodiment. FIG. 92 is a cross-sectional view (through the 57-57' plane of FIG. 91) of an exemplary fifth apparatus 720 embodiment. FIG. 93 is a perspective view of an exemplary sixth apparatus 730 embodiment. FIG. 94 is a cross-sectional view (through the 58-58' plane of FIG. 93) of an exemplary sixth apparatus 730 embodiment. FIG. 95 is a perspective view of an exemplary seventh apparatus 740 embodiment. FIG. 96 is a cross-sectional view (through the 59-59' plane of FIG. 95) of an exemplary seventh apparatus 740 embodiment. FIG. 97 is a perspective view of an exemplary eighth apparatus 750 embodiment. FIG. 98 is a cross-sectional view (through the 61-61' plane of FIG. 97) of an exemplary eighth apparatus 750 embodiment. FIG. 99 is a plan (or top) view illustrating an exemplary second electrode structure of a first conductive layer for an exemplary apparatus embodiment. FIG. 101 is a plan (or top) view of exemplary ninth and tenth apparatus 760, 770 embodiments, typically utilized with the system 800, 810 embodiments illustrated in FIG. 100. FIG. 102 is a cross-sectional view (through the 63-63' plane of FIG. 101) of an exemplary ninth apparatus 760 embodiment. FIG. 103 is a cross-sectional view (through the 63-63' plane of FIG. 101) of an exemplary tenth apparatus 770 embodiment. FIG. 109 is a photograph of an energized exemplary apparatus 300A embodiment emitting light.

Referring to FIGS. 76-79, in an apparatus 300, one or more first conductors 310 are deposited on a base 305 on a first side, followed by depositing a plurality of diodes 100-100K (coupling the second terminals 127 to the conductors 310), a dielectric layer 315, second conductor(s) 320 (generally transparent conductors coupling to the first terminals), optionally followed by a stabilization layer 335, luminescent (or emissive) layer 325, and protective layer or coating 330. In this apparatus 300 embodiment, if an optically opaque base 305 and first conductor(s) 310 are utilized, light is emitted or absorbed primarily through the top, first side of the apparatus 300, and if an optically transmissive base 305 and first conductor(s) 310 are utilized, light is emitted or absorbed form or to both sides of the apparatus 300, particularly if energized with an AC voltage to energize diodes 100-100K having either a first or second orientation.

Referring to FIGS. 80-83, in an apparatus 700, a plurality of diodes 100L are deposited on a first side of an base 305 which is optically transmissive and therefore referred to herein as a base 305A, followed by depositing one or more first conductors 310 (coupling the conductors 310 to the second terminals 127), a dielectric layer 315, second conductor(s) 320 (coupling to the first terminals) (which may or may not be optically transmissive), and optionally followed by a stabilization layer 335 and protective layer or coating 330. An optional luminescent (or emissive) layer 325 may be applied to the second side of the base 305, along with any other protective layer or coating 330, either before or after any of the deposition steps on the first side of the base 305. In this apparatus 700 embodiment, if one or more optically opaque second conductors 320 are utilized, light is emitted or absorbed primarily through the base 305A of the apparatus 700 on the second side, and if one or more optically transmissive second conductors 320 are utilized, light is emitted or absorbed on both sides of the apparatus 700.

Figure 100:
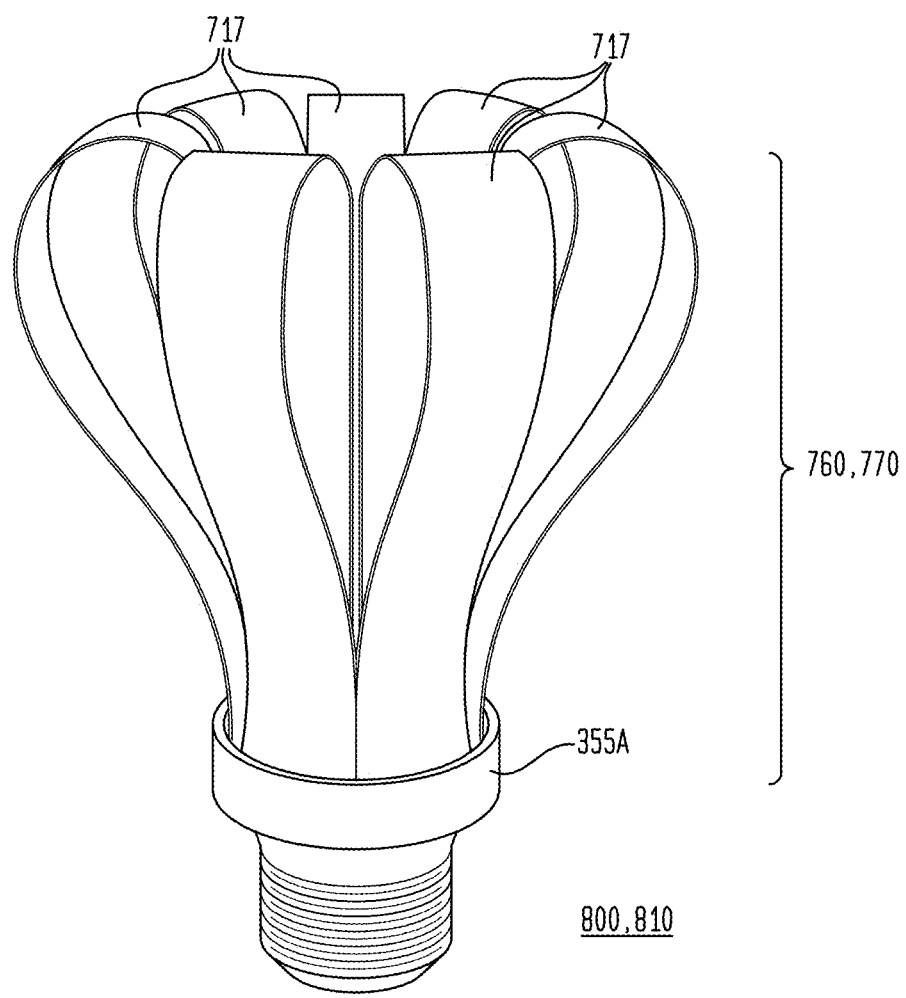
FIG. 100 is a perspective view of third and fourth exemplary system embodiments.

The various apparatus 300, 700, 720, 730, 740, 750, 760, 770 embodiments may be printed as flexible sheets of LED-based lighting or other luminaires, for example, which may be curled, folded, twisted, spiraled, flattened, knotted, creased, and otherwise shaped into any of various forms and designs, of any kind, including architectural shapes, folded and creased origami shapes of other artistic or fanciful designs, Edison bulb shapes, fluorescent bulb shapes, chandelier shapes, for example and without limitation, with one such curled and folded Edison bulb shape illustrated in FIG. 100 as system 800, 810. The various apparatus 300, 700 embodiments may also be combined in various ways, such as back-to-back, to have light emitted or absorbed from both sides of the resulting device. For example and without limitation, two apparatuses 300 may be combined back-to-back on the second sides of the respective substrates 305 to form an apparatus 300C embodiment, or an apparatus 300 may be printed on both sides of a substrate 305 to form an apparatus 300D embodiment, both as illustrated in cross-section in FIGS. 87 and 88, respectively. Also for example and without limitation, not separately illustrated, two apparatuses 700 also may be combined back-to-back on the non-substrate 305, first side, also providing light emission from both sides of the resulting device.

Referring to FIGS. 91-92, in an apparatus 720, a first conductor 310 is deposited as one or more layers on a base 305 on a first side, followed by depositing a carbon contact 322A to couple to the conductor 310, followed by depositing a plurality of diodes 100-100K (coupling the second terminals 127 to the conductors 310), a dielectric layer 315, a second conductor 320 also deposited as one or more layers (generally transparent conductors coupling to the first terminals), followed by depositing a carbon contact 322B to couple to the conductor 320, optionally followed by a stabilization layer 335, luminescent (or emissive) layer 325, and protective layer or coating 330. In this apparatus 300 embodiment, light is emitted or absorbed primarily through the top, first side of the apparatus 720, and if an optically transmissive base 305 and first conductors 310 are utilized, light is emitted or absorbed form or to both sides of the apparatus 720, particularly if energized with an AC voltage.

Referring to FIGS. 93-94, in an apparatus 730, a substantially optically transmissive first conductor 310 is deposited as one or more layers on an optically transmissive base 305A on a first side, followed by depositing a carbon contact 322A to couple to the conductor 310, followed by depositing a plurality of diodes 100-100K (coupling the second terminals 127 to the conductors 310) with a plurality of inert particles 292, a dielectric layer 315, a second conductor 320 also deposited as one or more layers (also generally transparent conductors coupling to the first terminals), followed by depositing a carbon contact 322B to couple to the conductor 320, optionally followed by a stabilization layer 335, a first luminescent (or emissive) layer 325, and protective layer or coating 330, followed by depositing on the second side of the base 305A a second luminescent (or emissive) layer 325, and protective layer or coating 330. In this apparatus 730 embodiment, light is emitted or absorbed through both the top, first side and the bottom, second side of the apparatus 730. In addition, the use of the second luminescent (or emissive) layer 325 may also shift the wavelengths of the light emitted through the second side (in addition to the first luminescent (or emissive) layer 325 shifting the spectrum of the light emitted through on the first side).

Referring to FIGS. 95-96, in an apparatus 740, a plurality of diodes 100L are deposited on a first side of an base 305 which is optically transmissive and also referred to herein as a base 305A, followed by depositing a first conductor 310 as one or more layers (coupling the conductor 310 to the second terminals 127), followed by depositing a carbon contact 322A to couple to the conductor 310, a dielectric layer 315, a second conductor 320 also deposited as one or more layers (coupling to the first terminals), followed by depositing a carbon contact 322B to couple to the conductor 320, and optionally followed by a stabilization layer 335 and protective layer or coating 330. An optional luminescent (or emissive) layer 325 may be applied to the second side of the base 305, along with any other protective layer or coating 330, either before or after any of the deposition steps on the first side of the base 305. In this apparatus 740 embodiment, light is emitted or absorbed primarily through the base 305A of the apparatus 740 on the second side (also with any shift of wavelengths from the first luminescent (or emissive) layer 325), and if one or more optically transmissive second conductors 320 are utilized, light is emitted or absorbed on both sides of the apparatus 740.

Referring to FIGS. 97-98, in an apparatus 750, a plurality of diodes 100L are deposited on a first side of an base 305 which is optically transmissive and also referred to herein as a base 305A, followed by depositing a first conductor 310 as one or more layers (coupling the conductor 310 to the second terminals 127), followed by depositing a carbon contact 322A to couple to the conductor 310, a dielectric layer 315, a substantially optically transmissive second conductor 320 also deposited as one or more layers (coupling to the first terminals), followed by depositing a carbon contact 322B to couple to the conductor 320, and optionally followed by a stabilization layer 335, an optional first luminescent (or emissive) layer 325, and protective layer or coating 330. An optional second luminescent (or emissive) layer 325 may be applied to the second side of the base 305A, along with any other protective layer or coating 330, either before or after any of the deposition steps on the first side of the base 305. In this apparatus 750 embodiment, light is emitted or absorbed through both the top, first side and the bottom, second side of the apparatus 750, also with any shift of wavelengths from the first and second luminescent (or emissive) layers 325.

Apparatuses 760 and 770 will be described in greater detail below with reference to FIGS. 100-103, and differ from the other illustrated apparatuses in utilizing a third conductor 312, also typically deposited as one or more layers. In addition, apparatus 770 also illustrates use of a barrier layer 318, discussed in greater detail below.

As mentioned above, the apparatus 300, 700, 720, 730, 740, 750, 760, 770 is formed by depositing (e.g., printing) a plurality of layers on a base 305, namely, for an apparatus 300, 720, 730, 750, depositing one or more first conductors 310 on the base 305, either as a layer or a plurality of conductors 310, followed by depositing the diodes 100-100L while in the liquid or gel suspension (to a wet film thickness of about 18 to 20 or more microns) (i.e., a diode ink), and evaporating or otherwise dispersing the liquid/gel portion of the suspension, and for an apparatus 700, 740, 750, by depositing the diodes 100-100L while in the liquid or gel suspension (to a wet film thickness of about 18 to 20 or more microns) (i.e., a diode ink) over a first side of the optically transmissive base 305A and evaporating or otherwise dispersing the liquid/gel portion of the suspension, followed by depositing one or more first conductors 310.

As the liquid or gel suspension of diodes 100-100L dries or cures, the components of the diode ink (especially the viscosity modifier or adhesive viscosity modifier, as mentioned above) form a comparatively thin film, coating, lattice or mesh around the diodes 100-100L, helping to hold them in place on the base 305 or first conductor(s) 310, illustrated as film 295 in FIGS. 89 and 90, typically on the order of about 50 nm to about 300 nm thick (when fully cured or dried), depending upon the concentration of viscosity modifier utilized, such as about 50-100 nm for lower concentrations of viscosity modifier, and about 200-300 nm for higher concentrations of viscosity modifier. The deposited film 295 may be continuous, surrounding the diodes 100-100L, as illustrated in FIG. 89, or may be discontinuous, leaving gaps and only partially surrounding the diodes 100-100L, as illustrated in FIG. 90. While the terminals 125, 127 are typically coated with the diode ink film 295, there is generally sufficient surface roughness of the terminals 125, 127 that the film 295 does not interfere with making electrical connections to the first and second conductors 310, 320. The film 295 typically comprises a cured or dried form of the viscosity modifier, and potentially also small or trace amounts of the various solvents, such as the first or second solvents, as mentioned below with reference to cured or dried diode ink embodiments. Also as discussed in greater detail below, a viscosity modifier may also be utilized to form a barrier layer 318, discussed below with reference to FIG. 103.

For an apparatus 300, the diodes 100-100K are physically and electrically coupled to the one or more first conductors 310A, and for an apparatus 700, the diodes 100K are physically coupled to the base 305 and subsequently coupled to the one or more first conductors 310, and in both apparatus 300, 700 embodiments, because of having been deposited while suspended in any orientation in a liquid or gel, the diodes 100-100L may be in a first orientation (first terminal 125 in an up direction), in a second orientation (first terminal 125 in a down direction), or possibly in a third orientation (first terminal 125 is sideways). In addition, because of having been deposited while suspended in a liquid or gel, the diodes 100-100L are generally spaced quite irregularly within an apparatus 300, 700. In addition, as mentioned above, in exemplary embodiments, the diode ink may include a plurality of chemically inert, typically optically transmissive particles, such as glass beads, having a range of sizes between about 10 to 30 microns, or more particularly between about 12 to 28 microns, or more particularly between about 15 to 25 microns.

In the first, up orientation or direction, as illustrated in FIG. 83, the first terminal 125 (either metal layer 120B forming the bump or protruding structure for diodes 100-100J or the metal layer 122 of diode 100K) is oriented upward, and the diodes 100-100K are coupled to the one or more first conductors 310A through second terminal 127, which may be a metal layer 120B for a diode 100K, or a back side metal layer 122 as illustrated for diode 100J, or through a center via 131 as illustrated for diode 100D (embodied without the optional back side metal layer 122 of a diode 100J), or through a peripheral via 134 (not separately illustrated), or through substrate 105 as illustrated for diode 100E. In the second, down orientation or direction, illustrated in FIGS. 78 and 79, the first terminal 125 is oriented downward, and the diodes 100-100K are or may be coupled to the one or more first conductors 310A through the first terminal 125 (e.g., either metal layer 120B forming the bump or protruding structure for diodes 100-100J or the metal layer 122 of diode 100K).

For a diode 100L, the diode 100L may be oriented in a first, up orientation or direction illustrated in FIGS. 81 and 82, in which both first and second terminals 125, 127 are oriented upward, and not separately illustrated, may be oriented in a second, down orientation or direction, in which both first and second terminals 125, 127 are oriented downward. For such a downward orientation, it should be noted that while the first terminal 125 may be in electrical contact with the one or more first conductors 310, the second terminal 127 is more likely to be within the dielectric layer 135 and will not make contact with a second conductor 320, resulting in that diode 100L being electrically isolated and nonfunctional when having the second orientation, which may be desirable in many embodiments.

Insofar as the diodes 100-100L are being deposited while suspended in a liquid or gel with indeterminate spacing between them and in any 360 degrees of orientation, it is not known in advance with any certainty (e.g., within a non-defect rate of 4-6 sigma of the mean for most high quality manufacturing) precisely where and in what orientation any particular diode 100-100L will land on the substrate 305A or one or more first conductors 310. Rather, there will be statistical distributions for both spacing of the diodes 100-100L from each other and the orientation of the diodes 100-100L (first, up or second, down). What can be said with a high degree of certainty is that of the potentially millions of diodes 100-100L which may be deposited on a substrate 305, 305A sheet or series of sheets, at least one such diode 100-100L will end up in a second orientation, because of having been deposited while dispersed and suspended in a liquid or gel.

Accordingly, the distribution and orientation of diodes 100-100L in an apparatus 300, 700, 720, 730, 740, 750, 760, 770 may be described statistically. For example, while it may be unknown or indeterminate in advance of deposition precisely where and in what orientation any particular diode 100-100L will land and be held in place on the substrate 305A or one or more first conductors 310, on average a certain number of diodes 100-100L will be in a particular orientation in a certain concentration of diodes 100-100L per unit area, such as 25 diodes 100-100L per square centimeter, for example and without limitation.

Accordingly, the diodes 100-100L may be considered to be or have been deposited in an effectively random or pseudo-random orientation and with irregular spacing, and may be up in a first orientation (first terminal 125 up), which is typically the direction of a forward bias voltage for diodes 100-100J and a reverse bias for diodes 100K (depending upon the polarity of the applied voltage), or down in a second orientation (first terminal 125 down), which is typically the direction of a reverse bias voltage for diodes 100-100J and forward bias for diodes 100K, (also depending upon the polarity of the applied voltage). Similarly for diodes 100L, which may be up in a first orientation (first and second terminals 125, 127 up), which is typically the direction of a forward bias voltage for diodes 100L, or down in a second orientation (first and second terminals 125, 127 down), which is typically the direction of a reverse bias voltage for diodes 100L (also depending upon the polarity of the applied voltage), although as mentioned above and as described in greater detail below, diodes 100L which are in the second orientation are typically not fully coupled electrically and are non-functioning. It is also possible that diodes 100-100L are deposited or end up sideways in a third orientation (a diode lateral side 121 down and another diode lateral side 121 up).

Fluid dynamics, the viscosity or rheology of the diode ink, screen mesh count, screen mesh openings, screen mesh material (surface energy of the screen mesh material), print speed, orientation of the tines of the interdigitated or comb structure of the first conductors 310 (tines being perpendicular to the direction of the motion of the base 305 through a printing press), the surface energy of the base 305 or first conductor(s) 310 upon which the diodes 100-100L are deposited, the shape and size of the diodes 100-100L, the printed or deposited density of the diodes 100-100L, the shape, size and/or thickness of the diode lateral sides 121, and sonication or other mechanical vibration of the liquid or gel suspension of diodes 100-100L prior to curing or drying of the diode ink, appear to influence the predominance of one first, second or third orientation over another first, second or third orientation. For example, diode lateral sides 121 being less than about 10 microns in height (or the vertical thickness, with vertical being with reference to the first or second orientations), and more particularly less than about 8 microns in height, such that the diodes 100-100L have comparatively thin sides or edges, significantly decreases the percentage of diodes 100-100L having the third orientation.

Similarly, fluid dynamics, higher viscosities, and lower mesh count and the other factors mentioned above provide a degree of control over the orientation of the diodes 100-100L, allowing the percentages of diodes 100-100L in the first or second orientations to be tuned or adjusted for a given application. For example, the factors enumerated above may be adjusted to increase the prevalence of the first orientation, resulting in a first orientation of as many as 80% to 90% of the diodes 100-100L or more. Also for example, the factors enumerated above may be adjusted to balance the prevalence of the first and second orientations, resulting in an approximately or substantially equal distribution of the first orientation and the second orientation of the diodes 100-100L, e.g., 40% to 60% of the diodes 100-100L in the first orientation and 60% to 40% of the diodes 100-100L in the second orientation.

It should be noted that even with a significantly high percentage of diodes 100-100L coupled to the first conductor 310A or base 305 in the first, up orientation or direction, statistically there is nonetheless a significant probability that at least one or more diodes 100-100L will have the second, down orientation or direction, and that statistically the diodes 100-100L will also exhibit irregular spacing, with some diodes 100-100J spaced comparatively closer, and at least some diodes 100-100J spaced apart much more.

Stated another way, depending upon the polarity of the applied voltage, while a significantly high percentage of diodes 100-100L are or will be coupled in a first, forward bias orientation or direction, statistically at least one or more diodes 100-100L will have a second, reverse bias orientation or direction. In the event the light emitting or absorbing region 140 is oriented differently, then those having skill in the art will recognize that also depending upon the polarity of the applied voltage, the first orientation will be a reverse bias orientation, and the second orientation will be a forward bias orientation.

For example, unlike traditional electronics manufacturing in which electrical components such as diodes are positioned for surface mounting, within a selected tolerance level, onto a predetermined location and in a predetermined orientation on a circuit board using a pick and place machine, in any given instance, there are no such predetermined or certain locations (in an x-y plane) and orientations (z-axis) for diodes 100-100L in an apparatus 300, 700 (i.e., at least one diode 100-100L will be in a second orientation in an apparatus 300, 700).

This is a significant departure from existing apparatus structures, in which all such diodes (such as LEDs) have a single orientation with respect to the voltage rails, namely, all having their corresponding anodes coupled to the higher voltage and their cathodes coupled to the lower voltage. As a result of the statistical orientation, depending upon the percentages of diodes 100-100L having first or second orientations, and depending upon various diode characteristics such as tolerances for reverse bias, the diodes 100-100L may be energized using either an AC or a DC voltage or current, without additional switching of voltage or current.

Referring to FIGS. 77 and 99, a plurality of first conductors 310 may be utilized, forming at least two separate electrode structures, illustrated as an interdigitated or comb electrode structures of a first (first) conductor electrode or contact 310A and a second (first) conductor electrode or contact 310B. As illustrated in FIG. 77, the conductors 310A and 310B have the same widths, and are illustrated in FIGS. 76 and 78 as having different widths, with all such variations within the scope of the disclosure. For the exemplary apparatus 300 embodiment, the diode ink or suspension (having the diodes 100-100K) is deposited over the conductor 310A. A second, transparent conductor 320 (optically transmissive, discussed below) is subsequently deposited (over a dielectric layer, as discussed below) to make separate electrical contact with the conductor 310B, as illustrated in FIG. 78. Although not separately illustrated, as an option, the exemplary apparatus 700 embodiment may also have these 310A, 310B electrical connections: after the diode ink or suspension (having the diodes 100L) is deposited over the base 305A, one or more conductors 310A and 310B (as an interdigitated or comb structure) may be deposited, followed by a dielectric layer 315 over the conductors 310A. A second conductor 320, which does not need to be optically transmissive, is subsequently deposited (over a dielectric layer 315, as discussed below), and also may have an interdigitated or comb structure) to make separate electrical contact with the conductors 310B, as illustrated in FIG. 78 for an apparatus 300. As illustrated in FIGS. 80-82 for the apparatus 700, to illustrate another structural alternative, the second terminals 127 are coupled to one or more first conductors 310, and the first terminals 125 are coupled to one or more second conductors 320. FIGS. 81 and 91-98 also illustrate another structural option, applicable to any of the apparatus 300, 700, 720, 730, 740, 750, 760, 770 embodiments, in which carbon electrodes 322A and 322B are respectively coupled to the first conductors 310 and the second conductors 320, and extend out of the protective coating 330, to provide for electrical connections or couplings to the apparatus 300, 700.

It should be noted that when the first conductors 310 have the interdigitated or comb structure illustrated in FIG. 77, the second conductor 320 may be energized using first conductor 310B. The interdigitated or comb structure of the first conductors provides electrical current balancing, such that every current path through the first conductor 310A, diodes 100-100L, second conductor 320, and first conductor 310B is substantially within a predetermined range. This serves to minimize the distance current must travel through the second, transparent conductor, thereby decreasing resistance and heat generation, and generally providing current to all or most of the diodes 100-100L in parallel and within a predetermined range of current levels.

In addition, multiple interdigitated or comb structures for the first conductors 310 may also be coupled in series, such as to produce an overall device voltage having the desired multiple of diode 100-100 J forward voltages, such as up to typical household voltages, for example and without limitation. For example, as illustrated in FIG. 99, for a first region 711 (with diodes 100-100L coupled in parallel), the conductors 310B may be coupled to or deposited as an integral layer with conductors 310A of a second region 712 (which also has its diodes 100-100L coupled in parallel), and for the second region 712 (with diodes 100-100L coupled in parallel), the conductors 310B may be coupled to or deposited as an integral layer with conductors 310A of a third region 713 (which also has its diodes 100-100L coupled in parallel), and so on, so that the first, second and third regions (711, 712, 713) are coupled in series, with each such region having diodes 100-100L coupled in parallel. This series connection is also utilized with the system 800, 810 and apparatus 760, 770 embodiments illustrated in FIGS. 100-103.

Also as illustrated in FIG. 99, energizing of any of the interdigitated or comb electrode structures may be performed by applying a voltage level to a busbar 714, coupled to all of the respective tines (310A, 310B). The busbar 714 is typically sized to have a comparatively low sheet resistance or impedance.

For comparatively smaller regions or for other applications, such as graphical arts, such current balancing and impedance matching (sheet resistance matching) structures are unnecessary, and simpler structures of the first and second conductors 310, 320 may be utilized, such as the layer structures illustrated in FIGS. 91-98, 102, 103. For example, such layered structures may be utilized when the sheet resistances of the first and second conductors 310, 320 is a comparatively or relatively small proportion of the overall resistance of the first and second conductors 310, 320 in conjunction with the diodes 100-100L. Also as illustrated in FIGS. 102 and 103, a third conductive layer 312 may also be utilized, such as to provide parallel busbar connections along a comparatively long strip of apparatus 300, 700, 720, 730, 740, 750, 760, 770.

One or more dielectric layers 315 are then deposited over the diodes 100-100L, in a way which leaves exposed either or both the first terminal 125 in the first orientation or the second, back side of the diode 100-100K (or the GaN heterostructure of a diode 100L) when in the second orientation, in an amount sufficient to provide electrical insulation between the one or more first conductors 310 (coupled to the diodes 100-100L) and the one or more second conductors 320 which are deposited over the one or more dielectric layers 315 and which make corresponding physical and electrical contact with the first terminal 125 or the second, back side of the diode 100-100K, depending on the orientation. For an apparatus 300, an optional luminescent (or emissive) layer 325 may then be deposited, followed by an optional stabilization layer 335 and/or any lensing, dispersion or sealing layer 330. For example, such an optional luminescent (or emissive) layer 325 may comprise a stokes shifting phosphor layer to produce a lamp or other apparatus emitting a desired color or other selected wavelength range or spectrum. These various layers, conductors and other deposited compounds are discussed in greater detail below. For an apparatus 700, a lensing, dispersion or sealing layer 330 generally is deposited over the one or more second conductors 320 on the first side, and the an optional luminescent (or emissive) layer 325 may then be deposited over the substrate 305 on the second side, followed by an optional stabilization layer 335 and/or any lensing, dispersion or sealing layer 330. Depending upon the locations of the first and second conductors 310, 320, carbon electrodes 322A, 322B may be applied after deposition of the corresponding first and second conductors or after any deposition of a lensing, dispersion or sealing layer 330. These various layers, conductors and other deposited compounds are discussed in greater detail below.

A base 305 may be formed from or comprise any suitable material, such as plastic, paper, cardboard, or coated paper or cardboard, for example and without limitation. The base 305 may comprise any flexible material having the strength to withstand the intended use conditions. In an exemplary embodiment, a base 305, 305A comprises a substantially optically transmissive polyester or plastic sheet, such as a CT-5 or CT-7 five or seven mil polyester (Mylar) sheet treated for print receptiveness and commercially available from MacDermid Autotype, Inc. of MacDermid, Inc. of Denver, Colo., USA, or a Coveme acid treated Mylar, for example. In another exemplary embodiment, a base 305 comprises a polyimide film such as Kapton commercially available from DuPont, Inc. of Wilmington Del., USA, also for example. Also in an exemplary embodiment, base 305 comprises a material having a dielectric constant capable of or suitable for providing sufficient electrical insulation for the excitation voltages which may be selected. A base 305 may comprise, also for example, any one or more of the following: paper, coated paper, plastic coated paper, fiber paper, cardboard, poster paper, poster board, books, magazines, newspapers, wooden boards, plywood, and other paper or wood-based products in any selected form; plastic or polymer materials in any selected form (sheets, film, boards, and so on); natural and synthetic rubber materials and products in any selected form; natural and synthetic fabrics in any selected form, including polymeric nonwovens (carded, meltblown and spunbond nowovens); extruded polyolefinic films, including LDPE films; glass, ceramic, and other silicon or silica-derived materials and products, in any selected form; concrete (cured), stone, and other building materials and products; or any other product, currently existing or created in the future. In a first exemplary embodiment, a base 305, 305A may be selected which provides a degree of electrical insulation (i.e., has a dielectric constant or insulating properties sufficient to provide electrical insulation of the one or more first conductors 310 deposited or applied on a first (front) side of the base 305, either electrical insulation from each other or from other apparatus or system components. For example, while comparatively expensive choices, a glass sheet or a silicon wafer also could be utilized as a base 305. In other exemplary embodiments, however, a plastic sheet or a plastic-coated paper product is utilized to form the base 305 such as the polyester mentioned above or patent stock and 100 lb. cover stock available from Sappi, Ltd., or similar coated papers from other paper manufacturers such as Mitsubishi Paper Mills, Mead, and other paper products. In another exemplary embodiment, an embossed plastic sheet or a plastic-coated paper product having a plurality of grooves, also available from Sappi, Ltd. is utilized, with the grooves utilized for forming the conductors 310. In additional exemplary embodiments, any type of base 305 may be utilized, including without limitation, those with additional sealing or encapsulating layers (such as plastic, lacquer and vinyl) deposited to one or more surfaces of the base 305. The base 305, 305A may also comprise laminates or other bondings of any of the foregoing materials.

In an exemplary embodiment, the comparatively small size of the diodes 100-100L, spread out over a substrate 305, 305A, provides for a comparatively fast heat dissipation without requiring a heat sink, and the availability of a wide range of materials suitable to be a base 305, 305A, including those materials having a relatively low flash-ignition temperature. These temperatures may include at or above 50° C., alternatively at or above 75° C., alternatively 100° C., or 125° C., or 150° C., or 200° C., or 300° C., for example and without limitation, and may be measured using the ISO 871:2006 standard, also for example and without limitation. The apparatus 300, 700 also generally has a comparatively lower operating temperature, for example, a mean operating temperature of less than about 150° C., or less than about 125° C., or less than about 100° C. or less than about 75° C., or less than about 50° C. Such a mean operating temperature generally should be determined after an apparatus 300, 700 has been on and warmed up, such as provided its maximum light output for at least about 10 minutes, for example and without limitation, and may be measured in increments (and arithmetically averaged) using a commercially available infrared thermometer, under typical ambient conditions, such as an ambient temperature of about 20-30° C., at the outermost surface of the apparatus 300, 700.

The exemplary base 305, 305A as illustrated in the various Figures have a form factor which is substantially flat in an overall sense, such as comprising a sheet of a selected material (e.g., paper or plastic) which may be fed through a printing press, for example and without limitation, and which may have a topology on a first surface (or side) which includes surface roughness, cavities, channels or grooves or having a first surface which is substantially smooth within a predetermined tolerance (and does not include cavities, channels or grooves). Those having skill in the art will recognize that innumerable, additional shapes and surface topologies are available, are considered equivalent and within the scope of the disclosure.

For an apparatus 300, 720, 730 embodiment, one or more first conductors 310 are then applied or deposited (on a first side or surface of the base 305), or are applied over the diodes 100L for an apparatus 700, 740, 750 embodiment, such as through a printing process, to a thickness depending upon the type of conductive ink or polymer, such as to about 0.1 to 15 microns (e.g., about 10-12 microns wet film thickness for a typical silver or nanoparticle silver ink, with a dried or cured film thickness of about 0.2 or 0.3 to 1.0 microns). In other exemplary embodiments, depending upon the applied thickness, the first conductors 310 also may be sanded to smooth the surface and also may be calendarized to compress the conductive particles, such as silver. In an exemplary method of manufacturing the exemplary apparatus 300, 700, 720, 730, 740, 750, 760, 770, a conductive ink, polymer, or other conductive liquid or gel (such as a silver (Ag) ink or polymer, a nanoparticle or nanofiber silver ink composition, a carbon nanotube ink or polymer, or silver/carbon mixture such as amorphous nanocarbon (having particle sizes between about 75-100 nm) dispersed in a silver ink) is deposited on a base 305 or over the diodes 100L, such as through a printing or other deposition process, and may be subsequently cured or partially cured (such as through an ultraviolet (uv) curing process), to form the one or more first conductors 310. In another exemplary embodiment, the one or more first conductors 310 may be formed by sputtering, spin casting (or spin coating), vapor deposition, or electroplating of a conductive compound or element, such as a metal (e.g., aluminum, copper, silver, gold, nickel). Combinations of different types of conductors and/or conductive compounds or materials (e.g., ink, polymer, elemental metal, etc.) may also be utilized to generate one or more composite first conductors 310. Multiple layers and/or types of metal or other conductive materials may be combined to form the one or more first conductors 310, such as first conductors 310 comprising gold plate over nickel, for example and without limitation. For example, vapor-deposited aluminum or silver, or mixed carbon-silver inks, may be utilized. In various exemplary embodiments, a plurality of first conductors 310 are deposited, and in other embodiments, a first conductor 310 may be deposited as a single conductive sheet or otherwise attached (e.g., a sheet of aluminum coupled to a base 305) (not separately illustrated). Also in various embodiments, conductive inks or polymers which may be utilized to form the one or more first conductors 310 may not be cured or may be only partially cured prior to deposition of a plurality of diodes 100-100K, and then fully cured while in contact with the plurality of diodes 100-100K, such as for creation of ohmic contacts with the plurality of diodes 100-100K. In an exemplary embodiment, the one or more first conductors 310 are fully cured prior to deposition of the plurality of diodes 100-100K, with other compounds of the diode ink providing some dissolving of the one or more first conductors 310 which subsequently re-cures in contact with the plurality of diodes 100-100K, and for an apparatus 700 embodiment, the one or more first conductors 310 are fully cured following deposition. Also for an apparatus 700 embodiment, a conductive ink having a lower concentration of conductive particles may also be utilized to form the one or more first conductors 310, to facilitate dewetting from the first terminal 125. Depending upon the selected embodiment, an optically transmissive conductive material may also be utilized to form the one or more first conductors 310.

Other conductive inks or materials may also be utilized to form the one or more first conductors 310, second conductor(s) 320, third conductors (not separately illustrated), and any other conductors discussed below, such as copper, tin, aluminum, gold, noble metals, carbon, carbon black, carbon nanotube ("CNT"), single or double or multi-walled CNTs, graphene, graphene platelets, nanographene platelets, nanocarbon and nanocarbon and silver compositions, nano particle and nano fiber silver compositions with good or acceptable optical transmission, or other organic or inorganic conductive polymers, inks, gels or other liquid or semi-solid materials. In an exemplary embodiment, carbon black (having a particle diameter of about 100 nm) is added to a silver ink to have a resulting carbon concentration in the range of about 0.025% to 0.5%, to enhance the ohmic contact and adhesion between the diodes 100-100L and the first conductors 310. In addition, any other printable or coatable conductive substances may be utilized equivalently to form the first conductor(s) 310, second conductor(s) 320 and/or third conductors, and exemplary conductive compounds include: (1) from Conductive Compounds (Londonberry, N.H., USA), AG-500, AG-800 and AG-510 Silver conductive inks, which may also include an additional coating UV-1006S ultraviolet curable dielectric (such as part of a first dielectric layer 125); (2) from DuPont, 7102 Carbon Conductor (if overprinting 5000 Ag), 7105 Carbon Conductor, 5000 Silver Conductor, 7144 Carbon Conductor (with UV Encapsulants), 7152 Carbon Conductor (with 7165 Encapsulant), and 9145 Silver Conductor; (3) from SunPoly, Inc., 128A Silver conductive ink, 129A Silver and Carbon Conductive Ink, 140A Conductive Ink, and 150A Silver Conductive Ink; (4) from Dow Corning, Inc., PI-2000 Series Highly Conductive Silver Ink; (5) from Henkel/Emerson & Cumings, Electrodag 725A; (6) Monarch M120 available from Cabot Corporation of Boston, Mass., USA, for use as a carbon black additive, such as to a silver ink to form a mixture of carbon and silver ink; (7) Acheson 725A conductive silver ink (available from Henkel), alone or in combination with additional silver nanofibers; and (8) Inktek PA-010 or PA-030 nanoparticle or nanofiber silver screen printable conductive ink, available from Inktec. of Gyeonggi-do, Korea. As discussed below, these compounds may also be utilized to form other conductors, including the second conductor(s) 320 and any other conductive traces or connections. In addition, conductive inks and compounds may be available from a wide variety of other sources.

Conductive polymers which are substantially optically transmissive may also be utilized to form the one or more first conductors 310, and also the second conductor(s) 320 and/or third conductors. For example, polyethylene-dioxithiophene may be utilized, such as the polyethylene-dioxithiophene commercially available under the trade name "Orgacon" from AGFA Corp. of Ridgefield Park, N.J., USA, in addition to any of the other transmissive conductors discussed below and their equivalents. Other conductive polymers, without limitation, which may be utilized equivalently include polyaniline and polypyrrole polymers, for example. In another exemplary embodiment, carbon nanotubes which have been suspended or dispersed in a polymerizable ionic liquid or other fluids are utilized to form various conductors which are substantially optically transmissive or transparent, such as one or more second conductors 320. It should be noted that for an apparatus 300 embodiment, the one or more second conductors 320 are generally substantially optically transmissive to provide greater light emission or absorption on the first side of the apparatus and, for an apparatus 700 embodiment, the one or more second conductors 320 are generally not appreciably optically transmissive, to provide a comparatively lower electrical impedance, unless light output is also desired on the first side. In some exemplary apparatus 700 embodiments, the one or more second conductors 320 are highly opaque and reflective to act as a mirror and increase light output from the second side of the apparatus 700.

An optically transmissive conductive ink which has been utilized to form one or more second conductors 320 includes a transparent conductive ink commercially available from NthDegree Technologies Worldwide, Inc. of Tempe, Ariz., USA and has been described in Mark D. Lowenthal et al., U.S. Provisional Patent Application Ser. No. 61/447,160, filed Feb. 28, 2011 and entitled "Metallic Nanofiber Ink, Substantially Transparent Conductor, and Fabrication Method", the entire contents of which are incorporated herein by reference with the same full force and effect as if set forth in their entirety herein. Another transparent conductor includes silver nanofibers (about 3% to 50% by weight, or more particularly about 4% to 40% by weight, or more particularly about 5% to 30% by weight, or more particularly about 6% to 20% by weight, or more particularly about 5% to 15% by weight, or more particularly about 7% to 13% by weight, or more particularly about 9% to 11% by weight, or more particularly about 10% by weight), in a mixture of solvents, such as 1-butanol, cyclohexanol, glacial acetic acid (about 1% by weight), and polyvinyl pyrrolidone (about a 1 million MW) (about 2% to 4% by weight, or more particularly about 3% by weight). Another conductive ink may also comprise a nanoparticle or nanofiber silver ink (such as Inktek PA-010 or PA-030 nanoparticle or nanofiber silver screen printable conductive ink), about 30% to 50% by weight, mixed with a plurality of other solvents, such as with about 50% to 65% by weight of propylene glycol, and about 1% to 10% by weight of n-propanol or 1-methoxy-2-propanol. Another conductive ink may also comprise a nanoparticle or nanofiber silver ink (such as Inktek PA-010 or PA-030 nanoparticle or nanofiber silver screen printable conductive ink), with a silver concentration of about 0.30% to 3.0% by weight, mixed with a plurality of other solvents, as mentioned above.

Organic semiconductors, variously called π-conjugated polymers, conducting polymers, or synthetic metals, are inherently semiconductive due to π-conjugation between carbon atoms along the polymer backbone. Their structure contains a one-dimensional organic backbone which enables electrical conduction following n- or p+ type doping. Well-studied classes of organic conductive polymers include poly (acetylene)s, poly(pyrrole)s, poly(thiophene)s, polyanilines, polythiophenes, poly(p-phenylene sulfide), poly(para-phenylene vinylene)s (PPV) and PPV derivatives, poly(3-alkylthiophenes), polyindole, polypyrene, polycarbazole, polyazulene, polyazepine, poly(fluorene)s, and polynaphthalene. Other examples include polyaniline, polyaniline derivatives, polythiophene, polythiophene derivatives, polypyrrole, polypyrrole derivatives, polythianaphthene, polythianaphthane derivatives, polyparaphenylene, polyparaphenylene derivatives, polyacetylene, polyacetylene derivatives, polydiacethylene, polydiacetylene derivatives, polyparaphenylenevinylene, polyparaphenylenevinylene derivatives, polynaphthalene, and polynaphthalene derivatives, polyisothianaphthene (PITN), polyheteroarylenvinylene (ParV), in which the heteroarylene group can be, e.g., thiophene, furan or pyrrol, polyphenylene-sulphide (PPS), polyperinaphthalene (PPN), polyphthalocyanine (PPhc) etc., and their derivatives, copolymers thereof and mixtures thereof. As used herein, the term derivatives means the polymer is made from monomers substituted with side chains or groups.

The method for polymerizing the conductive polymers is not particularly limited, and the usable methods include uv or other electromagnetic polymerization, heat polymerization, electrolytic oxidation polymerization, chemical oxidation polymerization, and catalytic polymerization, for example and without limitation. The polymer obtained by the polymerizing method is often neutral and not conductive until doped. Therefore, the polymer is subjected to p-doping or n-doping to be transformed into a conductive polymer. The semiconductor polymer may be doped chemically, or electrochemically. The substance used for the doping is not particularly limited; generally, a substance capable of accepting an electron pair, such as a Lewis acid, is used. Examples include hydrochloric acid, sulfuric acid, organic sulfonic acid derivatives such as parasulfonic acid, polystyrenesulfonic acid, alkylbenzenesulfonic acid, camphorsulfonic acid, alkylsulfonic acid, sulfosalycilic acid, etc., ferric chloride, copper chloride, and iron sulfate.

It should be noted that for a "reverse" build of the apparatus 300, the base 305 and the one or more first conductors 310 are selected to be optically transmissive, for light to enter and/or exit through the second side of the base 305. In addition, when the second conductor(s) 320 are also transparent, light may be emitted or absorbed from or in both sides of the apparatus 300.

Various textures may be provided for the one or more first conductors 310, such as having a comparatively smooth surface, or conversely, a rough or spiky surface, or an engineered micro-embossed structure (e.g., available from Sappi, Ltd.) to potentially improve the adhesion of other layers (such as the dielectric layer 315 and/or to facilitate subsequent forming of ohmic contacts with diodes 100-100L. One or more first conductors 310 may also be given a corona treatment prior to deposition of the diodes 100-100L, which may tend to remove any oxides which may have formed, and also facilitate subsequent forming of ohmic contacts with the plurality of diodes 100-100L. Those having skill in the electronic or printing arts will recognize innumerable variations in the ways in which the one or more first conductors 310 may be formed, with all such variations considered equivalent and within the scope of the disclosure. For example, the one or more first conductors 310 may also be deposited through sputtering or vapor deposition, without limitation. In addition, for other various embodiments, the one or more first conductors 310 may be deposited as a single or continuous layer, such as through coating, printing, sputtering, or vapor deposition.

As a consequence, as used herein, "deposition" includes any and all printing, coating, rolling, spraying, layering, sputtering, plating, spin casting (or spin coating), vapor deposition, lamination, affixing and/or other deposition processes, whether impact or non-impact, known in the art. "Printing" includes any and all printing, coating, rolling, spraying, layering, spin coating, lamination and/or affixing processes, whether impact or non-impact, known in the art, and specifically includes, for example and without limitation, screen printing, inkjet printing, electro-optical printing, electroink printing, photoresist and other resist printing, thermal printing, laser jet printing, magnetic printing, pad printing, flexographic printing, hybrid offset lithography, Gravure and other intaglio printing, for example. All such processes are considered deposition processes herein and may be utilized. The exemplary deposition or printing processes do not require significant manufacturing controls or restrictions. No specific temperatures or pressures are required. Some clean room or filtered air may be useful, but potentially at a level consistent with the standards of known printing or other deposition processes. For consistency, however, such as for proper alignment (registration) of the various successively deposited layers forming the various embodiments, relatively constant temperature (with a possible exception, discussed below) and humidity may be desirable. In addition, the various compounds utilized may be contained within various polymers, binders or other dispersion agents which may be heat-cured or dried, air dried under ambient conditions, or IR or uv cured.

It should also be noted, generally for any of the applications of various compounds herein, such as through printing or other deposition, the surface properties or surface energies may also be controlled, such as through the use of resist coatings or by otherwise modifying the "wetability" of such a surface, for example, by modifying the hydrophilic, hydrophobic, or electrical (positive or negative charge) characteristics, for example, of surfaces such as the surface of the base 305, the surfaces of the various first or second conductors (310, 320, respectively), and/or the surfaces of the diodes 100-100L. In conjunction with the characteristics of the compound, suspension, polymer or ink being deposited, such as the surface tension, the deposited compounds may be made to adhere to desired or selected locations, and effectively repelled from other areas or regions.

For example and without limitation, the plurality of diodes 100-100L are suspended in a liquid, semi-liquid or gel carrier using any evaporative or volatile organic or inorganic compound, such as water, an alcohol, an ether, etc., which may also include an adhesive component, such as a resin, and/or a surfactant or other flow aid. In an exemplary embodiment, for example and without limitation, the plurality of diodes 100-100L are suspended as described above in the Examples. A surfactant or flow aid may also be utilized, such as octanol, methanol, isopropanol, or deionized water, and may also use a binder such as an anisotropic conductive binder containing substantially or comparatively small nickel beads (e.g., 1 micron) (which provides conduction after compression and curing and may serve to improve or enhance creation of ohmic contacts, for example), or any other uv, heat or air curable binder or polymer, including those discussed in greater detail below (and which also may be utilized with dielectric compounds, lenses, and so on).

In addition, the various diodes 100-100L may be configured, for example, as light emitting diodes having any of various colors, such as red, green, blue, yellow, amber, etc. Light emitting diodes 100-100L having different colors may then be mixed within an exemplary diode ink, such that when energized in an apparatus 300, 300A, a selected color temperature is generated.

Dried or Cured Diode Ink Example 1

A composition comprising:
a plurality of diodes 100-100L; and
a cured or polymerized resin or polymer.

Dried or Cured Diode Ink Example 2

A composition comprising:
a plurality of diodes 100-100L; and
a cured or polymerized resin or polymer forming a film at least partially surrounding each diode and having a thickness between about 10 nm and 300 nm.

Dried or Cured Diode Ink Example 3

A composition comprising:
a plurality of diodes 100-100L; and
at least trace amounts of a cured or polymerized resin or polymer.

Dried or Cured Diode Ink Example 4

A composition comprising:
a plurality of diodes 100-100L;
a cured or polymerized resin or polymer; and
at least trace amounts of a solvent.

Dried or Cured Diode Ink Example 5

A composition comprising:
a plurality of diodes 100-100L;
at least trace amounts of a cured or polymerized resin or polymer; and
at least trace amounts of a solvent.

Dried or Cured Diode Ink Example 6

A composition comprising:

a plurality of diodes 100-100L;

a cured or polymerized resin or polymer;

at least trace amounts of a solvent; and at least trace amounts of a surfactant.

Dried or Cured Diode Ink Example 7

A composition comprising:

a plurality of diodes 100-100L;

at least trace amounts of a cured or polymerized resin or polymer;

at least trace amounts of a solvent; and at least trace amounts of a surfactant.

The diode ink (suspended diodes 100-100L and optional inert particles) is then deposited over the base 305A for an apparatus 700 embodiment, or over the one or more first conductors 310 for an apparatus 300 embodiment, such as by printing using a 280 mesh polyester or PTFE-coated screen, and the volatile or evaporative components are dissipated, such as through a heating, uv cure or any drying process, for example, to leave the diodes 100-100L substantially or at least partially in contact with and adhering to the base 305A or the one or more first conductors 310. In an exemplary embodiment, the deposited diode ink is cured at about 110° C., typically for 5 minutes or less. The remaining dried or cured diode ink, as in Dried or Cured Diode Ink Examples 1 and 2, generally comprises a plurality of diodes 100-100L and a cured or polymerized resin or polymer (at least in trace amounts) (which, as mentioned above, may general secure or hold the diodes 100-100L in place) and form a film 295, as previously discussed. While the volatile or evaporative components (such as first and/or second solvents and/or surfactants) are substantially dissipated, trace or more amounts may remain, as illustrated in Dried or Cured Diode Ink Examples 3-6. As used herein, a "trace amount" of an ingredient should be understood to be an amount greater than zero and less than or equal to 5% of the amount of the ingredient originally present in the diode ink when initially deposited over the first conductors 310 and/or base 305, 305A.

The resulting density or concentration of diodes 100-100L, as the number of diodes 100-100L per square centimeter, for example, in the completed apparatus (300, 300A, 300B, 300C, 300D, 700, 700A, 700B, 720, 730, 740, 750, 760, 770), will vary depending upon the concentration of diodes 100-100L in the diode ink. When the diodes 100-100L are in the range of 20-30 microns in size, very high densities are available which still cover only a small percentage of the surface area (one of the advantages allowing greater heat dissipation without a separate need for heat sinks). For example, when the diodes 100-100L are in the range of 20-30 microns in size are utilized, 10,000 diodes in a square inch covers only about 1% of the surface area. Also for example, in an exemplary embodiment, a wide variety of diode densities are available and within the scope of the disclosure for use in an apparatus 300, 300A, 300B, 300C, 300D, 700, 700A, 700B, 720, 730, 740, 750, 760, 770, including without limitation: 2 to 10,000 diodes 100-100L per square centimeter; or more specifically, 5 to 10,000 diodes 100-100L per square centimeter; or more specifically, 5 to 1,000 diodes 100-100L per square centimeter; or more specifically, 5 to 100 diodes 100-100L; or more specifically, 5 to 50 diodes 100-100L per square centimeter; or more specifically, 5 to 25 diodes 100-100L per square centimeter; or more specifically, 10 to 8,000 diodes 100-100L per square centimeter; or more specifically, 15 to 5,000 diodes 100-100L per square centimeter; or more specifically, 20 to 1,000 diodes 100-100L per square centimeter; or more specifically, 25 to 100 diodes 100-100L per square centimeter; or more specifically, 25 to 50 diodes 100-100L per square centimeter.

Additional steps or several step processes may also be utilized for deposition of the diodes 100-100L over the one or more first conductors 310. Also for example and without limitation, a binder such as a methoxylated glycol ether acrylate monomer (which may also include a water soluble photoinitiator such TPO (triphosphene oxides)) or an anisotropic conductive binder may be deposited first, followed by deposition of the diodes 100-100L which have been suspended in a liquid or gel as discussed above.

In an exemplary embodiment, for an apparatus 300, 720, 730, 760 embodiment, the suspending medium for the diodes 100-100K may also comprise a dissolving solvent or other reactive agent, such as the one or more dibasic esters, which initially dissolves or re-wets some of the one or more first conductors 310. When the suspension of the plurality of diodes 100-100K is deposited and the surfaces of the one or more first conductors 310 then become partially dissolved or uncured, the plurality of diodes 100-100K may become slightly or partially embedded within the one or more first conductors 310, also helping to form ohmic contacts, and creating an adhesive bonding or adhesive coupling between the plurality of diodes 100-100K and the one or more first conductors 310. As the dissolving or reactive agent dissipates, such as through evaporation, the one or more first conductors 310 re-hardens (or re-cures) in substantial contact with the plurality of diodes 100-100K. In addition to the dibasic esters discussed above, exemplary dissolving, wetting or solvating agents, for example and without limitation, also as mentioned above, include propylene glycol monomethyl ether acetate ($C_6H_{12}O_3$) (sold by Eastman under the name "PM Acetate"), used in an approximately 1:8 molar ratio (or 22:78 by weight) with 1-propanol (or isopropanol) to form the suspending medium, and a variety of dibasic esters, and mixtures thereof, such as dimethyl succinate, dimethyl adipate and dimethyl glutarate (which are available in varying mixtures from Invista under the product names DBE, DBE-2, DBE-3, DBE-4, DBE-5, DBE-6, DBE-9 and DBE-IB). In an exemplary embodiment, DBE-9 has been utilized. The molar ratios of solvents will vary based upon the selected solvents, with 1:8 and 1:12 being typical ratios. Various compounds or other agents may also be utilized to control this reaction: for example, the combination or mixture of 1-propanol and water may apparently suppress the dissolving or re-wetting of the one or more first conductors 310 by DBE-9 until comparatively later in the curing process when various compounds of the diode ink have evaporated or otherwise dissipated and the thickness of the diode ink is less than the height of the diodes 100-100K, so that any dissolved material (such as silver ink resin and silver ink particles) of the first conductors 310 are not deposited on the upper surface of the diodes 100-100K (which are then capable of forming electrical contacts with the second conductor(s) 320).

Dielectric Ink Example 1

A composition comprising:
a dielectric resin comprising about 0.5% to about 30% methylcellulose resin;
a first solvent comprising an alcohol; and
a surfactant.

Dielectric Ink Example 2

A composition comprising:
a dielectric resin comprising about 4% to about 6% methylcellulose resin;
a first solvent comprising about 0.5% to about 1.5% octanol;
a second solvent comprising about 3% to about 5% IPA; and
a surfactant.

Dielectric Ink Example 3

A composition comprising:
about 10% to about 30% dielectric resin;
a first solvent comprising a glycol ether acetate;
a second solvent comprising a glycol ether; and
a third solvent.

Dielectric Ink Example 4

A composition comprising:
about 10% to about 30% dielectric resin;
a first solvent comprising about 35% to 50% ethylene glycol monobutyl ether acetate;
a second solvent comprising about 20% to 35% dipropylene glycol monomethyl ether; and
a third solvent comprising about 0.01% to 0.5% toluene.

Dielectric Ink Example 5

A composition comprising:
about 15% to about 20% dielectric resin;
a first solvent comprising about 35% to 50% ethylene glycol monobutyl ether acetate;
a second solvent comprising about 20% to 35% dipropylene glycol monomethyl ether; and
a third solvent comprising about 0.01% to 0.5% toluene.

Dielectric Ink Example 6

A composition comprising:
about 10% to about 30% dielectric resin;
a first solvent comprising about 50% to 85% dipropylene glycol monomethyl ether; and
a second solvent comprising about 0.01% to 0.5% toluene.

Dielectric Ink Example 7

A composition comprising:
about 15% to about 20% dielectric resin;
a first solvent comprising about 50% to 90% ethylene glycol monobutyl ether acetate; and
a second solvent comprising about 0.01% to 0.5% toluene.

Dielectric Ink Example 8

A composition comprising:
about 15% to about 20% dielectric resin;
a first solvent comprising about 50% to 85% dipropylene glycol monomethyl ether; and
the balance comprising a second solvent comprising about 0.01% to 8.0% propylene glycol or deionized water.

An insulating material (referred to as a dielectric ink, such as those described as Dielectric Ink Examples 1-8) is then deposited over the diodes 100-100L or the peripheral or lateral portions of the diodes 100-100L to form an insulating or dielectric layer 315, such as through a printing or coating process, prior to deposition of second conductor(s) 320. The dielectric layer 315 has a wet film thickness on the order of about 30 to 40 microns and a dried or cured film thickness on the order of about 5 to 7 microns. The insulating or dielectric layer 315 may be comprised of any of the insulating or dielectric compounds suspended in any of various media, as discussed above and below. In an exemplary embodiment, insulating or dielectric layer 315 comprises a methylcellulose resin, in an amount ranging from about 0.5% to 15%, or more specifically about 1.0% to about 8.0%, or more specifically about 3.0% to about 6.0%, or more specifically about 4.5% to about 5.5%, such as E-3 "methocel" available from Dow Chemical; with a surfactant in an amount ranging from about 0.1% to 1.5%, or more specifically about 0.2% to about 1.0%, or more specifically about 0.4% to about 0.6%, such as 0.5% BYK 381 from BYK Chemie GmbH; in a suspension with a first solvent in an amount ranging from about 0.01% to 0.5%, or more specifically about 0.05% to about 0.25%, or more specifically about 0.08% to about 0.12%, such as about 0.1% octanol; and a second solvent in an amount ranging from about 0.0% to 8%, or more specifically about 1.0% to about 7.0%, or more specifically about 2.0% to about 6.0%, or more specifically about 3.0% to about 5.0%, such as about 4% IPA, with the balance being a third solvent such as deionized water. With the E-3 formulation, four to five coatings are deposited, to create an insulating or dielectric layer 315 having a total thickness on the order of 6-10 microns, with each coating cured at about 110° C. for about five minutes. In other exemplary embodiments, the dielectric layer 315 may be IR (infrared) cured, uv cured, or both. Also in other exemplary embodiments, different dielectric formulations may be applied as different layers to form the insulating or dielectric layer 315; for example and without limitation, a first layer of a solvent-based clear dielectric available from Henkel Corporation of Dusseldorf, Germany is applied, such as Henkel BIK-20181-40A, Henkel BIK-20181-40B, and/or Henkel BIK-20181-24B followed by the water-based E-3 formulation described above, to form the dielectric layer 315. In other exemplary embodiments, other dielectric compounds are commercially available from Henkel and may be utilized equivalently, such as in Dielectric Ink Example 8. The dielectric layer 315 may be transparent but also may include a comparatively low concentration of light diffusing, scattering or reflective particles, as well as heat conductive particles such as aluminum oxide, for example and without limitation. In various exemplary embodiments, the dielectric ink will also de-wet from the upper surface of the diodes 100-100L, leaving at least some of the first terminal 125 or the second, back side of the diodes 100-100K (depending on the orientation) exposed for subsequent contact with the second conductor(s) 320.

Exemplary one or more solvents may be used in the exemplary dielectric inks, for example and without limitation: water; alcohols such as methanol, ethanol, N-propanol (including 1-propanol, 2-propanol (isopropanol), 1-methoxy-2-propanol), isobutanol, N-butanol (including 1-butanol, 2-butanol), N-pentanol (including 1-pentanol, 2-pentanol, 3-pentanol), N-octanol (including 1-octanol, 2-octanol, 3-octanol); ethers such as methyl ethyl ether, diethyl ether, ethyl propyl ether, and polyethers; esters such ethyl acetate, dimethyl adipate, propylene glycol monomethyl ether acetate, dimethyl glutarate, dimethyl succinate, glycerin acetate, dibasic esters (e.g., Invista DBE-9); esters such ethyl acetate; glycols such as ethylene glycols, diethylene glycol, polyethylene glycols, propylene glycols, dipropylene glycols, glycol ethers, glycol ether acetates, PM acetate (propylene glycol monomethyl ether acetate), dipropylene glycol monomethyl ether, ethylene glycol monobutyl ether acetate; carbonates such as propylene carbonate; glycerols such as glycerin; acetonitrile, tetrahydrofuran (THF), dimethyl formamide (DMF), N-methyl formamide (NMF), dimethyl sulfoxide (DMSO); and mixtures thereof. In addition to water-soluble resins, other solvent-based resins may also be utilized. One or more thickeners may be used, for example clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxylethylcellulose, cellulose ether, cellulose ethyl ether, chitosan; polymers such as acrylate and (meth) acrylate polymers and copolymers, polyvinyl pyrrolidone, polyethylene glycol, polyvinyl acetate (PVA), polyvinyl alcohols, polyacrylic acids, polyethylene oxides, polyvinyl butyral (PVB); diethylene glycol, propylene glycol, 2-ethyl oxazoline, fumed silica (such as Cabosil), silica powders and modified ureas such as BYK® 420 (available from BYK Chemie). Other viscosity modifiers may be used, as well as particle addition to control viscosity, as described in Lewis et al., Patent Application Publication Pub. No. US 2003/0091647. Flow aids or surfactants may also be utilized, such as octanol and Emerald Performance Materials Foamblast 339, for example. In other exemplary embodiments, one or more insulators 135 may polymeric, such as comprising PVA or PVB in deionized water, typically less than 12 percent.

Following deposition of insulating or dielectric layer 315, one or more second conductor(s) 320 are deposited (e.g., through printing a conductive ink, polymer, or other conductor such as metal), which may be any type of conductor, conductive ink or polymer discussed above, or may be an optically transmissive (or transparent) conductor, to form an ohmic contact with exposed or non-insulated portions of the diodes 100-100L (generally, the first terminal 125 for diodes 100-100L in the first orientation). The one or more optically transmissive second conductor(s) 320 have a wet film thickness on the order of about 6 to 18 microns and a dried or cured film thickness on the order of about 0.1 to 0.4 microns, and optically opaque one or more second conductor(s) 320 (such as Acheson 725A conductive silver) generally have a wet film thickness on the order of about 14 to 18 microns and a dried or cured film thickness on the order of about 5 to 8 microns. For example, an optically transmissive second conductor may be deposited as a single continuous layer (forming a single electrode), such as for lighting or photovoltaic applications. For a reverse build mentioned above, and for the apparatus 700 embodiments, the second conductor(s) 320 do not need to be, although they can be, optically transmissive, allowing light to enter or exit from both top and bottom sides of the apparatus 300, 300A, 300B, 300C, 300D, 700, 700A, 700B, 720, 730, 740, 750, 760, 770. An optically transmissive second conductor(s) 320 may be comprised of any compound which: (1) has sufficient conductivity to energize or receive energy from the first or upper portions of the apparatus 300 (and generally with a sufficiently low resistance or impedance to reduce or minimize power losses and heat generation, as may be necessary or desirable); and (2) has at least a predetermined or selected level of transparency or transmissibility for the selected wavelength(s) of electromagnetic radiation, such as for portions of the visible spectrum. The choice of materials to form the optically transmissive or non-transmissive second conductor(s) 320 may differ, depending on the selected application of the apparatus 300, 700 and depending upon the utilization of optional one or more third conductors. The one or more second conductor(s) 320 are deposited over exposed and/or non-insulated portions of the diodes 100-100L, and/or also over any of the insulating or dielectric layer 315, such as by using a printing or coating process as known or may become known in the printing or coating arts, with proper control provided for any selected alignment or registration, as may be necessary or desirable.

For example, an exemplary transparent conductive ink utilized to form one or more second conductors 320 may comprise about 0.4-3.0% silver nanofibers (or more, in other embodiments), about 2-4% polyvinyl pyrrolidone (1 million MW), 0.5-2% glacial acetic acid, with the balance being 1-butanol and/or cyclohexanol.

In an exemplary embodiment, in addition to the conductors described above, carbon nanotubes (CNTs), nanoparticle or nanofiber silvers, polyethylene-dioxithiophene (e.g., AGFA Orgacon), a combination of poly-3,4-ethylenedioxythiophene and polystyrenesulfonic acid (marketed as Baytron P and available from Bayer AG of Leverkusen, Germany), a polyaniline or polypyrrole polymer, indium tin oxide (ITO) and/or antimony tin oxide (ATO) (with the ITO or ATO typically suspended as particles in any of the various binders, polymers or carriers previously discussed) may be utilized to form optically transmissive second conductor(s) 320. In an exemplary embodiment, carbon nanotubes are suspended in a volatile liquid with a surfactant, such as carbon nanotube compositions available from SouthWest NanoTechnologies, Inc. of Norman, Okla., USA. In addition, one or more third conductors (not separately illustrated) having a comparatively lower impedance or resistance is or may be incorporated into corresponding transmissive second conductor(s) 320. For example, to form one or more third conductors, one or more fine wires may be formed using a conductive ink or polymer (e.g., a silver ink, CNT or a polyethylene-dioxithiophene polymer) printed over corresponding sections or layers of the transmissive second conductor(s) 320, or one or more fine wires (e.g., having a grid or ladder pattern) may be formed using a conductive ink or polymer printed over a larger, unitary transparent second conductor(s) 320 in larger displays.

Other compounds which may be utilized equivalently to form substantially optically transmissive second conductor(s) 320 include indium tin oxide (ITO) as mentioned above, and other transmissive conductors as are currently known or may become known in the art, including one or more of the conductive polymers discussed above, such as polyethylene-dioxithiophene available under the trade name "Orgacon", and various carbon and/or carbon nanotube-based transparent conductors. Representative transmissive conductive materials are available, for example, from DuPont, such as 7162 and 7164 ATO translucent conductor. Transmissive second conductor(s) 320 may also be combined with various binders, polymers or carriers, including those previously discussed, such as binders which are curable under various conditions, such as exposure to ultraviolet radiation (uv curable).

An optional stabilization layer 335 may be deposited over the second conductor(s) 320, as may be necessary or desirable, and is utilized to protect the second conductor(s) 320, such as to prevent the luminescent (or emissive) layers 325 or any intervening conformal coatings from degrading the conductivity of the second conductor(s) 320. One or more comparatively thin coatings of any of the inks, compounds or coatings discussed below (with reference to protective coating 330) may be utilized, such as Nazdar 9727 clear base or DuPont 5018 or an infrared curable resin such as about 7% polyvinylbutyral in cyclohexanol. In addition, heat dissipation and/or light scattering particles may also be optionally included in the stabilization layer 335. An exemplary stabilization layer is typically about 10-40 microns, in dried or cured form.

As an option, carbon electrodes 322 (illustrated as 322A and 322B) may be utilized to form contacts, external to the sealing or protective layer 330, to the one or more first conductors 310 and one or more second conductor(s) 320, as illustrated for various exemplary embodiments, and helps to protect the one or more first conductors 310 and one or more second conductor(s) 320 from corrosion and abrasion. In an exemplary embodiment, a carbon ink is utilized, such as Acheson 440A, having a wet film thickness on the order of about 18 to 20 microns and a dried or cured film thickness on the order of about 7 to 10 microns.

Also as an option illustrated in FIGS. 102 and 103, an optional third conductive layer 312 may be utilized, and may comprise any of the conductive materials described herein for one or more first conductors 310 and/or one or more second conductor(s) 320.

One or more luminescent (or emissive) layers 325 (e.g., comprising one or more phosphor layers or coatings) may be deposited over the stabilization layer 335 (or over the second conductor(s) 320 when no stabilization layer 335 is utilized), or directly on the second side of the base 305A for an apparatus 700 embodiment. Multiple luminescent (or emissive) layers 325 may also be utilized, as illustrated, such as one on each side of an apparatus 300, 300A, 300C, 300D, 700, 700A, 720, 730, 740, 750, 760, 770. In an exemplary embodiment, such as an LED embodiment, one or more emissive layers 325 may be deposited, such as through printing or coating processes discussed above, over the entire surface of the stabilization layer 335 (or over the second conductor(s) 320 when no stabilization layer 335 is utilized), for an apparatus 300 embodiment, or directly on the second side of the base 305A for an apparatus 700 embodiment, or both, for example and without limitation. The one or more emissive layers 325 may be formed of any substance or compound capable of or adapted to emit light in the visible spectrum or to shift (e.g., stokes shift) the frequency of the emitted light (or other electromagnetic radiation at any selected frequency) in response to light (or other electromagnetic radiation) emitted from diodes 100-100L. For example, a yellow phosphor-based emissive layer 325 may be utilized with a blue light emitting diode 100-100L to produce a substantially white light. Such luminescent compounds include various phosphors, which may be provided in any of various forms and with any of various dopants. The luminescent compounds or particles forming the one or more emissive layers 325 may be utilized in or suspended in a polymer form having various binders, and also may be separately combined with various binders (such as phosphor binders available from DuPont or Conductive Compounds), both to aid the printing or other deposition process, and to provide adhesion of the phosphor to the underlying and subsequent overlying layers. The one or more emissive layers 325 may also be provided in either uv-curable or heat-curable forms.

A wide variety of equivalent luminescent or otherwise light emissive compounds are available and are within the scope of the disclosure, including without limitation: (1) G1758, G2060, G2262, G3161, EG2762, EG 3261, EG3560, EG3759, Y3957, EY4156, EY4254, EY4453, EY4651, EY4750, O5446, O5544, O5742, O6040, R630, R650, R6733, R660, R670, NYAG-1, NYAG-4, NYAG-2, NYAG-5, NYAG-3, NYAG-6, TAG-1, TAG-2, SY450-A, SY450-B, SY460-A, SY460-B, OG450-75, OG450-27, OG460-75, OG460-27, RG450-75, RG450-65, RG450-55, RG450-50, RG450-45, RG450-40, RG450-35, RG450-30, RG450-27, RG460-75, RG460-65, RG460-55, RG460-50, RG460-45, RG460-40, RG460-35, RG460-30, and RG460-27, available from Internatix of Fremont, Calif. USA; (2) 13C1380, 13D1380, 14C1220, and GG-84 available from Global Tungsten & Powders Corp. of Towanda, Pa., USA; (3) FL63/S-D1, HPL63/F-F1, HL63/S-D1, QMK58/F-U1, QUMK58/F-D1, KEMK63/F-P1, CPK63/N-U1, ZMK58/N-D1, and UKL63/F-U1 available from Phosphor Technology Ltd. of Herts, England; (4) BYWO1A/PTCW01AN, BYWO1B/PTCWO1BN, BUVOR02, BUVG01, BUVR02, BUVY02, BUVG02, BUVR03/PTCR03, and BUVY03 available from Phosphor Tech Corp. of Lithia Springs, Ga., USA; and (5) Hawaii655, Maui535, Bermuda465, and Bahama560 available from Lightscape Materials, Inc. of Princeton, N.J. USA. In addition, depending upon the selected embodiment, colorants, dyes and/or dopants may be included within any such luminescent (or emissive) layer 325. In an exemplary embodiment, a yittrium aluminum garnet ("YAG") phosphor is utilized, available from Phosphor Technology Ltd. and from Global Tungsten & Powders Corp, such as 40% YAG in a uv curable resin (with a wet and dry/cured film thickness of about 40 to 100 microns), or 70% YAG in an infrared curable resin-solvent system, such as about 5% polyvinylbutyral in about 95% cyclohexanol (with a wet film thickness of about 15 to 17 microns and dry/cured film thickness of about 13 to 15 microns). In addition, the phosphors or other compounds utilized to form an emissive layer 325 may include dopants which emit in a particular spectrum, such as green or blue. In those cases, the emissive layer may be printed to define pixels for any given or selected color, such as RGB or CMYK, to provide a color display. Those having skill in the art will recognize that any of the apparatus 300 embodiments may also comprise such one or more emissive layers 325 coupled to or deposited over the stabilization layer 335 or second conductor(s) 320.

Depending upon the solvents utilized in forming the one or more second conductor(s) 320, an optional one or more barrier layers 318 may be utilized, as illustrated in FIG. 103, such as to prevent compounds of the one or more second conductor(s) 320 from penetrating through the dielectric layer 315 to the one or more first conductors 310. In an exemplary embodiment, a viscosity modifier is utilized, such as an E-10 viscosity modifier or any of the other viscosity modifiers discussed above, deposited to form a cured or dried film or membrane thickness of about 100 to 200 nm. Any of the materials utilized to form a protective or sealing coating 330 or stabilization layer 335 may also be utilized to form the one or more barrier layers 318.

The apparatus 300 may also include an optional protective or sealing coating 330 (which also may be combined with the optional stabilization layer 335), which may also include any type of lensing or light diffusion or dispersion structure or filter, such as a substantially clear plastic or other polymer, for protection from various elements, such as weather, airborn corrosive substances, etc., or such a sealing and/or protective function may be provided by the polymer (resin or other binder) utilized with the emissive layer 325. For ease of illustration, FIGS. 76, 78-82, 87, 88, 91-98, 102 and 103 illustrate such a polymer (resin or other binder) forming a protective or sealing coating 330 using the dotted lines to indicate substantial transparency.) In an exemplary embodiment, protective or sealing coating 330 is deposited as one or more conformal coatings using a urethane-based material such as a proprietary resin available as NAZDAR 9727 (www.nazdar.com) or a uv curable urethane acrylate PF 455 BC available from Henkel Corporation of Dusseldorf, Germany to a thickness of between about 10-40 microns. In another exemplary embodiment, protective or sealing coating 330 is performed by laminating the apparatus 300. Not separately illustrated, but as discussed in related U.S. patent applications (U.S. patent application Ser. No. 12/560,334, U.S. patent application Ser. No. 12/560,340, U.S. patent application Ser. No. 12/560,355, U.S. patent application Ser. No. 12/560,364, and U.S. patent application Ser. No. 12/560,371, incorporated in their entireties herein by reference with the same full force and effect as if set forth in their entireties herein), a plurality of lenses (suspended in a polymer (resin or other binder)) also may be deposited directly over the one or more emissive layers 325 and other features, to create any of the various light emitting apparatus 300 embodiments.

Those having skill in the art will recognize that any number of first conductors 310, insulators 315, second conductors 320, etc., be utilized within the scope of the claimed invention. In addition, there may be a wide variety of orientations and configurations of the plurality of first conductors 310, one or more of insulators (or dielectric layer) 315, and a plurality of second conductor(s) 320 (with any incorporated corresponding and optional one or more third conductors) for any of the apparatuses 300, such as substantially parallel orientations, in addition to the orientations illustrated. For example, a plurality of first conductors 310 may be all substantially parallel to each other, and a plurality of second conductor(s) 320 also may be all substantially parallel to each other. In turn, the plurality of first conductors 310 and plurality of second conductor(s) 320 may be perpendicular to each other (defining rows and columns), such that their area of overlap may be utilized to define a picture element ("pixel") and may be separately and independently addressable. When either or both the plurality of first conductors 310 and the plurality of second conductor(s) 320 may be implemented as spaced-apart and substantially parallel lines having a predetermined width (both defining rows or both defining columns), they may also be addressable by row and/or column, such as sequential addressing of one row after another, for example and without limitation. In addition, either or both the plurality of first conductors 310 and the plurality of second conductor(s) 320 may be implemented as a layer or sheet as mentioned above.

As may be apparent from the disclosure, an exemplary apparatus 300, 300A, 300B, 300C, 300D, 700, 700A, 700B, 720, 730, 740, 750, 760, 770 depending upon the choices of composite materials such as a base 305, may be designed and fabricated to be highly flexible and deformable, potentially even foldable, stretchable and potentially wearable, rather than rigid. For example, an exemplary apparatus 300, 300A, 300B, 300C, 300D, 700, 700A, 700B, 720, 730, 740, 750, 760, 770, may comprise flexible, foldable, and wearable clothing, or a flexible lamp, or a wallpaper lamp, without limitation. With such flexibility, an exemplary apparatus 300, 300A, 300B, 300C, 300D, 700, 700A, 700B, 720, 730, 740, 750, 760, 770, may be rolled, such as a poster, or folded like a piece of paper, and fully functional when re-opened. Also for example, with such flexibility, an exemplary apparatus 300, 300A, 300B, 300C, 300D, 700, 700A, 700B, 720, 730, 740, 750, 760, 770, may have many shapes and sizes, and be configured for any of a wide variety of styles and other aesthetic goals. Such an exemplary apparatus 300, 300A, 300B, 300C, 300D, 700, 700A, 700B, 720, 730, 740, 750, 760, 770, is also considerably more resilient than prior art devices, being much less breakable and fragile than, for example, a typical large screen television.

Figure 84:
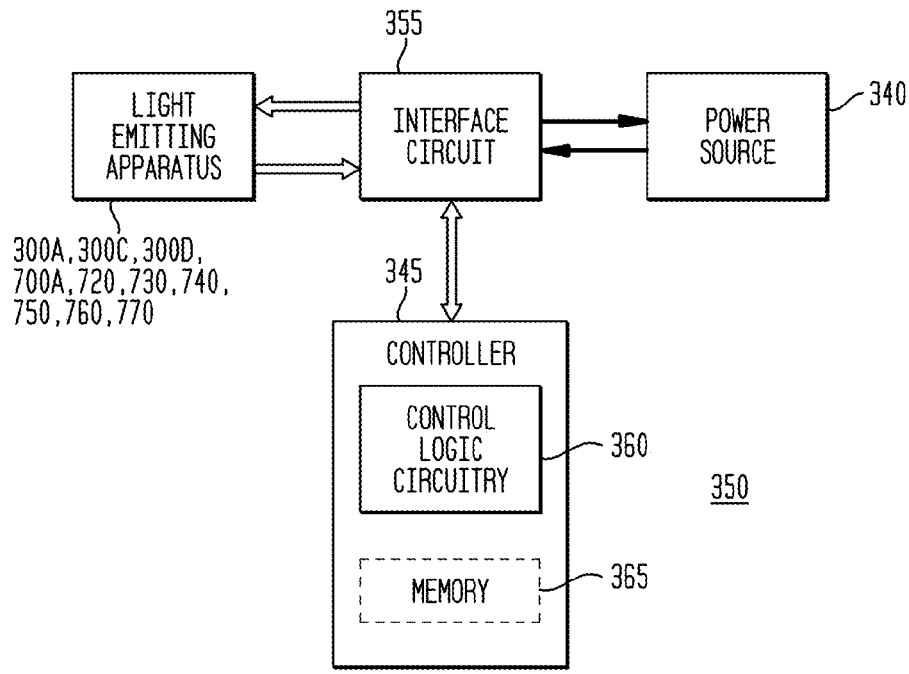
FIG. 84 is a block diagram of a first exemplary system embodiment.

As indicated above, the plurality of diodes 100-100L may be configured (through material selection and corresponding doping) to be photovoltaic (PV) diodes or LEDs, as examples and without limitation. FIG. 84 is a block diagram of a first exemplary system 350 embodiment, in which the plurality of diodes 100-100L are implemented as LEDs, of any type or color. The system 350 comprises a light emitting apparatus 300A, 300C, 300D, 300C, 300D, 700A (and any of apparatuses 720, 730, 740, 750, 760, 770 in which the diodes are LEDs), an interface circuit 355 couplable to a power source 340 (such as an AC line or a DC battery), and optionally a controller 345 (having control logic circuitry 360 and optionally memory 365). (An apparatus 300A is otherwise generally the same as an apparatus 300 but have the plurality of diodes 100-100L implemented as LEDs, and double-sided, for apparatus 300C, 300D embodiments, and similarly, an apparatus 700A is otherwise generally the same as an apparatus 700 but has the plurality of diodes 100-100L implemented as LEDs.). When one or more first conductors 310 and one or more second conductor(s) 320 (or third conductors 312) are energized, such as through the application of a corresponding voltage (e.g., from power source 340), energy will be supplied to one or more of the plurality of LEDs (diodes 100-100L), either entirely across the apparatus 300A, 300C, 300D, 300C, 300D, 700A, 720, 730, 740, 750, 760, 770 when the conductors and insulators are each implemented as single layers, or at the corresponding intersections (overlapping areas) of the energized first conductors 310 and second conductor(s) 320, which depending upon their orientation and configuration, define a pixel, a sheet, or a row/column, for example. Accordingly, by selectively energizing the first conductors 310 and second conductor(s) 320, the apparatus 300A (and/or system 350) provides a pixel-addressable, dynamic display, or a lighting device, or signage, etc. For example, the plurality of first conductors 310 may comprise a corresponding plurality of rows, with the plurality of transmissive second conductor(s) 320 comprising a corresponding plurality of columns, with each pixel defined by the intersection or overlapping of a corresponding row and corresponding column. When either or both the plurality of first conductors 310 and the plurality of second conductor(s) 320 may be implemented as illustrated in FIGS. 76-82, 87, 88, 91-98, 102, 103, also for example, energizing of the conductors 310, 320 will provide power to substantially all (or most) of the plurality of LEDs (diodes 100-100L), such as to provide light emission for a lighting device or a static display, such as signage. Such a pixel count may be quite high, well above typical high definition levels.

Continuing to refer to FIG. 84, the apparatus 300A, 300C, 300D, 300C, 300D, 700A, 720, 730, 740, 750, 760, 770 is coupled through an interface circuit 355 to a power source 340, which may be a DC power source (such as a battery or a photovoltaic cell) or an AC power source (such as household or building power), and also optionally to a controller 345.

The interface circuit 355 may be embodied in a wide variety of ways, such as a full or half wave rectifier, impedance matching circuitry, capacitors to reduce DC ripple, a switching power supply for coupling to an AC line, etc., and may include a wide variety of components (not separately illustrated) for controlling the energizing of the diodes 100-100L, for example and without limitation. When the controller 345 is implemented, such as for an addressable light emitting display system 350 embodiment and/or a dynamic light emitting display system 350 embodiment, the controller 345 may be utilized to control the energizing of the diodes 100-100L (via the various pluralities of first conductors 310 and the plurality of transmissive second conductor(s) 320) as known or becomes known in the electronic arts, and typically comprises control logic circuitry 360 (which may be combinational logic circuitry, a finite state machine, a processor, etc.), and a memory 365. Other input/output (I/O) circuitry may also be utilized. When the controller 345 is not implemented, such as for various lighting system 350 embodiments (which are typically non-addressable and/or a non-dynamic light emitting display system 350 embodiments), the system 350 is typically coupled to an electrical or electronic switch (not separately illustrated), which may comprise any suitable type of switching arrangement, such as for turning on, off, and/or dimming a lighting system. The Control logic circuitry 360, memory 365 are discussed in greater detail below, following the discussion of FIGS. 100-103, 85 and 86.

The interface circuit 355 may be implemented as known or may become known in the art, and may include impedance matching capability, voltage rectification circuitry, voltage translation for a low voltage processor to interface with a higher voltage control bus for example, various switching mechanisms (e.g., transistors) to turn various lines or connectors on or off in response to signaling from the control logic circuitry 360, and/or physical coupling mechanisms. In addition, the interface circuit 355 may also be adapted to receive and/or transmit signals externally to the system 350, such as through hard-wiring or RF signaling, for example, to receive information in real-time to control a dynamic display, for example, or to control brightness of light output (dimming), also for example. The interface circuit 355A also may be stand-alone device (e.g., modular) and re-usable, for example, with the apparatus 760, 770 configured to snap, screw, lock, or otherwise couple to the interface circuit 355A, so that the interface circuit 355A may be used repeatedly over time with multiple replacement apparatuses 760, 770.

For example, as illustrated in FIG. 100, an exemplary system embodiment 800, 810 comprises an apparatus 760 (if implemented using diodes 100-100K) or an apparatus 770 (if implemented using diodes 100L), in which the plurality of diodes 100-100L are light emitting diodes, and an interface circuit 355 to fit any of the various standard Edison sockets for light bulbs. Continuing with the example and without limitation, the interface circuit 355 may be sized and shaped to conform to one or more of the standardized screw configurations, such as the E12, E14, E26, and/or E27 screw base standards, such as a medium screw base (E26) or a candelabra screw base (E12), and/or the other various standards promulgated by the American National Standards Institute ("ANSI") and/or the Illuminating Engineering Society, also for example. In other exemplary embodiments, the interface circuit 355 may be sized and shaped to conform to a standard fluorescent bulb socket or a two plug base, such as a GU-10 base, also for example and without limitation. Such an exemplary system embodiment also may be viewed equivalently as another type of apparatus, particularly when having a form factor compatible for insertion into an Edison or fluorescent socket, for example and without limitation.

For example, an LED-based "light bulb" may be formed having a design which resembles a traditional incandescent light bulb, having a screw-type connection as part of interface circuit 355, such as ES, E27, SES, or E14, which may be adapted to connect with any power socket type, e.g., L1, PL-2 pin, PL-4 pin, G9 halogen capsule, G4 halogen capsule, GU10, GU5.3, bayonet, small bayonet, or any other connection known in the art, for example and without limitation.

The apparatus 300A, 300C, 300D, 700 and first system 350 may be used to form a wide variety of lighting devices or other illuminating products, for many purposes, as light bulbs and tubes, lamps, lighting fixtures, indoor and outdoor lighting, lamps configured to have a lamp shade form factor, architectural lighting, work or task lighting, decorative or mood lighting, overhead lighting, safety lighting, dimmable lighting, colored lighting, theatrical and/or color-changeable lighting, display lighting, and lighting having any of the various decorative or fanciful forms mentioned herein. Not separately illustrated, the first system 350 will generally also include various mechanical structures to provide sufficient physical support of the apparatus 300A, 300C, 300D, in any desired shape or form within a system 350.

Referring to FIG. 100, the exemplary system 800 comprises an apparatus 760 and an interface circuit 355A, and the exemplary system 810 comprises an apparatus 770 and an interface circuit 355A. The interface circuit 355A has been configured to fit in a standard, Edison bulb screw-type socket for coupling to a standard AC power source, such as an AC mains (not separately illustrated). Such an interface circuit 355A will typically comprise rectification circuitry to convert an AC voltage to a DC voltage, and may also include impedance matching circuitry and various capacitors and/or resistors (and often switches implemented using transistors) to reduce ripple of the DC voltage, as known in the field of LED lighting and LED power supplies. As illustrated in FIGS. 102 and 103, the apparatus 760 is comprised of a plurality of diodes 100-100K, while the apparatus 770 is comprised of a plurality of diodes 100L, with corresponding differences in apparatus structure and materials, as discussed above and as discussed in greater detail below. FIG. 100 also serves to illustrate the extremely thin and flexible form factor of an exemplary apparatus (300, 300A, 300B, 300C, 300D, 300C, 300D, 700, 700A, 700B, 720, 730, 740, 750, 760, 770), which has been twisted and folded into a fanciful, decorative form.

FIG. 101 is a plan view illustrating the printed layout of an apparatus 760, 770. As illustrated, the apparatus 760, 770 is printed as a flat sheet with a very thin form factor, and is then die cut in the regions 716, forming comparatively narrow lamp strips 717 (coupled in series, as described above). Electrodes (illustrated as carbon electrodes 322A, 322B) are provided at each end. The apparatus 760, 770 is then curled and ends 718 of the lamp strips 717 are gathered together and overlapped with each other in a circle, with access to the electrodes 322A and 322B to provide power to the apparatus 760, 770 through the interface circuit 355A, and with the lamp strips 717 having some separation from each other, as illustrated in FIG. 100.

Referring to FIG. 102, an apparatus 760 is similar to the other illustrated apparatuses, with the addition of two more layers, namely, one or more third conductors 312 (which also may be deposited as a single layer using any of the transparent or nontransparent conductive inks and compounds discussed herein), and an additional dielectric layer (illustrated as 315A, to distinguish it from the other dielectric layer, illustrated as 315B), between the one or more third conductors 312 and the one or more first conductors 310. The one or more third conductors 312 are utilized to provide power (e.g., a voltage level) along the edges of the lamp strips 717 and are coupled to the one or more second conductors 320, which may be deposited as a layer of transparent conductive material as discussed above, and provides a method to reduce the overall impedance, current levels and power consumption of the apparatus 760, effectively functioning as parallel busbars along the length of each lamp strip 717.

Referring to FIG. 103, an apparatus 770 is also similar to the other illustrated apparatuses, with the addition of three more layers: (1) one or more third conductors 312 (which also may be deposited as a single layer using any of the transparent or nontransparent conductive inks and compounds discussed herein); (2) an additional dielectric layer (illustrated as 315A, to distinguish it from the other dielectric layer, illustrated as 315B), between the one or more third conductors 312 and the one or more second conductors 320; and (3) one or more barrier layers 318, as mentioned above, deposited between the dielectric layer 315B and the one or more second conductors 320. The one or more third conductors 312 are utilized to provide power (e.g., a voltage level) along the edges of the lamp strips 717 and are coupled to the one or more first conductors 310, and also provides a method to reduce the overall impedance, current levels and power consumption of the apparatus 770, also effectively functioning as parallel busbars along the length of each lamp strip 717.

Any of various levels of light output may be provided by an apparatus 300A, 300C, 300D, 300C, 300D, 700A, 720, 730, 740, 750, 760, 770, and will generally vary based on the concentration of diodes 100-100L utilized, the number of apparatuses 300A, 300C, 300D, 300C, 300D, 700A, 720, 730, 740, 750, 760, 770 utilized in a first system 350, selected or allowed power consumption, and the applied voltage and/or current levels. In an exemplary embodiment, an apparatus 300A, 300C, 300D, 300C, 300D, 700A, 720, 730, 740, 750, 760, 770 may provide light output in the range of about 25 to 1300 lumens, for example and without limitation, depending upon the power consumption, the concentration or density of the diodes 100-100L, the current levels of the diodes 100-100L current levels (i.e., how hard the diodes 100-100L are driven), overall impedance levels, etc.

Figure 85:
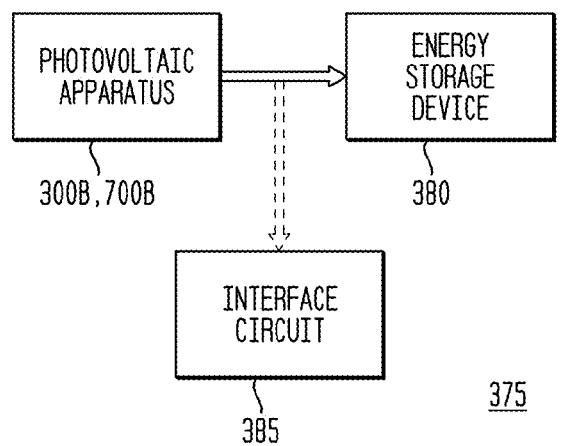
FIG. 85 is a block diagram of a second exemplary system embodiment.

As indicated above, the plurality of diodes 100-100L also may be configured (through material selection and corresponding doping) to be photovoltaic (PV) diodes. FIG. 85 is a block diagram of a second exemplary system 375 embodiment, in which the diodes 100-100L are implemented as photovoltaic (PV) diodes. The system 375 comprises an apparatus 300B, 700B (which is otherwise generally the same as an apparatus 300, 700 (or any of the other illustrated apparatuses) but having the plurality of diodes 100-100L implemented as photovoltaic (PV) diodes), and either or both an energy storage device 380, such as a battery, or an interface circuit 385 to deliver power or energy to another system (not separately illustrated), for example, such as a motorized device or an electric utility. (In other exemplary embodiments which do not comprise an interface circuit 385, other circuit configurations may be utilized to provide energy or power directly to such an energy using apparatus or system or energy distributing apparatus or system.) Within the system 375, the one or more first conductors 310 (or electrodes 322A) of an apparatus 300B, 700B are coupled to form a first terminal (such as a negative or positive terminal), and the one or more second conductor(s) 320 (or electrodes 322B) of the apparatus 300B, 700B are coupled to form a second terminal (such as a correspondingly positive or negative terminal), which are then couplable for connection to either or both an energy storage device 380 or an interface circuit 385. When light (such as sunlight) is incident upon the apparatus 300B, 700B, the light may be concentrated on one of more photovoltaic (PV) diodes 100-100L which, in turn, convert the incident photons to electron-hole pairs, resulting in an output voltage generated across the first and second terminals, and output to either or both an energy storage device 380 or an interface circuit 385.

It should be noted that when the first conductors 310 have the interdigitated or comb structure illustrated in FIG. 77, the second conductor 320 may be energized using first conductor 310B or, similarly, a generated voltage may be received across first conductors 310A and 310B.

Figure 86:
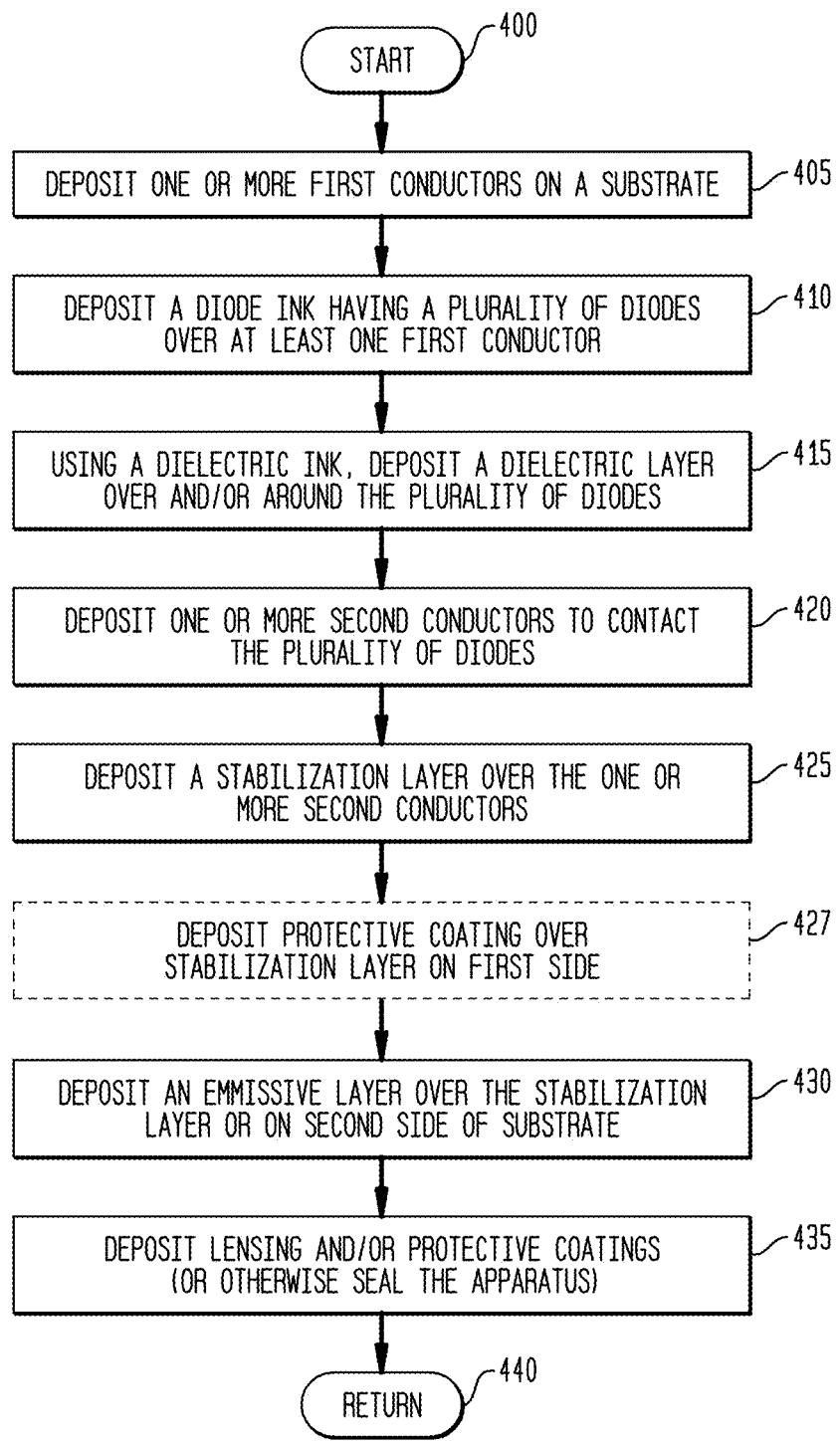
FIG. 86 is a flow diagram illustrating an exemplary method embodiment for apparatus fabrication.

FIG. 86 is a flow diagram illustrating an exemplary method embodiment for apparatus 300, 300A, 300B, 300C, 300D, 700, 700A, 700B, 720, 730, 740, 750, 760, 770 fabrication, and provides a useful summary. Beginning with start step 400, one or more first conductors (310) are deposited onto a base (305), such as by printing a conductive ink or polymer or vapor depositing, sputtering or coating the base (305) with one or more metals, followed by curing or partially curing the conductive ink or polymer, or potentially removing a deposited metal from unwanted locations, depending upon the implementation, step 405. A plurality of diodes 100-100L, having typically been suspended in a liquid, gel or other compound or mixture (e.g., suspended in diode ink), which also may include a plurality of inert particles 292, are then deposited over the one or more first conductors, step 410, also typically through printing or coating, to form an ohmic contact between the plurality of diodes 100-100L and the one or more first conductors (which may also involve various chemical reactions, compression and/or heating, for example and without limitation). For an apparatus 700 embodiment, steps 405 and 410 occur in the opposite order, as discussed above.

A dielectric or insulating material, such as a dielectric ink, is then deposited on or about the plurality of diodes 100-100L, such as about the periphery of the diodes 100-100L (and cured or heated), step 415, to form one or more insulators or dielectric layer 315. For an apparatus 760 embodiment, not separately illustrated, one or more third conductors 312 and a dielectric layer 315A may be deposited, as a step 405 and 415, then followed by another step 405 and a step 410. For an apparatus 770 embodiment, a barrier layer 318 may also be deposited, also not separately illustrated. Next, one or more second conductors 320 (which may or may not be optically transmissive) are then deposited over and form contacts with the plurality of diodes 100-100L, such as over the dielectric layer 315 and about the upper surface of the diodes 100-100L and cured (or heated), step 420, also to form ohmic contacts between the one or more second conductors (320) and the plurality of plurality of diodes 100-100L. In exemplary embodiments, such as for an addressable display, a plurality of (transmissive) second conductors 320 are oriented substantially perpendicular to a plurality of first conductors 310. For an apparatus 770 embodiment, not separately illustrated, a dielectric layer 315A may be deposited, as a step 415, followed by depositing one or more third conductors 312, as a step 405.

As another option, before or during step 420, testing may be performed, with non-functioning or otherwise defective diodes 100-100L removed or disabled. For example, for PV diodes, the surface (first side) of the partially completed apparatus may be scanned with a laser or other light source and, when a region (or individual diode 100-100L) does not provide the expected electrical response, it may be removed using a high intensity laser or other removal technique. Also for example, for light emitting diodes which have been powered on, the surface (first side) may be scanned with a photosensor, and, when a region (or individual diode 100-100L) does not provide the expected light output and/or draws excessive current (i.e., current in excess of a predetermined amount), it also may be removed using a high intensity laser or other removal technique. Depending upon the implementation, such as depending upon how non-functioning or defective diodes 100-100L are removed, such a testing step may be performed instead after steps 425, 430 or 435 discussed below. A stabilization layer 335 is then deposited over the one or more second conductors 320 or other layer as illustrated for the various apparatuses, step 425, followed by depositing an emissive layer 325 over the stabilization layer, step 430. In apparatus 700 embodiments, the layer 325 is typically deposited on the second side of the base 305A, as mentioned above. A plurality of lenses (not separately illustrated), also typically having been suspended in a polymer, a binder, or other compound or mixture to form a lensing or lens particle ink or suspension, are then place or deposited over the emissive layer, also typically through printing, or a preformed lens panel comprising a plurality of lenses suspended in a polymer is attached to the first side of the partially completed apparatus (such as through a lamination process), followed by any optional deposition (such as through printing) of protective coatings (and/or selected colors), step 355, and the method may end, return step 440.

Referring again to FIG. 84, control logic circuitry 360 may be any type of controller, processor or control logic circuit, and may be embodied as one or more processors, to perform the functionality discussed herein. As the term processor is used herein, a processor 360 may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or EPROM. A processor, with its associated memory, may be adapted or configured (via programming, FPGA interconnection, or hard-wiring) to perform the methodology of the invention, such as selective pixel addressing for a dynamic display embodiment, or row/column addressing, such as for a signage embodiment. For example, the methodology may be programmed and stored, in a processor with its associated memory (and/or memory 365) and other equivalent components, as a set of program instructions or other code (or equivalent configuration or other program) for subsequent execution when the processor is operative (i.e., powered on and functioning). Equivalently, when the control logic circuitry 360 may implemented in whole or part as FPGAs, custom ICs and/or ASICs, the FPGAs, custom ICs or ASICs also may be designed, configured and/or hard-wired to implement the methodology of the invention. For example, the control logic circuitry 360 may be implemented as an arrangement of processors, controllers, microprocessors, DSPs and/or ASICs, collectively referred to as a "controller" or "processor", which are respectively programmed, designed, adapted or configured to implement the methodology of the invention, in conjunction with a memory 365.

Control logic circuitry 360, with its associated memory, may be configured (via programming, FPGA interconnection, or hard-wiring) to control the energizing of (applied voltages to) the various pluralities of first conductors 310 and the plurality of second conductor(s) 320 (and the optional one or more third conductors 312), for corresponding control over what information is being displayed. For example, static or time-varying display information may be programmed and stored, configured and/or hard-wired, in control logic circuitry 360 with its associated memory (and/or memory 365) and other equivalent components, as a set of program instructions (or equivalent configuration or other program) for subsequent execution when the control logic circuitry 360 is operative.

The memory 365, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor), whether volatile or non-volatile, whether removable or non-removable, including without limitation RAM, FLASH, DRAM, SDRAM, SRAM, MRAM, FeRAM, ROM, EPROM or EPROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory 365 may be adapted to store various look up tables, parameters, coefficients, other information and data, programs or instructions (of the software of the present invention), and other types of tables such as database tables.

As indicated above, the processor 360 is programmed, using software and data structures of the invention, for example, to perform the methodology of the present invention. As a consequence, the system and method of the present invention may be embodied as software which provides such programming or other instructions, such as a set of instructions and/or metadata embodied within a computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 360, for example).

The software, metadata, or other source code of the present invention and any resulting bit file (object code, database, or look up table) may be embodied within any tangible storage medium, such as any of the computer or other machine-readable data storage media, as computer-readable instructions, data structures, program modules or other data, such as discussed above with respect to the memory 365, e.g., a floppy disk, a CDROM, a CD-RW, a DVD, a magnetic hard drive, an optical drive, or any other type of data storage apparatus or medium, as mentioned above.

In addition to the controller 345 illustrated in FIG. 84, those having skill in the art will recognize that there are innumerable equivalent configurations, layouts, kinds and types of control circuitry known in the art, which are within the scope of the present invention.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. One having skill in the art will further recognize that additional or equivalent method steps may be utilized, or may be combined with other steps, or may be performed in different orders, any and all of which are within the scope of the claimed invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment and not necessarily in all embodiments, and further, are not necessarily referring to the same embodiment. Furthermore, the particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

As used herein for purposes of the present invention, the term "LED" and its plural form "LEDs" should be understood to include any electroluminescent diode or other type of carrier injection- or junction-based system which is capable of generating radiation in response to an electrical signal, including without limitation, various semiconductor- or carbon-based structures which emit light in response to a current or voltage, light emitting polymers, organic LEDs, and so on, including within the visible spectrum, or other spectra such as ultraviolet or infrared, of any bandwidth, or of any color or color temperature. Also as used herein for purposes of the present invention, the term "photovoltaic diode" (or PV) and its plural form "PVs" should be understood to include any photovoltaic diode or other type of carrier injection- or junction-based system which is capable of generating an electrical signal (such as a voltage) in response to incident energy (such as light or other electromagnetic waves) including without limitation, various semiconductor- or carbon-based structures which generate of provide an electrical signal in response to light, including within the visible spectrum, or other spectra such as ultraviolet or infrared, of any bandwidth or spectrum.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus comprising:
    a plurality of diodes, each diode of the plurality of diodes comprising:
    a light emitting or absorbing region having a lateral dimension between 20 microns to 30 microns and a height between 2.5 to 7 microns;
    a first terminal coupled to the light emitting or absorbing region on a first side, the first terminal having a height between 1 to 6 microns; and
    a second terminal coupled to the light emitting or absorbing region on a second side opposite the first side, the second terminal having a height between 1 to 6 microns;
    wherein each diode of the plurality of diodes is substantially hexagonal laterally, has a lateral dimension between 10 to 50 microns measured opposing face-to-face, and a height between 5 to 25 microns;
    one or more first conductors coupled to a first plurality of first terminals of the plurality of diodes;
    a first dielectric layer coupled to the one or more first conductors; and
    one or more second conductors coupled to a first plurality of second terminals of the plurality of diodes.

2. The apparatus of claim 1, further comprising:
    a film substantially surrounding each diode of the plurality of diodes, the film comprising a polymer or a resin and having a thickness between 10 nm to 300 nm.

3. The apparatus of claim 2, wherein the film comprises a methylcellulose resin.

4. The apparatus of claim 2, wherein the film comprises a cured, polymerized or dried viscosity modifier selected from the group consisting of: clays; saccharides; polysaccharides; celluloses; modified celluloses; polymers and copolymers; glycols; fumed silica, silica powders; modified ureas; and mixtures thereof.

5. The apparatus of claim 1, further comprising at least a trace amount of a first solvent, wherein the first solvent comprises at least one solvent selected from the group consisting of: water; alcohols; ethers; esters; glycols; carbonates; glycerols; acetonitrile, tetrahydrofuran (THF), dimethyl formamide (DMF), N-methyl formamide (NMF), dimethyl sulfoxide (DMSO); and mixtures thereof.

6. The apparatus of claim 5, further comprising at least a trace amount of a second solvent different from the first solvent, wherein the second solvent is at least one solvent selected from the group consisting of: water; alcohols; ethers; esters; glycols; carbonates; glycerols; acetonitrile, tetrahydrofuran (THF), dimethyl formamide (DMF), N-methyl formamide (NMF), dimethyl sulfoxide (DMSO); and mixtures thereof.

7. The apparatus of claim 1, wherein each diode of the plurality of diodes has a lateral dimension between 20 to 30 microns and a height between 5 to 15 microns.

8. The apparatus of claim 1, further comprising:
    a plurality of substantially optically transparent and chemically inert particles, each inert particle of the plurality of substantially optically transparent and chemically inert particles between 10 to 50 microns.

9. The apparatus of claim 1, wherein the light emitting or absorbing region of each diode of the plurality of diodes is substantially hexagonal, square, triangular, rectangular, lobed, stellate, or toroidal.

10. The apparatus of claim 1, wherein the light emitting or absorbing region of each diode of the plurality of diodes has a surface texture selected from the group consisting of: a plurality of circular rings, a plurality of substantially curvilinear trapezoids, a plurality of parallel stripes, a stellate pattern, and mixtures thereof.

11. The apparatus of claim 1, wherein the first and second terminals of each diode of the plurality of diodes are each comprised of one or more metals or metal alloys.

12. The apparatus of claim 1, wherein the first and second terminals of each diode of the plurality of diodes are each comprised of a conductor.

13. The apparatus of claim 1, wherein each diode of the plurality of diodes is 20 to 30 microns in lateral dimension measured opposing face-to-face, and is 5 to 15 microns in height.

14. The apparatus of claim 1, wherein the lateral sides of each diode of the plurality of diodes are less than 10 microns in height.

15. The apparatus of claim 1, wherein the lateral sides of each diode of the plurality of diodes are between 2.5 to 6 microns in height.

16. The apparatus of claim 1, wherein the lateral sides of each diode of the plurality of diodes are substantially sigmoidal and terminate in a curved point.

17. The apparatus of claim 1, wherein each diode of the plurality of diodes comprises at least one inorganic semiconductor selected from the group consisting of: silicon, gallium arsenide (GaAs), gallium nitride (GaN), GaP, InAlGaP, AlInGaAs, InGaNAs, and AlInGaSb.

18. The apparatus of claim 1, wherein at least one diode of the plurality of diodes has a first terminal coupled to at least one second conductor and a second terminal coupled to at least one first conductor.

19. The apparatus of claim 1, wherein each diode of a second plurality of diodes has a first terminal coupled to at least one second conductor and a second terminal coupled to at least one first conductor.

20. The apparatus of claim 1, further comprising:
    an interface circuit coupled to the one or more first conductors and to the one or more second conductors, the interface circuit further couplable to a power source or power supply.

21. The apparatus of claim 1, wherein the one or more first conductors comprise:
    first electrode comprising a first busbar and a first plurality of elongated conductors extending from the first busbar, wherein the first busbar or the first plurality of elongated conductors are coupled to the first plurality of first terminals of the plurality of diodes; and
    a second electrode comprising a second busbar and a second plurality of elongated conductors extending from the second busbar.

22. The apparatus of claim 21, wherein the second plurality of elongated conductors are interdigitated with the first plurality of elongated conductors.

23. The apparatus of claim 21, wherein the one or more second conductors are further coupled to the second plurality of elongated conductors.

24. The apparatus of claim 1, wherein the first dielectric layer is between the one or more first conductors and the one or more second conductors, and has a thickness between 1 to 7 microns.

25. The apparatus of claim 1, further comprising:
a barrier layer coupled to the dielectric layer and to the one or more second conductors, wherein the barrier layer comprises a cured, dried or polymerized viscosity modifier selected from the group consisting of: clays; saccharides; polysaccharides; celluloses; modified celluloses; polymers and copolymers; glycols; fumed silica, silica powders; modified ureas; and mixtures thereof.

26. The apparatus of claim 1, further comprising:
a substantially optically transmissive base wherein the base coupled to the plurality of diodes on a first side; and
a phosphor layer coupled to the base on the second side.

27. The apparatus of claim 1, further comprising:
a substantially optically transmissive base coupled to the plurality of diodes on a first side;
a first phosphor layer coupled over the one or more second conductors; and
a second phosphor layer coupled to the base on the second side;
wherein the one or more second conductors are substantially optically transmissive.

28. The apparatus of claim 1, further comprising:
a substantially optically transmissive base coupled to the one or more first conductors on a first side;
a first phosphor layer coupled over the one or more second conductors; and
a second phosphor layer coupled to the base on the second side:
wherein the one or more first conductors and the one or more second conductors are substantially optically transmissive.

29. The apparatus of claim 1, further comprising:
a substantially flat base, and wherein a mean concentration of the plurality of diodes is from 25 diodes to 50,000 diodes per square centimeter of the base.

30. The apparatus of claim 1, further comprising:
one or more third conductors coupled to the one or more first conductors or to the one or more second conductors; and
a second dielectric layer coupled to the one or more third conductors.

31. The apparatus of claim 1, wherein the apparatus is flexible, foldable and bendable.

32. The apparatus of claim 1, wherein the apparatus is die cut and folded into a selected shape.

33. The apparatus of claim 1, wherein the apparatus has an average surface area concentration of the plurality of diodes from 25 to 50,000 diodes per square centimeter.

34. The apparatus of claim 1, wherein the plurality of diodes are light emitting diodes, and wherein the apparatus is adapted, when operative, to emit light in an amount of at least 10 lumens per watt of power consumed.

35. The apparatus of claim 1, wherein the plurality of diodes are light emitting diodes, wherein density of the plurality of diodes is 25 to 100 diodes per square centimeter, and wherein a surface temperature of the apparatus when operative is less than 100° C.

36. The apparatus of claim 1, wherein the plurality of diodes are light emitting diodes, wherein a density of the plurality of diodes is 25 to 100 diodes per square centimeter, and wherein a surface temperature of the apparatus when operative is less than 70° C.

37. The apparatus of claim 1, wherein the plurality of diodes are light emitting diodes, and wherein the apparatus is adapted, when operative, to emit light in an amount of at least 60 lumens per watt of power consumed.

38. The apparatus of claim 1, wherein the light emitting or absorbing region of each diode of the plurality of diodes has a surface texture.

39. The apparatus of claim 1, wherein the first and second terminals of each diode of the plurality of diodes are electrically conductive.

40. The apparatus of claim 1, wherein the first and second terminals of each diode of the plurality of diodes provide ohmic contacts to the light emitting or absorbing region.

41. The apparatus of claim 1, wherein the one or more first conductors are comprised of a substantially optically transparent conductor.

42. The apparatus of claim 1, wherein the substantially optically transparent conductor comprises one or more compounds selected from the group consisting essentially of indium tin oxide (ITO), antimony tin oxide (ATO), polyethylene-dioxithiophene, and combinations or mixtures thereof.

43. The apparatus of claim 1, wherein the one or more second conductors are comprised of a substantially optically transparent conductor.

44. The apparatus of claim 43, wherein the substantially optically transparent conductor comprises one or more compounds selected from the group consisting essentially of: indium tin oxide (ITO), antimony tin oxide (ATO), polyethylene-dioxithiophene, and combinations or mixtures thereof.

45. An apparatus comprising:
a plurality of diodes, each diode of the plurality of diodes comprising:
a light emitting or absorbing region having a lateral dimension between 10 microns to 40 microns and a height between 2 to 7 microns;
a first terminal coupled to the light emitting or absorbing region on a first side, the first terminal having a height less than 6 microns; and
a second terminal coupled to the light emitting or absorbing region on a second side opposite the first side, the second terminal having a height less than 6 microns;
wherein each diode of the plurality of diodes is substantially hexagonal laterally, has a lateral dimension between 10 to 50 microns measured opposing face-to-face, and a height between 5 to 25 microns;
one or more first conductors coupled to a first plurality of first terminals of the plurality of diodes;
a first dielectric layer coupled to the one or more first conductors; and
one or more second conductors coupled to a first plurality of second terminals of the plurality of diodes.

46. The apparatus of claim 45, further comprising a film substantially surrounding each diode of the plurality of diodes, the film comprising a polymer or a resin and having a thickness between 10 nm to 300 nm.

47. The apparatus of claim 46, wherein the film comprises a methylcellulose resin.

48. The apparatus of claim 46, wherein the film comprises a cured, polymerized or dried viscosity modifier selected from the group consisting of: clays; saccharides; polysaccharides; celluloses; modified celluloses; polymers and copolymers; glycols; fumed silica, silica powders; modified ureas; and mixtures thereof.

49. The apparatus of claim 45, further comprising at least a trace amount of a first solvent, wherein the first solvent comprises at least one solvent selected from the group consisting of: water; alcohols; ethers; esters; glycols; carbonates; glycerols; acetonitrile, tetrahydrofuran (THF), dimethyl formamide (DMF), N-methyl formamide (NMF), dimethyl sulfoxide (DMSO); and mixtures thereof.

50. The apparatus of claim 49, further comprising at least a trace amount of a second solvent different from the first solvent, wherein the second solvent is at least one solvent selected from the group consisting of: water; alcohols; ethers; esters; glycols; carbonates; glycerols; acetonitrile, tetrahydrofuran (THF), dimethyl formamide (DMF), N-methyl formamide (NMF), dimethyl sulfoxide (DMSO); and mixtures thereof.

51. The apparatus of claim 45, wherein each diode of the plurality of diodes has a lateral dimension between 20 to 30 microns and a height between 5 to 15 microns.

52. The apparatus of claim 45, further comprising:
a plurality of substantially optically transparent and chemically inert particles, each inert particle of the plurality of substantially optically transparent and chemically inert particles between 10 to 50 microns.

53. The apparatus of claim 45, wherein the light emitting or absorbing region of each diode of the plurality of diodes is substantially hexagonal, square, triangular, rectangular, lobed, stellate, or toroidal.

54. The apparatus of claim 45, wherein the light emitting or absorbing region of each diode of the plurality of diodes has a surface texture.

55. The apparatus of claim 45, wherein the light emitting or absorbing region of each diode of the plurality of diodes has a surface texture selected from the group consisting of: a plurality of circular rings, a plurality of substantially curvilinear trapezoids, a plurality of parallel stripes, a stellate pattern, and mixtures thereof.

56. The apparatus of claim 45, wherein the first and second terminals of each diode of the plurality of diodes are comprised of one or more metals or metal alloys.

57. The apparatus of claim 45, wherein the first and second terminals of each diode of the plurality of diodes are electrically conductive.

58. The apparatus of claim 45, wherein the first and second terminals of each diode of the plurality of diodes are each comprised of one or more electrically conductive compounds.

59. The apparatus of claim 45, wherein the first and second terminals of each diode of the plurality of diodes provide ohmic contacts to the light emitting or absorbing region.

60. The apparatus of claim 45, wherein each diode of the plurality of diodes is 20 to 30 microns in lateral dimension measured opposing face-to-face, and is 5 to 15 microns in height.

61. The apparatus of claim 45, wherein the lateral sides of each diode of the plurality of diodes are less than 10 microns in height.

62. The apparatus of claim 45, wherein the lateral sides of each diode of the plurality of diodes are between 2.5 to 6 microns in height.

63. The apparatus of claim 45, wherein the lateral sides of each diode of the plurality of diodes are substantially sigmoidal and terminate in a curved point.

64. The apparatus of claim 45, wherein each diode of the plurality of diodes comprises at least one inorganic semiconductor selected from the group consisting of: silicon, gallium arsenide (GaAs), gallium nitride (GaN), GaP, InAIGaP, AlInGaAs, InGaNAs, and AlInGaSb.

65. The apparatus of claim 45, wherein at least one diode of the plurality of diodes has a first terminal coupled to at least one second conductor and a second terminal coupled to at least one first conductor.

66. The apparatus of claim 45, wherein each diode of a second plurality of diodes has a first terminal coupled to at least one second conductor and a second terminal coupled to at least one first conductor.

67. The apparatus of claim 45, further comprising:
an interface circuit coupled to the one or more first conductors and to the one or more second conductors, the interface circuit further couplable to a power source or power supply.

68. The apparatus of claim 45, wherein the one or more first conductors comprise:
a first electrode comprising a first busbar and a first plurality of elongated conductors extending from the first busbar, wherein the first busbar or the first plurality of elongated conductors are coupled to the first plurality of first terminals of the plurality of diodes, and
a second electrode comprising a second busbar and a second plurality of elongated conductors extending from the second busbar.

69. The apparatus of claim 68, wherein the second plurality of elongated conductors are interdigitated with the first plurality of elongated conductors.

70. The apparatus of claim 68, wherein the one or more second conductors are further coupled to the second plurality of elongated conductors.

71. The apparatus of claim 45, wherein the first dielectric layer is between the one or more first conductors and the one or more second conductors, and has a thickness between 1 to 7 microns.

72. The apparatus of claim 45, further comprising:
a barrier layer coupled to the dielectric layer and to the one or more second conductors, wherein the barrier layer comprises a cured, dried or polymerized viscosity modifier selected from the group consisting of: clays; saccharides; polysaccharides; celluloses; modified celluloses; polymers and copolymers; glycols; fumed silica, silica powders; modified ureas; and mixtures thereof.

73. The apparatus of claim 45, further comprising:
a substantially optically transmissive base coupled to the plurality of diodes on a first side; and
a phosphor layer coupled to the base on the second side.

74. The apparatus of claim 45, further comprising:
a substantially optically transmissive base coupled to the plurality of diodes on a first side;
a first phosphor layer coupled over the one or more second conductors; and
a second phosphor layer coupled to the base on the second side;
wherein the one or more second conductors are substantially optically transmissive.

75. The apparatus of claim 45, further comprising:
a substantially optically transmissive base coupled to the one or more first conductors on a first side;
a first phosphor layer coupled over the one or more second conductors; and
a second phosphor layer coupled to the base on the second side;
wherein the one or more first conductors and the one or more second conductors are substantially optically transmissive.

76. The apparatus of claim 45, further comprising:
one or more third conductors coupled to the one or more first conductors or to the one or more second conductors; and
a second dielectric layer coupled to the one or more third conductors.

77. The apparatus of claim 45, wherein the one or more first conductors are comprised of a substantially optically transparent conductor.

78. The apparatus of claim 77, wherein the substantially optically transparent conductor comprises one or more compounds selected from the group consisting essentially of: indium tin oxide (ITO), antimony tin oxide (ATO), polyethylene-dioxithiophene, and combinations or mixtures thereof.

79. The apparatus of claim 45, wherein the one or more second conductors are comprised of a substantially optically transparent conductor.

80. The apparatus of claim 79, wherein the substantially optically transparent conductor comprises one or more compounds selected from the group consisting essentially of: indium tin oxide (ITO), antimony tin oxide (ATO), polyethylene-dioxithiophene, and combinations or mixtures thereof.

81. The apparatus of claim 45, wherein the apparatus is flexible, foldable and bendable.

82. The apparatus of claim 45, wherein the apparatus is die cut and folded into a selected shape.

83. An apparatus comprising:
a substantially optically transmissive base;
a plurality of diodes, each diode of the plurality of diodes comprising:
  a light emitting or absorbing region having a lateral dimension between 10 microns to 50 microns and a height between 2 to 7 microns;
  a first terminal coupled to the light emitting or absorbing region on a first side, the first terminal having a height less than about 6 microns; and
  a second terminal coupled to the light emitting or absorbing region on a second side opposite the first side, the second terminal having a height less than 6 microns;
wherein each diode of the plurality of diodes is substantially hexagonal laterally, has a lateral dimension between 10 to 50 microns measured opposing face-to-face, and a height between 5 to 25 microns; and
wherein each diode of the plurality of diodes comprises at least one inorganic semiconductor selected from the group consisting of: silicon, gallium arsenide (GaAs), gallium nitride (GaN), GaP, InAIGaP, AlInGaAs, InGaNAs, and AlInGaSb;
a plurality of substantially optically transparent and chemically inert particles, each inert particle of the plurality of substantially optically transparent and chemically inert particles between 10 to 50 microns;
one or more first conductors coupled to a first plurality of first terminals of the plurality of diodes;
a first dielectric layer coupled to the one or more first conductors; and
one or more second conductors coupled to a first plurality of second terminals of the plurality of diodes.

84. A lighting apparatus comprising:
a flexible base having an adhesive on a first side;
a plurality of first conductors coupled to the base;
a plurality of light emitting diodes distributed substantially randomly and in parallel on a first conductor of the plurality of first conductors, at least some of the plurality of light emitting diodes having a first, forward-bias orientation and at least one of the plurality of light emitting diodes having a second, reverse-bias orientation;
at least one second conductor coupled to the plurality of diodes and coupled to a second conductor of the plurality of first conductors;
a luminescent layer coupled to the at least one second conductor or an intervening stabilization layer;
a protective coating coupled to the luminescent layer;
an electrical interface coupled to the plurality of first conductors; and
optionally a power source couplable to the electrical interface.

85. The lighting apparatus of claim 84, further comprising:
a polymer or resin lattice coupled to the plurality of light emitting diodes.

86. The lighting apparatus of claim 84, wherein the apparatus emits light in an amount of at least about 10 lm/W.

87. The lighting apparatus of claim 84, wherein the plurality of light emitting diodes comprise an average particle size of from about 20 microns to about 30 microns in diameter.

88. The lighting apparatus of claim 84, wherein the base is selected from the group consisting of: flexible materials, porous materials, permeable materials, transparent materials, translucent materials, opaque materials and mixtures thereof.

89. The lighting apparatus of claim 84, wherein the base is selected from the group consisting of: plastics, polymer materials, natural rubber, synthetic rubber, natural fabrics, synthetic fabrics, glass, ceramics, silicon-derived materials, silica-derived materials, concrete, stone, extruded polyolefinic films, polymeric nonwovens, cellulosic paper, and mixtures thereof.

90. The lighting apparatus of claim 84, wherein the base is sufficient to provide electrical insulation and wherein the protective coating forms a weatherproof) seal.

91. The lighting apparatus of claim 1, wherein the apparatus has an average surface area concentration of the plurality of light emitting diodes from about 5 to 10,000 diodes per square centimeter.

92. The lighting apparatus of claim 84, wherein the electrical interface comprises at least one interface selected from the group consisting of: ES, E27, SES, E14, L1, PL—2 pin, PL—4 pin, G9 halogen capsule, G4 halogen capsule, GU10, GU5.3, bayonet, and small bayonet.

93. The lighting apparatus of claim 84, further comprising a composition selected from the group consisting of:
a. a first composition comprising: a plurality of diodes; a first solvent; and a viscosity modifier;
b. a second composition comprising: a plurality of diodes; and a viscosity modifier;
c. a third composition comprising: a plurality of diodes; a first solvent; a second solvent; and a viscosity modifier;
d. a fourth composition comprising: a plurality of diodes; and a wetting solvent;
e. a fifth composition comprising: a plurality of diodes; and an adhesive viscosity modifier;
f. a sixth composition comprising: a plurality of diodes; a first solvent comprising N-propanol, ethanol, tetrahydrofurfuryl alcohol, or cyclohexanol; a viscosity modifier comprising methoxyl cellulose or hydroxypropyl cellulose resin; a second, nonpolar resin solvent;
g. a seventh composition comprising: a plurality of diodes; a first solvent comprising N-propanol, ethanol, tetrahydrofurfuryl alcohol, or cyclohexanol; a viscosity modifier comprising of methoxyl cellulose or hydroxypropyl cellulose resin; and a dibasic ester;

h. an eighth composition comprising: a plurality of diodes; N-propanol; methoxyl cellulose resin; and dimethyl glutarate;
i. a ninth composition comprising: a plurality of diodes; N-propanol; hydroxypropyl cellulose resin; and dimethyl glutarate;
j. a tenth composition comprising: a plurality of diodes; N-propanol; methoxyl cellulose resin or hydroxypropyl cellulose resin; dimethyl glutarate; and dimethyl succinate; and
k. mixtures thereof.

94. The lighting apparatus of claim 84, further comprising a composition selected from the group consisting of:
a. a first composition comprising: a plurality of diodes; a first solvent; and a viscosity modifier;
b. a second composition comprising: a plurality of diodes; and a viscosity modifier;
c. a third composition comprising: a plurality of diodes; a first solvent; a second solvent; and a viscosity modifier;
d. a fourth composition comprising: a plurality of diodes; and a wetting solvent;
e. a fifth composition comprising: a plurality of diodes; and an adhesive viscosity modifier;
f. a sixth composition comprising: a plurality of diodes; a first solvent comprising N-propanol, ethanol, tetrahydrofurfuryl alcohol, or cyclohexanol; a viscosity modifier comprising methoxyl cellulose or hydroxypropyl cellulose resin; a second, nonpolar resin solvent;
g. a seventh composition comprising: a plurality of diodes; a first solvent comprising N-propanol, ethanol, tetrahydrofurfuryl alcohol, or cyclohexanol; a viscosity modifier comprising of methoxyl cellulose or hydroxypropyl cellulose resin; and a dibasic ester;
h. an eighth composition comprising: a plurality of diodes; N-propanol; methoxyl cellulose resin; and dimethyl glutarate;
i. a ninth composition comprising: a plurality of diodes; N-propanol; hydroxypropyl cellulose resin; and dimethyl glutarate;
j. a tenth composition comprising: a plurality of diodes; N-propanol; methoxyl cellulose resin or hydroxypropyl cellulose resin; dimethyl glutarate; and dimethyl succinate; and
k. mixtures thereof.

95. A lighting apparatus comprising:
a translucent or transparent housing;
an electrical interface coupled to the housing and couplable to a power source;
a base;
a plurality of first conductors coupled to the base and coupled to the electrical interface;
a plurality of light emitting diodes distributed substantially randomly and in parallel on a first conductor of the plurality of first conductors, at least some of the plurality of light emitting diodes having a first, forward-bias orientation and at least one of the plurality of light emitting diodes having a second, reverse-bias orientation;
at least one second conductor coupled to the plurality of diodes and coupled to a second conductor of the plurality of first conductors;
a luminescent layer coupled to the at least one second conductor or an intervening stabilization layer; and
a protective coating coupled to the luminescent layer.

96. The lighting apparatus of claim 95, further comprising: a polymer or resin lattice coupled to the plurality of light emitting diodes.

97. The lighting apparatus of claim 95, wherein the apparatus emits light in an amount of at least about 10 lm/W.

98. The lighting apparatus of claim 95, wherein the plurality of light emitting diodes comprise an average particle size of from about 20 microns to about 30 microns in diameter.

99. The lighting apparatus of claim 95, wherein the base is selected from the group consisting of of flexible materials, porous materials, permeable materials, transparent materials, translucent materials, opaque materials and mixtures thereof.

100. The lighting apparatus of claim 95, wherein the base is selected from the group consisting of: plastics, polymer materials, natural rubber, synthetic rubber, natural fabrics, synthetic fabrics, glass, ceramics, silicon-derived materials, silica-derived materials, concrete, stone, extruded polyolefinic films, polymeric nonwovens, cellulosic paper, and mixtures thereof.

101. The lighting apparatus of claim 95, wherein the base is sufficient to provide electrical insulation.

102. The lighting apparatus of claim 95, wherein the protective coating forms a weatherproof seal.

103. The lighting apparatus of claim 95, wherein the apparatus has an average surface area concentration of the plurality of light emitting diodes from about 5 to 10,000diodes per square centimeter.

104. The lighting apparatus of claim 95, wherein the electrical interface comprises at least one interface selected from the group consisting of: ES, E27, SES, E14, Ll, PL—2 pin, PL—4 pin, G9 halogen capsule, G4 halogen capsule, GU10, GU5.3, bayonet, and small bayonet.

105. The lighting apparatus of claim 95, wherein the housing has a size adapted to fit into a user's hand.

* * * * *